United States Patent
Sun et al.

(10) Patent No.: US 8,143,117 B2
(45) Date of Patent: Mar. 27, 2012

(54) ACTIVE DEVICE ARRAY SUBSTRATE AND METHOD FOR FABRICATING THE SAME

(75) Inventors: Ming-Wei Sun, Hsinchu County (TW); Chen-Yueh Li, Taichung (TW); Yu-Cheng Chen, Hsinchu County (TW); Chia-Tien Peng, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 212 days.

(21) Appl. No.: 12/539,614

(22) Filed: Aug. 12, 2009

(65) Prior Publication Data
US 2010/0230763 A1 Sep. 16, 2010

(30) Foreign Application Priority Data

Mar. 16, 2009 (TW) .............................. 98108435 A

(51) Int. Cl.
*H01L 21/336* (2006.01)
*H01L 21/8232* (2006.01)
*H01L 27/085* (2006.01)

(52) U.S. Cl. ..... 438/164; 438/74; 438/98; 257/E21.412; 257/E21.615

(58) Field of Classification Search .................... 257/72, 257/E21.412, E21.615; 438/74, 98
See application file for complete search history.

(56) References Cited

U.S. PATENT DOCUMENTS

| 5,940,151 | A | 8/1999 | Ha |
| 6,576,504 | B2 | 6/2003 | Ohtani et al. |
| 7,242,449 | B1* | 7/2007 | Yamazaki et al. ............ 349/116 |
| 7,915,723 | B2* | 3/2011 | Sasaki et al. .................. 257/686 |
| 2006/0180816 | A1 | 8/2006 | Li et al. |
| 2007/0290246 | A1* | 12/2007 | Zhang et al. .................. 257/294 |
| 2009/0117681 | A1* | 5/2009 | Maruyama et al. ............. 438/59 |

FOREIGN PATENT DOCUMENTS

| TW | 200537691 | 11/2005 |
| TW | I271867 | 1/2007 |

* cited by examiner

Primary Examiner — Angel Roman
(74) Attorney, Agent, or Firm — Jianq Chyun IP Office

(57) ABSTRACT

A method for fabricating an active device array substrate is provided. A first patterned semiconductor layer, a gate insulator, a first patterned conductive layer and a first dielectric layer is sequentially formed on a substrate. First contact holes exposing the first patterned semiconductor layer are formed in the first dielectric layer and the gate insulator. A second patterned conductive layer and a second patterned semiconductor layer disposed thereon are simultaneously formed on the first dielectric layer. The second conductive layer includes contact conductors and a bottom electrode. The second patterned semiconductor layer includes an active layer. A second dielectric layer having second contact holes is formed on the first dielectric layer, wherein a portion of the second contact holes exposes the active layer. A third patterned conductive layer electrically connected to the active layer through a portion of the second contact holes is formed on the second dielectric layer.

23 Claims, 108 Drawing Sheets

ACTIVE DEVICE ARRAY SUBSTRATE AND METHOD FOR FABRICATING THE SAME

CROSS-REFERENCE TO RELATED APPLICATION

This application claims the priority benefit of Taiwan application serial no. 98108435, filed on Mar. 16, 2009. The entirety of the above-mentioned patent application is hereby incorporated by reference herein and made a part of specification.

BACKGROUND OF THE INVENTION

1. Field of the Invention

The present invention relates to a display array and a method for fabricating the same, and in particular, to an active device array substrate and a method for fabricating the same.

2. Description of Related Art

With a rapid progress in science and technology, a demand for displays is increasing along with an advancement of display technology. Conventionally, since cathode ray tubes (CRTs) are fully developed and have extraordinary display quality, the CRTs have played a dominant role in the display market for years. However, the rise of "environmental protection" awareness is against the CRTs due to the CRTs' disadvantages including high power consumption and high radiation, and the limited flattening capability of the CRTs is against the market demands for light, thin, short, small, compact, and power-saving displays. As a result, a thinner and lighter flat panel display (FPD) gradually replaces the traditional CRT, wherein a liquid crystal display (LCD) with great properties of high image quality, high efficiency of space use, low power consumption, and low radiation has become the main trend in the market.

In recent years, a photo sensor is integrated in the FPD in order to enhance the convenience in operating a display interface between a user and the FPD, or to improve the display quality of the FPD. In detail, the photo sensor can be used as an input device of an optical touch panel. When the user touch the optical touch panel with his/her fingers or other articles, the photo sensor integrated in the LCD detects the change in light and output a corresponding signal to perform various functions. Another employment of the photo sensor is to integrate the photo sensor in the FPD as an ambient light sensor, thereby detecting the intensity of the ambient light.

A current and common ambient light sensing technology is to form a p-i-n (P-type doped/undoped/N-type doped) photo sensor on a glass substrate of a display panel through a low temperature poly-silicon (LTPS) process. However, due to the limitation of the process, the p-i-n photo-sensors manufactured by the LTPS technology have a poor quantum effect (i.e. photoelectric conversion efficiency) because of an insufficient thickness of the poly-silicon thin film. In addition, the light from a backlight source directly irradiates the p-i-n photo sensor through the glass substrate and thus affects the photosensitive characteristics of the p-i-n photo sensor, reduces a signal to noise ratio (SNR) of a photosensitive signal, and causes distortion of measurement results.

In other words, a photosensitive material serving as the active layer in the photo sensor has the problem that, even though a voltage is not applied to electrodes on two sides of the photosensitive material, as long as the photosensitive material is irradiated by light, the reliability performance of the photo sensor is affected due to the attenuation of photo current of the photo sensor. Therefore, when manufacturing an active device array substrate having the photo sensor, a patterning process of the photosensitive material and the patterning process of the light-shielding electrode layer adjacent to the photosensitive material are performed by using different photolithography and etching processes, such that the size of the photosensitive material is smaller than the size of the light-shielding electrode layer adjacent thereto. Thus, with respect to the method for fabricating the active device array substrate having the photo sensor, an additional photolithography and etching process is required to form the patterns of the photosensitive material because of the incompatibility between the patterning process of the photosensitive material and the method for fabricating the active device array substrate. Therefore, the fabricating process can not be curtailed to reduce the process cost, which results in lowering the competitiveness of the product.

SUMMARY OF THE INVENTION

The present invention relates to a method for fabricating an active device array substrate incorporating a photo sensor, wherein no additional photolithography and etching processes are required to fabricate the photo sensor.

The present invention relates to an active device array substrate incorporating a photo sensor, the active device array substrate is fabricated with low cost and more accurate sensitivity.

The present invention provides a method for fabricating an active device array substrate, which includes following steps. First, a first patterned semiconductor layer, a gate insulator, a first patterned conductive layer, and a first dielectric layer are formed on a substrate, wherein the gate insulator covers the first patterned semiconductor layer, the first patterned conductive layer is disposed on the gate insulator, and the first dielectric layer is disposed on the gate insulator to cover the first patterned conductive layer. A plurality of first contact holes exposing the first patterned semiconductor layer is formed in the first dielectric layer and the gate insulator. A second patterned conductive layer and a second patterned semiconductor layer disposed on the second patterned conductive layer are simultaneously formed on the first dielectric layer, wherein the second patterned conductive layer includes a plurality of contact conductors and a bottom electrode, and the second patterned semiconductor layer includes an active layer disposed on the bottom electrode. A second dielectric layer is formed on the first dielectric layer. A plurality of second contact holes is formed in the second dielectric layer, wherein a portion of the second contact holes exposes the active layer. A third patterned conductive layer is formed on the second dielectric layer, wherein a portion of the third patterned conductive layer is electrically connected to the active layer through a portion of the second contact holes.

According to one embodiment of the present invention, a method for forming the first patterned semiconductor layer includes following steps, for example. First, a plurality of island patterns is formed on the substrate. Next, a plurality of first type doping regions and a plurality of second type doping regions are formed in the island patterns. The first type doping regions are P-type doping regions and the second type doping regions are N-type doping regions, for example. More specifically, the P-type doping regions include a P-type heavily doping region, while the N-type doping regions include an N-type heavily doping region and an N-type lightly doping region. Furthermore, a contact interface can be disposed between a portion of the first type doping regions and the second type doping regions, and a portion of the first contact holes exposes the contact interface, for example.

According to one embodiment of the present invention, a method for forming the second patterned conductive layer and the second patterned semiconductor layer includes following steps, for example. First, a second conductive layer and a second semiconductor layer are sequentially formed on the first dielectric layer. Next, the second conductive layer and the second semiconductor layer are patterned to form the bottom electrode and the active layer on the first dielectric layer and to form the contact conductors in at least a portion of the first contact holes. In this situation, a portion of the third patterned conductive layer is electrically connected to the first patterned semiconductor layer in a direct manner through the first contact holes and the second contact holes.

According to one embodiment of the present invention, the method for fabricating the active device array substrate further includes following steps. First, a plurality of third contact holes exposing the first patterned conductive layer are formed in the first dielectric layer at the same time of forming the first contact holes, wherein a portion of the second contact holes are disposed over the first contact holes and the third contact holes. At this point, a portion of the third patterned conductive layer is electrically connected to the first patterned conductive layer in a direct manner through, for example, the third contact holes and the second contact holes. Furthermore, a method for forming the second patterned conductive layer and the second patterned semiconductor layer includes following steps, for example. First, a second conductive layer and a second semiconductor layer are sequentially formed on the first dielectric layer. Next, the second conductive layer and the second semiconductor layer are patterned to form the bottom electrode and the active layer on the first dielectric layer and forming the contact conductors in the first contact holes and a portion of the third contact holes. At this point, a portion of the third patterned conductive layer is electrically connected to the first patterned semiconductor layer in an indirect manner through the first patterned conductive layer and the second patterned conductive layer.

According to one embodiment of the present invention, the second patterned semiconductor layer further includes a plurality of dummy semiconductor layers disposed on the contact conductors, wherein the sizes of the dummy semiconductor layers are smaller than or equal to the sizes of the contact conductors. Furthermore, a method for forming the second patterned conductive layer and the second patterned semiconductor layer includes following steps. First, a second conductive layer, a second semiconductor layer, and a patterned photoresist layer are formed on the first dielectric layer sequentially. Next, the second conductive layer and the second semiconductor layer are patterned to form the bottom electrode, the active layer, the contact conductors, and the dummy semiconductor layers by using the patterned photoresist layer as a mask. Then, a lateral etching process is performed on the active layer and the dummy semiconductor layers, so that the sizes of the dummy semiconductor layers are smaller than the sizes of the contact conductors, and the size of the active layer is smaller than the size of the bottom electrode. The third patterned conductive layer is electrically connected to the first patterned semiconductor layer through a portion of the second contact holes and the second patterned conductive layer.

According to one embodiment of the present invention, a portion of the third patterned conductive layer is electrically connected to the first patterned conductive layer in a direct manner through the third contact holes and the second contact holes.

According to one embodiment of the present invention, a method for forming the second patterned conductive layer and the second patterned semiconductor layer includes following steps. First, a second conductive layer, a second semiconductor layer and a patterned photoresist layer are sequentially formed on the first dielectric layer, wherein the patterned photoresist layer covers, for example, a portion of the second semiconductor layer, the patterned photoresist layer includes a first block and a second block, a thickness of the first block is greater than that of the second block, and the first block is correspondingly disposed over the active layer. Next, the second conductive layer and the second semiconductor layer are patterned to form the bottom electrode, the active layer and the contact conductors by using the patterned photoresist layer as a mask.

According to one embodiment of the present invention, a method for forming the second contact holes in the second dielectric layer includes, for example, first forming the patterned photoresist layer on the second dielectric layer, wherein the patterned photoresist layer covers a portion of the second semiconductor layer, the patterned photoresist layer has a first block and a second block, a thickness of the first block is greater than that of the second block, and the second block is disposed correspondingly over the active layer. Next, the second dielectric layer is patterned to form the second contact holes by using the patterned photoresist layer as a mask.

According to one embodiment of the present invention, a method for forming the second contact holes in the second dielectric layer includes, for example, first forming the patterned photoresist layer on the second dielectric layer, wherein the patterned photoresist layer covers a portion of the second semiconductor layer, the patterned photoresist layer has a first block and a second block, the thickness of the first block is greater than that of the second block, and the second block is disposed correspondingly over the active layer. Next, the second dielectric layer is patterned to form the second contact holes.

According to one embodiment of the present invention, the third patterned conductive layer is electrically connected to the first patterned semiconductor layer through a portion of the second contact holes and the second patterned conductive layer.

According to one embodiment of the present invention, a portion of the third patterned conductive layer is electrically connected to the first patterned conductive layer in a direct manner through the third contact holes and the second contact holes. Alternatively, a portion of the third patterned conductive layer is electrically connected to the first patterned conductive layer in an indirect manner through the third contact holes and the second patterned conductive layer in the second contact holes.

According to one embodiment of the present invention, the method for fabricating the active device array substrate further includes forming a first light-shielding layer at the same time of forming the first patterned semiconductor layer.

According to one embodiment of the present invention, the method for fabricating the active device array substrate further includes forming a second light-shielding layer at the same time of the step of forming the first patterned conductive layer.

According to one embodiment of the present invention, the method for fabricating the active device array substrate further includes surrounding the first contact holes by the second dielectric layer at the same time of the step of forming a portion of the third patterned conductive layer being electrically connected to the first patterned semiconductor layer in a direct manner through the first contact holes and the second contact holes.

According to one embodiment of the present invention, the method for fabricating the active device array substrate further includes surrounding the third contact holes by the second dielectric layer at the same time of the step of forming a portion of the third patterned conductive layer being electrically connected to the first patterned semiconductor layer in a direct manner through the third contact holes and the second contact holes.

The present invention further provides a method for fabricating an active device array substrate, which includes following steps. First, a first patterned semiconductor layer and a gate insulator are formed on a substrate, wherein the gate insulator covers the first patterned semiconductor layer. Next, a first patterned conductive layer and a second patterned semiconductor layer disposed on the first patterned conductive layer are simultaneously formed on the gate insulator, wherein the first patterned conductive layer comprises a plurality of gates and a bottom electrode, and the second patterned semiconductor layer includes an active layer disposed on the bottom electrode. Following that, a dielectric layer is formed on the gate insulating layer to cover the first patterned conductive layer. Then, a plurality of first contact holes exposing the first patterned semiconductor layer is formed in the first dielectric layer and the gate insulator. After that, a second patterned semiconductor layer is formed on the first dielectric layer, wherein the second patterned conductive layer includes a plurality of contact conductors in the first contact holes. Thereafter, a second dielectric layer is formed on the first dielectric layer. Afterwards, a plurality of second contact holes is formed in the second dielectric layer, wherein a portion of the second contact holes is disposed over the active layer, and the third contact holes are formed in the first dielectric layer. Then, a third patterned conductive layer is formed on the second dielectric layer, wherein a portion of the third patterned conductive layer is electrically connected to the active layer through a portion of the second contact holes and the third contact holes.

According to one embodiment of the present invention, a method for forming the first patterned semiconductor layer includes following steps. First, a plurality of island patterns is formed on the substrate. Next, a plurality of first type doping regions and a plurality of second type doping regions are formed in the island patterns. The first type doping regions are P-type doping regions and the second type doping regions are N-type doping regions, for example. More specifically, the P-type doping regions include a P-type heavily doping region, and the N-type doping regions include an N-type heavily doping region and an N-type lightly doping region. Furthermore, a contact interface can be disposed between a portion of the first type doping regions and the second type doping regions, and a portion of the first contact holes exposes, for example, the contact interface.

According to one embodiment of the present invention, a method for forming the first patterned conductive layer and the second patterned semiconductor layer includes, for example, first forming a first conductive layer and a second semiconductor layer sequentially on the gate insulator. Next, the first conductive layer and the second semiconductor layer are patterned to form the bottom electrode and the active layer on the gate insulator. At this point, a portion of the third patterned conductive layer is electrically connected to the first patterned semiconductor layer in a direct manner through, for example, the first contact holes and the second contact holes.

Accordingly to one embodiment of the present invention, the method for fabricating the active device array substrate further includes, at the same time of forming the first contact holes, forming a plurality of third contact holes exposing the first patterned conductive layer or the second patterned semiconductor layer in the first dielectric layer, wherein a portion of the second contact holes is disposed over the first contact holes and the third contact holes. At this point, a portion of the third patterned conductive layer is electrically connected to the first patterned conductive layer in a direct manner through, for example, the third contact holes and the second contact holes while a portion of the third patterned conductive layer is electrically connected to the first patterned conductive layer through, for example, the third contact holes and the second patterned conductive layer in the second contact holes.

According to one embodiment of the present invention, the third patterned conductive layer is electrically connected to the first patterned semiconductor layer through a portion of the second contact holes and the second patterned conductive layer.

According to one embodiment of the present invention, a method for forming the first patterned conductive layer and the second patterned semiconductor layer includes following steps. First, a first conductive layer, a second semiconductor layer and a patterned photoresist layer are sequentially formed on the gate insulator, wherein the patterned photoresist layer covers a portion of the second semiconductor layer, the patterned photoresist layer has a first block and a second block, a thickness of the first block is greater than that of the second block, and the first block is correspondingly disposed over the active layer. Next, the first conductive layer and the second semiconductor layer are patterned to form the bottom electrode, the active layer, the gates, and the dummy semiconductor layers by using the patterned photoresist layer as a mask.

According to one embodiment of the present invention, the second patterned semiconductor layer further includes a plurality of dummy semiconductor layers disposed on the gates, wherein the sizes of the dummy semiconductor layers are smaller than or equal to the sizes of the contact conductors. Furthermore, a method for forming the first patterned conductive layer and the second patterned semiconductor layer includes following steps. First, a first conductive layer, a second semiconductor layer, and a patterned photoresist layer are formed on the gate insulator sequentially. Next, the first conductive layer and the second semiconductor layer are patterned to form the bottom electrode, the active layer, the gates, and the dummy semiconductor layers by using the patterned photoresist layer as a mask. Then, a lateral etching process is performed on the active layer and the dummy semiconductor layers, so that the sizes of the dummy semiconductor layers are smaller than the sizes of the gates, and the size of the active layer is smaller than the size of the bottom electrode.

According to one embodiment of the present invention, the method for fabricating the active device array substrate further includes forming a first light-shielding layer at the same time of forming the first patterned semiconductor layer.

According to one embodiment of the present invention, the method for fabricating the active device array substrate further includes surrounding the third contact holes by the second dielectric layer at the same time of forming the portion of the third patterned conductive layer being electrically connected to the first patterned semiconductor layer in a direct manner through the first contact holes and the second contact holes.

According to one embodiment of the present invention, the method for fabricating the active device array substrate further includes surrounding the third contact holes by the second dielectric layer at the same time of forming the portion of the third patterned conductive layer being electrically connected to the first patterned conductive layer in a direct manner through the third contact holes and the second contact holes.

The present invention provides an active device array substrate. The active device array substrate includes a substrate, a first patterned semiconductor layer, a gate insulator, a first patterned conductive layer, a first dielectric layer, a second patterned conductive layer, a second patterned semiconductor layer, a second dielectric layer, and a third patterned conductive layer. The first patterned semiconductor layer is disposed on the substrate, the gate insulator is disposed on the substrate to cover the first patterned semiconductor layer, the first patterned conductive layer is disposed on the gate insulator, and the first dielectric layer is disposed on the gate insulator to cover the first patterned conductive layer, wherein the first dielectric layer and the gate insulator include a plurality of contact holes exposing the first patterned semiconductor layer, the second patterned conductive layer is disposed on the first dielectric layer, the second patterned conductive layer includes a plurality of contact conductors and a bottom electrode, the second patterned semiconductor layer is disposed on the second patterned conductive layer, the second patterned semiconductor layer includes an active layer disposed on the bottom electrode, the second dielectric layer is disposed on the first dielectric layer, the second dielectric layer includes a plurality of second contact holes exposing the active layer, the third patterned conductive layer is disposed on the second dielectric layer, a portion of the third patterned conductive layer is electrically connected to the active layer through a portion of the second contact holes.

According to one embodiment of the present invention, the active device array substrate further includes a first light-shielding layer disposed on the substrate.

According to one embodiment of the present invention, the active device array substrate further includes a second light-shielding layer disposed on the first dielectric layer.

According to one embodiment of the present invention, the first patterned semiconductor layer includes a plurality of island patterns, a portion of the island patterns includes a plurality of first type doping regions, and a portion of the island patterns includes a plurality of second type doping regions. The first type doping regions are P-type doping regions while the second type doping regions are N-type doping regions. More specifically, the P-type doping regions include a P-type heavily doping region, and the N-type doping regions include an N-type heavily doping region and an N-type lightly doping region. Furthermore, a contact interface can be disposed between a portion of the first type doping regions and the second type doping regions, and a portion of the first contact holes exposes, for example, the contact interface.

According to one embodiment of the present invention, the contact conductors are disposed in at least a portion of the first contact holes.

According to one embodiment of the present invention, a portion of the third patterned conductive layer is electrically connected to the first patterned semiconductor layer in a direct manner through the first contact holes and the second contact holes. A portion of the third patterned conductive layer is electrically connected to the first patterned conductive layer in a direct manner through, for example, the third contact holes and the second contact holes.

According to one embodiment of the present invention, the contact conductors are disposed in the first contact holes and a portion of the third contact holes. A portion of the third patterned conductive layer is electrically connected to the first patterned conductive layer in a direct manner through, for example, the third contact holes and the second contact holes, or a portion of the third patterned conductive layer is electrically connected to the first patterned conductive layer in an indirect manner through, for example, the third contact holes and the second patterned conductive layer in the second contact holes. Moreover, a portion of the third patterned conductive layer may electrically connect to the first patterned semiconductor layer in an indirect manner through the first patterned conductive layer and the second patterned conductive layer.

According to one embodiment of the present invention, the contact conductors are disposed in the first contact holes and a portion of the third contact holes. A portion of the third patterned conductive layer is electrically connected to the first patterned conductive layer in a direct manner through, for example, the third contact holes and the second contact holes, or a portion of the third patterned conductive layer is electrically connected to the first patterned conductive layer in an indirect manner through, for example, the third contact holes and the second patterned conductive layer in the second contact holes. Furthermore, a portion of the third patterned conductive layer may electrically connect to the first patterned semiconductor layer through a portion of the second contact holes and the second patterned conductive layer.

According to one embodiment of the present invention, the second patterned semiconductor layer further includes a plurality of dummy semiconductor layers disposed on the contact conductors. The sizes of the dummy semiconductor layers are smaller than or equal to the sizes of the contact conductors, for example.

According to one embodiment of the present invention, the active device array substrate further includes surrounding the third contact holes by the second dielectric layer at the same time of forming a portion of the third patterned conductive layer being electrically connected to the first patterned semiconductor layer in a direct manner through the first contact holes and the second contact holes.

According to one embodiment of the present invention, the active device array substrate further includes surrounding the third contact holes by the second dielectric layer at the same time of forming a portion of the third patterned conductive layer being electrically connected to the first patterned semiconductor layer in a direct manner through the third contact holes and the second contact holes.

The present invention provides an active device array substrate. The active device array substrate includes a substrate, a first patterned semiconductor layer, a gate insulator, a first patterned conductive layer, a second patterned semiconductor layer, a first dielectric layer, a second patterned conductive layer, a second dielectric layer, and a third patterned conductive layer. The first patterned semiconductor layer is disposed on the substrate. The gate insulator is disposed on the substrate, wherein the gate insulator covers the first patterned semiconductor layer. The first patterned conductive layer includes a plurality of gates and a bottom electrode. The second patterned semiconductor layer is disposed on the first patterned conductive layer, wherein the second patterned semiconductor layer includes an active layer disposed on the bottom electrode. The first dielectric layer is disposed on the gate insulator to cover the first patterned conductive layer, wherein the first dielectric layer and the gate insulator include a plurality of first contact holes exposing the first patterned semiconductor layer, and include a third contact hole. The second patterned conductive layer is disposed on the first dielectric layer, wherein the second patterned conductive layer includes a plurality of contact conductors in the first contact holes. The second dielectric layer is disposed on the first dielectric layer, wherein the second dielectric layer includes a plurality of second contact holes, and a portion of the second contact holes is disposed over the active layer. The third patterned conductive layer is disposed on the second dielectric layer, wherein a portion of the third patterned conductive layer is electrically connected to the active layer through a portion of the second contact holes and the third contact hole.

According to one embodiment of the present invention, the first patterned semiconductor layer includes a plurality of island patterns, a portion of the island patterns includes a plurality of first type doping regions, and a portion of the island patterns includes a plurality of second type doping regions. The first type doping regions are P-type doping regions while the second type doping regions are N-type doping regions. More specifically, the P-type doping regions include a P-type heavily doping region, and the N-type doping regions include an N-type heavily doping region and an N-type lightly doping region. Furthermore, a contact interface can be disposed between a portion of the first type doping regions and the second type doping regions, and a portion of the first contact holes exposes the contact interface, for example.

According to one embodiment of the present invention, a portion of the third patterned conductive layer is electrically connected to the first patterned semiconductor layer in a direct manner through the first contact holes and the second contact holes.

According to one embodiment of the present invention, the first dielectric layer includes a plurality of third contact holes exposing the first patterned conductive layer, and a portion of the second contact holes is disposed over the third contact hole. At this point, a portion of the third patterned conductive layer is electrically connected to the first patterned conductive layer in a direct manner through, for example, the third contact hole and the second contact holes. Certainly, a portion of the third patterned conductive layer can also be electrically connected to the first patterned conductive layer through the third contact hole and the second patterned conductive layer in the second contact holes.

According to one embodiment of the present invention, the third patterned conductive layer is electrically connected to the active layer through a portion of the second contact holes and the second patterned conductive layer.

According to one embodiment of the present invention, the second patterned semiconductor layer further includes a plurality of dummy semiconductor layers disposed on the gates. The sizes of the dummy semiconductor layers are smaller than or equal to the sizes of the contact conductors, for example.

According to one embodiment of the present invention, the active device array substrate further includes a first light-shielding layer disposed on the substrate.

According to one embodiment of the present invention, the active device array substrate further includes surrounding the third contact holes by the second dielectric layer at the same time of forming a portion of the third patterned conductive layer being electrically connected to the first patterned semiconductor layer in a direct manner through the first contact holes and the second contact holes.

According to one embodiment of the present invention, the active device array substrate further includes surrounding the third contact holes by the second dielectric layer at the same time of forming the portion of the third patterned conductive layer being electrically connected to the first patterned conductive layer in a direct manner through the third contact holes and the second contact holes.

In light of the above, in the method for fabricating the active device array substrate according to the present invention, because the active layer and the bottom electrode of the photo sensor are fabricated together, the active layer and the bottom electrode can be fabricated in the same photolithography and etching process used for fabricating the second patterned conductive layer or the first patterned conductive layer. Moreover, the photolithography and etching process has high compatibility with the fabricating process for the active device array substrate. Therefore, no additional photolithography and etching processes are required, and the process cost is reduced. In some embodiments, the size of the bottom electrode can be larger than the size of the active layer without any additional photolithography and etching processes being added, so that the sensitivity of photo sensor is enhanced under the same photolithography and etching process.

To make the above and other features and advantages of the present invention more comprehensible, several embodiments accompanied with figures are detailed as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A'-2G' are respective cross-sectional views along line AA' of a pixel region, line BB' of a sensing region, and line CC' of a pad region in FIGS. 2A-2G.

FIGS. 4A'-4G' are respective cross-sectional views along line AA' of a pixel region, line BB' of a sensing region, and line CC' of a pad region in FIGS. 4A-4G.

FIGS. 6A'-6G' are respective cross-sectional views along line AA' of a pixel region, line BB' of a sensing region, and line CC' of a pad region in FIGS. 6A-6G.

FIGS. 9A'-9G' are respective cross-sectional views along line AA' of a pixel region, line BB' of a sensing region, and line CC' of a pad region in FIGS. 9A-9G.

FIGS. 12A'-12G' are respective cross-sectional views along line AA' of a pixel region, line BB' of a sensing region, and line CC' of a pad region in FIGS. 12A-12G.

FIGS. 15A'-15G' are respective cross-sectional views along line AA' of a pixel region, line BB' of a sensing region, and line CC' of a pad region in FIGS. 15A-15G.

DESCRIPTION OF EMBODIMENTS

First Embodiment

Figure 1:
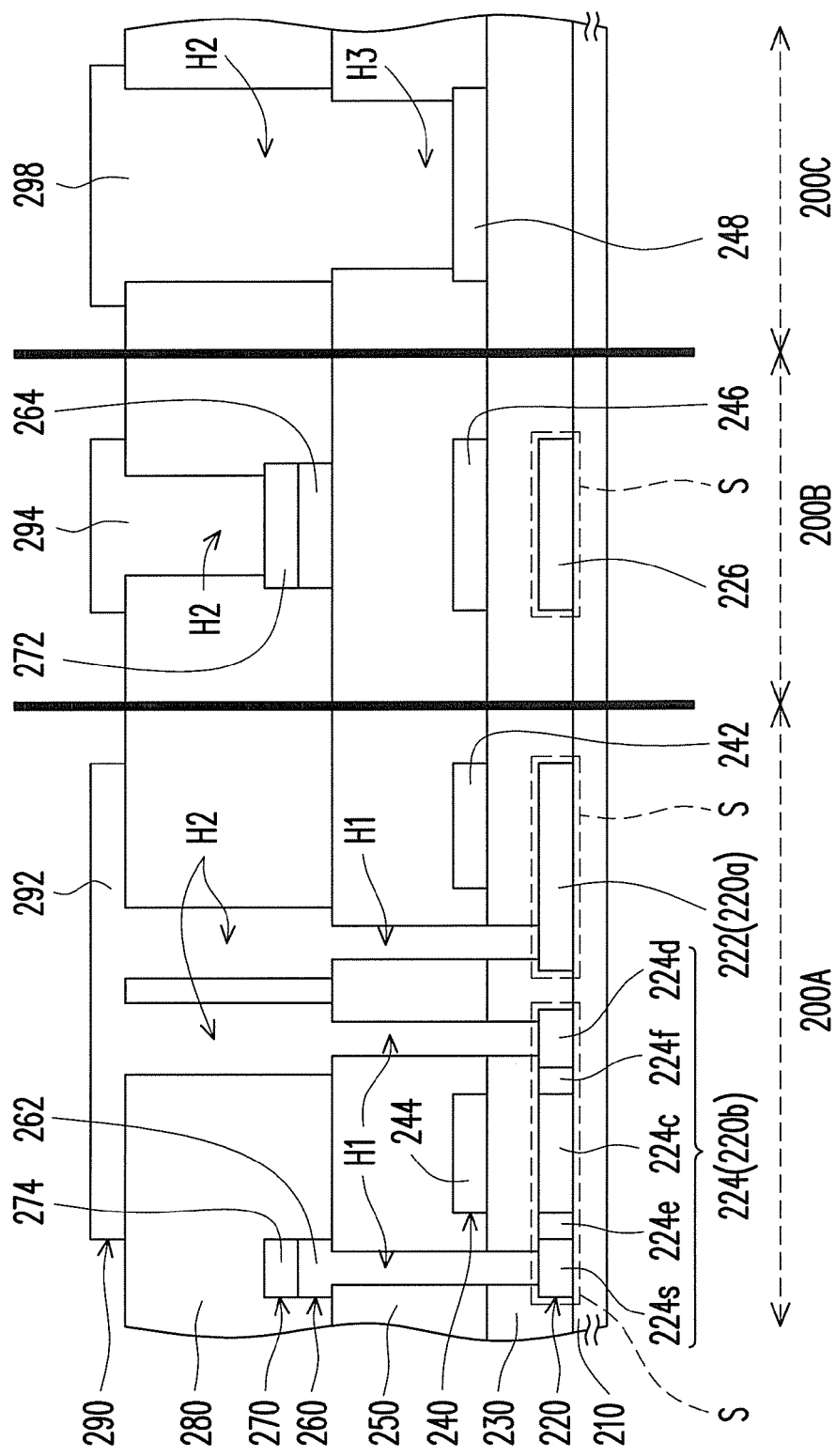
FIG. 1 shows an active device array substrate according to a first embodiment of the present invention.

FIG. 1 shows an active device array substrate according to one embodiment of the present invention. For the purpose of simplification, elements which may be plural may be shown as singular in FIG. 1. Furthermore, in order to facilitate the illustration, the active device array substrate is divided into a pixel region 200A, a sensing region 200B, and a pad region 200C, as shown in FIG. 1. The pixel region 200A has an active device therein for controlling displaying status. According to the present embodiment, the active device in the pixel region 200A can incorporate a storage capacitor to achieve desired display performance.

Referring to FIG. 1, the active device array substrate 200 includes a substrate 210, a first patterned semiconductor layer 220, a gate insulator 230, a first patterned conductive layer 240, a first dielectric layer 250, a second patterned conductive layer 260, a second patterned semiconductor layer 270, a second dielectric layer 280, and a third patterned conductive layer 290. As shown in FIG. 1, the first patterned semiconductor layer 220 is disposed on the substrate 210, and the first patterned semiconductor 220 is formed by a plurality of island patterns S, for example, wherein the material of the first patterned semiconductor layer 220 includes polysilicon or other semiconductor material. A buffer dielectric layer is selectively formed between the substrate 210 and the first patterned semiconductor layer 220.

According to the present embodiment, a portion of the island patterns in the pixel region 200A includes, for example, a plurality of first type doping regions 220a serving as a storage electrode 222 of a storage capacitor, wherein the first type doping regions 220a are, for example, P-type doing regions. Furthermore, a portion of the island patterns S includes, for example, a plurality of second type doping regions 220b. For instance, the first type doping region 220a and the second type doping region 220b have different compositions, the second type doping region 220b serving as the active device includes a source doping region 224s and a drain doping region 224d, wherein the second type doping region 220b is, for example, an N-type doping region, and a part of the first patterned semiconductor layer 220 disposed between the source doping region 224s and the drain doping region 224d constitutes a channel 224c. Furthermore, the island patterns S can selectively include a source lightly doping region 224e and a drain lightly doping region 224f with different dopant concentrations in the same dopant type. For example, the source doping region 224s and the drain doping region 224d are, for example, N-type heavily doping regions, and the source lightly doping region 224e and the drain lightly doping region 224f are, for example, N-type lightly doping regions. Certainly, the names of the source doping region 224s and the drain doping region 224d may be interchanged according to electrical requirement, and the dopant types doping in the first type doping region 220a and the second type doping region 220b also may be interchanged, and so may the source lightly doping region 224e and the drain lightly doping region 224f. The invention may be embodied in many different forms and should not be construed as limited to the embodiments set forth herein. Furthermore, in order to prevent the sensitivity of the photo sensor from being affected by unexpected light irradiating the photo sensor, the first patterned semiconductor layer 220 can selectively form, in the sensing region 200B of the active device array substrate 200, a first light-shielding layer 226 disposed on the substrate 210, wherein the first light-shielding layer 226 can be formed of intrinsic semiconductor, P-type doping semiconductor, or N-type doping semiconductor, wherein the semiconductor includes an amorphous silicon layer, a poly-silicon layer, or a single crystalline silicon layer layer.

Referring to FIG. 1, the gate insulator 230 is disposed on the substrate 210 to cover the first patterned semiconductor layer 220, and the gate insulator 230 is formed of dielectric material. The first patterned conductive layer 240 is disposed on the gate insulator 230. According to the present embodiment, the first patterned conductive layer 240 can be divided into a gate forming the active device; a storage electrode 242 forming a storage capacitor; and a first pad layer 248 disposed in the pad region 200C, wherein the storage electrode 222, the gate 244, and the first pad layer 248 are formed of conductive material, the gate 244 is disposed on the gate insulator 230 over the channel 224c, and the storage electrode 242 is disposed on the gate insulator 230 over the storage electrode 222. Furthermore, to prevent the operation of the photo sensor from being affected by unexpected light, a second light-shielding layer 246 can be formed to dispose on the gate insulator 230 in the sensing region 200B. For example, the second light-shielding layer 246 is simultaneously formed with the storage electrode 242, the gate 244, and the first pad layer 248.

Referring to FIG. 1, the first dielectric layer 250 is disposed on the gate insulator 230 to cover the first patterned conductive layer 240. In the pixel region 200A, the first dielectric layer 250 and the gate insulator 230 have a plurality of first contact holes H1 exposing the first patterned semiconductor layer 220. Moreover, according to the present embodiment, the first dielectric layer 250 can form a plurality of third contact holes H3 in the pad region 200C to expose the first pad layer 248 of the first patterned conductive layer 240. The second patterned conductive layer 260 is disposed on the first dielectric layer 250. The second patterned conductive layer 260 includes a plurality of contact conductors 262 and a bottom electrode 264 in the sensing region 200B. The contact conductors 262 are disposed in at least a portion of the first contact holes H1 to couple with a portion of the first patterned semiconductor layer 220, corresponding to the contact conductors 262, through the first dielectric layer 250 and the gate insulator 230, as shown by the leftmost contact hole H1 in FIG. 1. According to the present embodiment, the contact conductor 262 is directly connected to the source doping region 224s, for example.

Still referring to FIG. 1, the second patterned semiconductor layer 270 is disposed on the second patterned conductive layer 260, wherein the second patterned semiconductor layer 270 includes an active layer 272 on the bottom electrode 264 for generating photo current according to ambient light. The active layer 272 is, for example, an amorphous silicon layer, a poly-silicon layer, a single crystalline silicon layer layer, or a silicon-rich dielectric layer. The second dielectric layer 280 is disposed on the first dielectric layer 250. The second dielectric layer 280 includes a plurality of second contact holes H2 to expose the active layer 272, and the third patterned conductive layer 290 is disposed on the second dielectric layer 280, wherein a portion of the third patterned conductive layer 290 serving as a top electrode 294, is electrically connected to the active layer 272 through a portion of the second contact holes H2. The third patterned conductive layer 290 can be formed of material with a high transmittance rate and low resistivity such as indium tin oxide (ITO) or indium zinc oxide (IZO). In detail, another portion of the third patterned conductive layer 290 contacts the active layer 272 through the second dielectric layer 280 to serve as a top electrode 294 of the photo sensor. As shown in FIG. 1, according to the present embodiment, the photo sensor formed in the sensing region 200B includes the bottom electrode 264 disposed on the first dielectric layer 250, the active layer 272 disposed on the bottom electrode 264, and the top electrode 294 contacting the active layer 272 through the second dielectric layer 280.

It should be noted that, the top electrode 294 or the bottom electrode 264 can be electrically connected to a signal to read a circuit, so as to read the light intensity detected by the active layer 272. According to the present embodiment, the contact conductors 262 serving as the source and the bottom electrode 264 are both formed by patterning the same conductive layer, for example. The top electrode 294 and the pixel electrode 292 are both formed by patterning the third conductive layer, for example. Furthermore, the active layer 272 is, for example, an amorphous layer, a ploy-silicon layer, a single crystalline silicon layer layer, or a silicon-rich dielectric layer. The silicon-rich dielectric layer is formed by performing a related chemical vapor deposition process in which a process gas ratio is controlled, such that silicon exceeds a normal chemical proportion (i.e. stoichiometry) to form the silicon-rich dielectric layer. The active layer 272 is, for example, a hydrogen-silicon rich oxide (H-SRO) layer, a hydrogen-silicon rich nitride (H-SRN) layer, a silicon rich oxide (SRO) layer, or a silicon rich nitride (SRN) layer. However, the active layer 272 of the present invention is not limited to the above materials. Other silicon-rich compound may be used in place thereof.

Moreover, according to the present embodiment, a first light-shielding layer 226 is selectively formed on the substrate 210 below the bottom electrode 264, or a second light-shielding layer 246 is selectively disposed on the gate insulator 230 and below the bottom electrode 264, thereby enhancing the sensitivity of the photo sensor by using the first light-shielding layer 226 or the second light-shielding layer 246 to shield unexpected light. According to the present embodiment, the first light-shielding layer 226, the first type doping region 220a of the active device, and the storage electrode 222 of the storage capacitor are formed by, for example, patterning the same first semiconductor layer, that is, the first patterned semiconductor layer 220. The second light-shielding layer 246, the gate 244 of the active device, and the storage electrode 242 of the storage capacitor are formed by patterning the first conductive layer, for example. The second light-shielding layer 246 is aligned with the first light-shielding layer 226, wherein an area (size) of the first light-shielding layer 226 is larger than or equal to that of the second light-shielding layer 246, and an area of the second light-shielding layer 246 is larger than or equal to the area of the bottom electrode 264.

Continuing to refer to FIG. 1, a portion of the second contact holes H2 is disposed corresponding to the first contact holes H1, so that the pixel electrode 292 in the third patterned conductive layer 290 is electrically connected to the active device and the storage electrode 222 in a direct manner through the first contact holes H1 and the second contact holes H2 aligning with each other. In other words, the pixel electrode 292 is electrically connected to the first patterned semiconductor layer 220 by passing through the layers underneath, such as the second dielectric layer 280, the first dielectric layer 250, and the gate insulator 230. According to the present embodiment, the pixel electrode 292 is directly coupled with the drain doping region 224d of the first patterned semiconductor layer 220, and the pixel electrode 292 is directly passing through the second dielectric layer 280, the first dielectric layer 250, and the gate insulator 230 to couple with the storage electrode 222. As shown in FIG. 1, the storage electrode 222 is electrically connected to the drain doping region 224d through the pixel electrode 292. In other words, the storage electrode 222 below the gate insulator 230 has substantially the same voltage as the pixel electrode 292. Therefore, according to the present embodiment, the storage electrode 222, the gate insulator 230, the storage electrode 242, the first dielectric layer 250, the second dielectric layer 280, and the pixel electrode 292 form a multi-layered storage capacitor. Depending on requirements of actual design in panel, the storage capacitor may be a single-layered or a multi-layered structure.

Furthermore, according to the present embodiment, in the pad region 200C, a portion of the second contact holes H2 is disposed corresponding to the third contact holes H3 to expose the first pad layer 248 of the first patterned conductive layer 240, a second pad layer 298 is electrically connected to the first pad layer 248 of the first patterned conductive layer 240 in a direct manner through the third contact holes H3 and the second contact holes H2. In other words, the second pad layer 298 is electrically connected downward to the first pad layer 248 therebelow through the second dielectric layer 280 and the first dielectric layer 250. According to the present embodiment, the pad is formed by the first patterned conductive layer 240 and the third patterned conductive layer 290.

To better explain the technical content of the present invention, the following description in association with the accompanied drawings further illustrates the method for fabricating active device array substrate 200 according to the present embodiment.

Figure 2A:
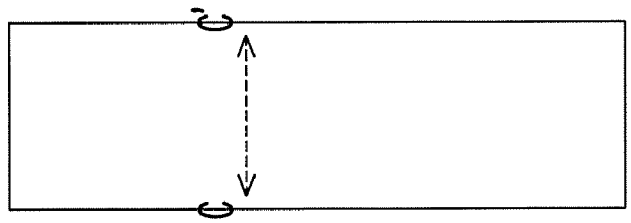
FIGS. 2A-2G illustrate a processing flow for fabricating the active device array substrate according to the first embodiment of the present invention.
Figure 2A:
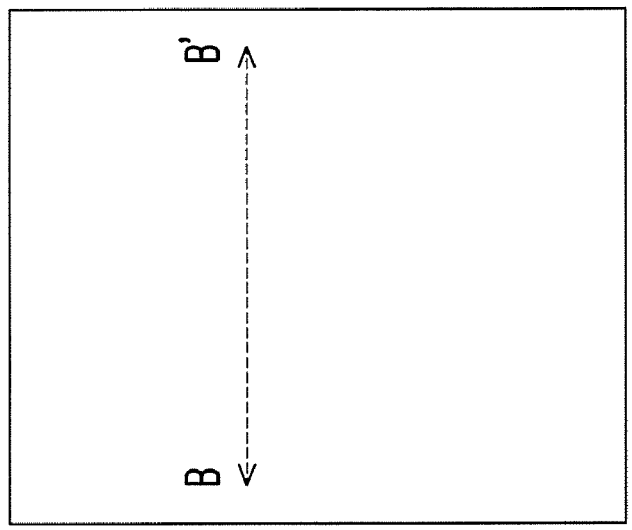
Figure 2A:
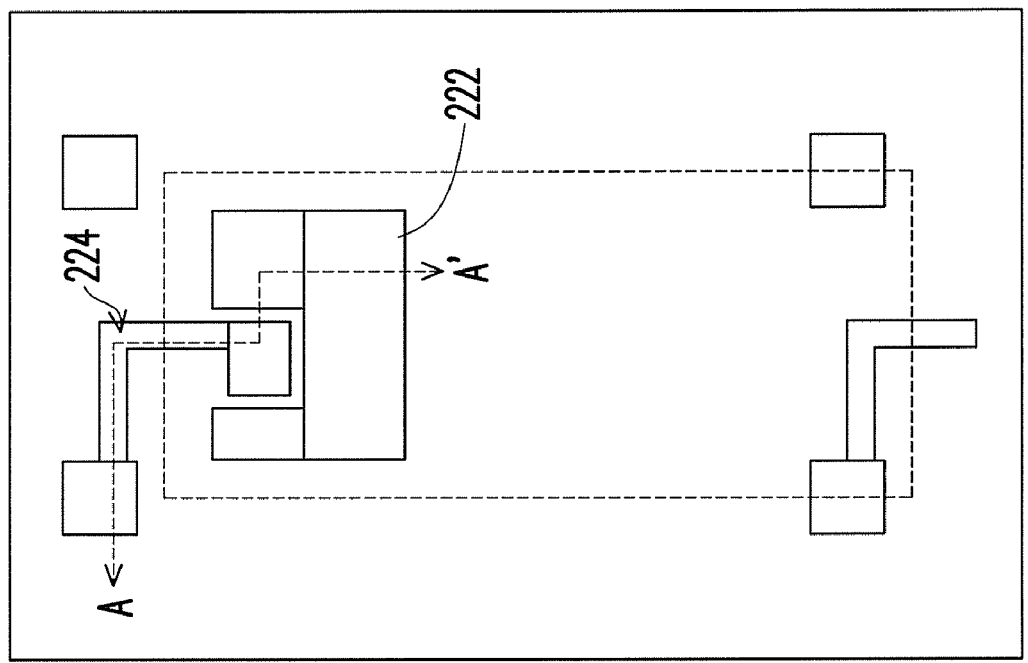
Figure 2A:
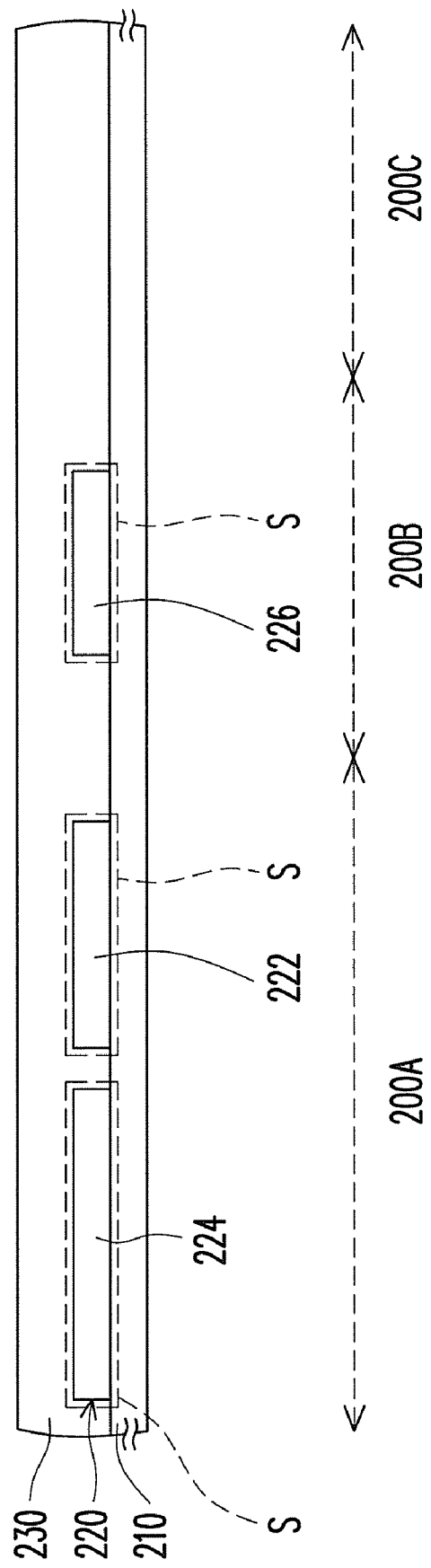

Please refer to FIGS. 2A-2G, which illustrate a processing flow for fabricating the active device array substrate according to the first embodiment of the present invention, wherein FIGS. 2A-2G respectively show the top views of the pixel region 200A, the sensing region 200B, and the pad region 200C of the active array substrate 200 in each step. FIGS. 2A'~2G' are respective cross-sectional views along line AA' of the pixel region, line BB' of the sensing region, and line CC' of the pad region in FIGS. 2A-2G.

First, as shown in FIGS. 2A and 2A', the substrate 210 is provided and a patterned semiconductor layer 220 is formed on the substrate 210. The substrate 210 is, for example, the glass substrate 210 or the plastic substrate 210, which is divided into at least the pixel region 200A, the sensing region 200B, and the pad region 200C, and the detailed arrangement thereof is discussed above and not repeated herein. The first patterned semiconductor layer 220 is, for example, a polysilicon layer (the first semiconductor layer), formed with an amorphous silicon layer and then forming an excimer laser annealing process. The polysilicon layer, after being patterned, is formed into a plurality of island patterns S in the pixel region 200A, and a portion of the island patterns S serves as a semiconductor block 224 of the active device, and a portion of the island patterns S serves as the storage electrode 222 of the storage capacitor. Moreover, a gate insulator 230 is formed on the substrate 210 to cover the semiconductor block 224 and the storage electrode 222. The gate insulator 230 is formed of dielectric material. Furthermore, to enhance the sensitivity of the photo sensor, the first light-shielding layer 226 is formed in the sensing region 200B on the substrate 210 by using the first patterned semiconductor layer 220.

Figure 2B:
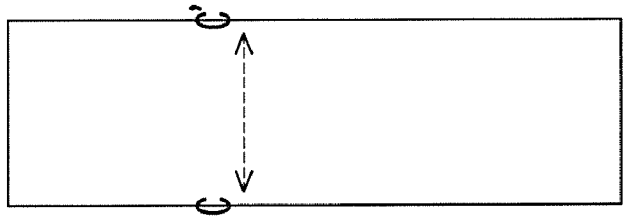
Figure 2B:
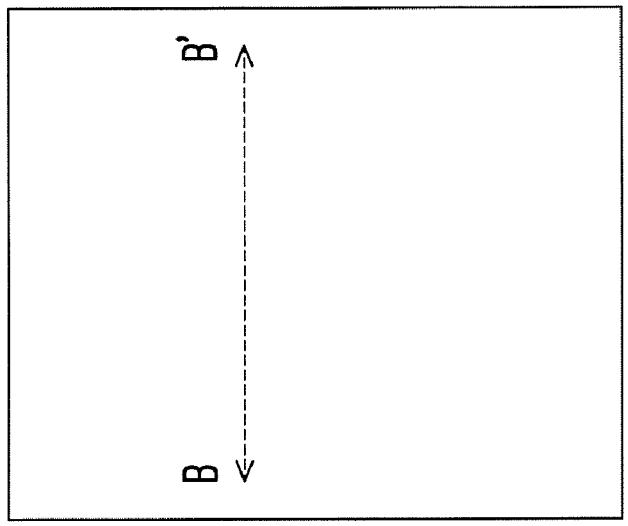
Figure 2B:
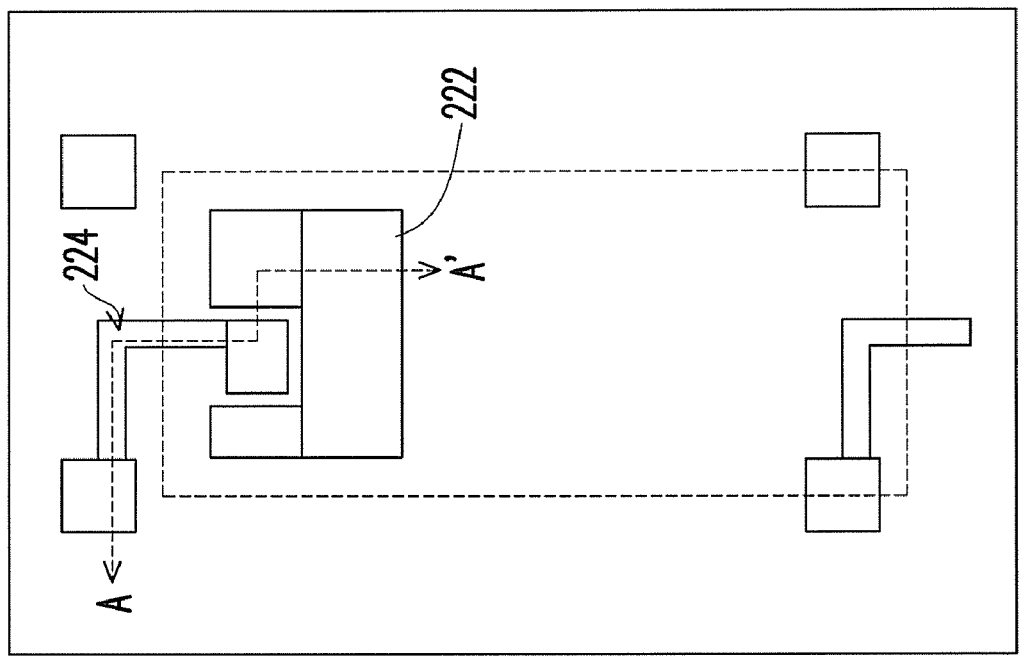
Figure 2B:
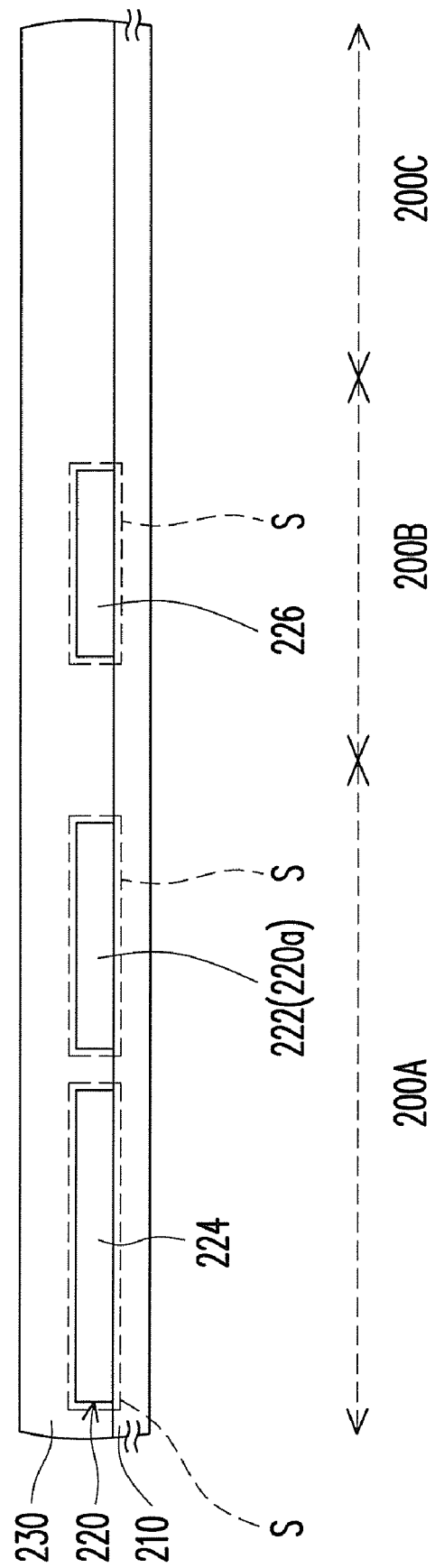

Next, as shown in FIGS. 2B and 2B', the first type doping region 220a is formed by performing a first type doping process on the storage electrode 222 of the storage capacitor, wherein the first type doping process is, for example, a P-type (P+) ion doping process, so that the storage electrode 222 contains P-type dopants. In detail, a patterned mask (not shown) exposing the storage electrode 222 is formed on the substrate 210, and the first type doping process is performed on the polysilicon layer exposed by the patterned mask, wherein the first type doping process is, for example, the P-type (P+) ion doping process, so that the storage electrode 222 has good conductivity by using the P-type ion doping process.

Figure 2C:
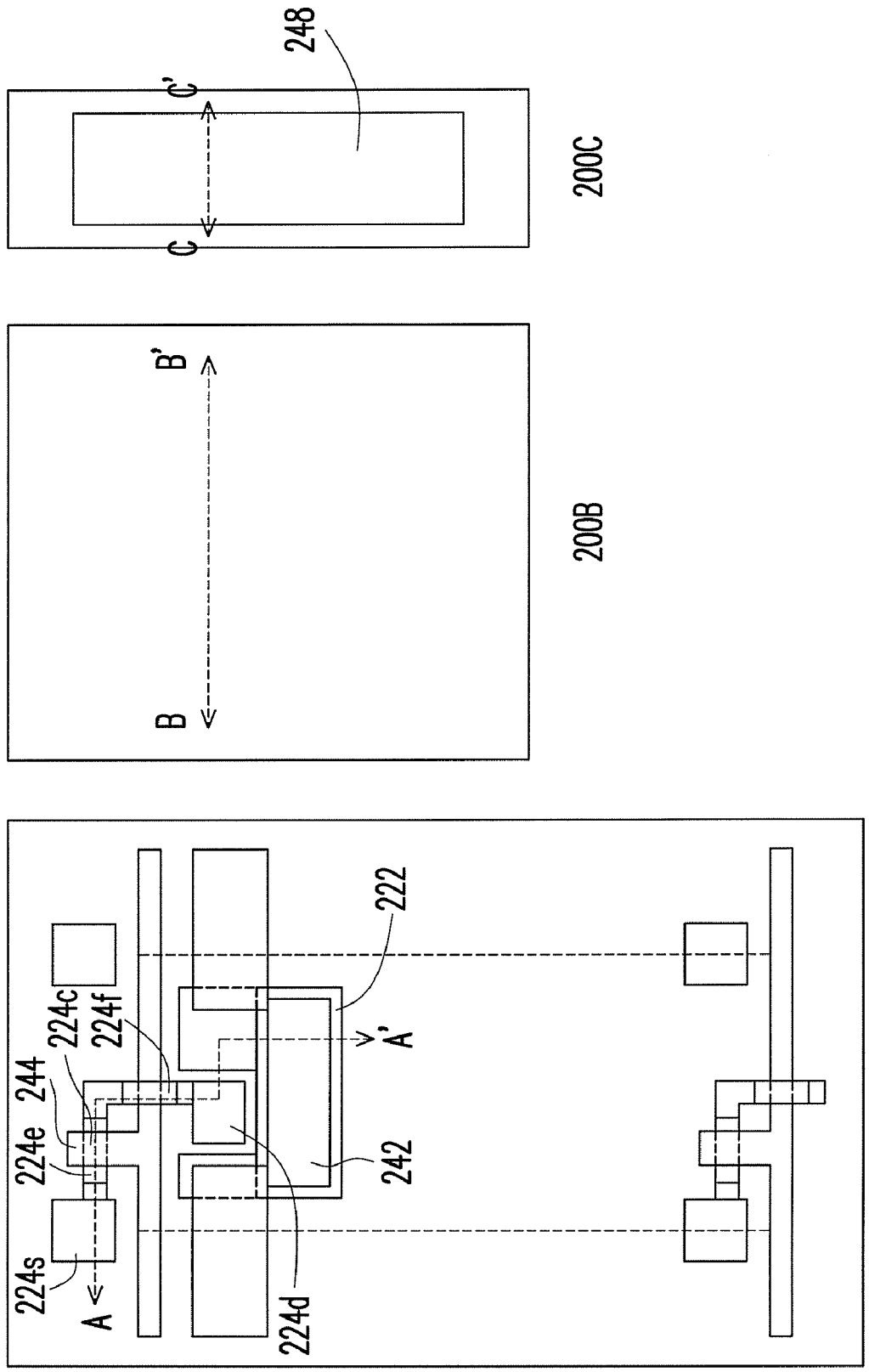
Figure 2C:
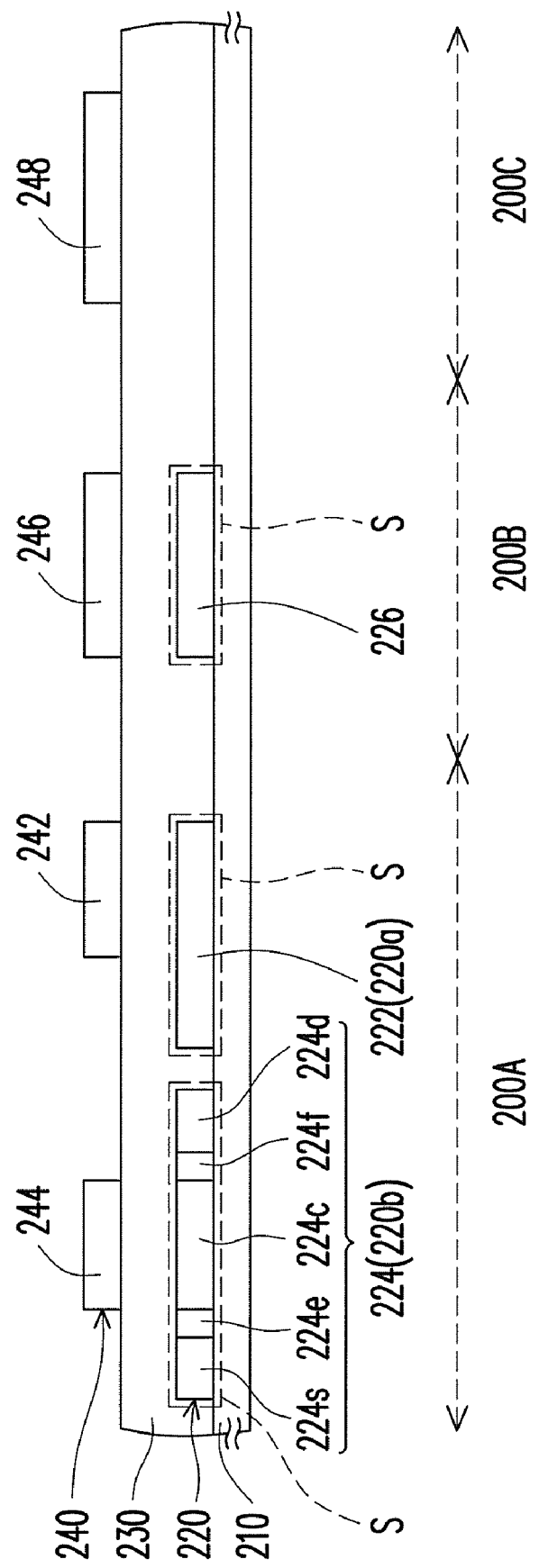

Then, as shown in FIGS. 2C and 2C', a first conductive layer (not shown) is formed on the gate insulator 230, and patterned to form the first patterned conductive layer mainly formed by the gate 244, the storage electrode 242 and the first pad layer 248. After that, a second type doping process is performed with different dopant concentrations on different regions of the semiconductor block 224, wherein the second type doping process is an N-type (N+) ion doping process or an N-type (N−) lightly doping process, for example. In detail, after the second type doping process with different dopant concentrations are performed on different regions of the semiconductor block 224, the semiconductor region 224 is divided into, from two ends to a center, the N-type heavily doping region, the N-type lightly doping region, and an intrinsic region, wherein the N-type heavily doping region at the two ends of the semiconductor block 224 is respectively formed into the source doping region 224s and the drain doping region 224d, the intrinsic region between the N-type heavily doping region is formed into the channel 224c, the N-type lightly doping region between the source doping region 224s and the channel 224c is formed into the source lightly doping region 224e, and the N-type lightly doping region between the drain doping region 224d and the channel 224c is formed into the drain lightly doping region 224f. Furthermore, in order to enhance the sensitivity of the photo sensor, the second light-shielding layer 246 is selectively formed, by using the first patterned conductive layer 240, on the gate insulator 230 over the first light-shielding layer 226 in the sensing region 200B. According to the present embodiment, the second light-shielding layer 246 overlaps the first light-shielding layer 226, the area of the second light-shielding layer 246 is smaller than or equal to the area of the first light-shielding layer 226, and the area of the second light-shielding layer 246 is larger than or equal to the area of the bottom electrode 264 (FIGS. 2E-2E').

Figure 2D:
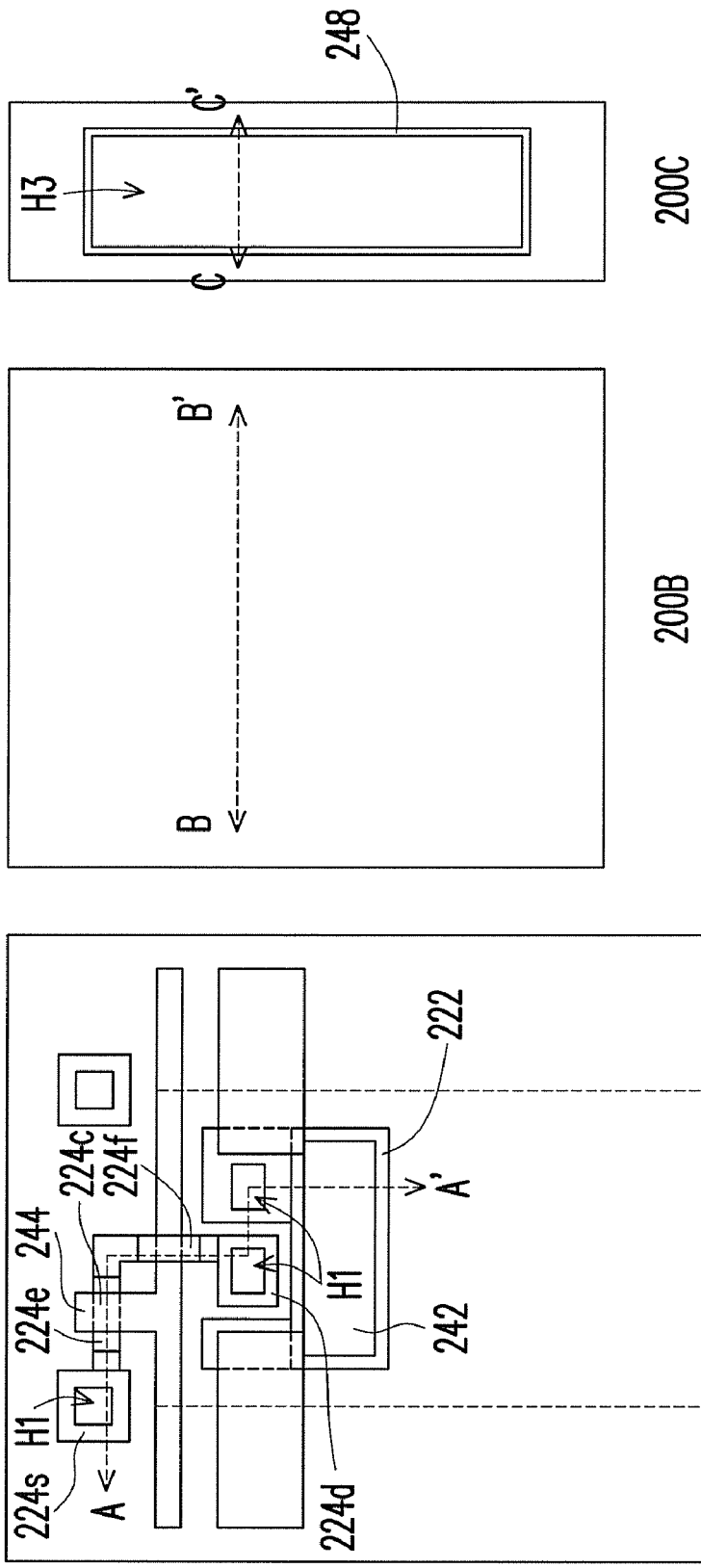
Figure 2D:
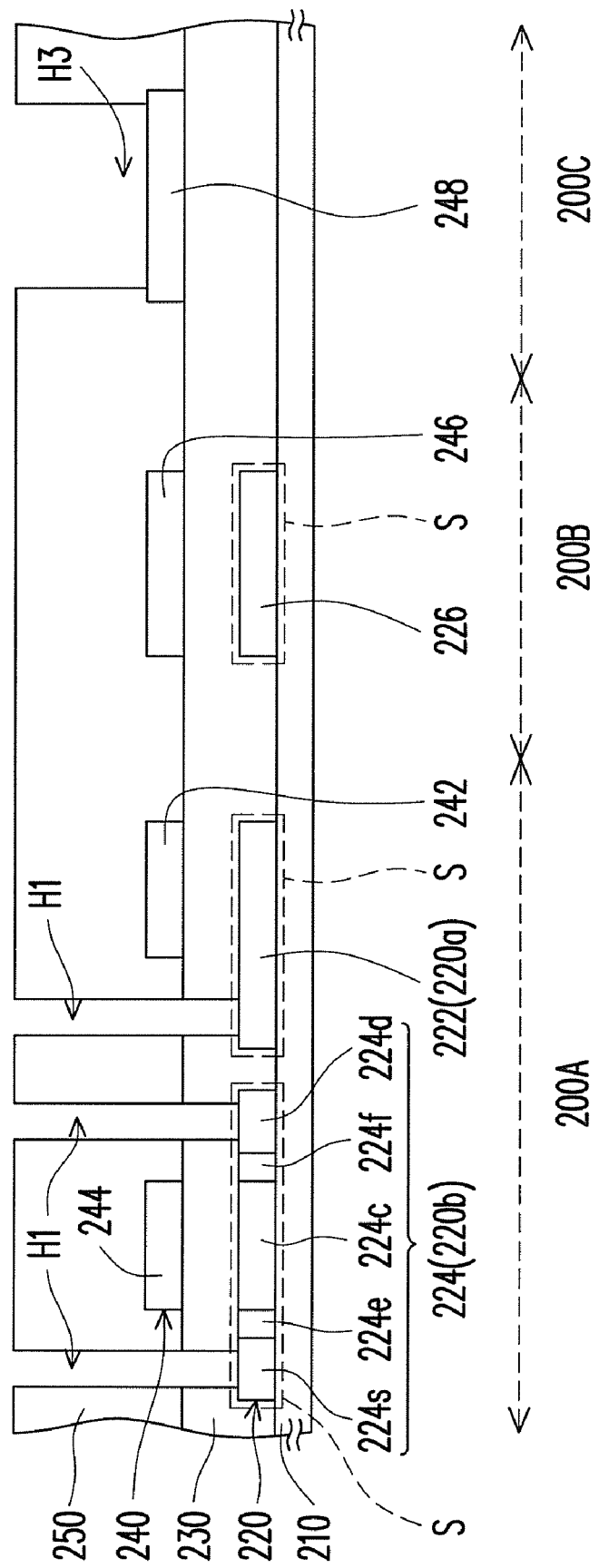

After that, as shown in FIGS. 2D and 2D', the first dielectric layer 250 is formed on the gate insulator 230 to cover the first patterned conductive layer 240. Moreover, the plurality of first contact holes H1 is formed in the first dielectric layer 250 and the gate insulator 230 to respectively expose the source doping region 224s, the drain doping regions 224d, and the storage electrode 222 in the first patterned semiconductor layer 220. It should be noted that, according to the present embodiment, at the same time of forming the first contact holes H1, the plurality of third contact holes H3 is formed in the dielectric layer 250 to expose the first pad layer 248 of the first patterned conductive layer 240. In detail, the first dielectric layer 250 is formed by performing a plasma chemical vapor deposition process or other proper thin film deposition processes. The first dielectric layer 250 is formed of the dielectric material such as silicon oxide, silicon nitride, silicon oxynitride, or a combination thereof.

Figure 2E:
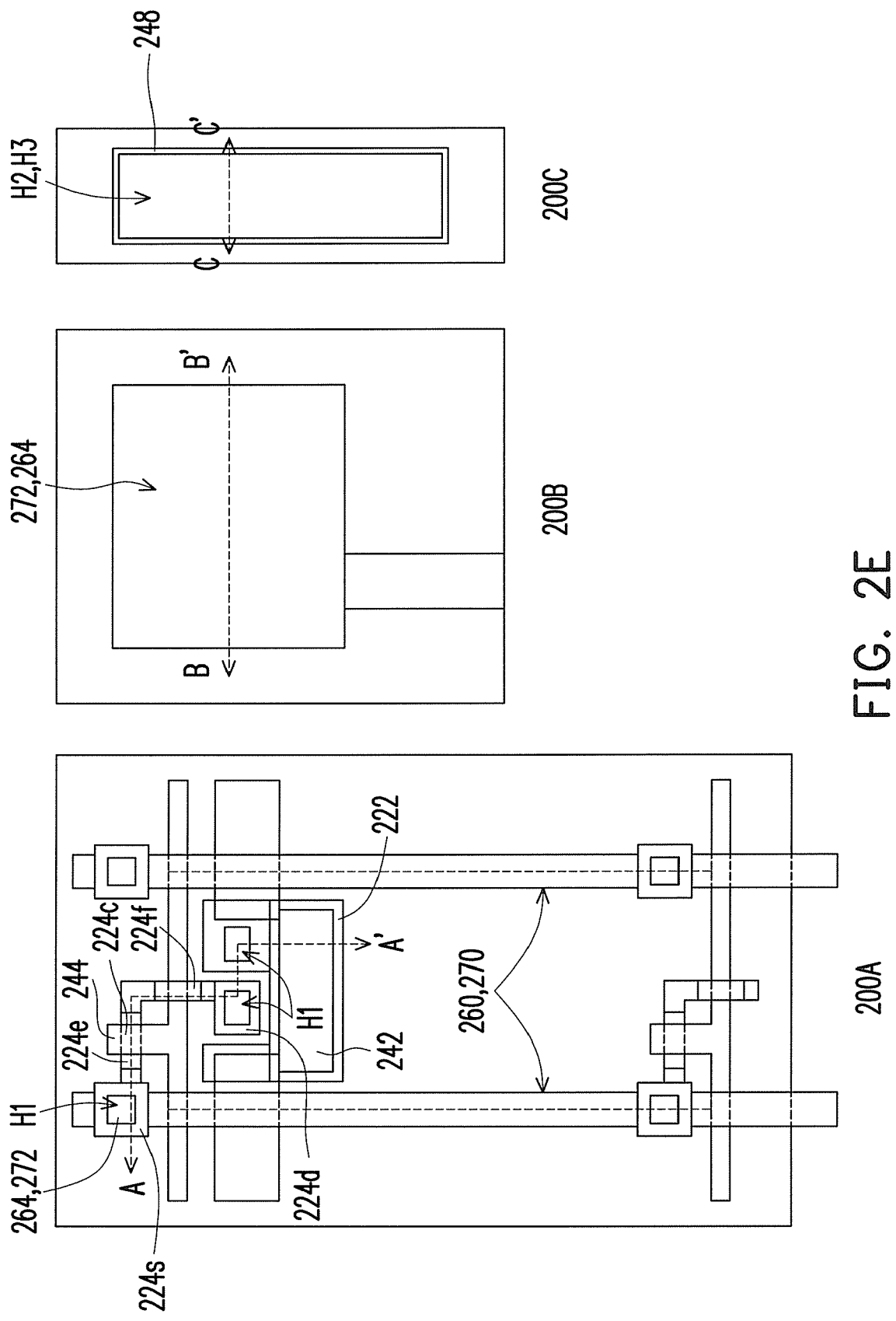
Figure 2E:
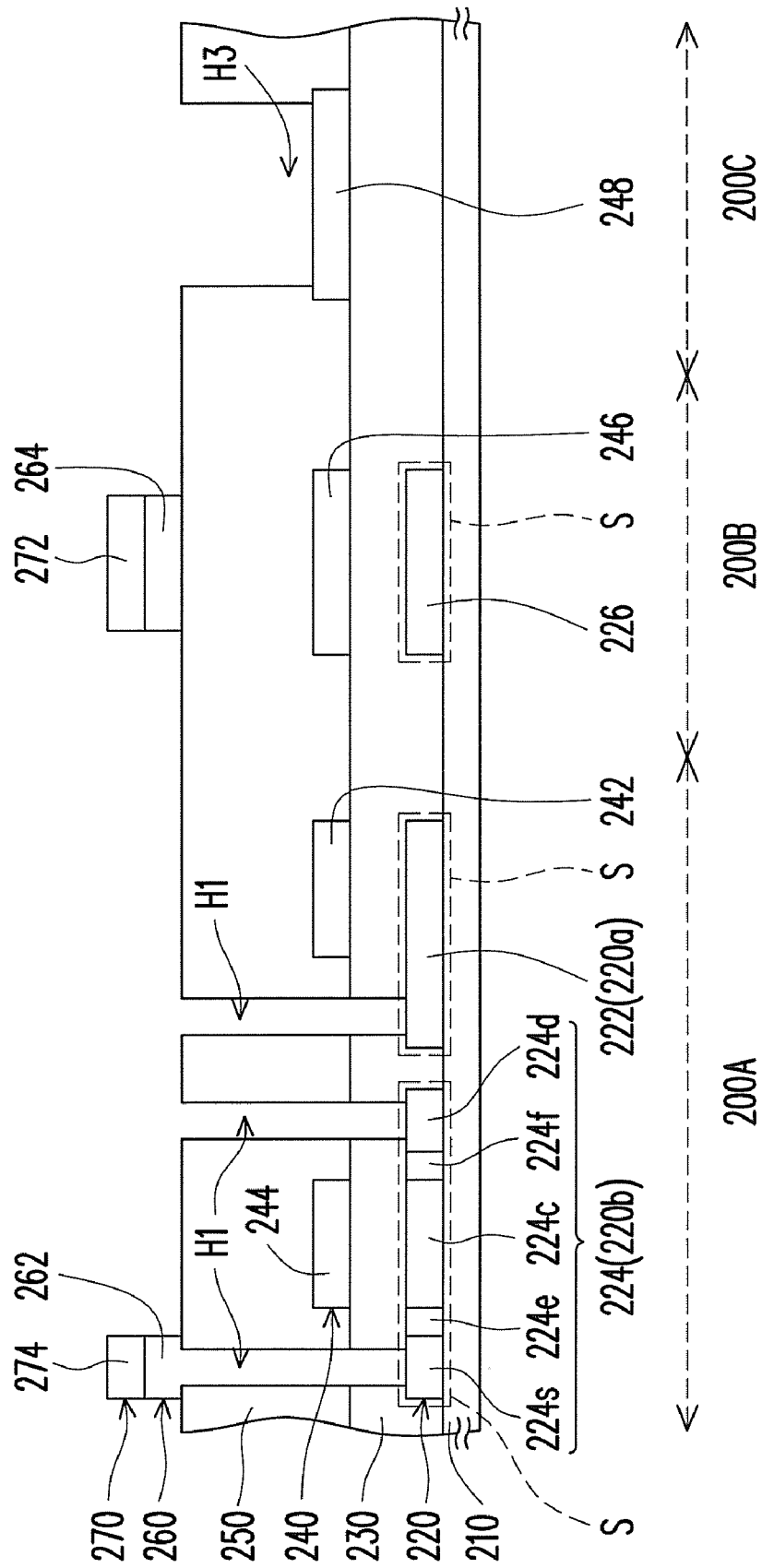

Afterwards, as shown in FIGS. 2E and 2E', a second conductive layer (not shown) and a second semiconductor layer (not shown) are sequentially formed on the first dielectric layer 250. Then, the second conductive layer (not shown) and the second semiconductor layer (not shown) are patterned to form the bottom electrode 264 and the active layer 272 on the first dielectric layer 250 in the sensing region 200B, and contact conductors 262 are formed in at least a portion of the first contact holes H1 in the pixel region 200A, wherein the contact conductors 262 directly contact the source doping region 224s through the first contact holes H1. In detail, the second patterned conductive layer 260 is formed of, for example, aluminum (Al), molybdenum (Mo), titanium (Ti), neodymium (Nd), and nitride of any of the aforementioned such as molybdenum nitride (MoN), titanium nitride (TiN), stacked layers thereof, any alloy of the aforementioned or other conductive materials. The second patterned semiconductor layer 270 may be formed of, for example, the amorphous silicon layer, the polysilicon layer, the single crystalline silicon layer layer, the silicon-rich dielectric layer, or etc., adjusted according to the requirements on sensitivity and reliability of the photo sensor. The silicon-rich dielectric layer is formed by performing the chemical vapor deposition process or other proper thin film deposition processes in which the process gas ratio is controlled to reach excessive silicon content higher than a normal chemical proportion (i.e. stoichiometry) to form the silicon-rich dielectric layer. The silicon-rich dielectric layer is a hydrogen-silicon rich oxide layer, a hydrogen-silicon rich nitride layer, a silicon rich oxide layer, and a silicon rich nitride layer, for example. It should be noted that, different from the related arts, in the photo sensor of the present invention, the active layer 272 serving as the photosensitive material in the photo sensor, and the contact conductors 262 in the active device are formed simultaneously in the same photolithography and etching process, so that an additional photolithography and etching process is omitted and the complexity of the fabricating process is reduced, and therefore the second patterned semiconductor layer 270 is entirely covered by the second patterned semiconductor layer 270.

Figure 2F:
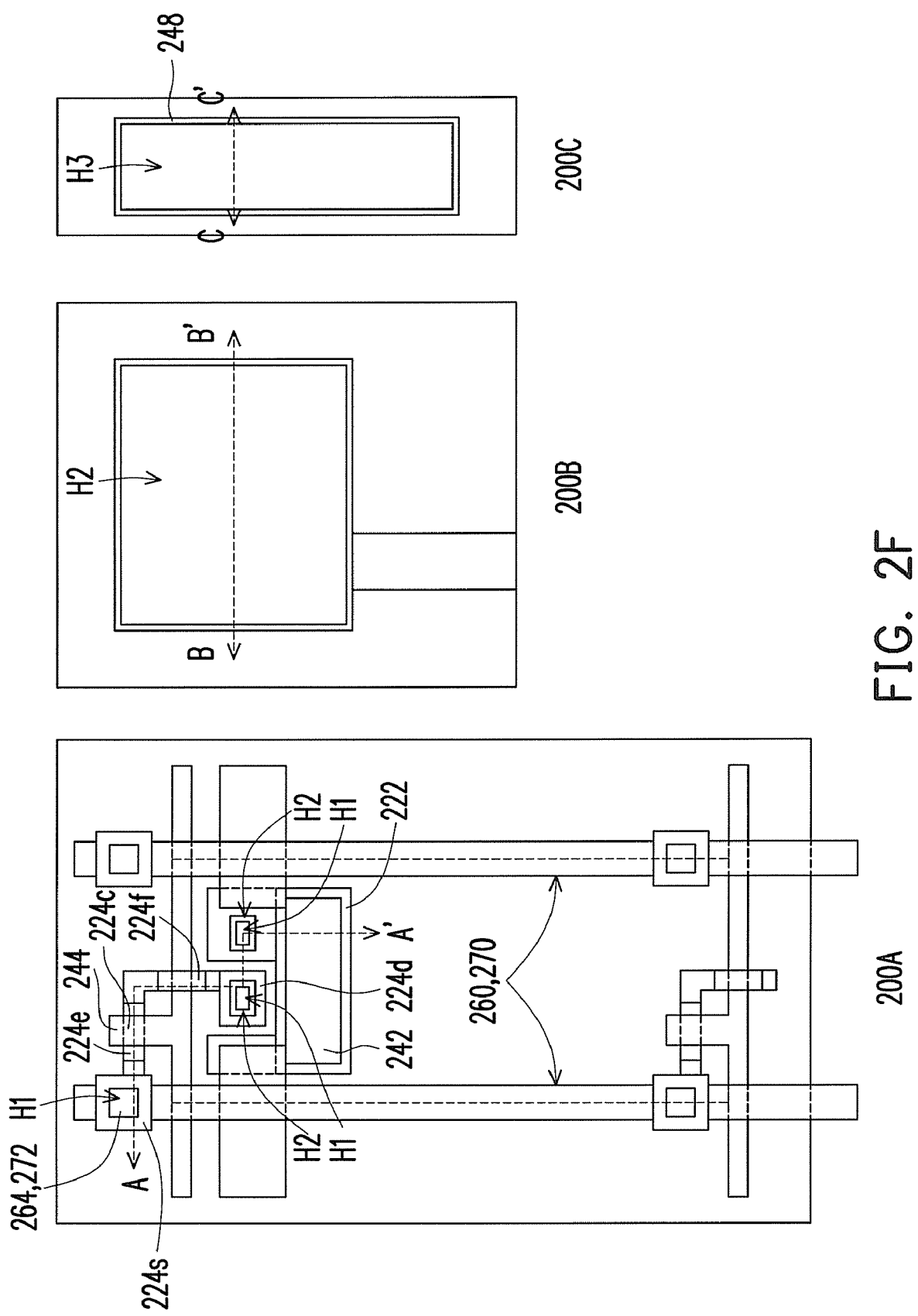
Figure 2F:
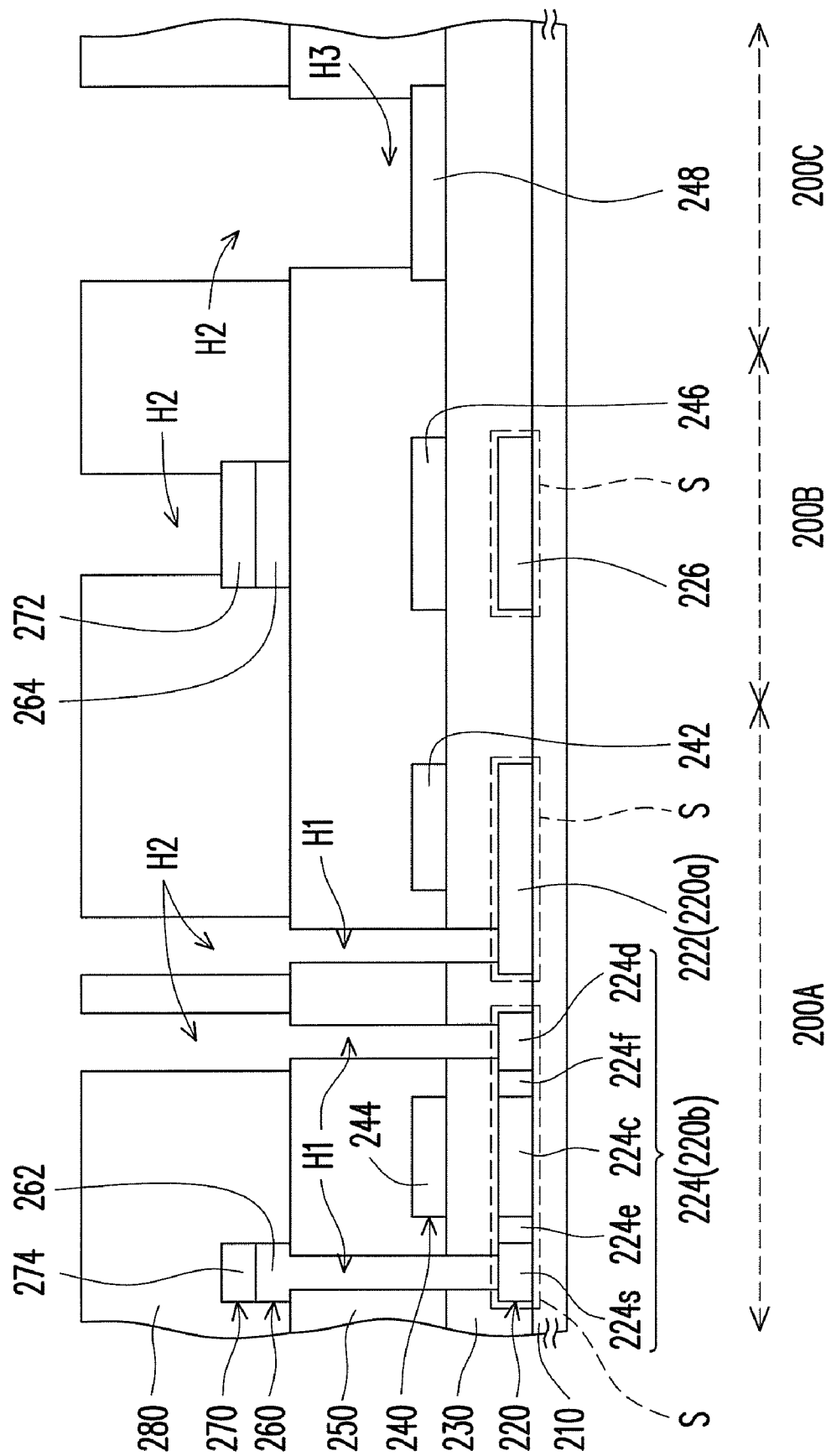

Then, as shown in FIGS. 2F and 2F', the second dielectric layer 280 is formed on the first dielectric layer 250 to cover the contact conductors 262, and the second dielectric layer 280 is, for example, an inorganic material layer such as the silicon oxide layer and the silicon nitride layer, or an organic layer, wherein the organic material layer may also act as a planar layer. Moreover, a plurality of second contact holes H2 is formed in the second dielectric layer 280, wherein a portion of the second contact holes H2 exposes the active layer 272 in the sensing region 200B, and according to the present embodiment, a portion of the second contact holes H2 in the pixel region 200A is disposed corresponding to the first contact holes H1 to respectively expose the drain doping region 224d of the active device and the storage electrode 222 of the storage capacitor. At the same time, a portion of the second contact holes H2 in the pad region 200C is disposed correspondingly over the third contact holes H3 to expose the first pad layer 248 serving as the pads.

Figure 2G:
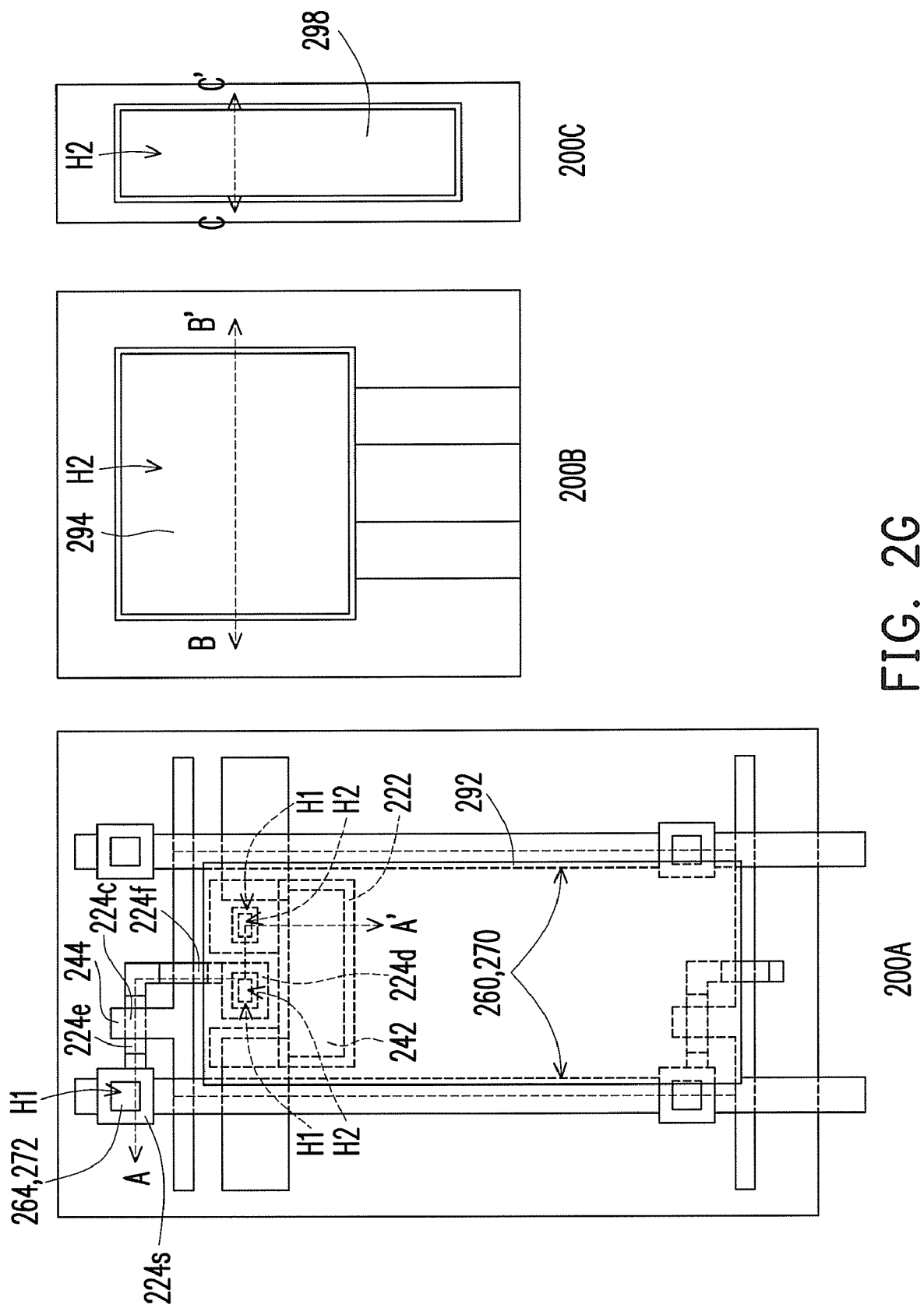
Figure 2G:
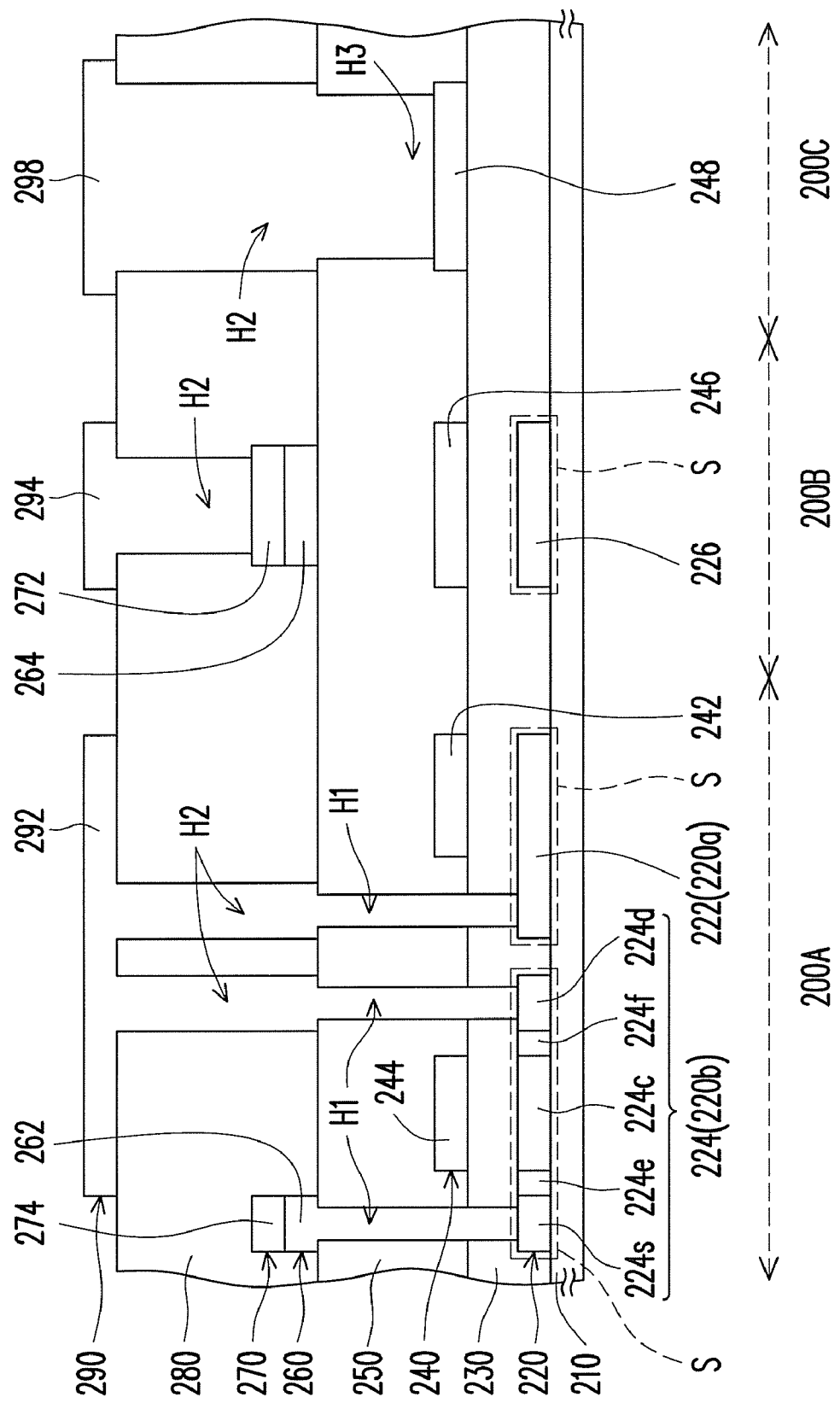

Following that, as shown in FIGS. 2G and 2G', the third conductive layer is formed on the second dielectric layer 280 and patterned to form the third patterned conductive layer 290 formed by the pixel electrode 292, the top electrode 294, and the second pad layer 298, wherein a portion of the third patterned conductive layer 290 is electrically connected to the active layer 272 through a portion of the second contact holes H2. A material of the third conductive layer is, for example, indium tin oxide (ITO), indium zinc oxide (IZO), or other transparent conductive material. The pixel electrode 292 is electrically connected to the drain doping region 224d of the first patterned semiconductor layer 220 in a direct manner through the first contact holes H1 and the second contact holes H2. The pixel electrode 292 is also electrically connected to the storage electrode 222 in a direct manner through the first contact holes H1 and the second contact holes H2 over the storage electrode 222. The top electrode 294 is stacked on the active layer 272 through the second contact holes H2 in the sensing region 200B to contact the active layer 272. Thereby, the bottom electrode 264, the active layer 272, and the top electrode 294 form the photo sensor to detect change in the ambient light. The top electrode 294 of the photo sensor is a transparent conductive layer, so external light may directly pass through the top electrode 294 and irradiate the active layer 272. Therefore, in manufacturing, the sensing area of the photo sensor is significantly increased and the efficiency of the sensibility of the photo sensor is improved. Furthermore, a material of the bottom electrode 264 is usually opaque metal, so that a backlight source is effectively prevented from irradiating the active layer 272, thus avoiding possible influence caused by noises on the sensibility of the photo sensor.

Moreover, the storage capacitor formed by the storage electrode 222, the gate insulator 230, and the storage electrode 242 may overlap the storage capacitor formed by the storage electrode 242, the first dielectric layer 250, the second dielectric layer 280, and pixel electrode 292 to enhance a voltage holding ratio of the pixel electrode 292.

Figure 2H:
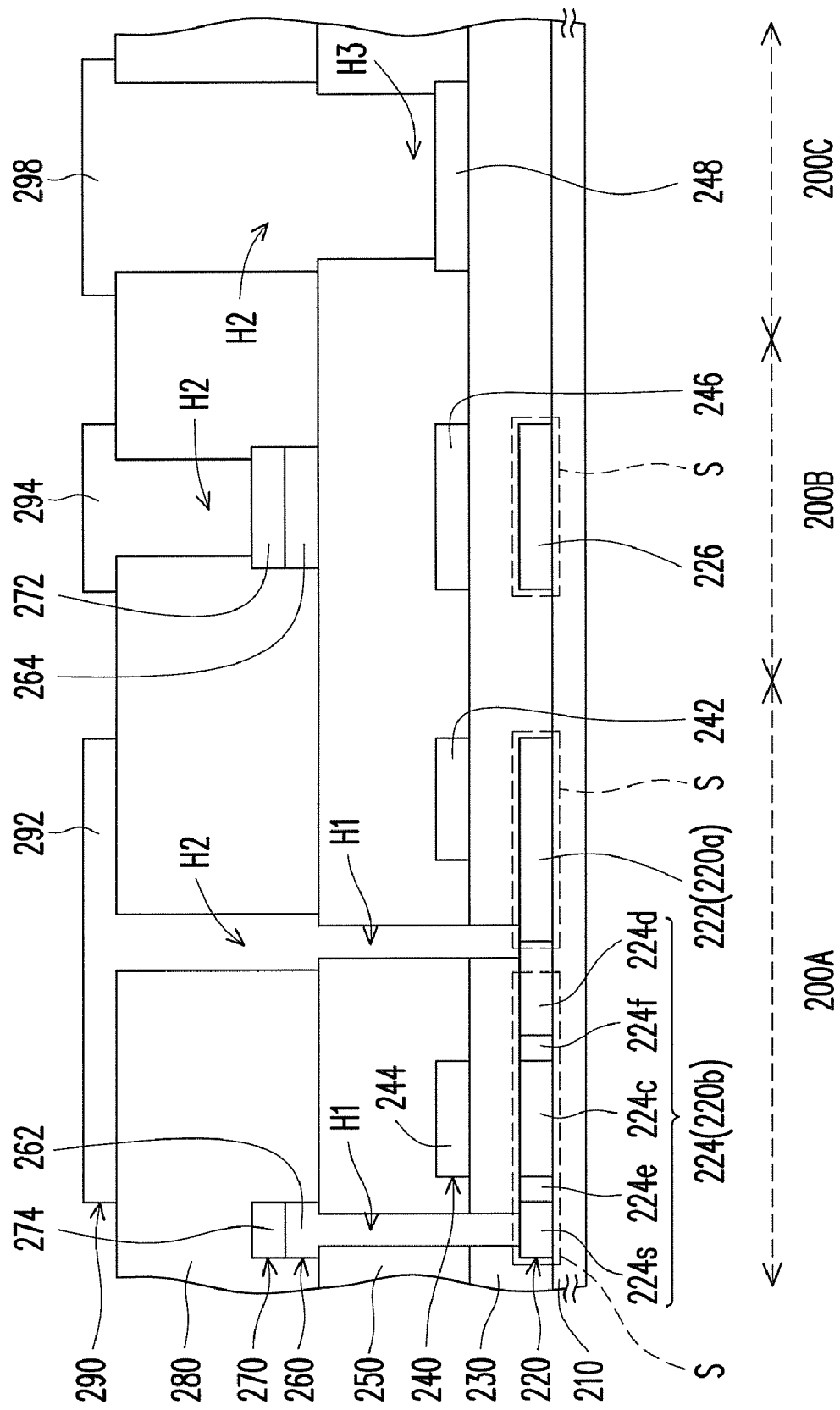
FIG. 2H is a schematic view illustrating another active device array substrate according to the first embodiment of the present invention.

FIG. 2H is a schematic view illustrating another active device array substrate according to the first embodiment of the present invention. Referring to FIG. 2H, a portion of the first type doping region 220a and the second type doping region 220b in the active device array substrate are in contact with or connected to each other. A contact interface is disposed between the first type doping region 220a and the second type doping region 220b. A portion of the first contact holes H1 exposes the contact interface. In other words, the first contact holes H1 expose both the first type doping region 220a and the second type doping region 220b at the same time, so that each of the pixel electrodes 292 is electrically connected to the storage electrode 222 in a direct manner simply through a single set of the first contact hole H1 and a second contact hole H2 over the storage electrode 222. The other elements of the active device array substrate and the method for fabricating the same are the same as those of the active device array substrate 200 of FIG. 1, and thus detailed descriptions are omitted herein.

The aforesaid embodiment is described using seven photolithography and etching processes for the active device array substrate 200 having the photo sensor as an example for illustration. Thereby, the present invention may incorporate the photosensitive material to the original processing flow for fabricating the active device array substrate 200 without additional photolithography and etching processes being added, so as to reduce the process cost and promote the process yield. However, the number of the photolithography and etching processes and the doping types of the active device may be modified according to actual requirements without departing from the scope of the present invention.

Second Embodiment

Figure 3:
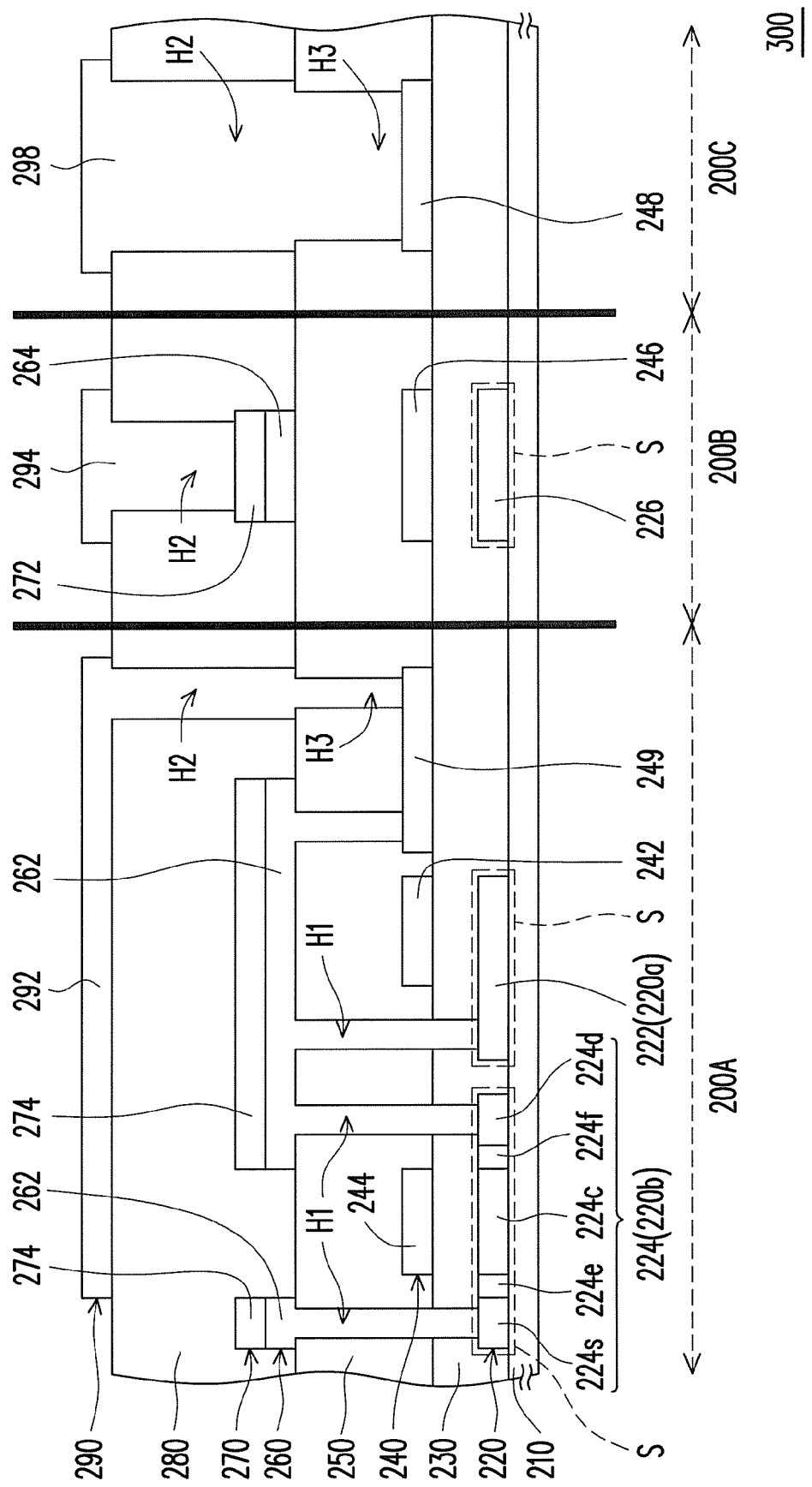
FIG. 3 illustrates an active device array substrate according to a second embodiment of the present invention.

FIG. 3 illustrates an active device array substrate according to a second embodiment of the present invention. Referring to FIG. 3, an active device array substrate 300 of the present embodiment is similar to the active device array substrate 200 of the first embodiment. Compared with the first embodiment, in the active device array substrate 300 of the present embodiment, the pixel electrode 292 in the pixel region 200A is electrically connected to the first patterned semiconductor layer 220 in an indirect manner through the first patterned conductive layer 240 and the second patterned conductive layer 260, for example.

In detail, compared with the first embodiment, the first patterned conductive layer 240 of the active device array substrate 300 further includes a bridge electrode 249 disposed in the pixel region 200A. Meanwhile, the contact conductors 262 of the active device array substrate 300 are filled into the first contact holes H1 and respectively in contact with the source doping region 224s, the drain doping region 224d, and the storage electrode 222. Moreover, the contact conductors 262 of the present embodiment are further filled into the third contact holes H3 exposing the bridge electrode 249. Thereby, a portion of the third patterned conductive layer 290 serving as the pixel electrode 292 is electrically connected to the bridge electrode 249 in a direct manner through the second contact holes H2 and the third contact holes H3, and the bridge electrode 249 is electrically connected to the drain doping region 224d and the storage electrode 222 through the contact conductors 262.

According to the present embodiment, a data voltage in the drain doping region 224d of the active device is transmitted to the pixel electrode 292, used for display, through the contact conductors 262 of the second patterned conductive layer 260 and the bridge electrode 249 of the first patterned conductive layer 240. Furthermore, according to the present embodiment, the storage electrode 222, the gate insulator 230, the storage electrode 242, the first dielectric layer 250, the contact conductors 262, the bridge electrode 249, the second dielectric layer 280 and the pixel electrode 292 together form a storage capacitor in a manner of multi-layered structure. Depending on the requirement of actual design in panel, the storage capacitor may be the single-layered structure or the multi-layered structure.

To better explain the technical content of the present invention, the following description in association with the accompanied drawings further illustrates the method for fabricating active device array substrate 300 according to the second embodiment of the present invention.

Figure 4A:
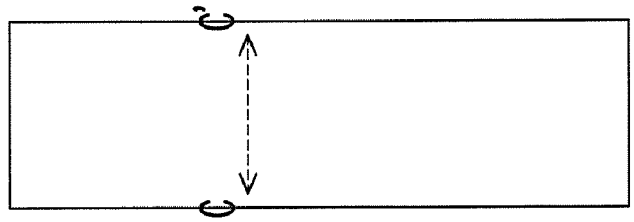
FIGS. 4A-4G illustrate a processing flow for fabricating the active device array substrate according to the second embodiment of the present invention.
Figure 4A:
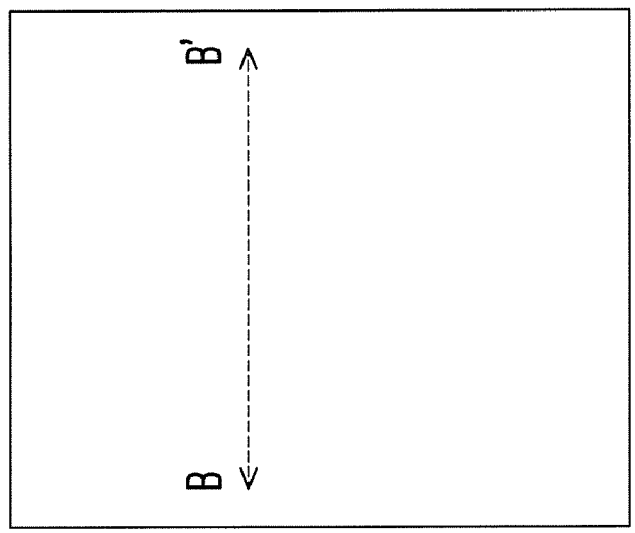
Figure 4A:
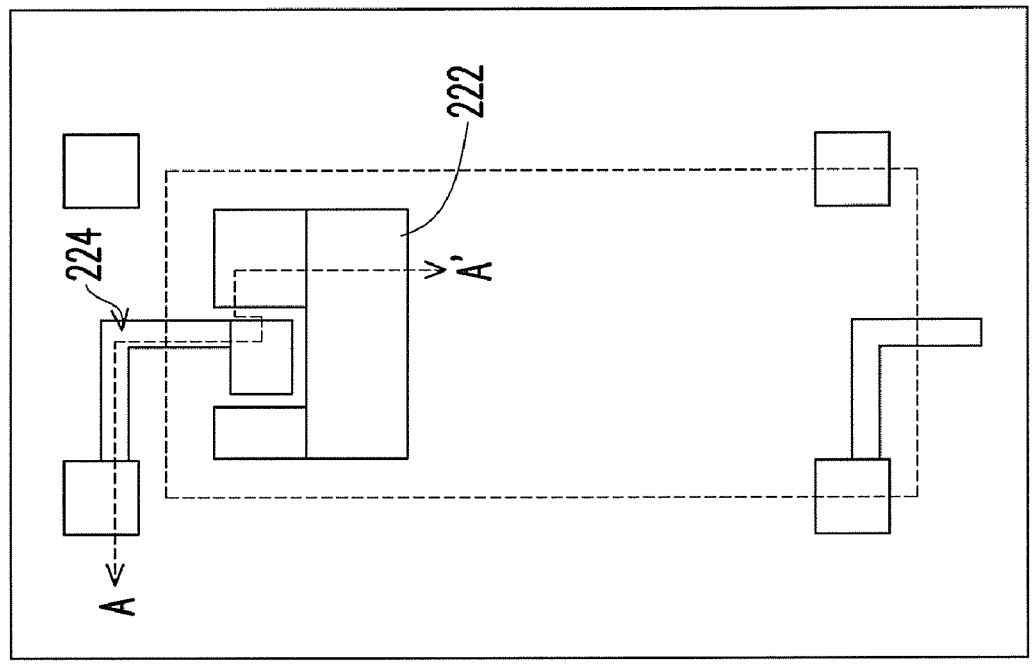
Figure 4A:
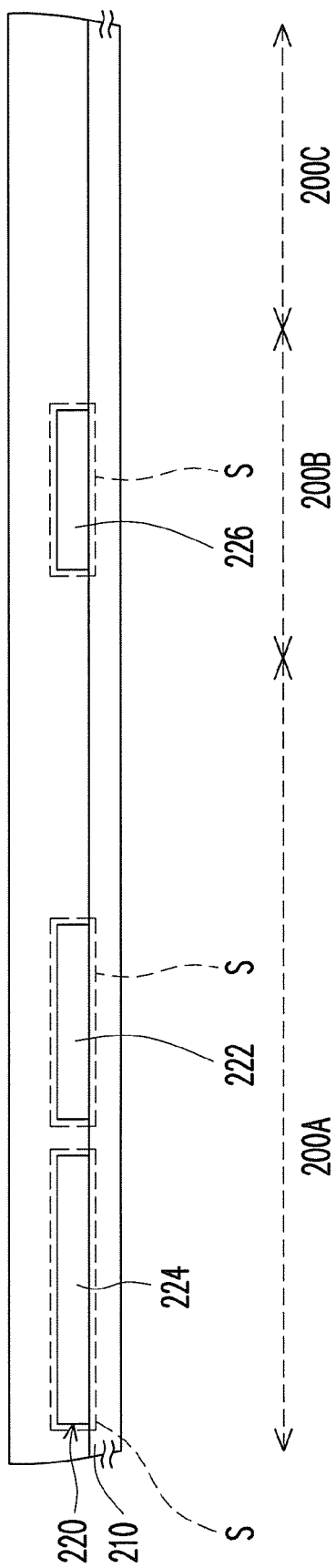
Figure 4B:
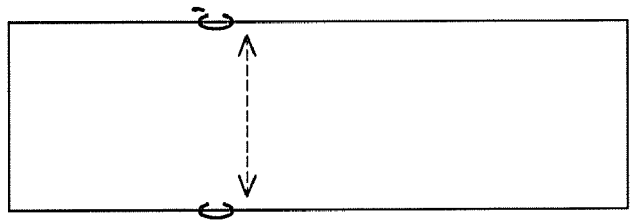
Figure 4B:
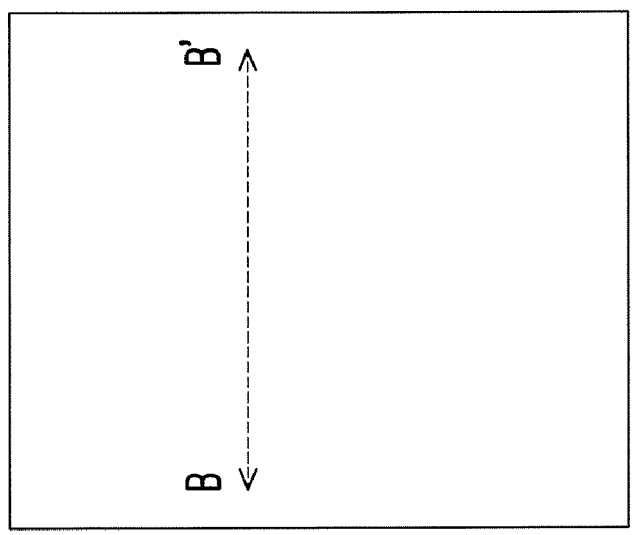
Figure 4B:
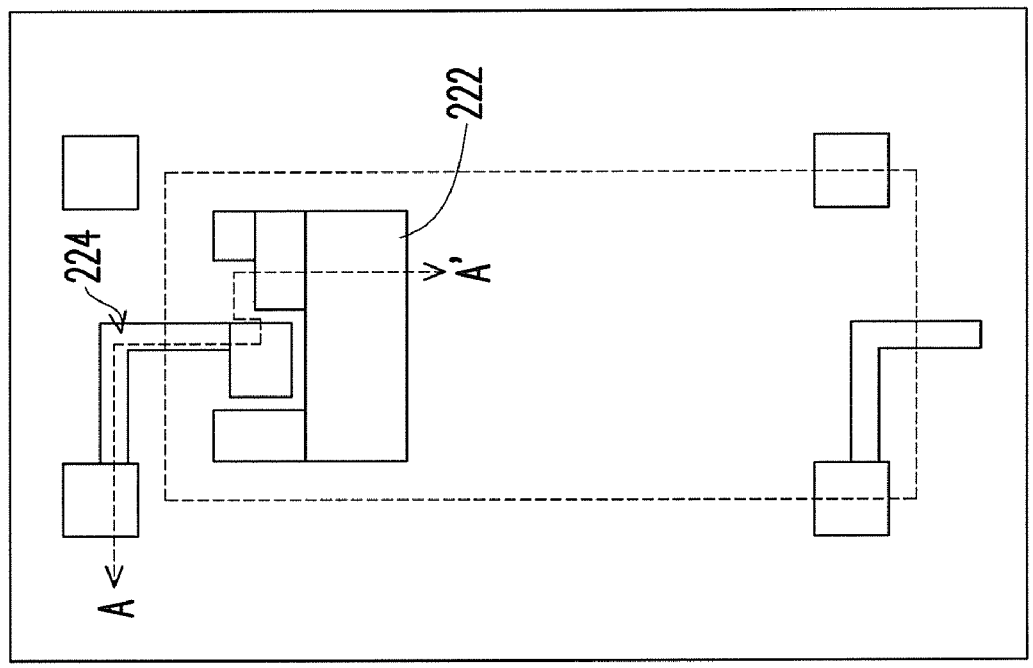
Figure 4B:
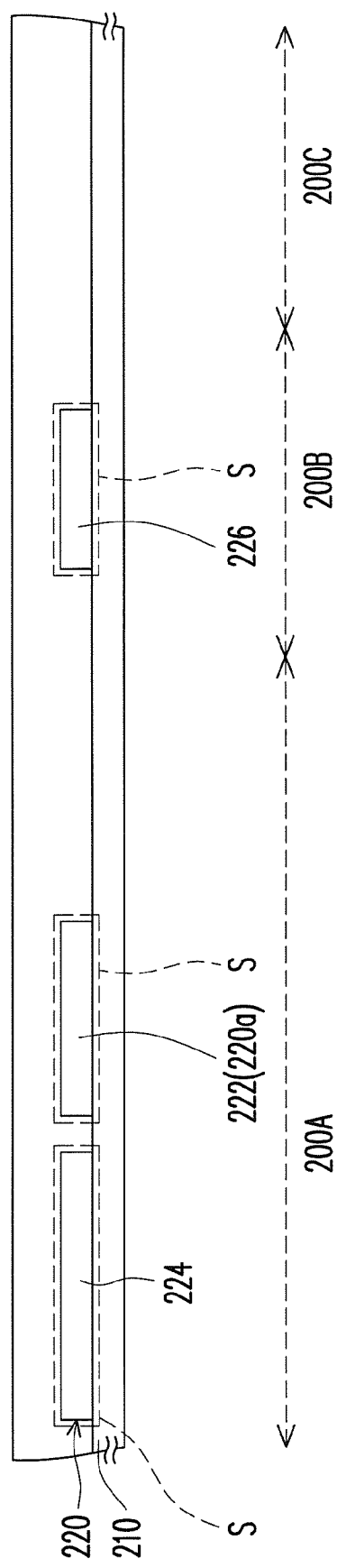

Please refer to FIGS. 4A-4G which illustrate a processing flow for fabricating the active device array substrate according to a second embodiment of the present invention. FIGS. 4A'-4G' are respective cross-sectional views along line AA' of the pixel region, line BB' of the sensing region, and line CC' of the pad region in FIGS. 4A-4G. In order to simplify the description, similarities in the processing flow of the present embodiment to the processing flows of FIGS. 2A-2G, and FIGS. 2A'-2G' will not be described repetitively.

Figure 4C:
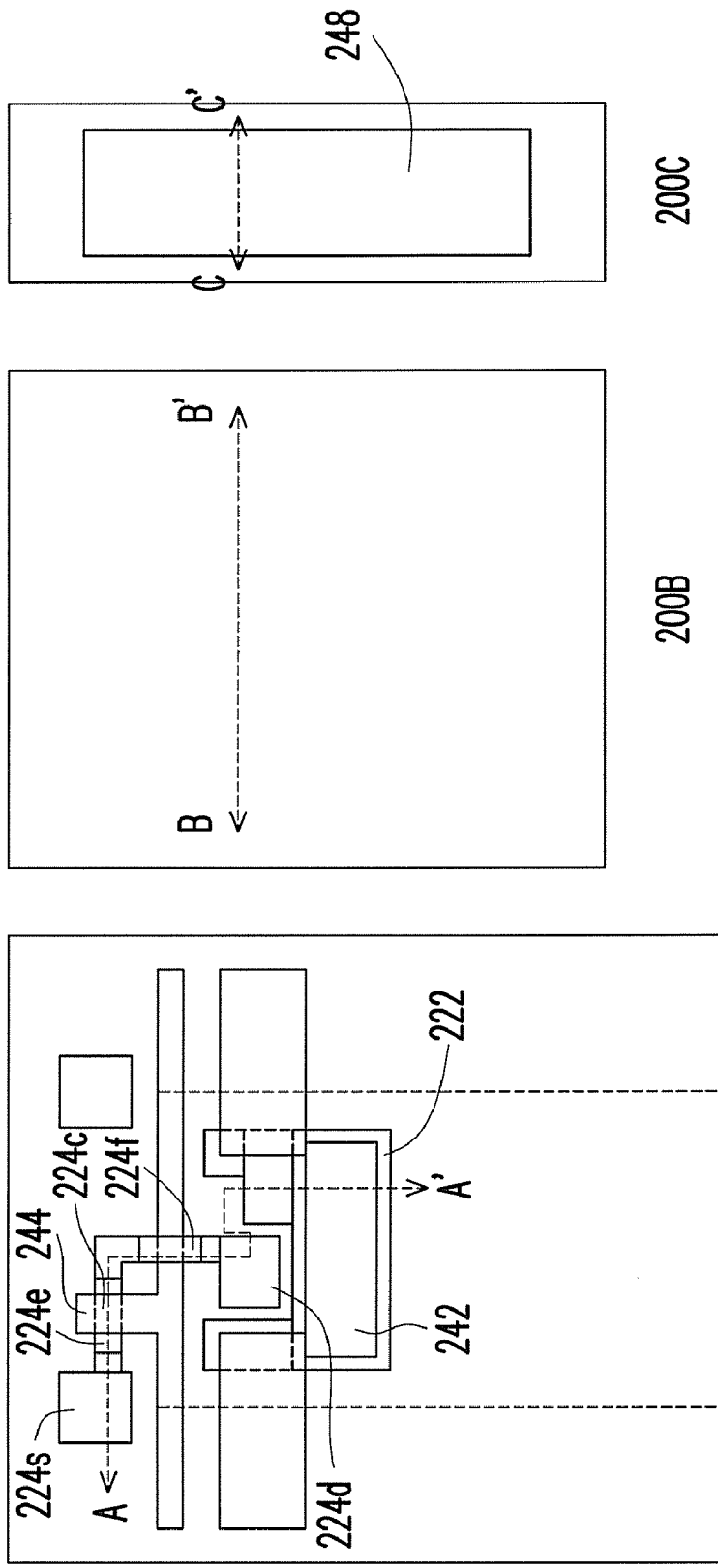
Figure 4C:
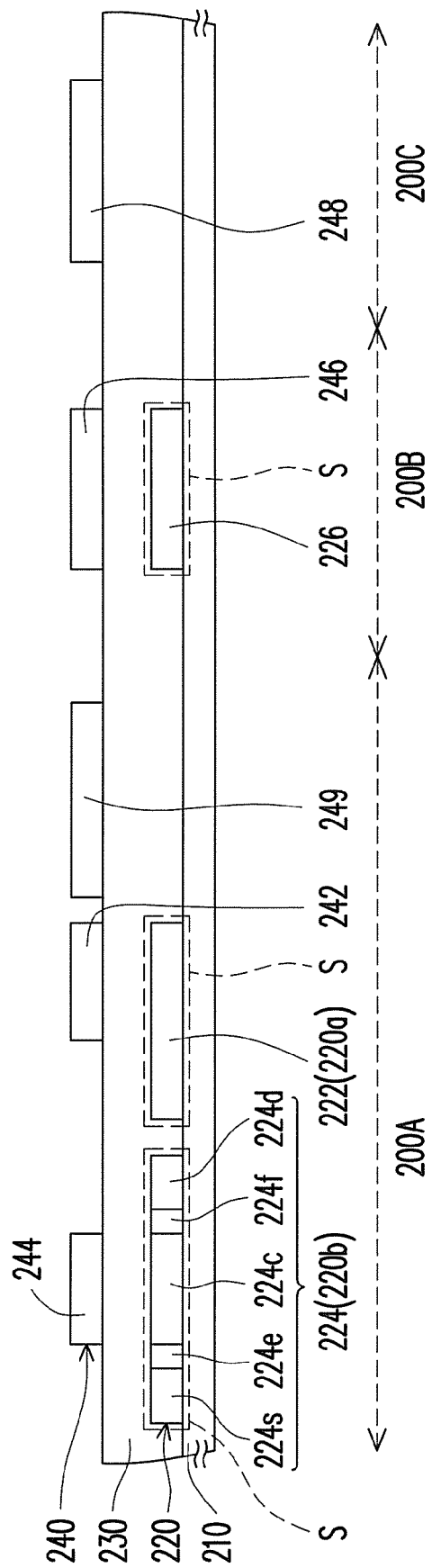
Figure 4D:
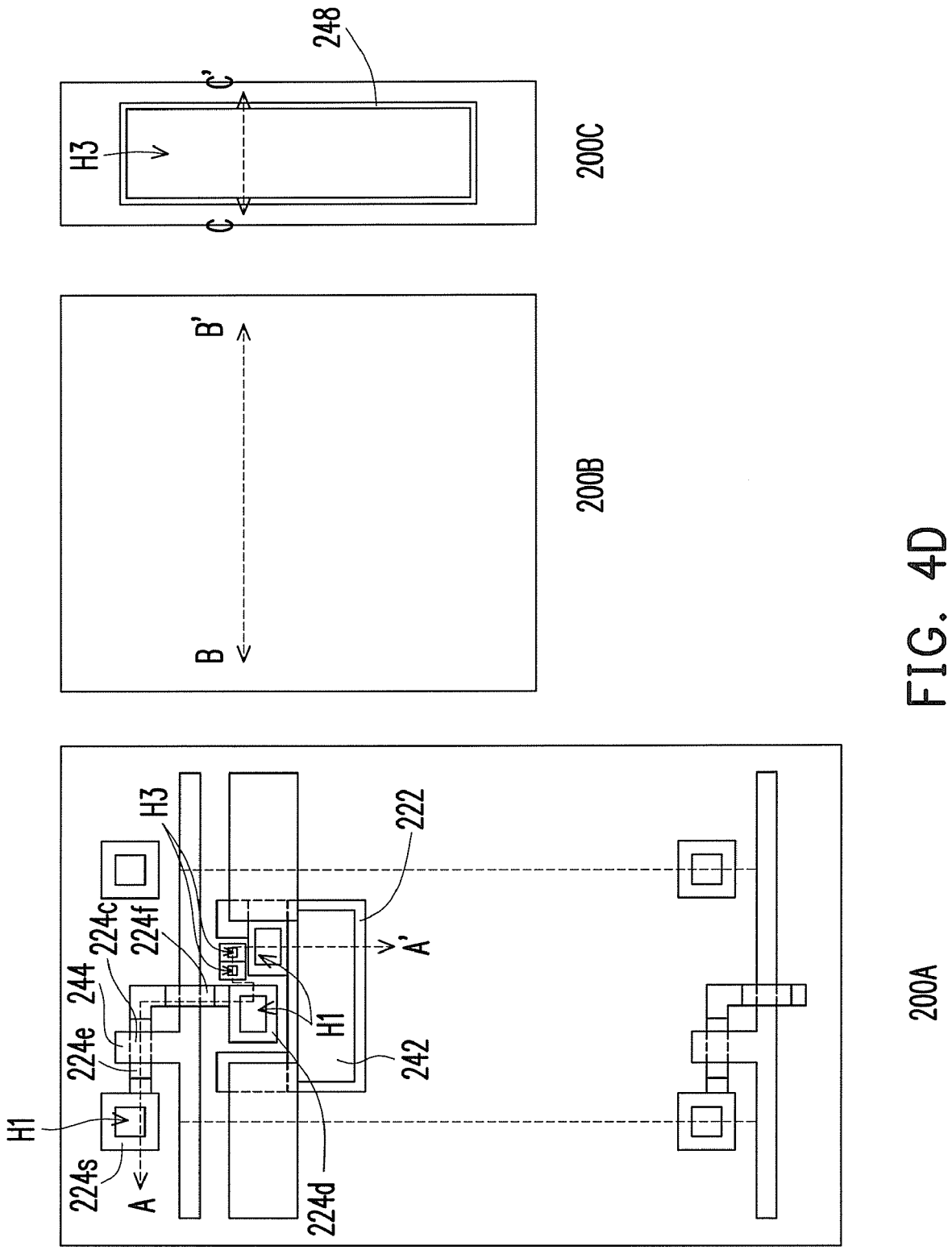
Figure 4D:
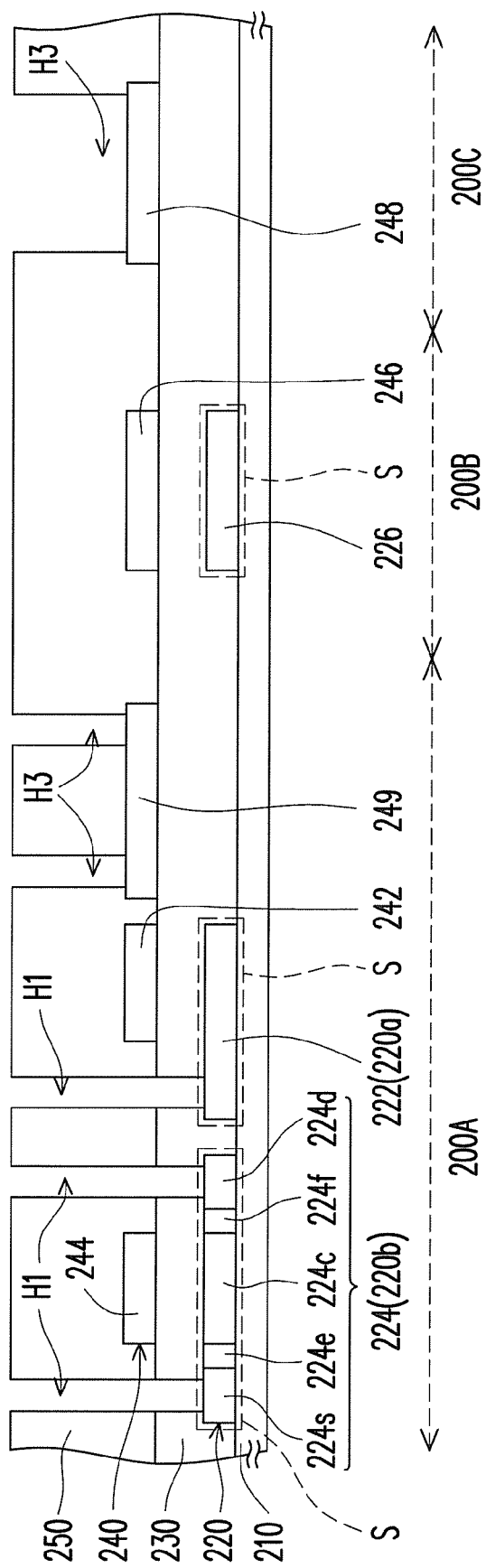
Figure 4E:
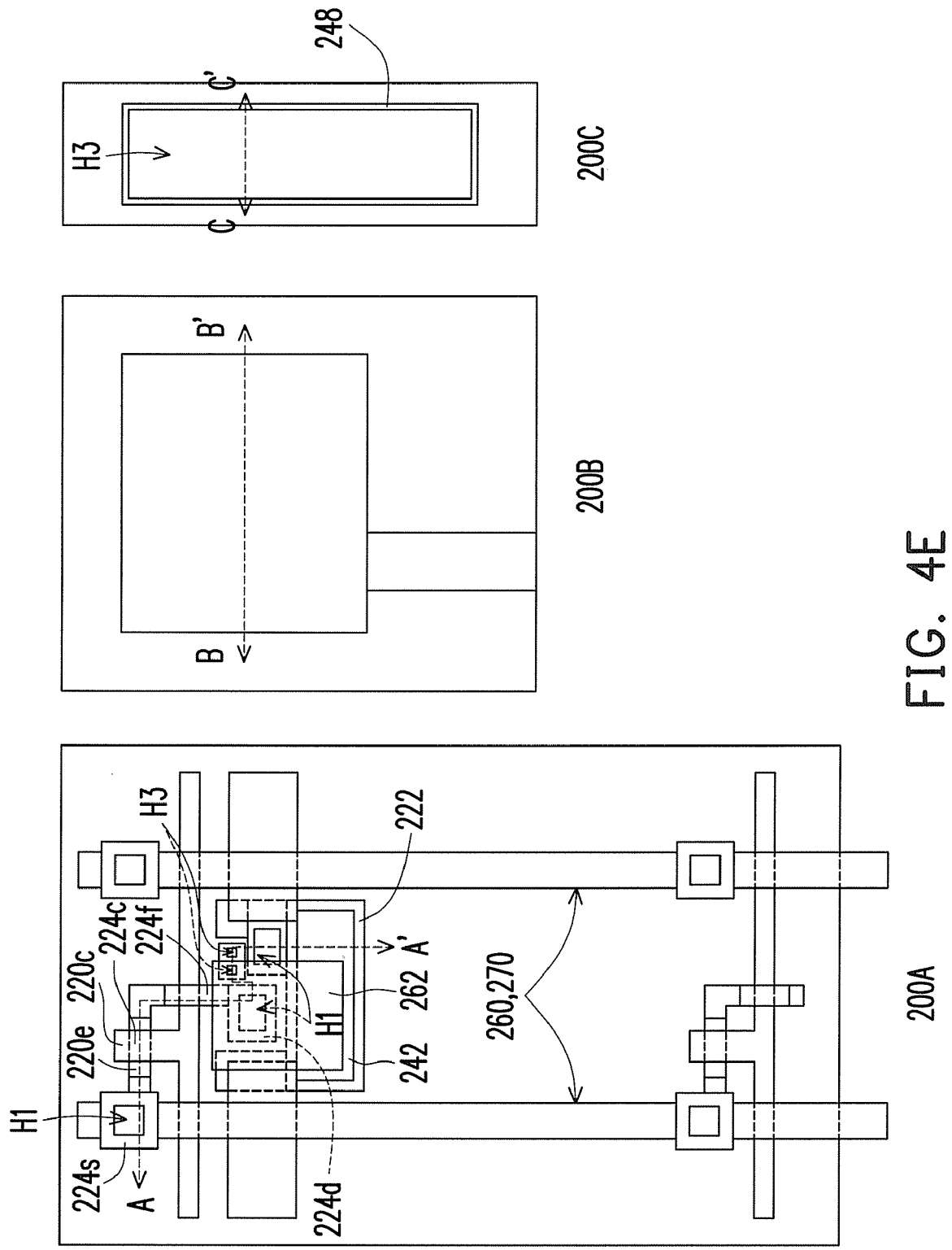
Figure 4E:
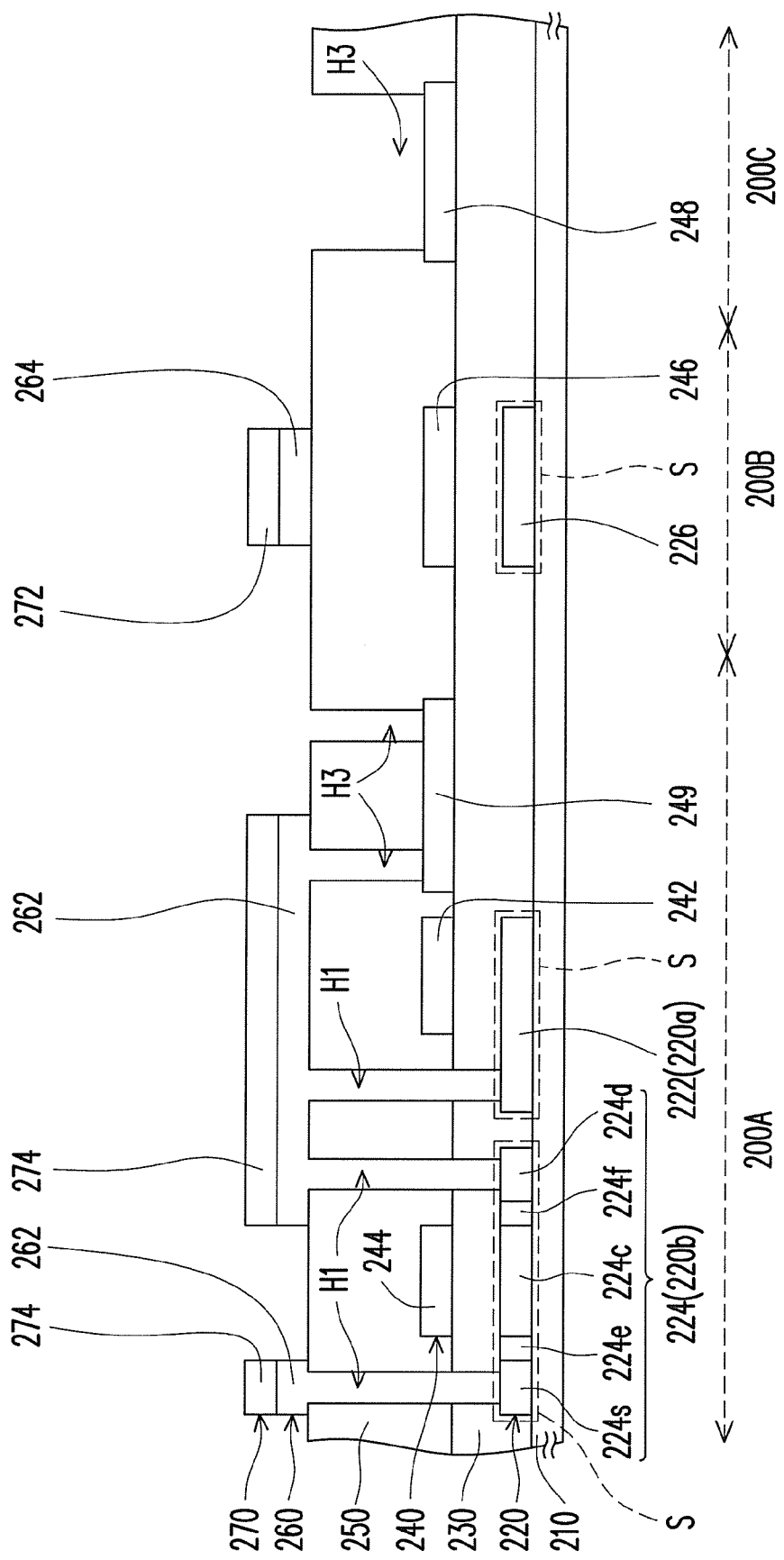

As shown in FIGS. 4C and 4C', compared with the active device array substrate 200 of the first embodiment, in the present embodiment, the bridge electrode 249 is further formed in the step of patterning the first conductive layer. Next, as shown in FIGS. 4D and 4D', compared with the first embodiment, in the present embodiment, the third contact holes H3 exposing the bridge electrode 249 are further formed over the bridge electrode 249 in the step of patterning the first dielectric layer 250. Then, as shown in FIGS. 4E and 4E', compared with the first embodiment, in the present embodiment, the contact conductors 262 are further filled into the first contact holes H1 to respectively contact the source doping region 224s, the drain doping region 224d and the storage electrode 222 at the same time of forming the second patterned conductive layer 260 and the second patterned semiconductor layer 270, and the contact conductors 262 pass through the third contact holes H3 exposing the bridge electrode 249 to contact the bridge electrode 249. Moreover, in this step, the contact conductors 262 are simultaneously formed to electrically connect the bridge electrode 249, the storage electrode 222, and the drain doping region 224d.

Figure 4F:
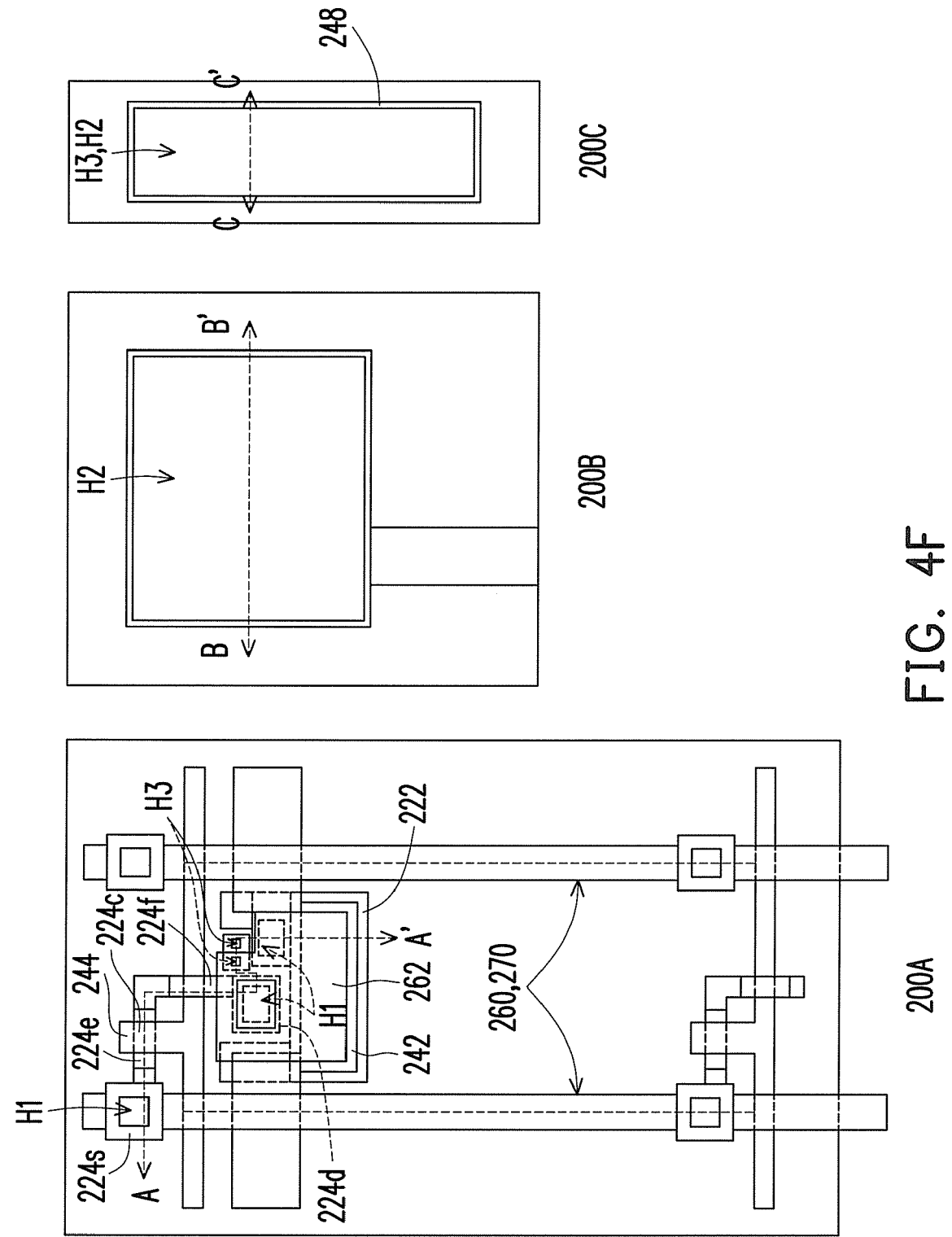
Figure 4F:
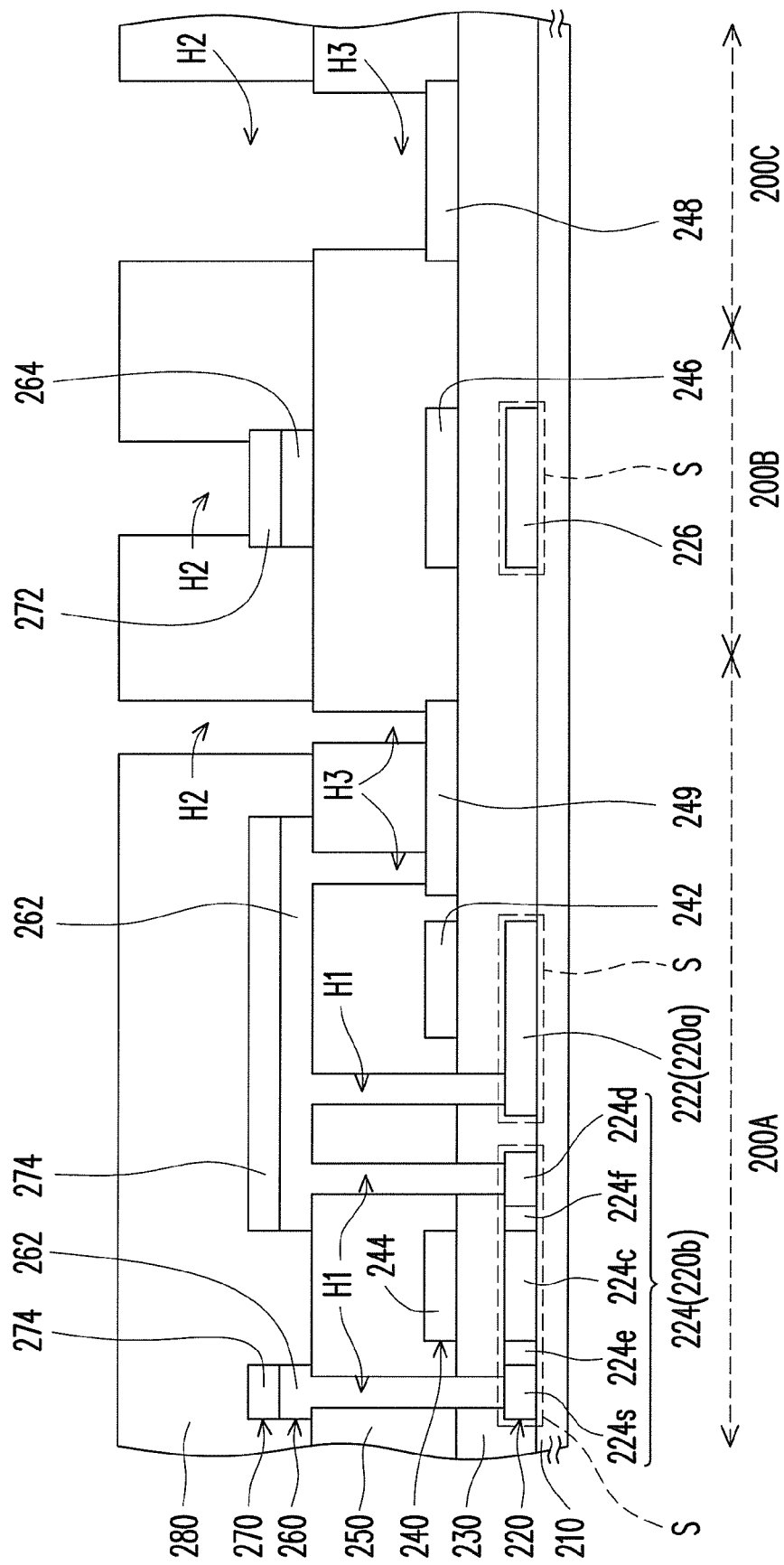
Figure 4G:
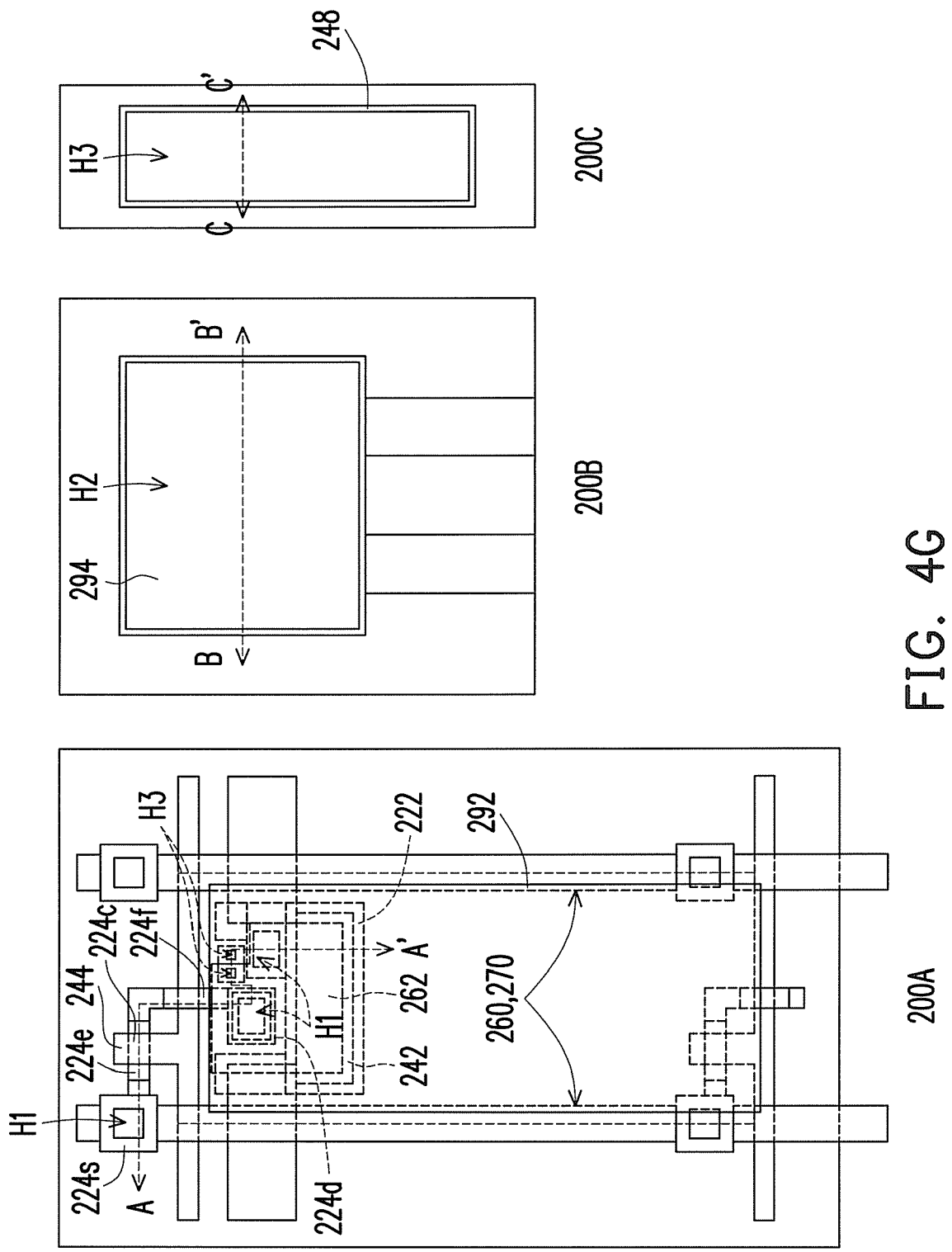
Figure 4G:
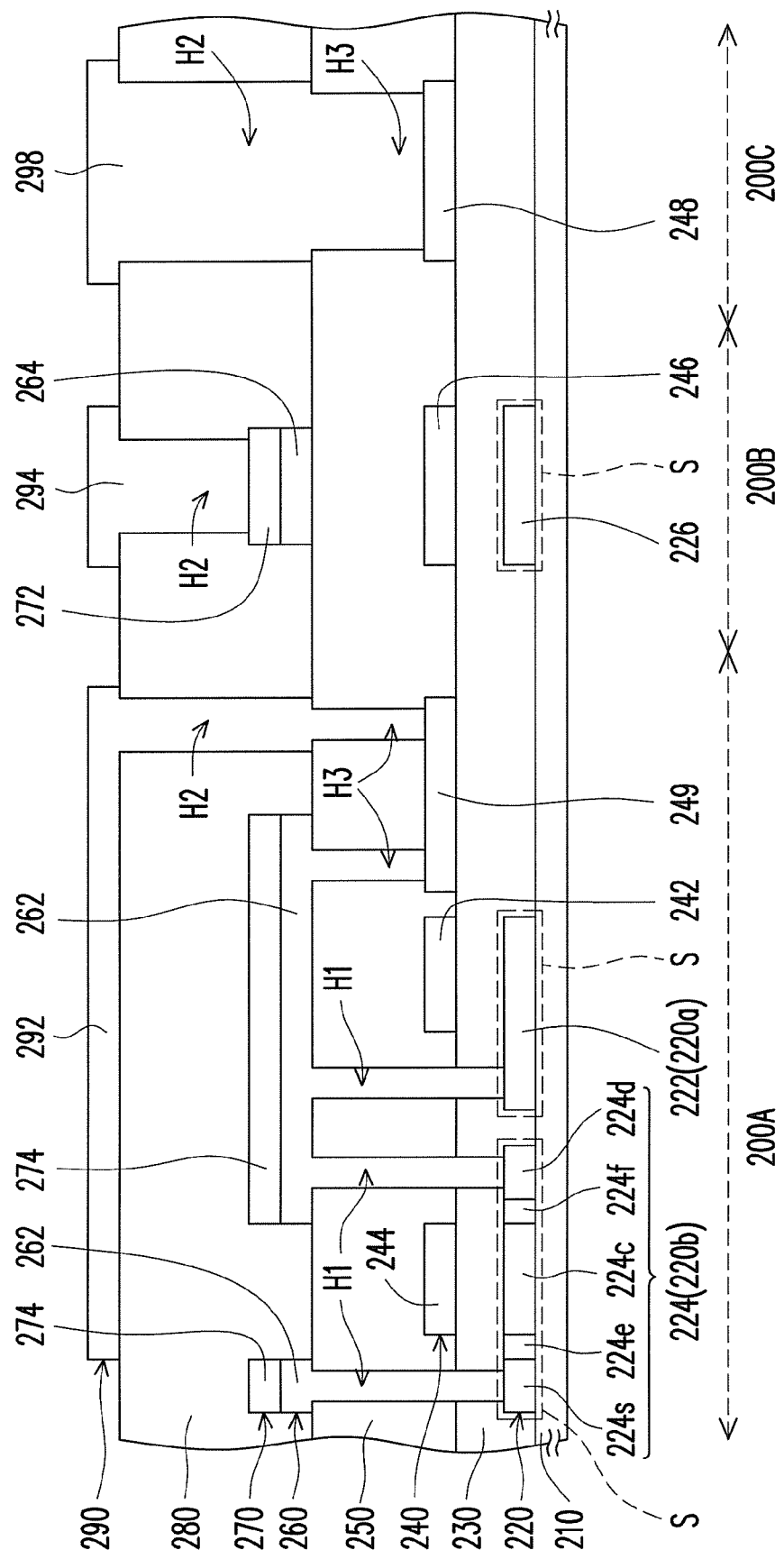

After that, as shown in FIGS. 4F and 4F', compared with the first embodiment, in the present embodiment, the second contact holes H2 disposed corresponding to a portion of the third contact holes H3 are further formed in the second dielectric layer 280 to expose a portion of the bridge electrode 249. Following that, as shown in FIGS. 4G and 4G', in the process of forming the third patterned conductive layer 290 according to the present embodiment, a portion of the third patterned conductive layer 290 serving as the pixel electrode 292 is electrically connected to the bridge electrode 249 of the first patterned conductive layer 240 in a direct manner through the third contact holes H3 and the second contact holes H2. A portion of the third patterned conductive layer 290 serving as the pixel electrode 292 is electrically connected to the drain doping region 224d and the storage electrode 222 in an indirect manner through the bridge electrode 249 of the first patterned conductive layer 240 and the contact conductors 262 of the second patterned conductive layer 260.

Figure 4H:
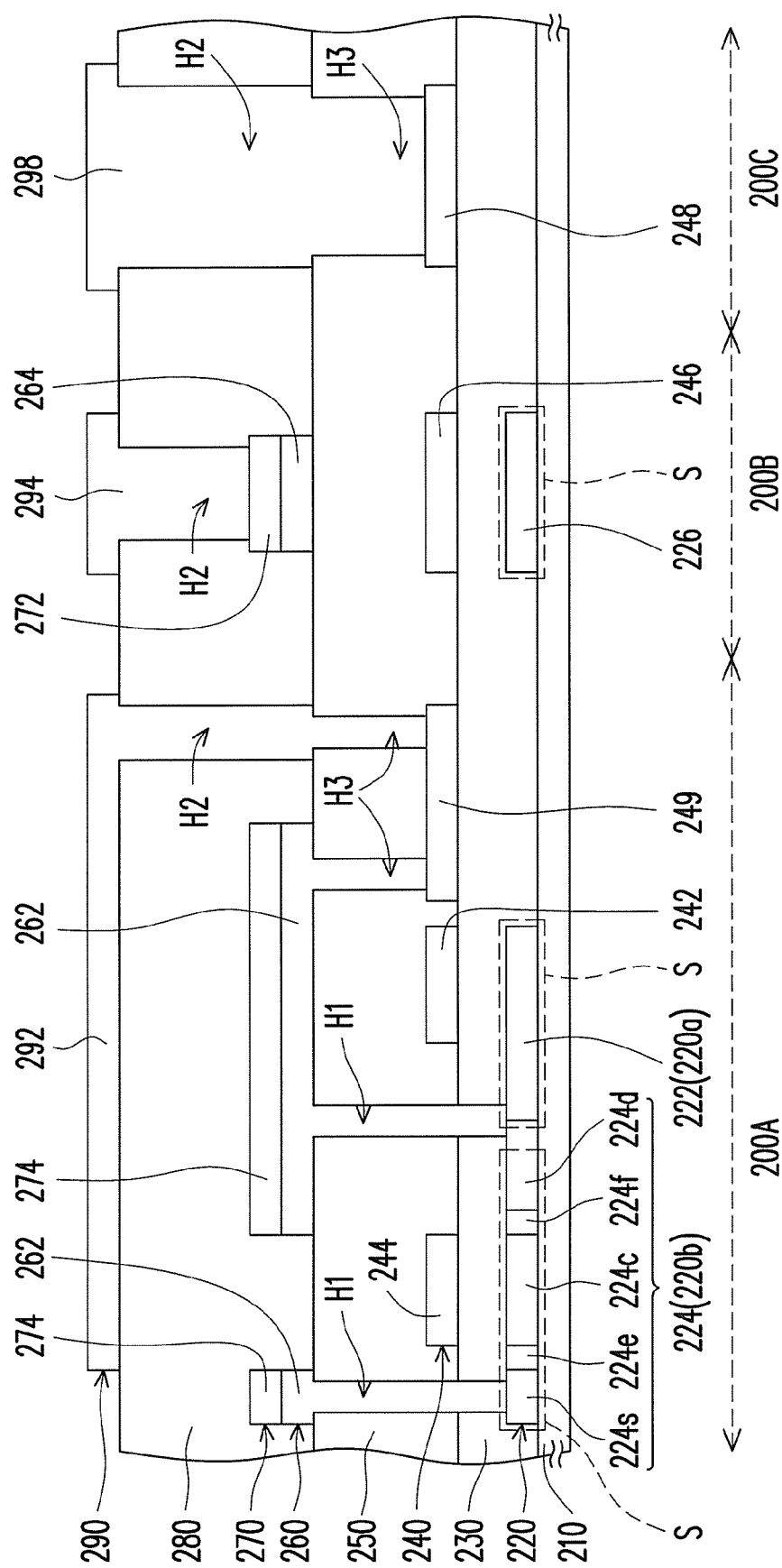
FIG. 4H is a schematic view illustrating another active device array substrate according to the second embodiment of the present invention.

FIG. 4H is a schematic view illustrating another active device array substrate according to the second embodiment of the present invention. Referring to FIG. 4H, a portion of the first type doping region 220a and the second type doping region 220b in the active device array substrate are in contact with each other. A contact interface is disposed between the first type doping region 220a and the second type doping region 220b. A portion of the first contact holes H1 exposes the contact interface. In other words, the first contact holes H1 simultaneously exposes both the first type doping region 220a and the second type doping region 220b, so that the contact conductors 262 electrically connected to the pixel electrode 292 is directly connected to the first type doping region 220a and the second type doping region 220b simply through a first contact hole H1. The other elements of the active device array substrate and the method for fabricating the same illustrated by FIG. 4H are the same as those illustrated by FIG. 3, and thus detailed descriptions are omitted herein.

Similar to the foregoing embodiments, in the second embodiment, seven photolithography and etching processes are also used to fabricate the active device array substrate 300 having the photo sensor. Thereby, as described above, the active device array substrate 300 according to the present embodiment may also reduce the process time and process cost.

Third Embodiment

Figure 5:
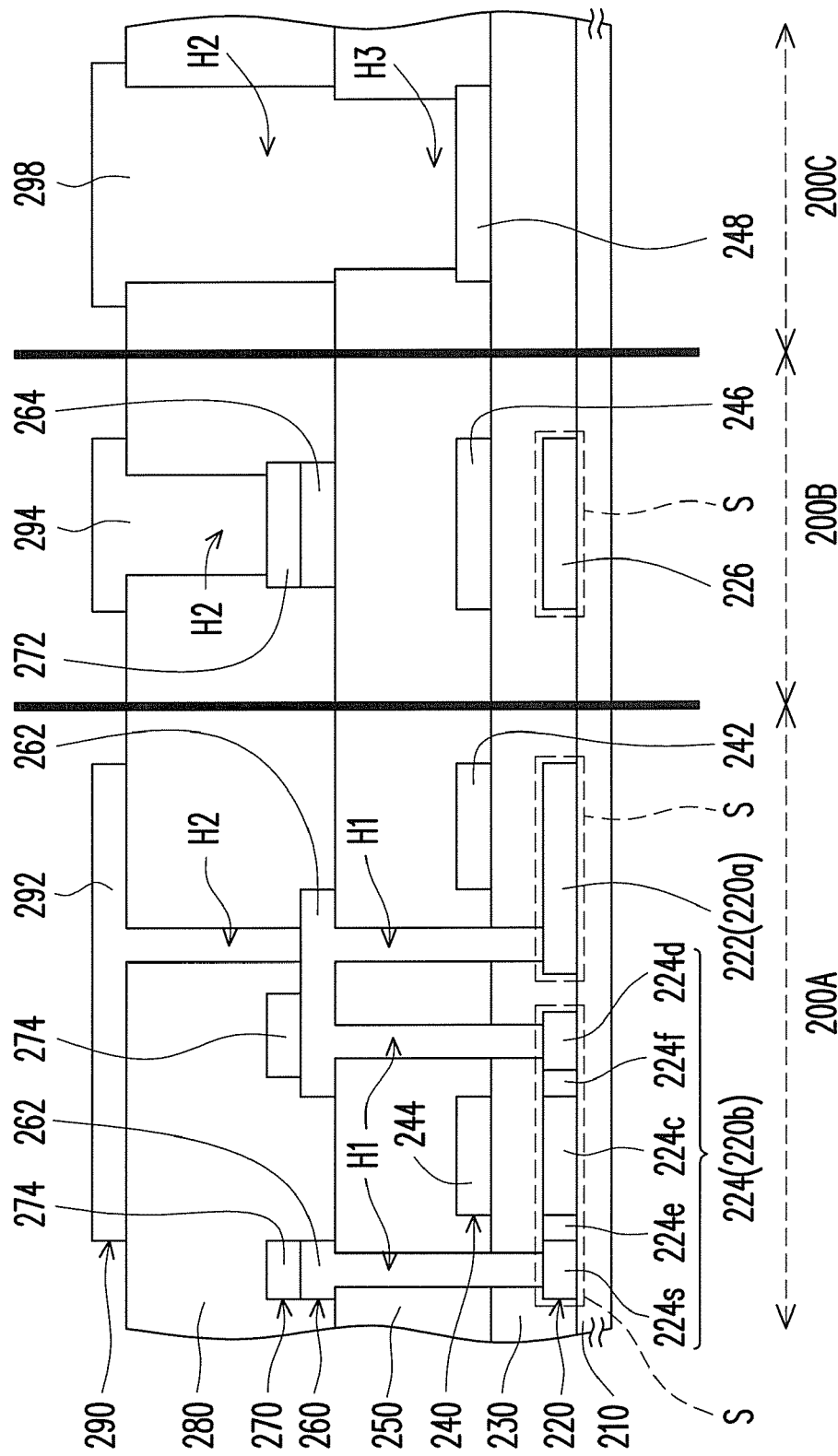
FIG. 5 illustrates an active device array substrate according to a third embodiment of the present invention.

FIG. 5 illustrates an active device array substrate according to a third embodiment of the present invention. Referring to FIG. 5, an active device array substrate 400 of the present embodiment is similar to the active device array substrates 200 and 300 of the foregoing embodiments. However, compared with the active device array substrates 200 and 300 of the foregoing embodiments, in the active device array substrate 400, the third patterned conductive layer 290, serving as the pixel electrode 292, in the pixel region 200A is electrically connected to the first patterned semiconductor layer 200 through a portion of the second contact holes H2 and the second patterned conductive layer 260. Moreover, according to the present embodiment, the second patterned semiconductor layer 270 further includes a plurality of dummy semiconductor layer 274 disposed on the contact conductor 262, wherein the sizes of a portion of the dummy semiconductor layers 274 are, for example, substantially equal to the sizes of the contact conductors, and the sizes of a portion of the dummy semiconductor layers 274 are, for example, substantially smaller than the sizes of the contact conductors 262. In other words, a portion of the dummy semiconductor layers 274 covers the contact conductors 262 while a portion of the dummy semiconductor layers 274 does not cover the contact conductors 262. As shown in FIG. 5, the sizes of the dummy semiconductor layers 274 disposed over the contact conductors 262 connected to the third patterned conductive layer are smaller than the sizes of the contact conductors 262 at this position.

In detail, compared with the foregoing embodiments, in the present embodiment, the dummy semiconductor layers 274 are disposed over the contact conductors 262. Moreover, by reducing the sizes of the dummy semiconductor layers 274 disposed over a portion of the contact conductors 262, the second contact holes H2 in the second dielectric layer 280 may avoid contacting the dummy semiconductor layers 274 and expose a portion of the contact conductors 262. Therefore, as shown in FIG. 5, a portion of the third patterned conductive layer 290 serving as the pixel electrode 292 can pass through the second contact holes H2 exposing the contact conductors 262 to contact the contact conductors 262 directly, so that the pixel electrode 292 is connected to the first patterned semiconductor layer 220 through the second contact holes H2 and the contact conductors 262, wherein the first patterned semiconductor layer 220 electrically connected to the pixel electrode 292 is, for example, the drain doping region 224d of the active device and the storage electrode 222 of the storage capacitor.

Therefore, according to the present embodiment, the data voltage in the drain doping region 224d of the active device is transmitted to the pixel electrode 292, used for display, through the contact conductors 262 of the second patterned conductive layer 260 and the second contact holes H2. Furthermore, according to the present embodiment, the storage electrode 222, the gate insulator 230, the storage electrode 242, the first dielectric layer 250, the second dielectric layer 280 and the pixel electrode 292 together form a storage capacitor having a multilayer structure. Depending on the requirement of actual design in panel, the storage capacitor may be a single-layered structure or a multi-layered structure.

To better explain the technical content of the present invention, the following description in association with the accompanied drawings further illustrates the method for fabricating active device array substrate 400 according to the third embodiment of the present invention.

Figure 6A:
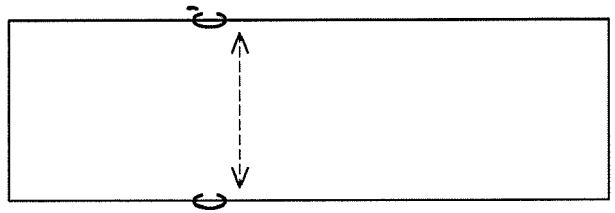
FIGS. 6A-6G illustrate a processing flow for fabricating the active device array substrate according to the third embodiment of the present invention.
Figure 6A:
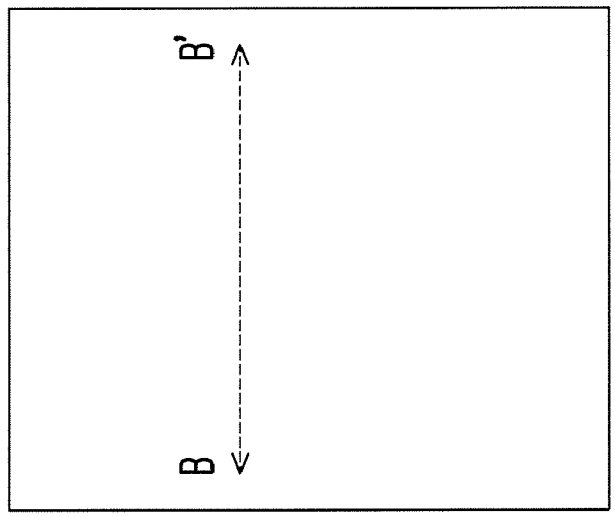
Figure 6A:
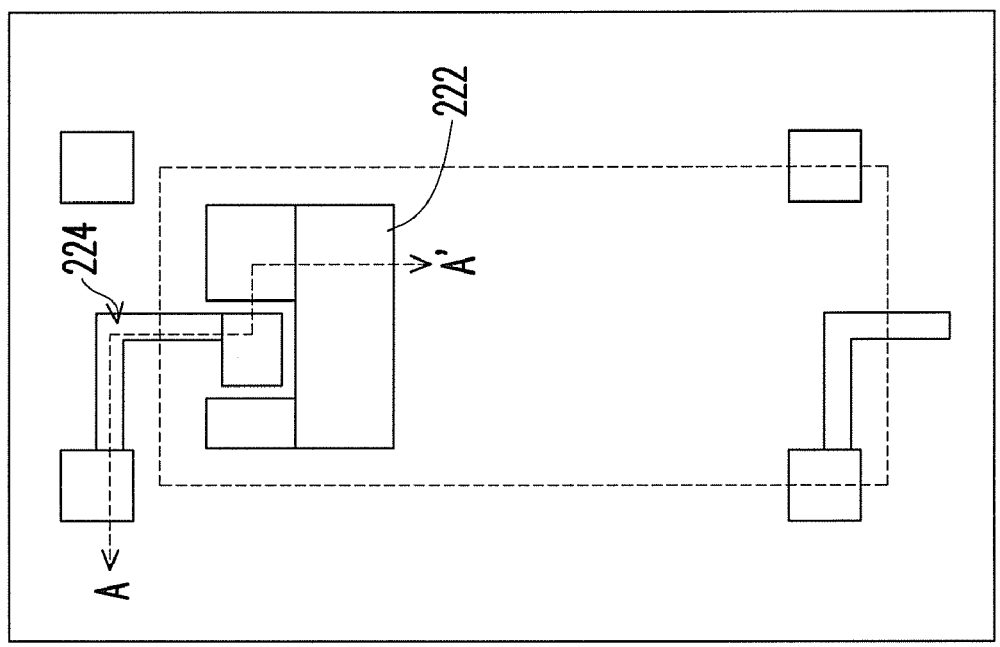
Figure 6A:
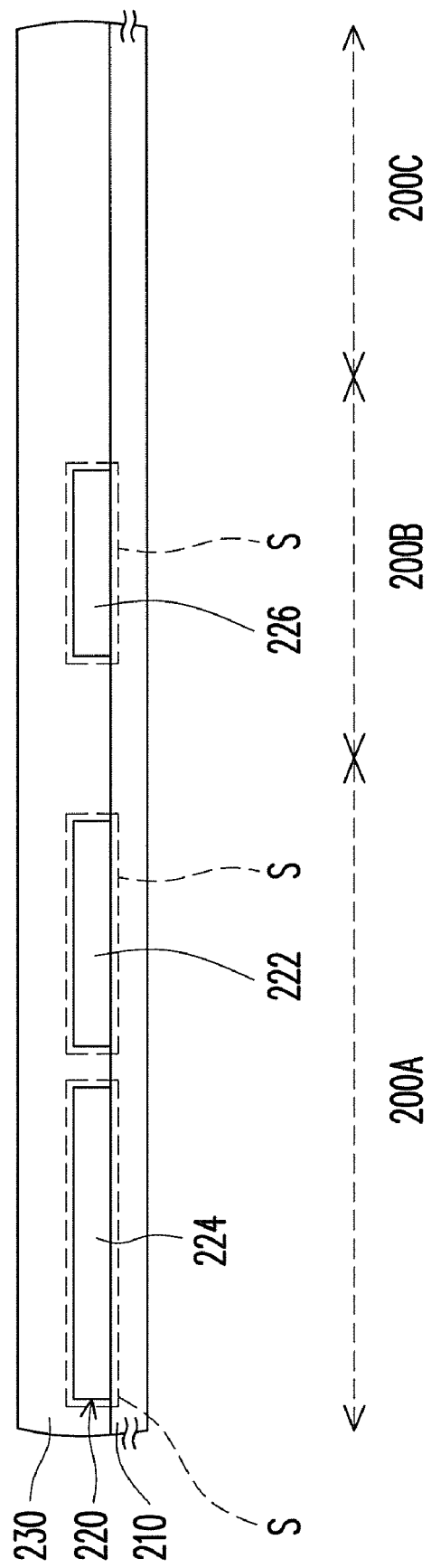
Figure 6B:
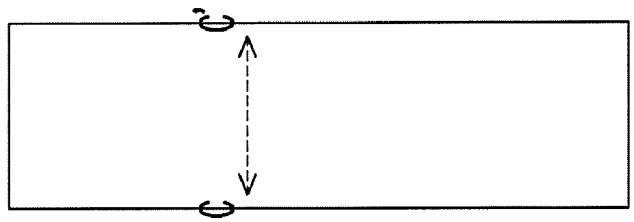
Figure 6B:
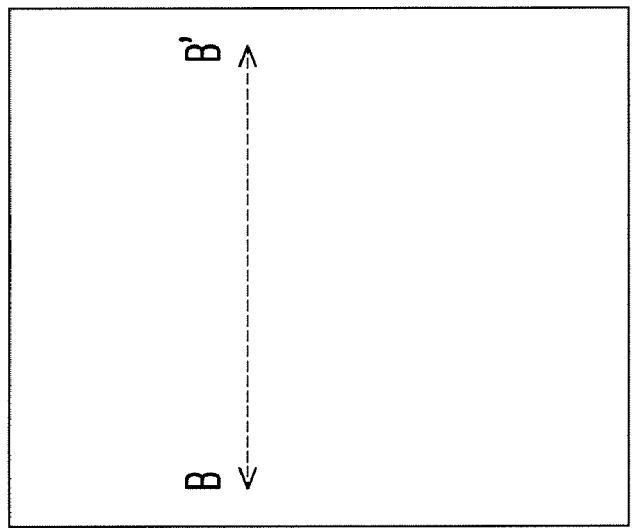
Figure 6B:
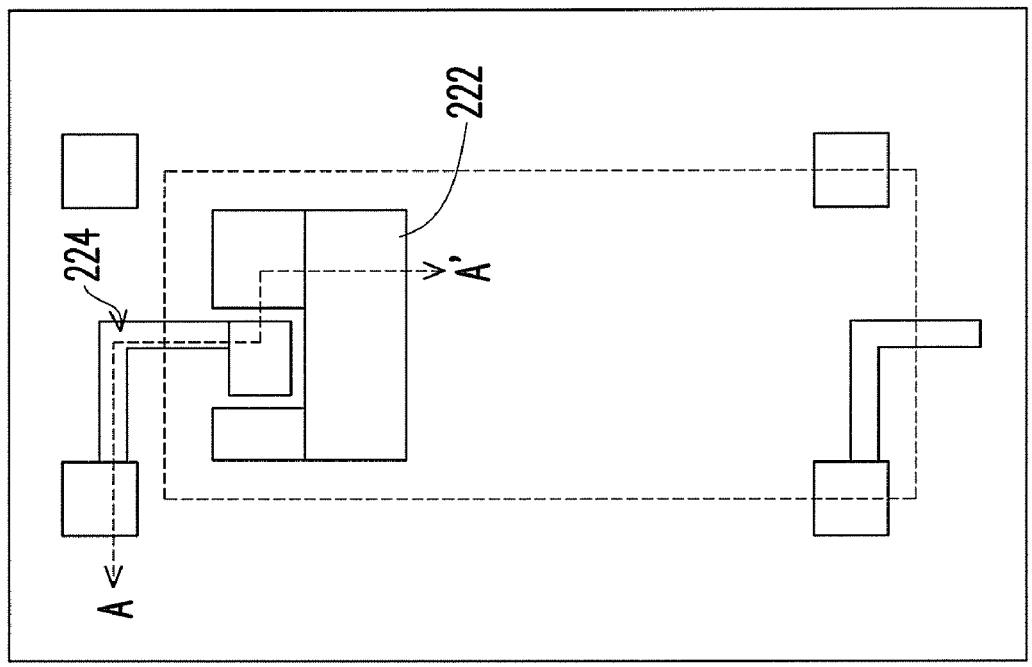
Figure 6B:
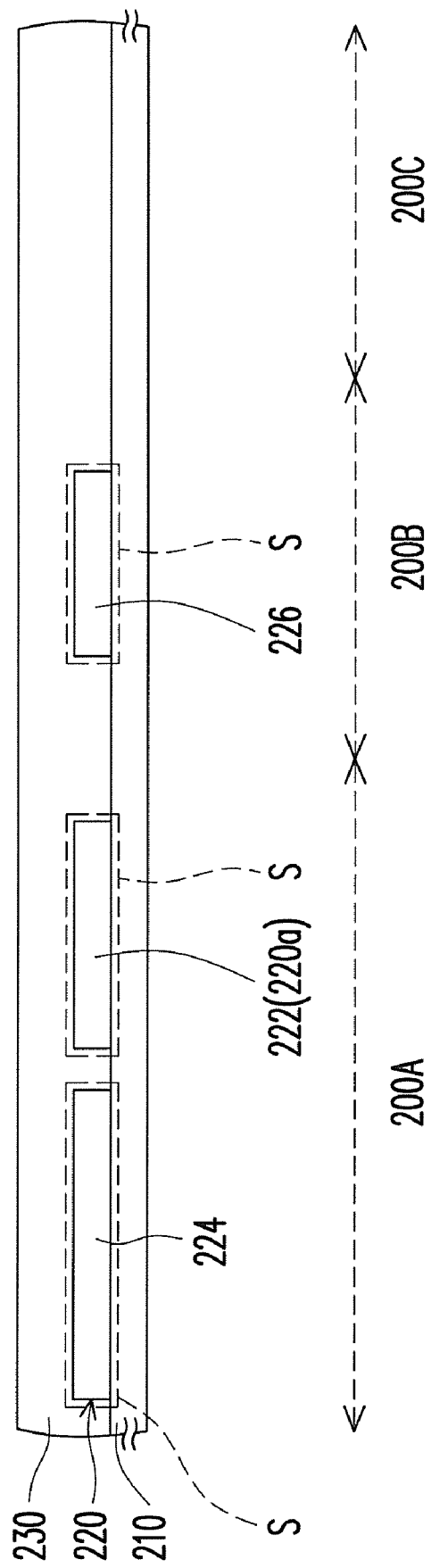
Figure 6C:
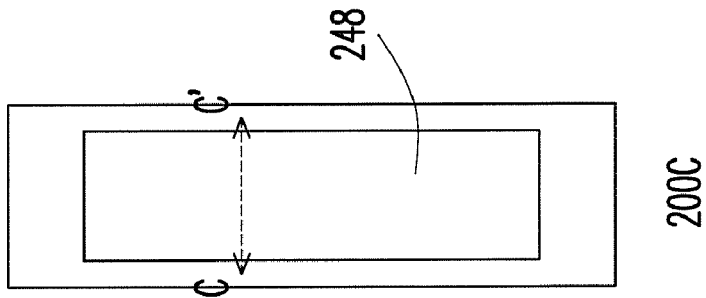
Figure 6C:
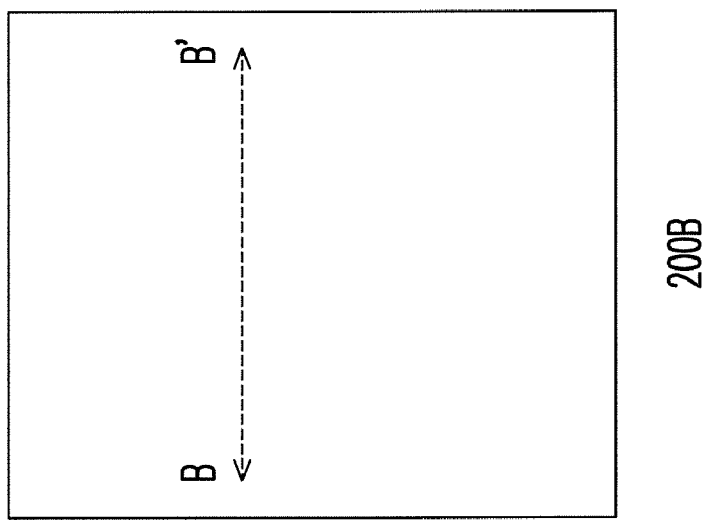
Figure 6C:
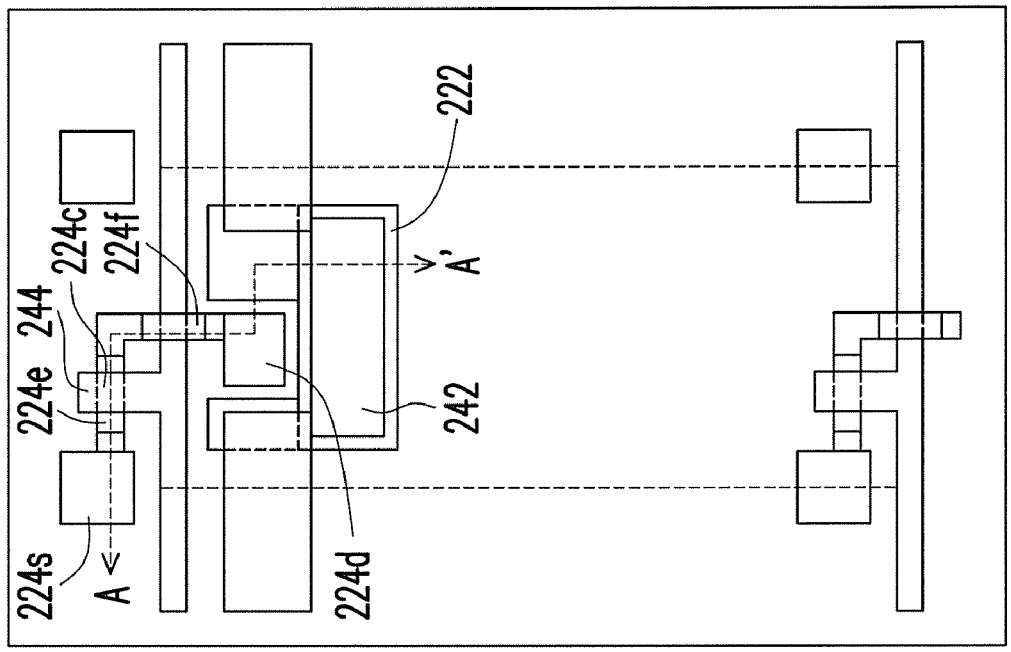
Figure 6C:
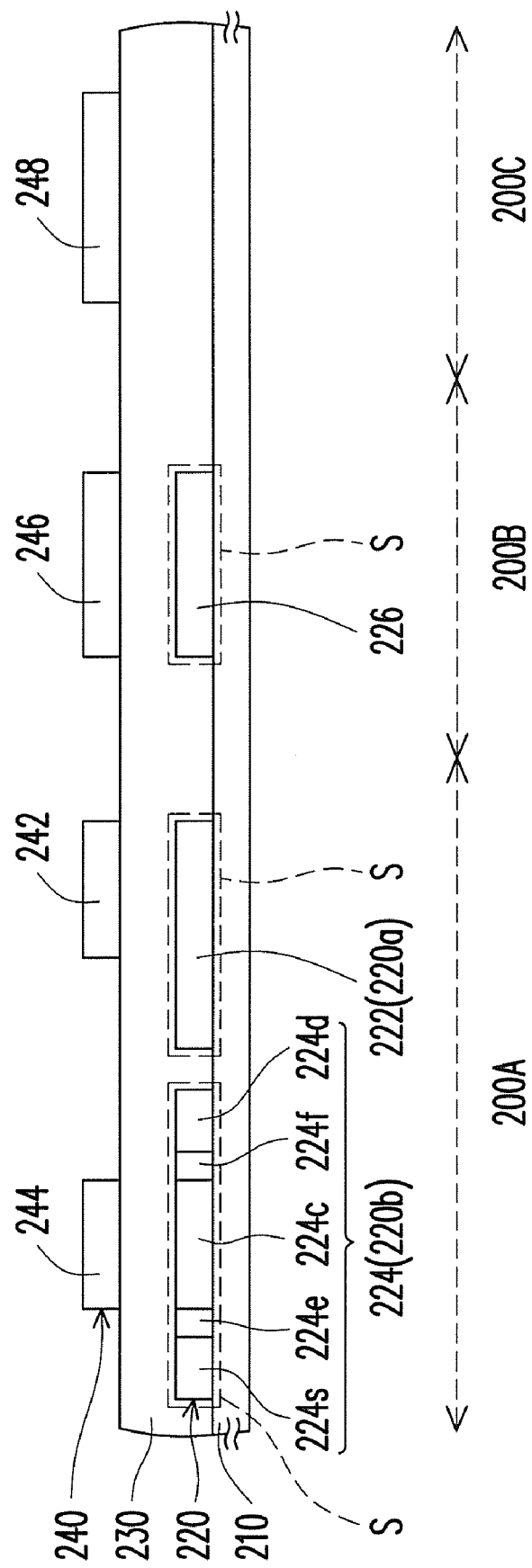
Figure 6D:
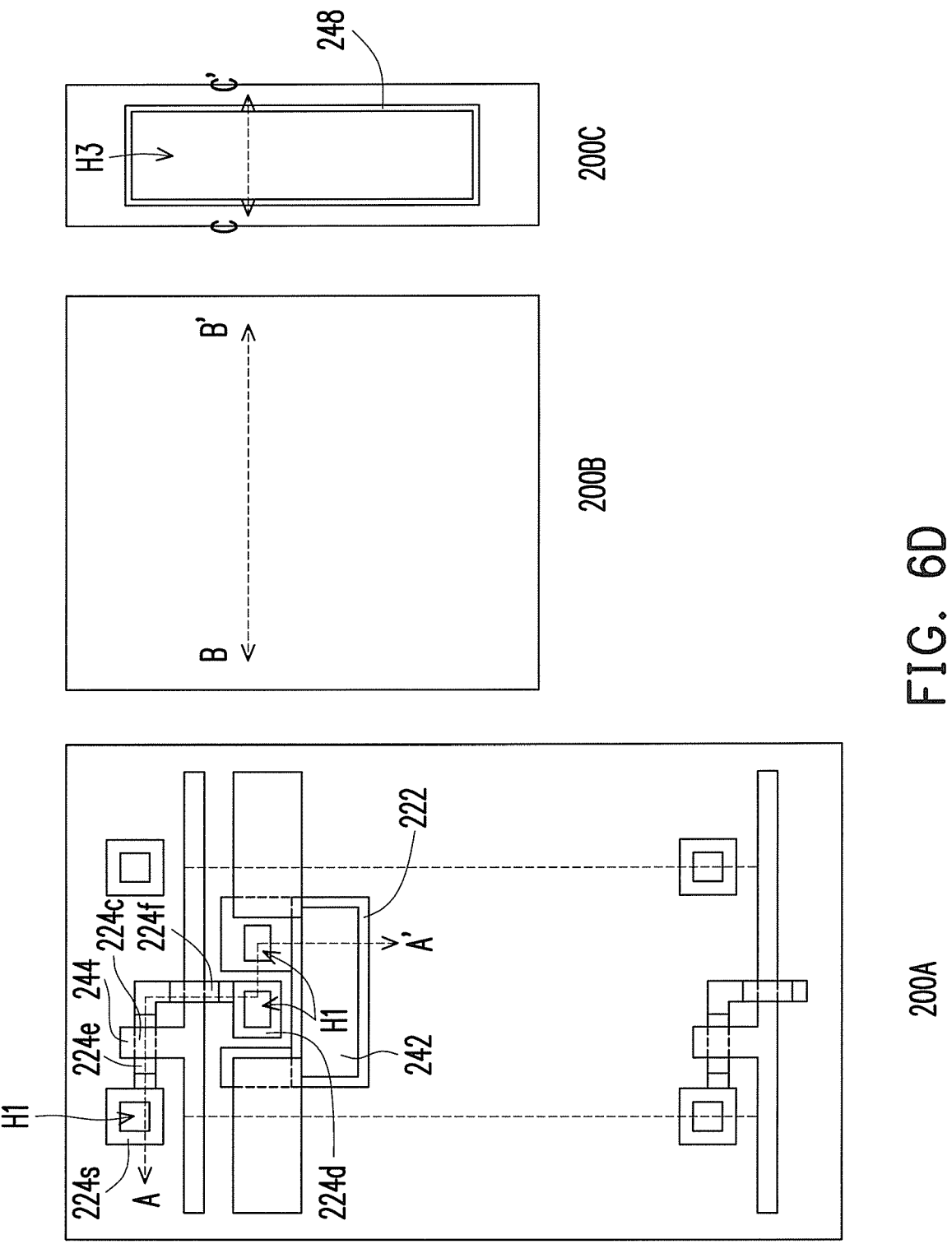
Figure 6D:
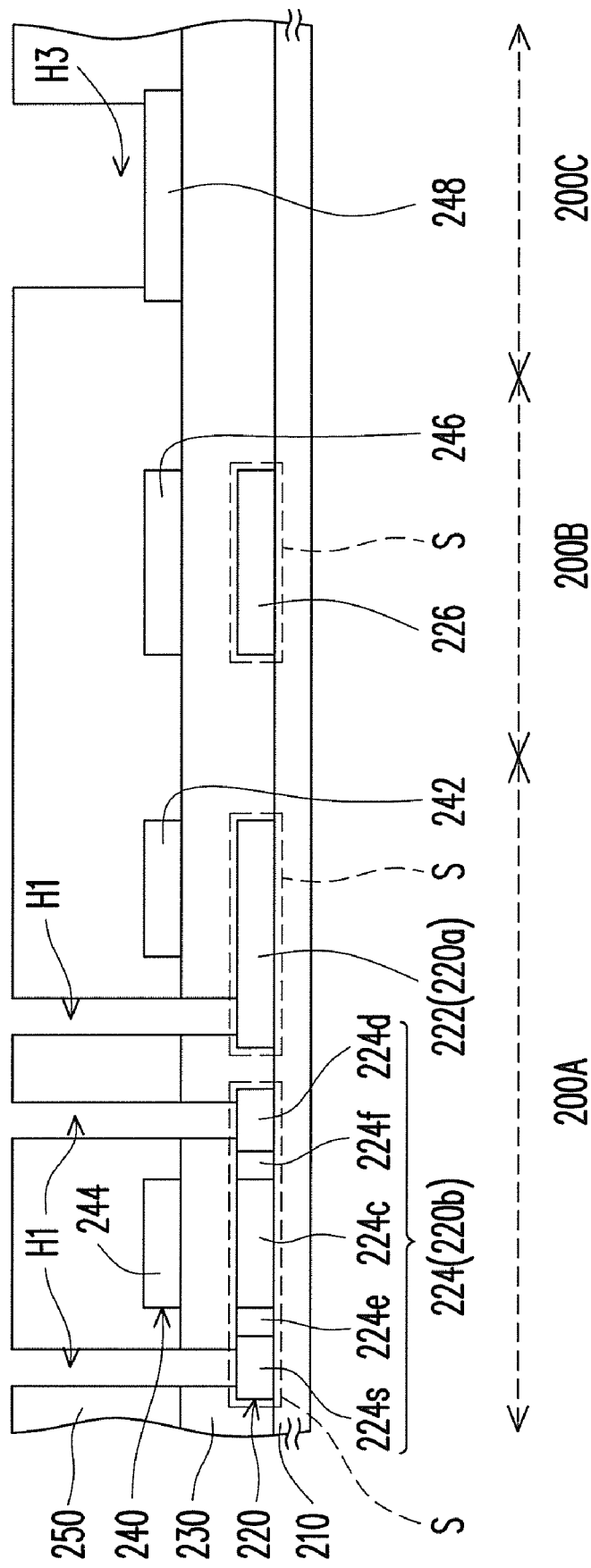

Please refer to FIGS. 6A-6G which illustrate a processing flow for fabricating the active device array substrate according to the third embodiment of the present invention. FIGS. 6A'-6G' are respective cross-sectional views along line AA' of the pixel region, line BB' of the sensing region, and line CC' of the pad region in FIGS. 6A-6G. In order to simplify the description, similarities in the processing flow of the present embodiment to the processing flows of FIGS. 2A-2G, and FIGS. 2A'-2G' will not be described repetitively.

Figure 6E:
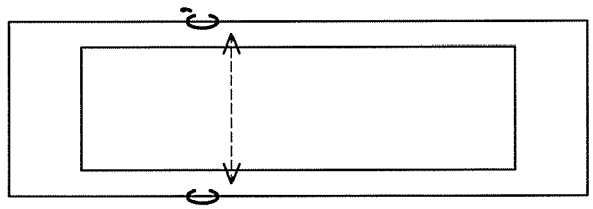
Figure 6E:
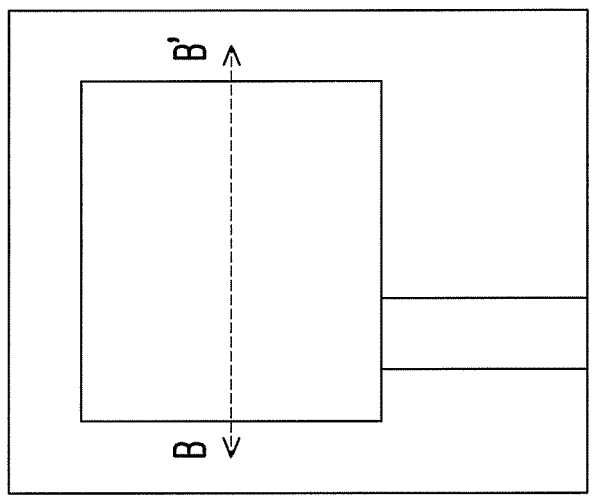
Figure 6E:
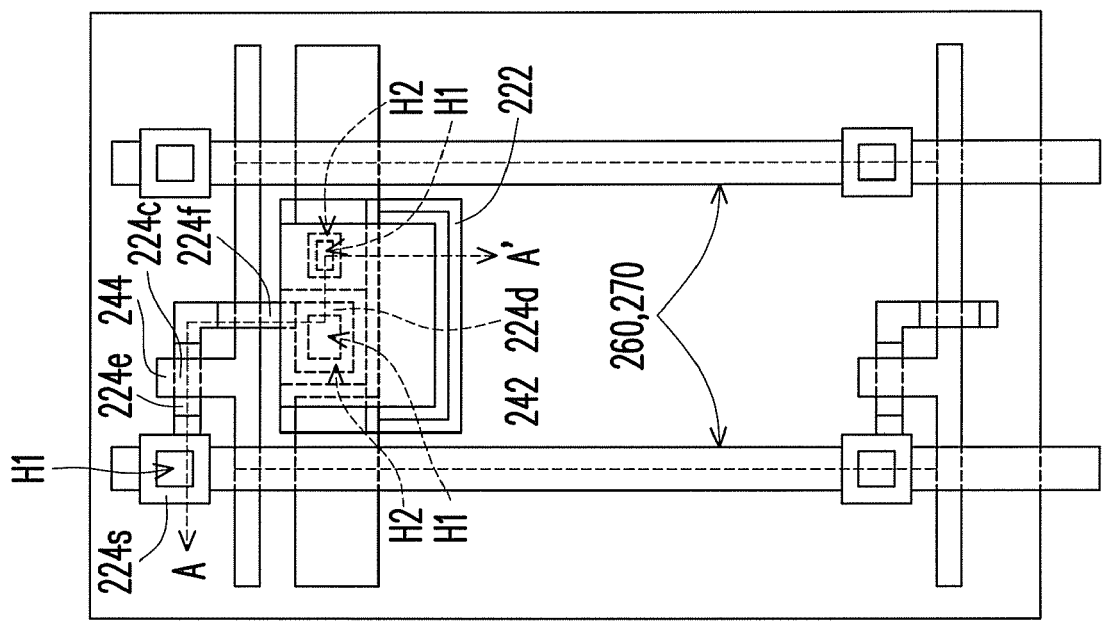
Figure 6E:
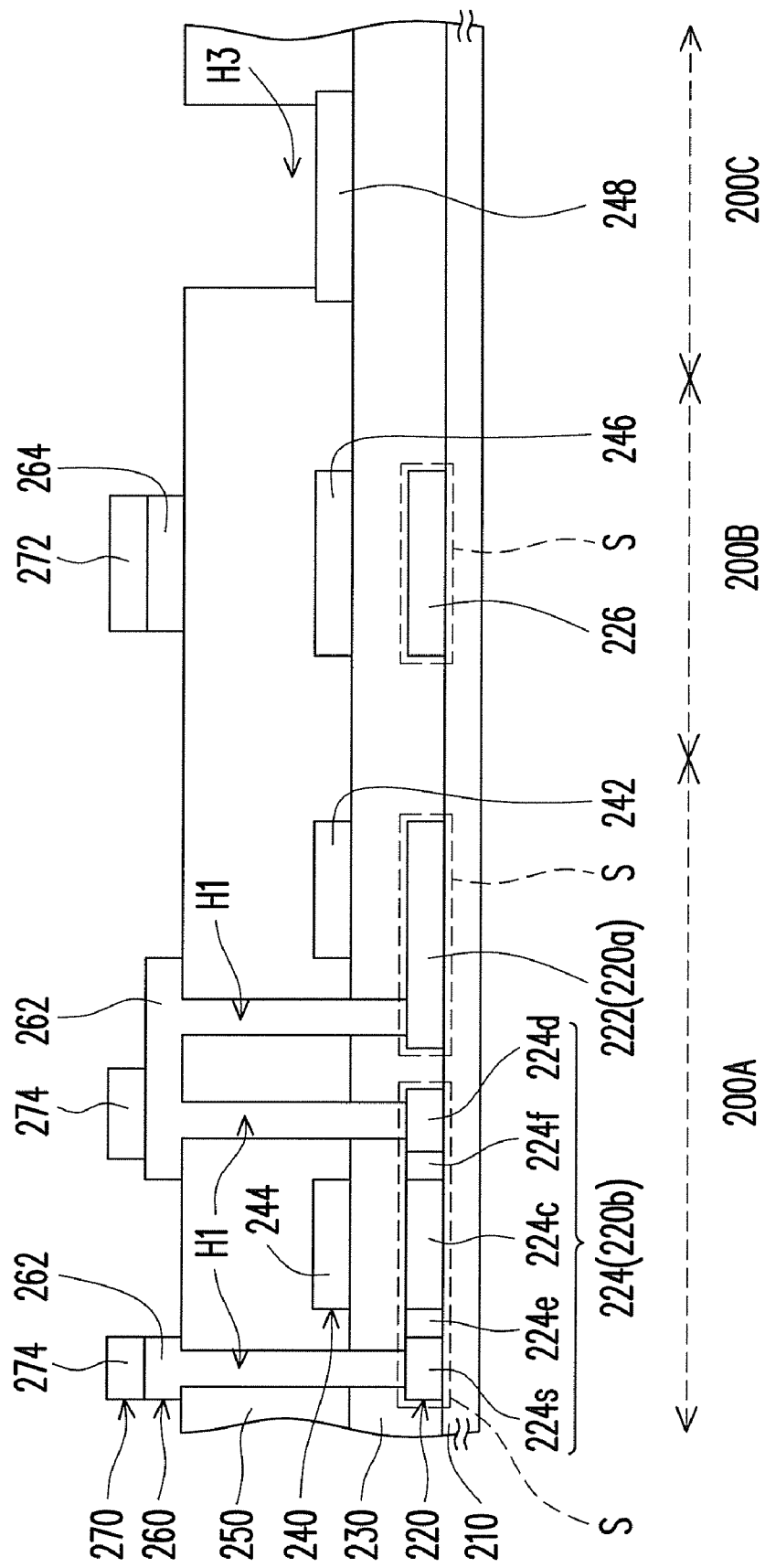

After that, as shown in FIGS. 6E and 6E', compared with the first embodiment, in the present embodiment, the contact conductors 262 are further filled into the first contact holes H1 to respectively contact the source doping region 224s, the drain doping region 224d and the storage electrode 222 at the same time of forming the second patterned conductive layer 260 and the second patterned semiconductor layer 270 simultaneously in the same photolithography and etching process, and the second patterned semiconductor layer 270 disposed over the contact conductors 262 forms the dummy semiconductor layers 274 respectively. Meanwhile, in this step, the sizes of the contact conductors 262 connected to the drain doping region 224d are larger than the sizes of the dummy semiconductor layers 274 disposed on the contact conductors 262 by using the same photolithography and etching process, wherein the photolithography and etching process is, for example, a half-tone mask photolithography and etching process or a gray-tone mask photolithography and etching process, and the detailed fabricating steps are described hereafter with reference to FIGS. 7A-7D.

Figure 6F:
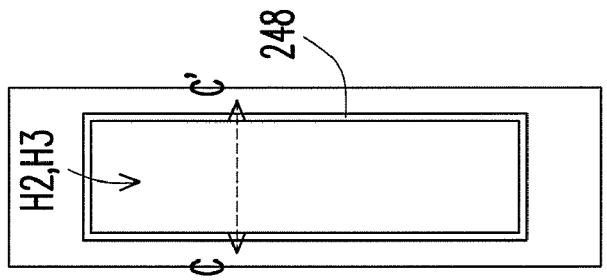
Figure 6F:
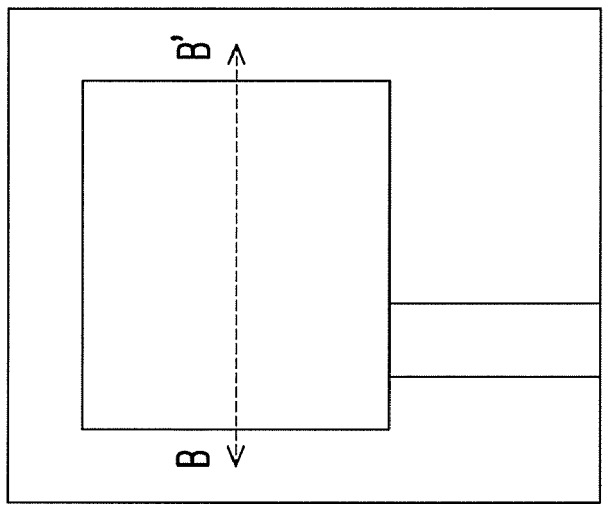
Figure 6F:
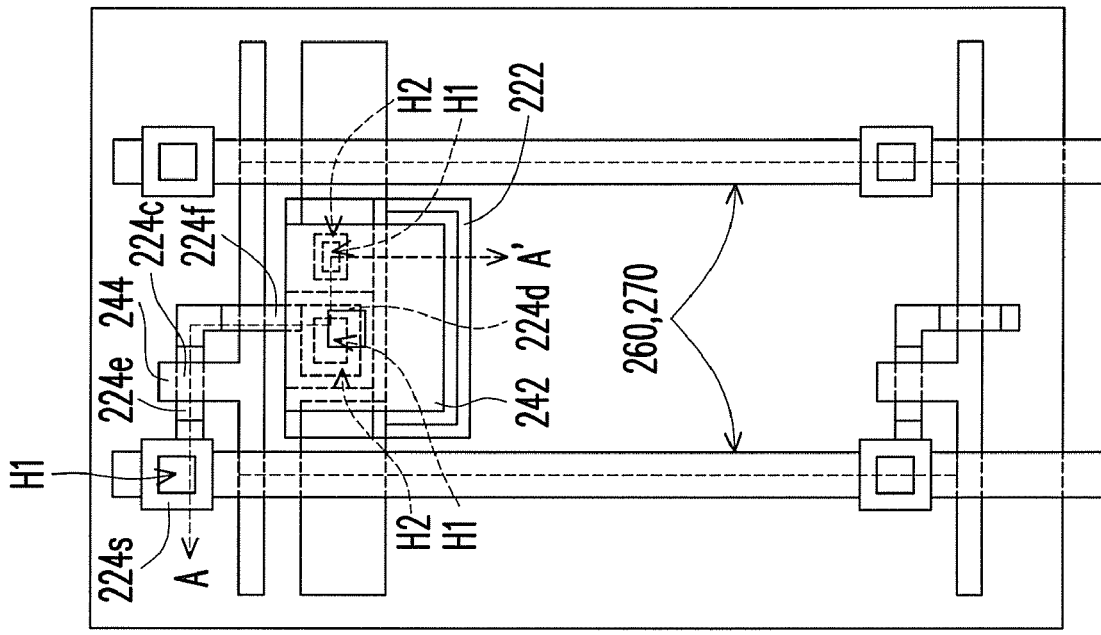
Figure 6F:
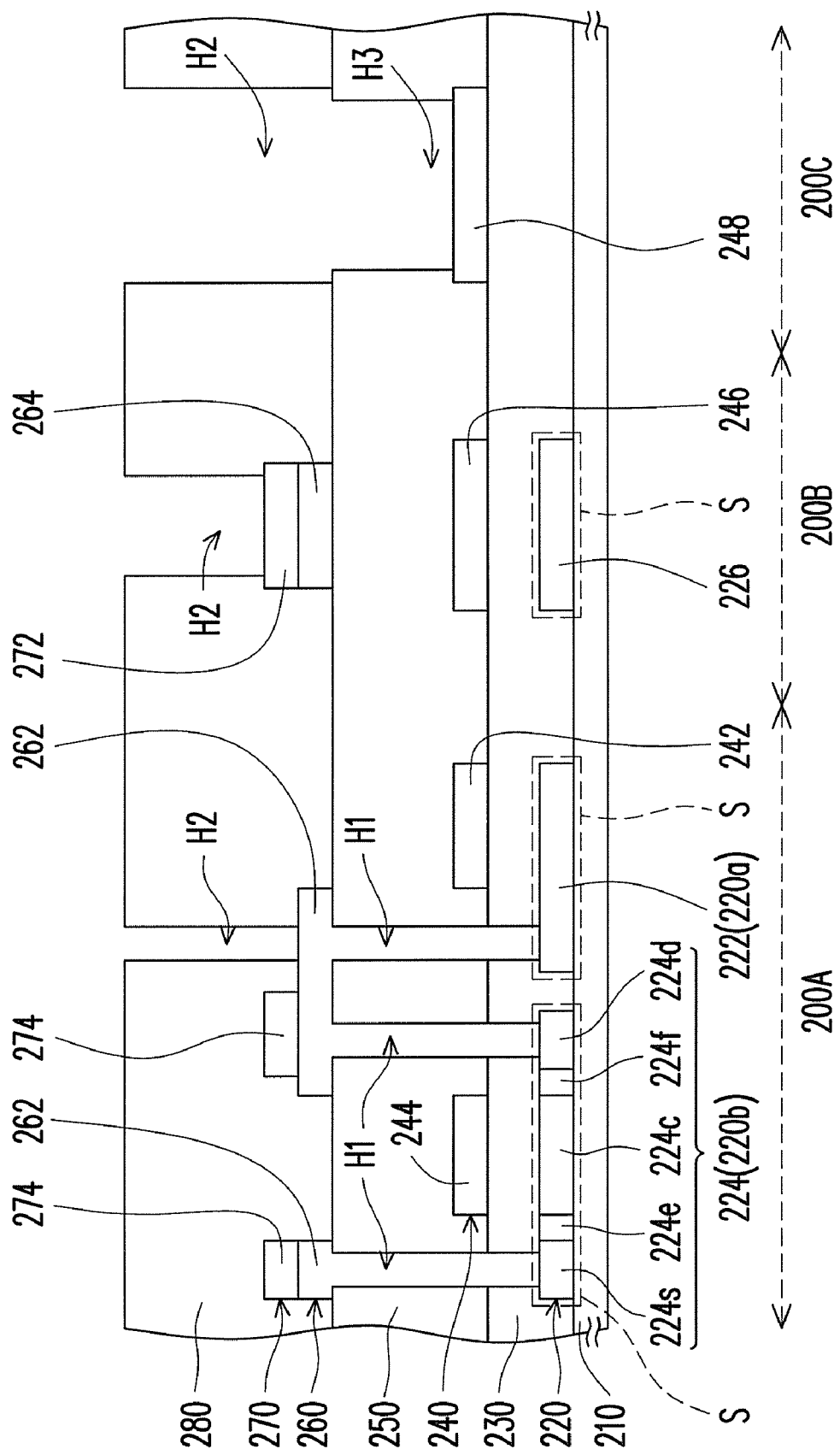
Figure 6G:
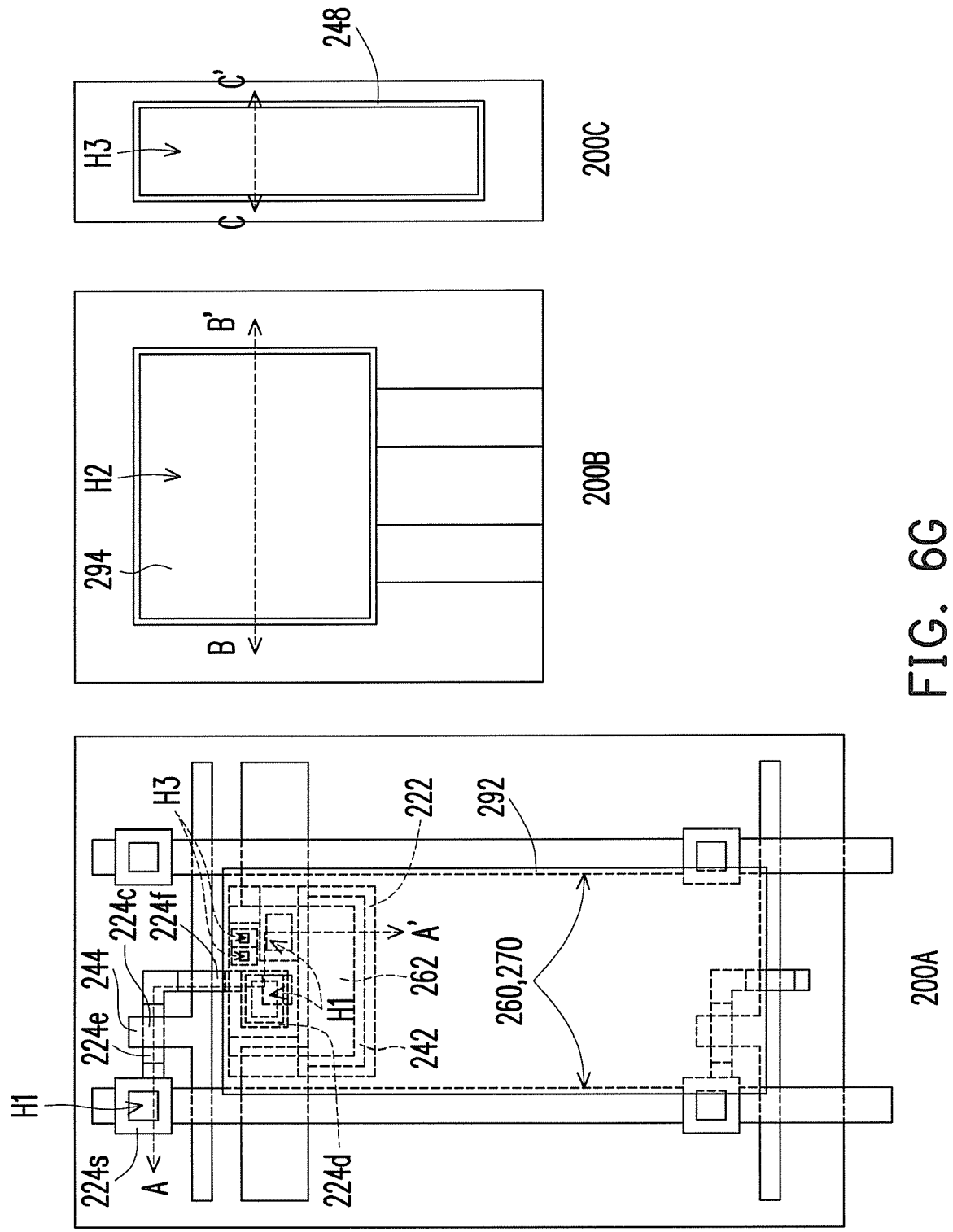
Figure 6G:
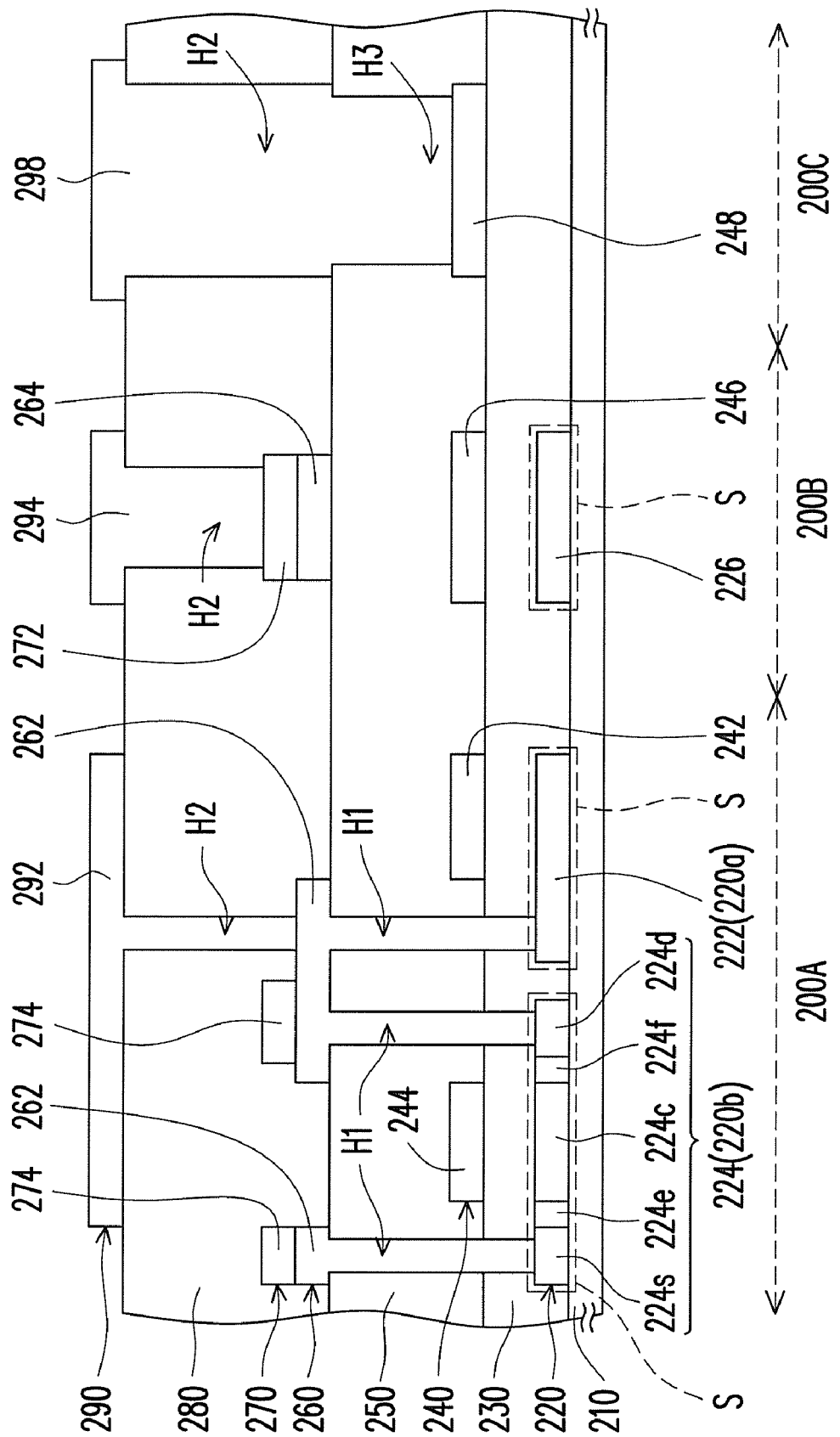

After that, as shown in FIGS. 6F and 6F', compared with the first embodiment, in the present embodiment, a portion of the second contact holes H2 in the second dielectric layer 280 is correspondingly formed over the contact conductors 262 filled into the first contact holes H1. Moreover, since a portion of the contact conductors 262 is not covered by the dummy semiconductor layer 274, the second contact holes H2 expose the contact conductors 262 connected to the drain doping region 224d and the storage electrode 222. Thereafter, as shown in FIGS. 6G and 6G', in the present embodiment, in the step of forming the third patterned conductive layer 290, a portion of the third patterned conductive layer 290 serving as the pixel electrode 292 is directly connected to the contact conductors 262 through the second contact holes H2, and the pixel electrode 292 is electrically connected to the drain doping region 224d and the storage electrode 222 through the contact conductors 262.

Figure 7A:
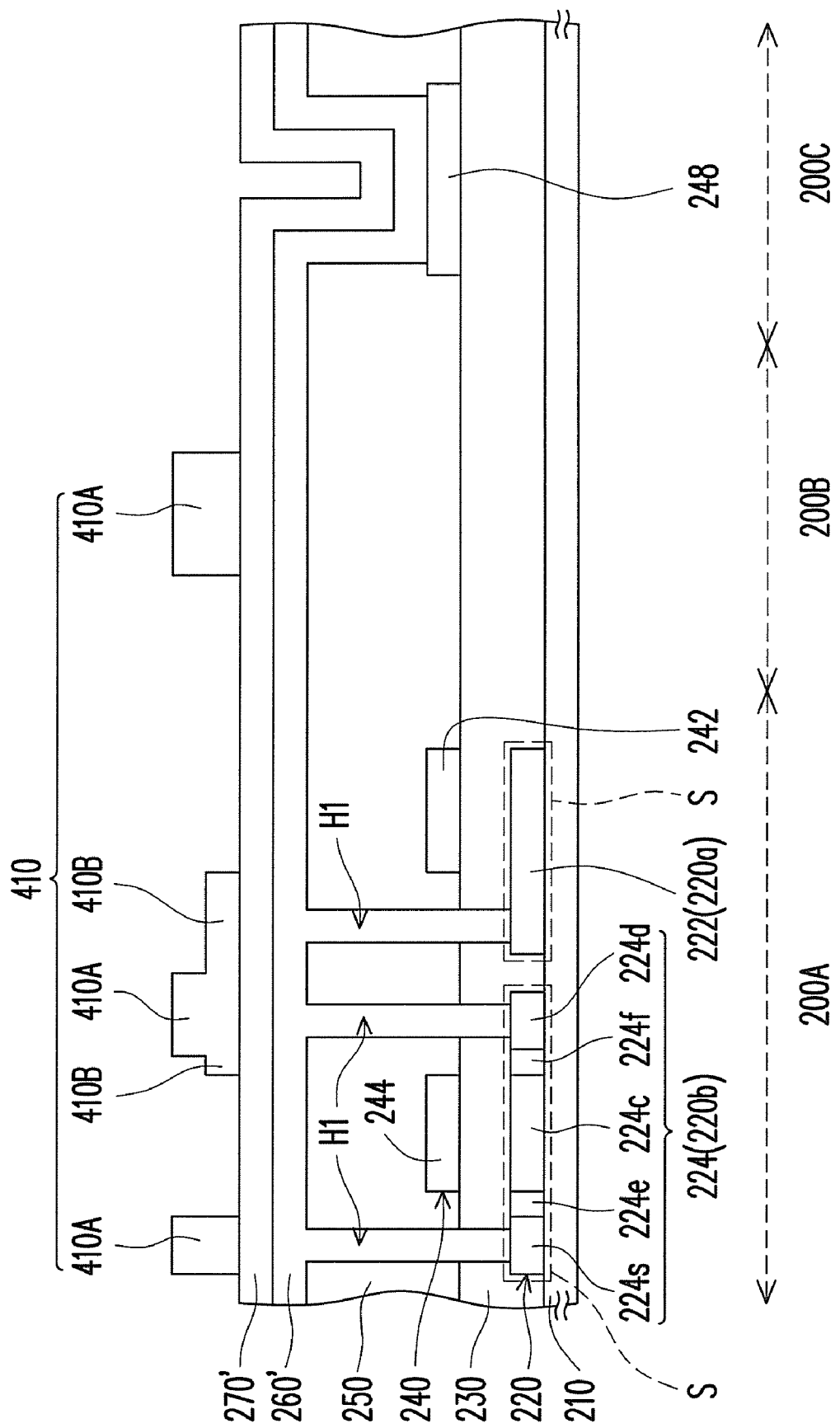
FIGS. 7A-7D illustrate a processing flow for forming the second patterned conductive layer and the second patterned semiconductor layer.
Figure 7B:
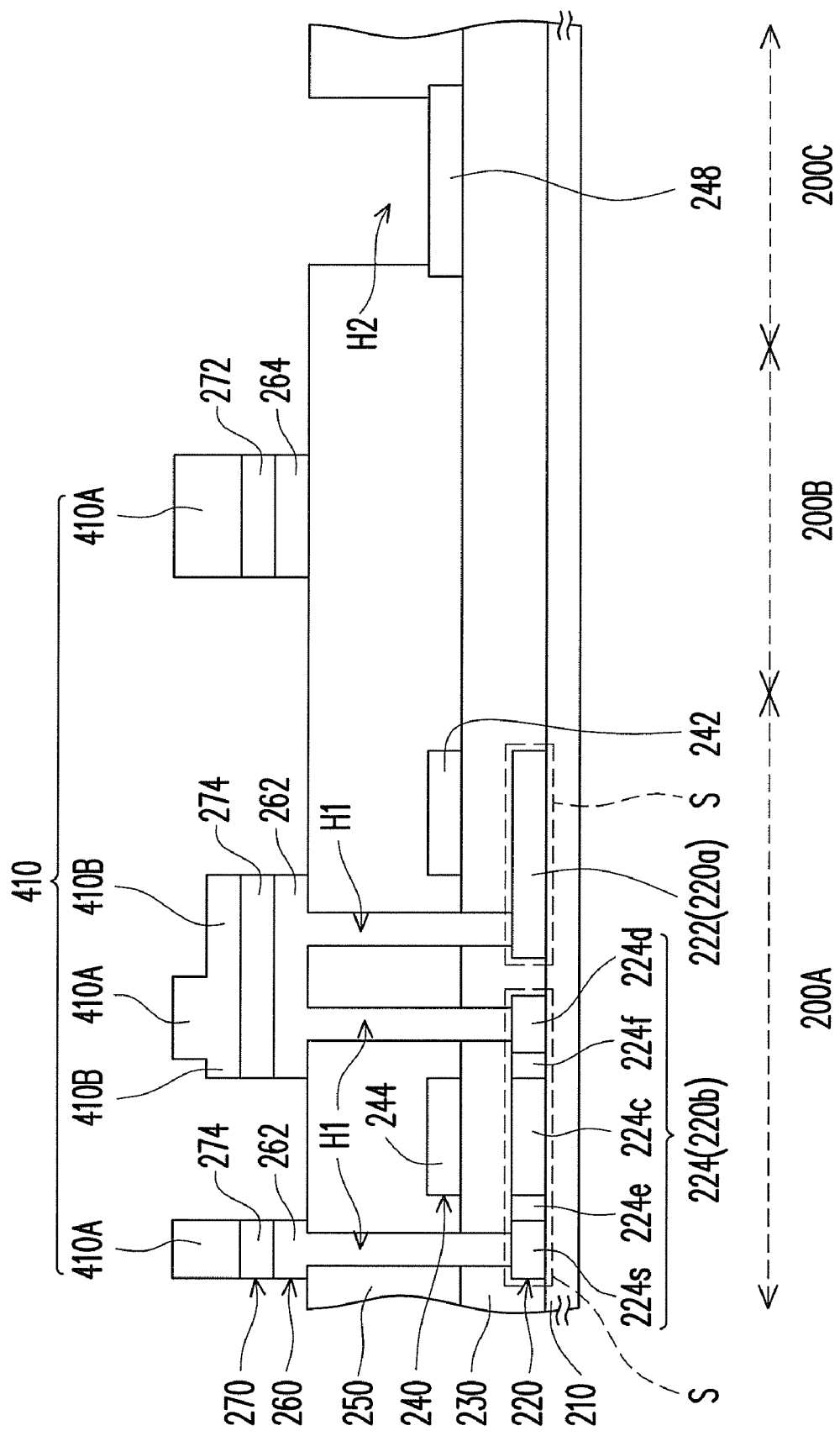

The contact conductors 262 and the dummy semiconductor layer 274 are formed, for example, by performing the half-tone mask photolithography and etching process. FIGS. 7A-7D illustrate a processing flow for forming the second patterned conductive layer and the second patterned semiconductor layer. As shown in FIG. 7A, a second conductive layer 260', a second semiconductor layer 270' and a patterned photoresist layer 410 are sequentially formed on the first dielectric layer 250, wherein the patterned photoresist layer 410 covers, for example, a portion of the second semiconductor layer, the patterned photoresist layer 410 includes a first block 410A and a second block 410B, and the first block 410A is thicker than the second block 410B. In detail, the first block 410A having a greater thickness is the patterned photoresist layer 410 disposed over the contact conductors 262 connected to the source doping region 224s. The patterned photoresist layer 410 disposed over the contact conductors 262 connected to the drain doping region 224d and the storage electrode 222 can be divided into the first block 410A and the second block 410B at two sides of the first block 410A. The first block 410A is thicker than the second block 410B. Then, as shown in FIG. 7B, by using the patterned photoresist layer 410 as the mask, an etching process is performed on the second conductive layer 260' and the second semiconductor layer 270' to form the bottom electrode 264, the active layer 272, the contact conductors 262, and the dummy semiconductor layer 274.

Figure 7C:
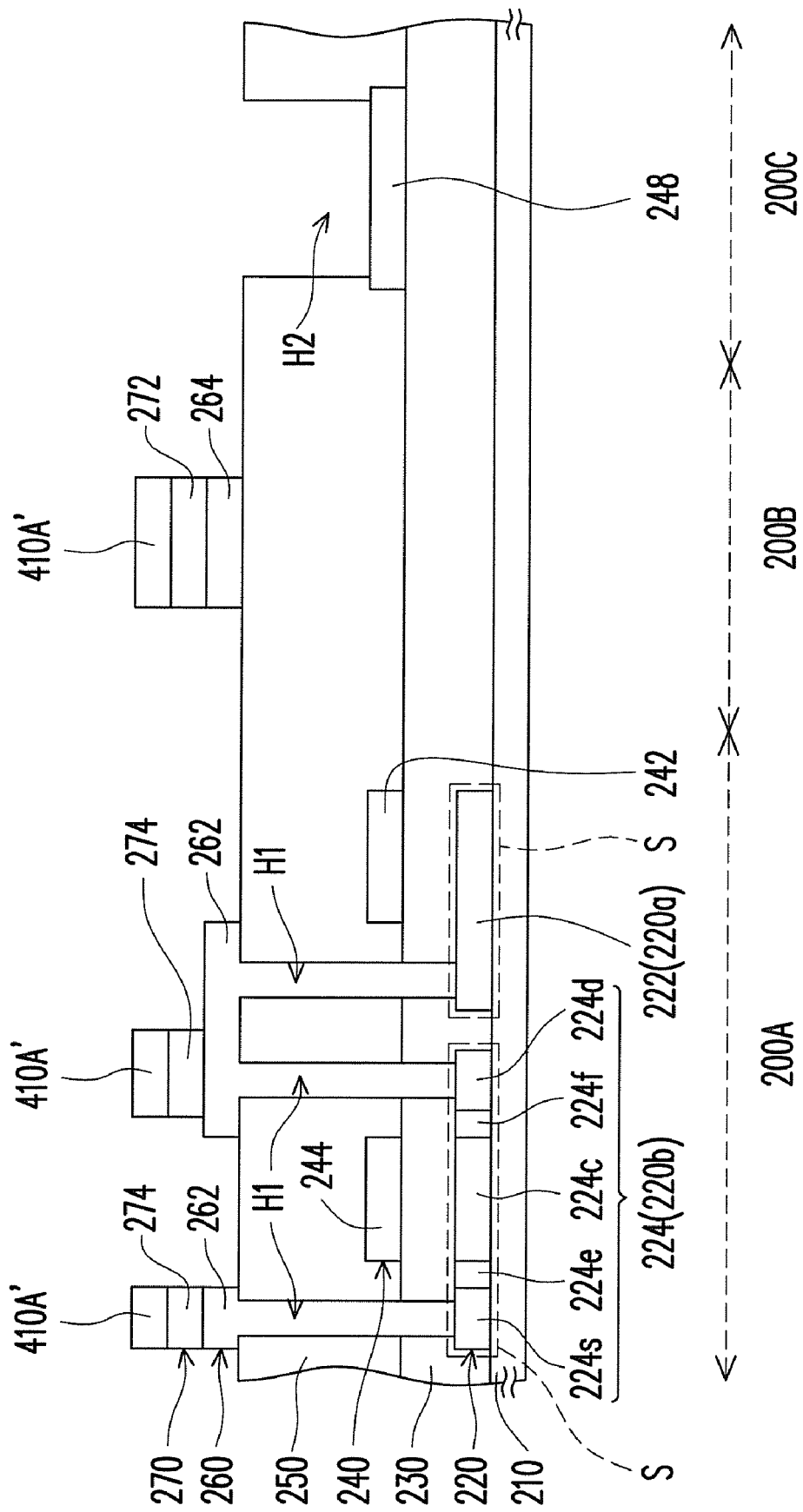
Figure 7D:
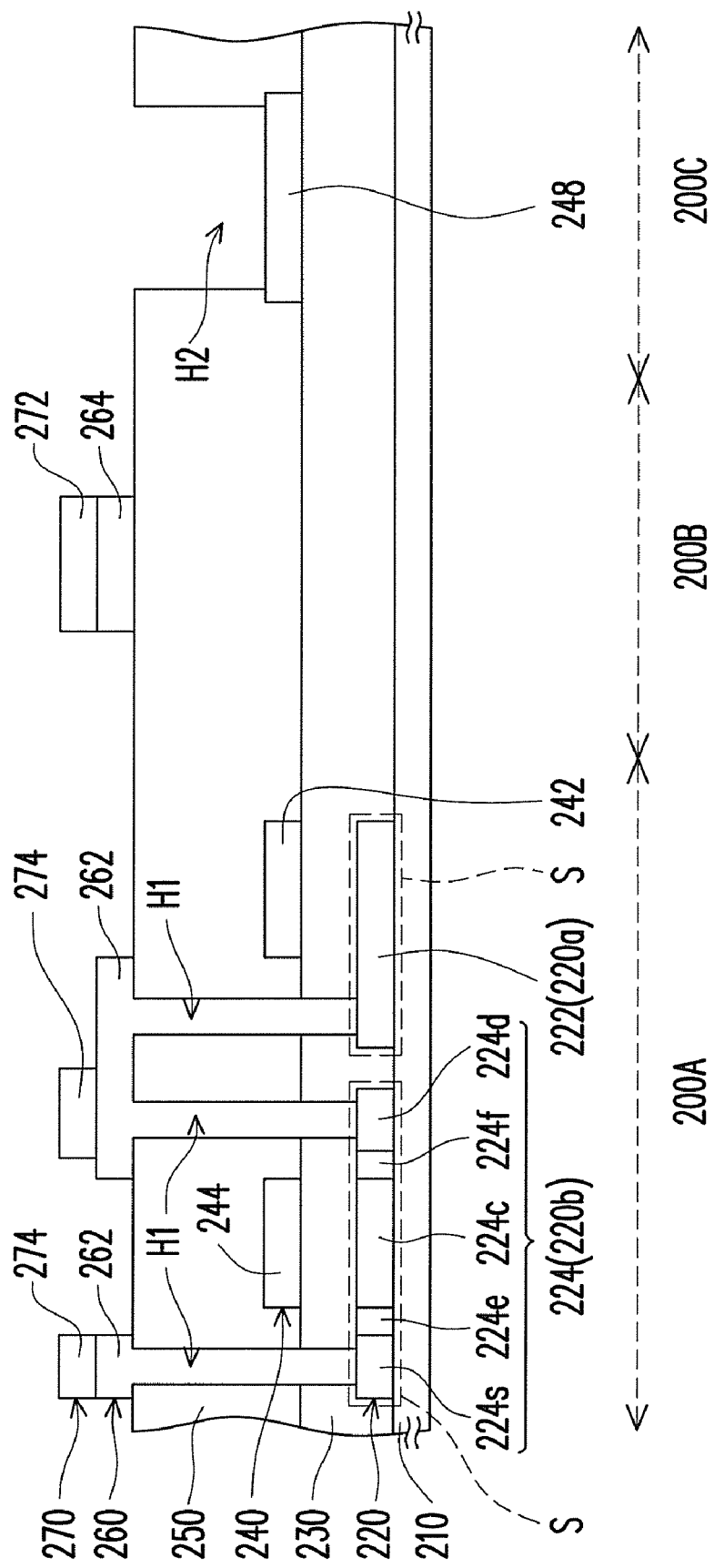

Then, as shown in FIG. 7C, the thickness of the patterned photoresist layer 410 is reduced until the second block 410B is completely removed. A method for reducing the thickness of the patterned photoresist layer 410 includes performing an ashing process, for example. Moreover, after the second block 410B is completely removed, an etching process is performed on a portion of the dummy semiconductor layers 274 by using the remained first block 410A' as the mask. Following that, as shown in FIG. 7D, a photoresist layer removing process is performed to remove the remained first block 410A' to form the structure shown in FIG. 6E, i.e., the sizes of a portion of the contact conductors 262 are larger than the sizes of the dummy semiconductor layers 274 disposed thereon.

Figure 6H:
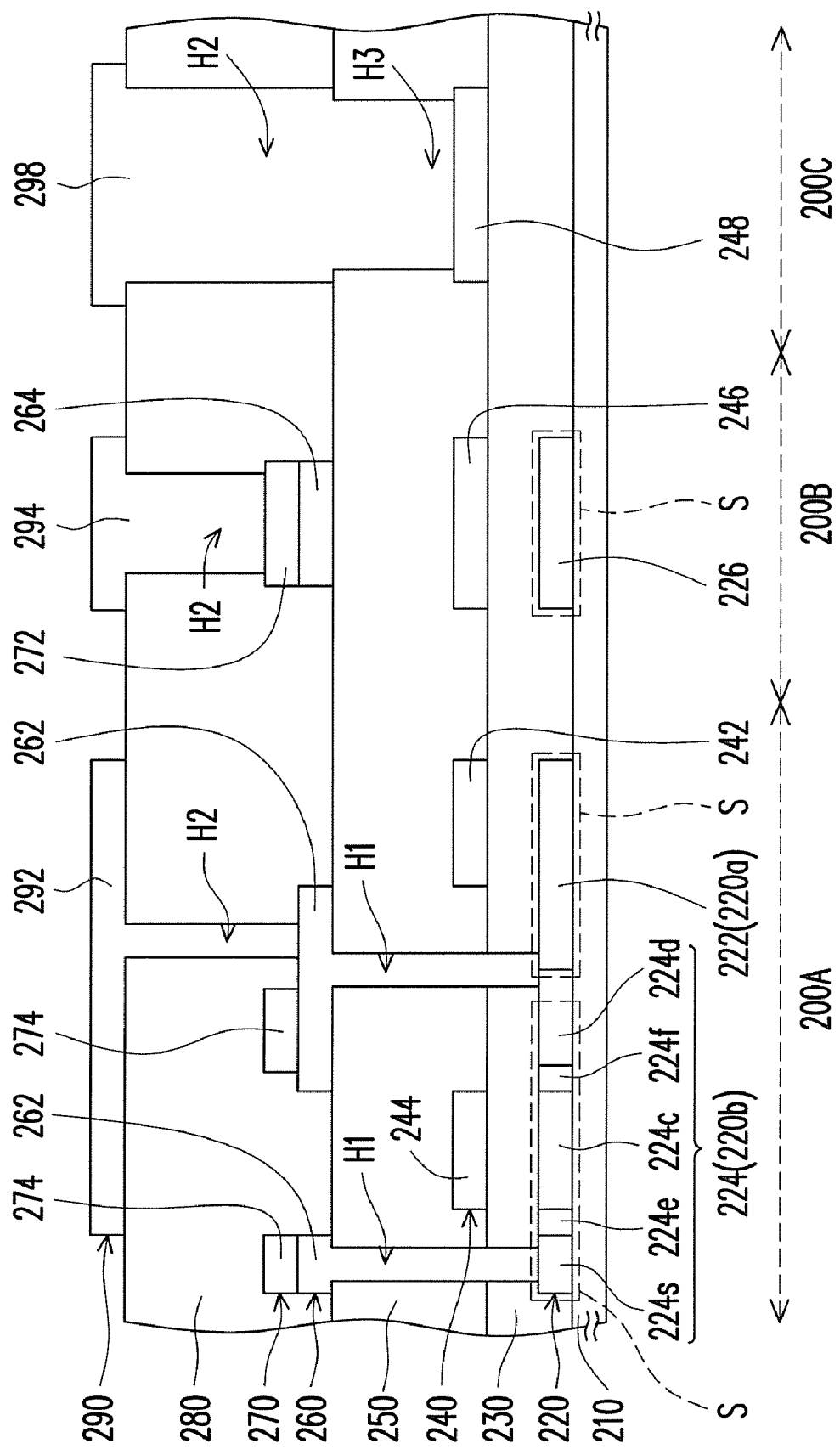
FIG. 6H is a schematic view illustrating another active device array substrate according to the third embodiment of the present invention.

FIG. 6H is a schematic view illustrating another active device array substrate according to the third embodiment of the present invention. Referring to FIG. 6H, a portion of the first type doping region 220a and the second type doping region 220b in the active device array substrate are in contact with each other. A contact interface is disposed between the first type doping region 220a and the second type doping region 220b. A portion of the first contact holes H1 exposes the contact interface. In other words, the first contact holes H1 expose both the first type doping region 220a and the second type doping region 220b at the same time, so that the contact conductor 262 electrically connected to the pixel electrode 292 is directly connected to the first type doping region 220a and the second type doping region 220b simply through a first contact hole H1.

Similar to the foregoing embodiments, in the third embodiment, seven photolithography and etching processes are also used to fabricate the active device array substrate 400 having the photo sensor. Thereby, the active device array substrate 400 according to the present embodiment also may reduce the process time and process cost.

Fourth Embodiment

Figure 8:
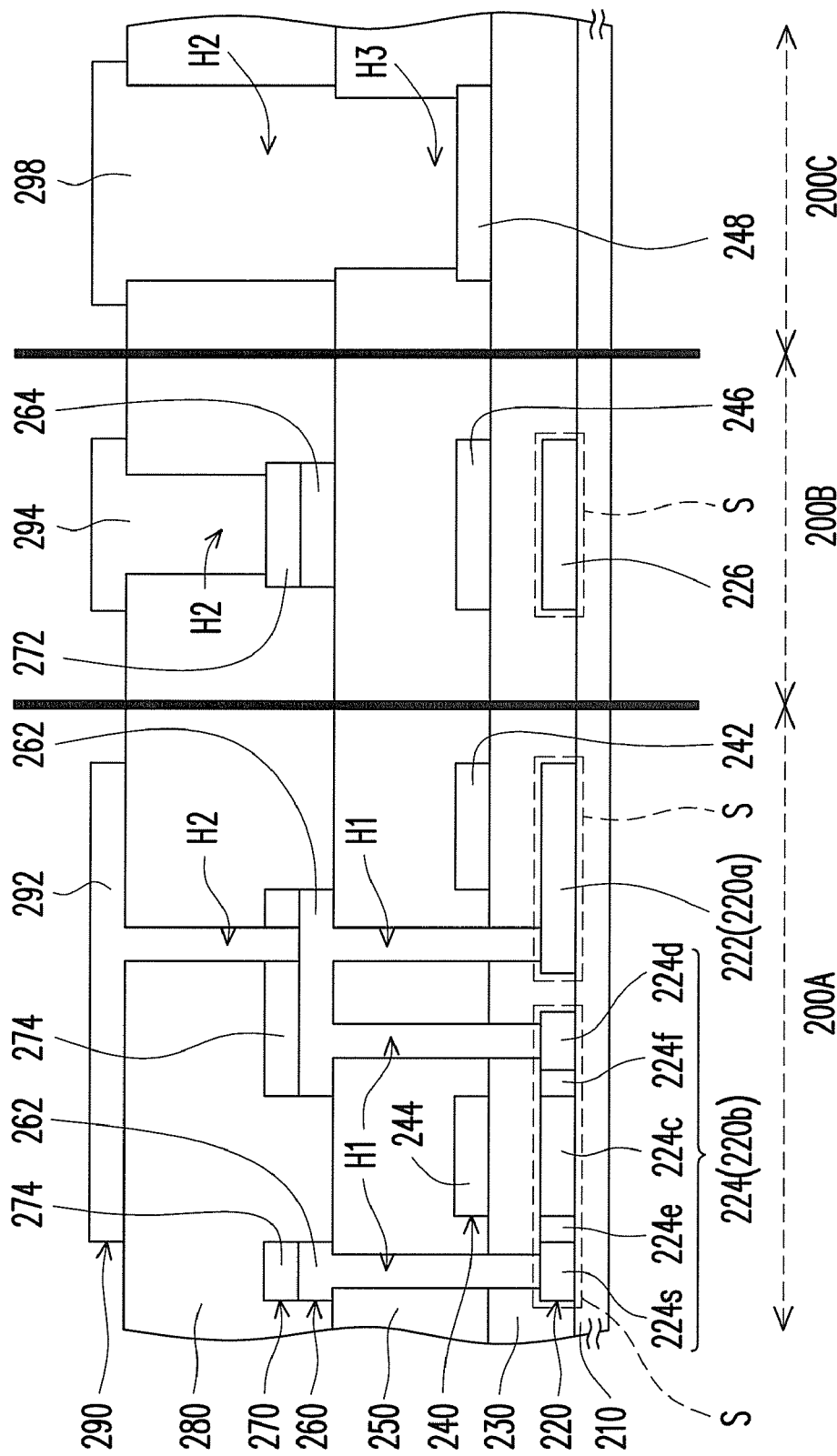
FIG. 8 illustrates an active device array substrate according to a fourth embodiment of the present invention.

FIG. 8 illustrates an active device array substrate according to a fourth embodiment of the present invention. Referring to FIG. 8, the active device array substrate of the present embodiment is similar to the active device array substrate 400 of the third embodiment, wherein the third patterned conductive layer 290 serving as the pixel electrode 292 in the pixel region 200A is electrically connected to the first patterned semiconductor layer 220 through a portion of the second contact holes and the second patterned conductive layer 260. However, compared with the third embodiment, in the active device array substrate 500 of the present embodiment, in addition to passing through the second contact hole H2 of the second dielectric layer 280, the pixel electrode 292 also passes through the dummy semiconductor layer 274 nearby such that the pixel electrode 292 to couple downward with the contact conductor 262 of the second patterned conductive layer 260, so as to be electrically connected to the drain doping region 224d and the storage electrode 222. Moreover, according to the present embodiment, the sizes of the dummy semiconductor layers 274 are, for example, substantially equal to the sizes of the contact conductors 262, as shown in FIG. 8. In other words, the edges of the dummy semiconductor layer 274 substantially are flush with the edges of the contact conductors 262.

In detail, compared with the third embodiment, in the present embodiment, the dummy semiconductor layers 274 are directly stacked on the contact conductors 262. By performing a proper patterning process detailed hereafter, the second contact holes H2 in the second dielectric layer 280 directly passes through the dummy semiconductor layer 274 to expose a portion of the contact conductors. Therefore, as shown in FIG. 8, a portion of the third patterned conductive layer 290 serving as the pixel electrode 292 can pass through the second dielectric layer 280 and the dummy semiconductor layers 274 through the second contact holes H2 to contact the contact conductors 262 directly, so that the pixel electrode 292 is connected to the first patterned semiconductor layer 220 through the second contact holes H2 and the contact conductors 262, wherein the first patterned semiconductor layer 220 electrically connected to the pixel electrode 292 is, for example, the drain doping region 224d of the active device and the storage electrode 222 of the storage capacitor.

Therefore, according to the present embodiment, the data voltage in the drain doping region 224d of the active device is transmitted to the pixel electrode 292, used for display, through the contact conductors 262 of the second patterned conductive layer 260 and by passing through the second patterned semiconductor layer 270 and the second contact holes H2. Furthermore, according to the present embodiment, the storage electrode 222, the gate insulator 230, the storage electrode 242, the first dielectric layer 250, the second dielectric layer 280 and the pixel electrode 292 together form a storage capacitor having a multi-layered structure. Depending on the requirement of actual design in panel, the storage capacitor may be designed as a single-layered structure or a multi-layered structure.

To better explain the technical content of the present invention, the following description in association with the accompanied drawings further illustrates the method for fabricating active device array substrate 500 according to the fourth embodiment of the present invention.

Figure 9A:
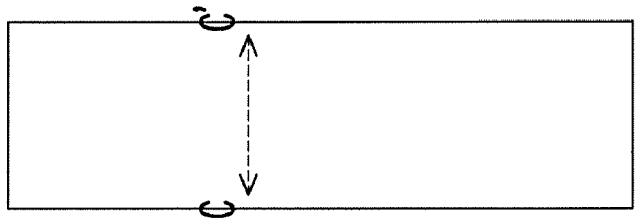
FIGS. 9A-9G illustrate a processing flow for fabricating the active device array substrate according to the third embodiment of the present invention.
Figure 9A:
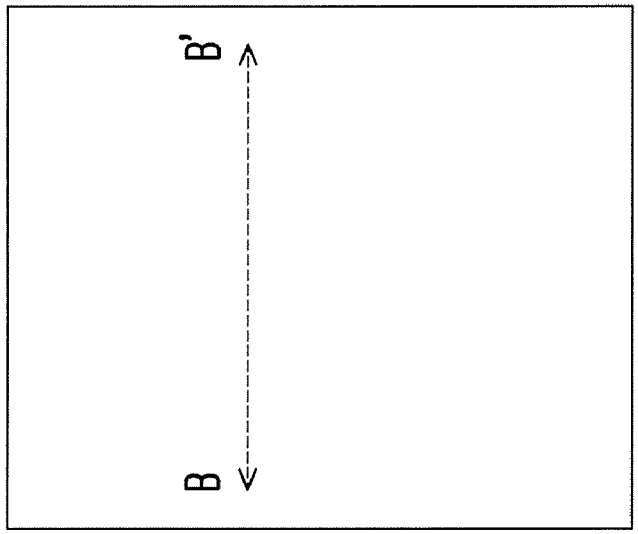
Figure 9A:
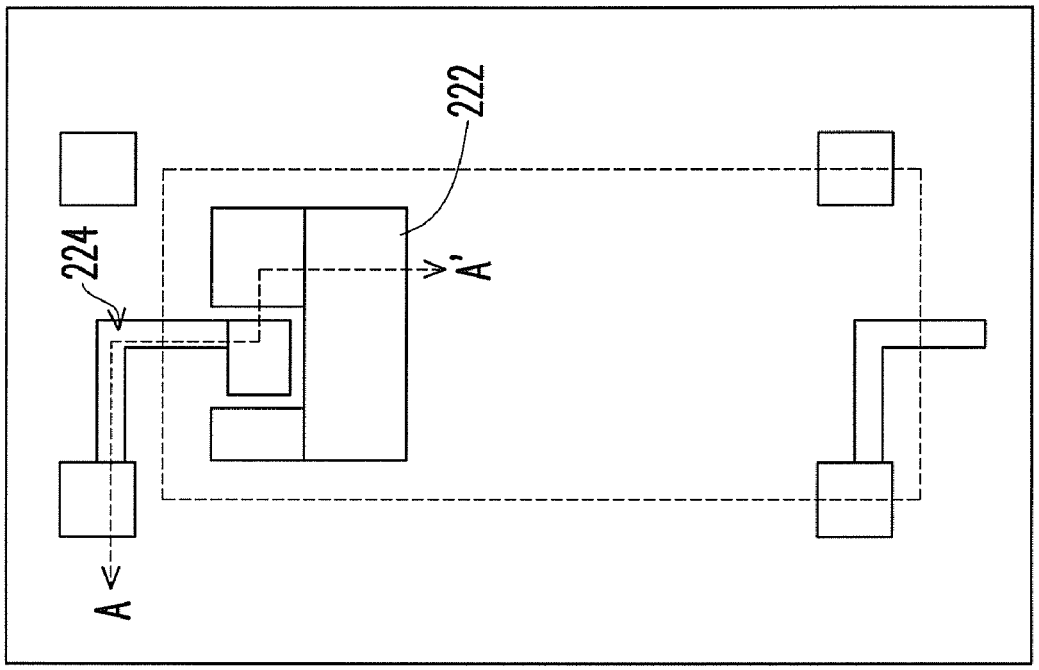
Figure 9A:
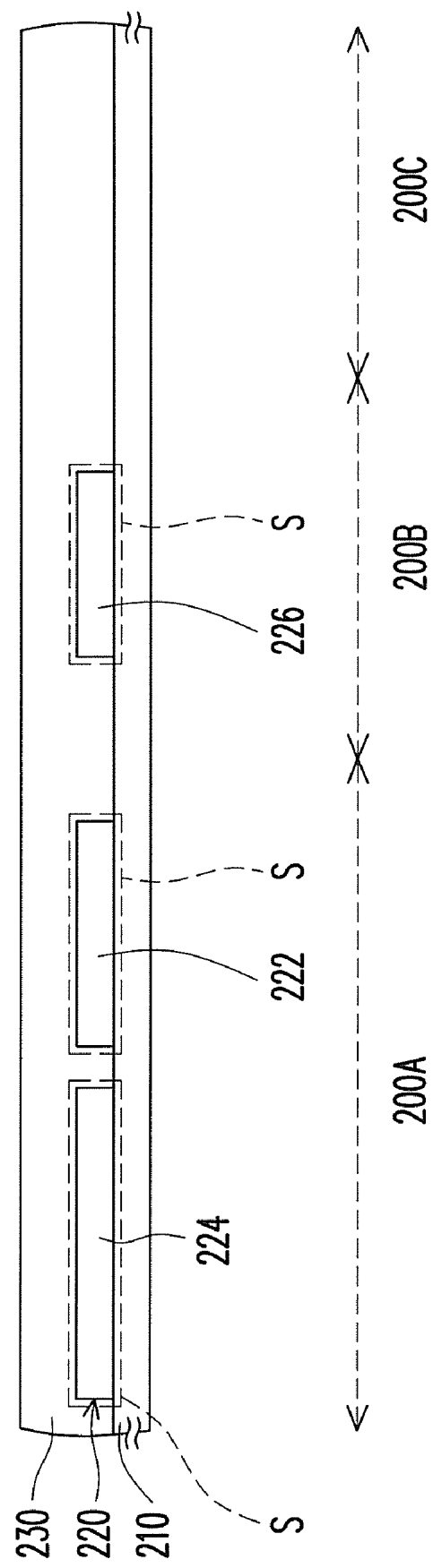
Figure 9B:
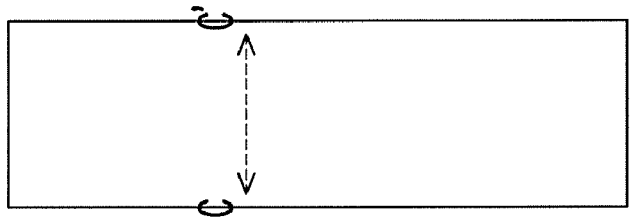
Figure 9B:
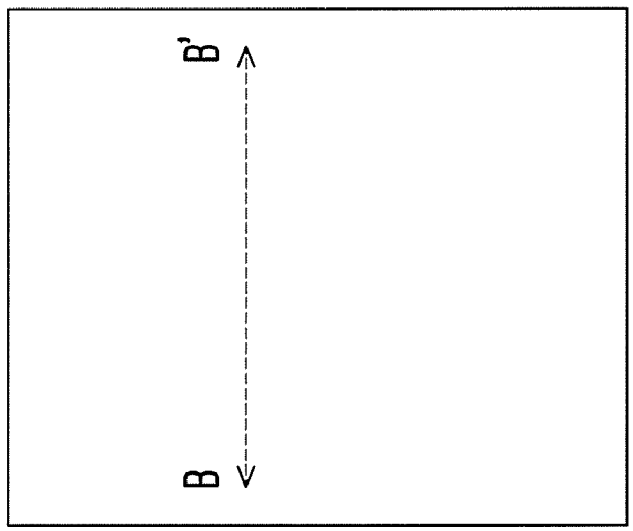
Figure 9B:
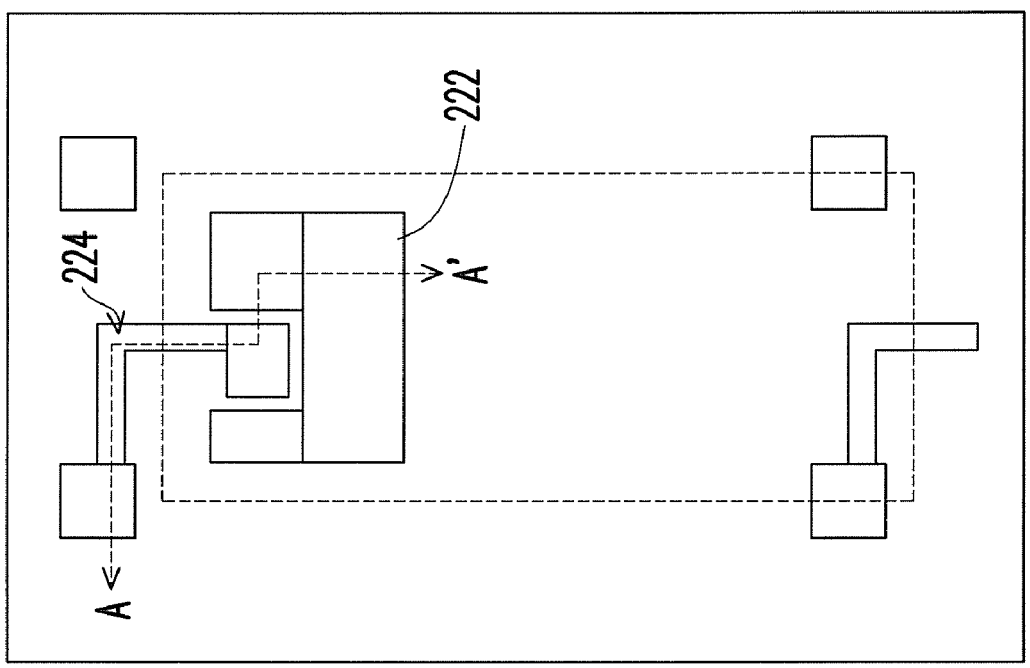
Figure 9B:
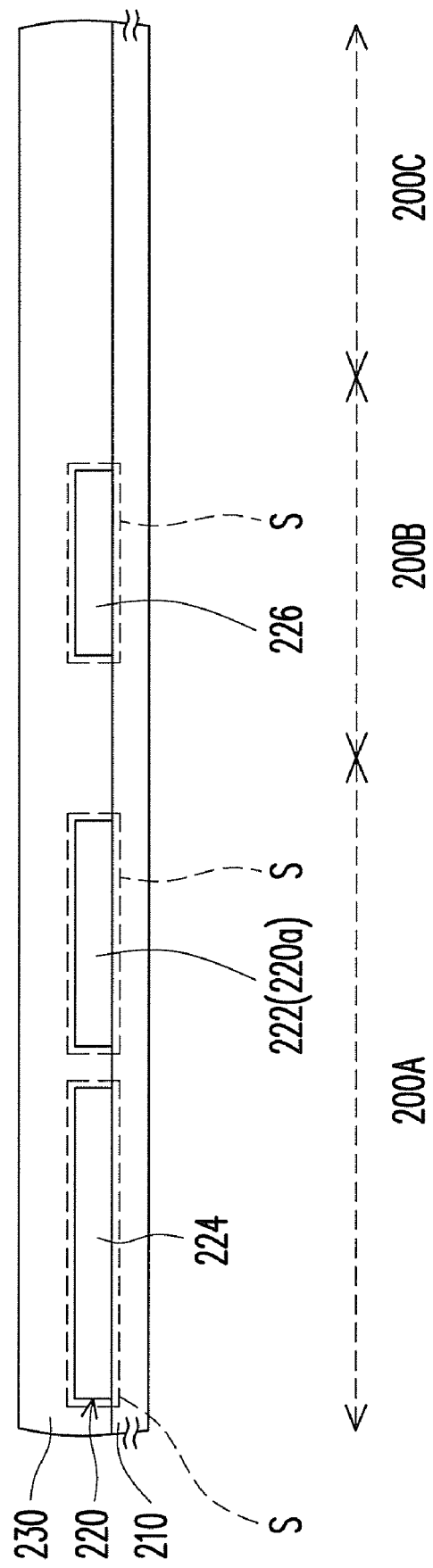
Figure 9C:
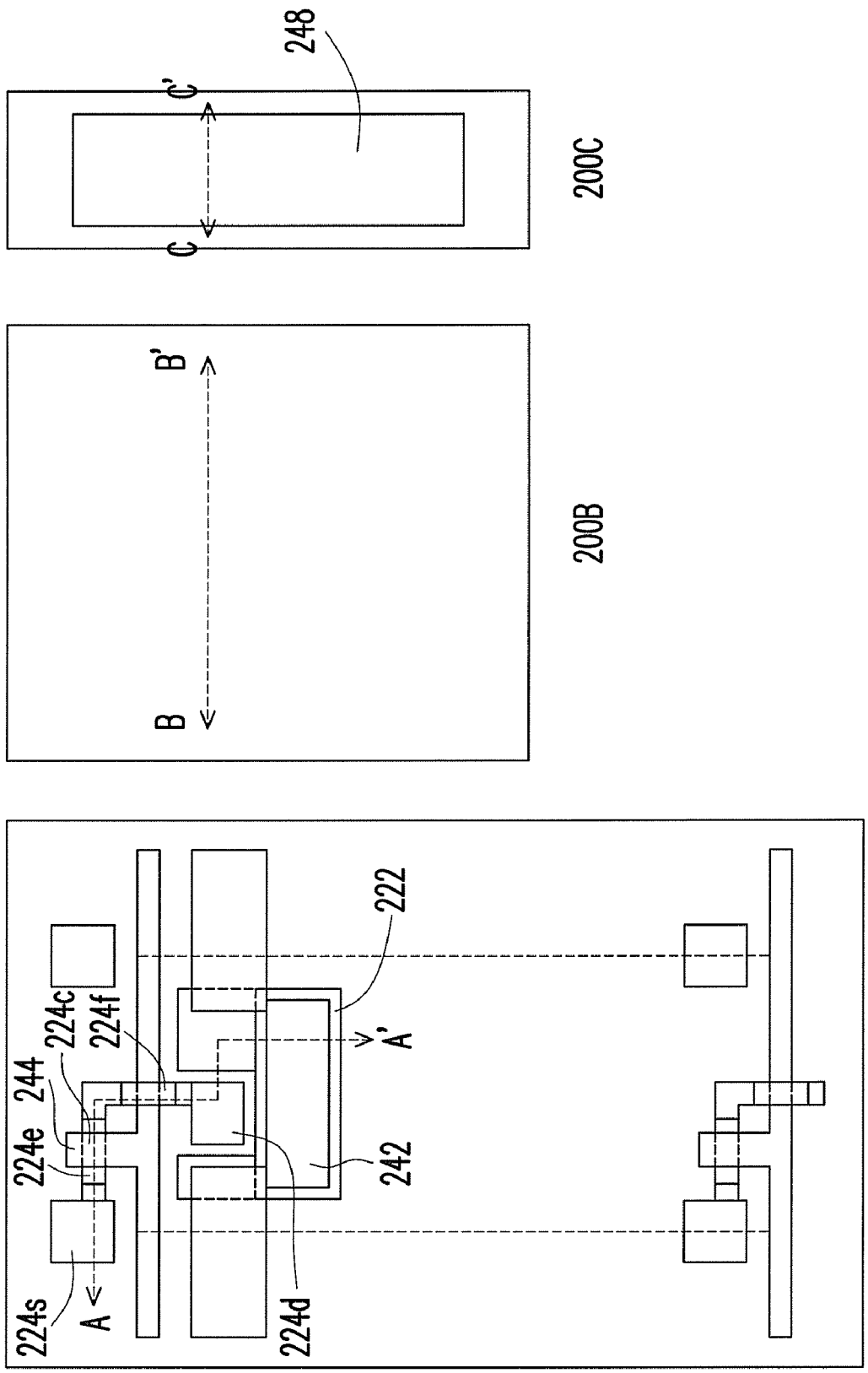
Figure 9C:
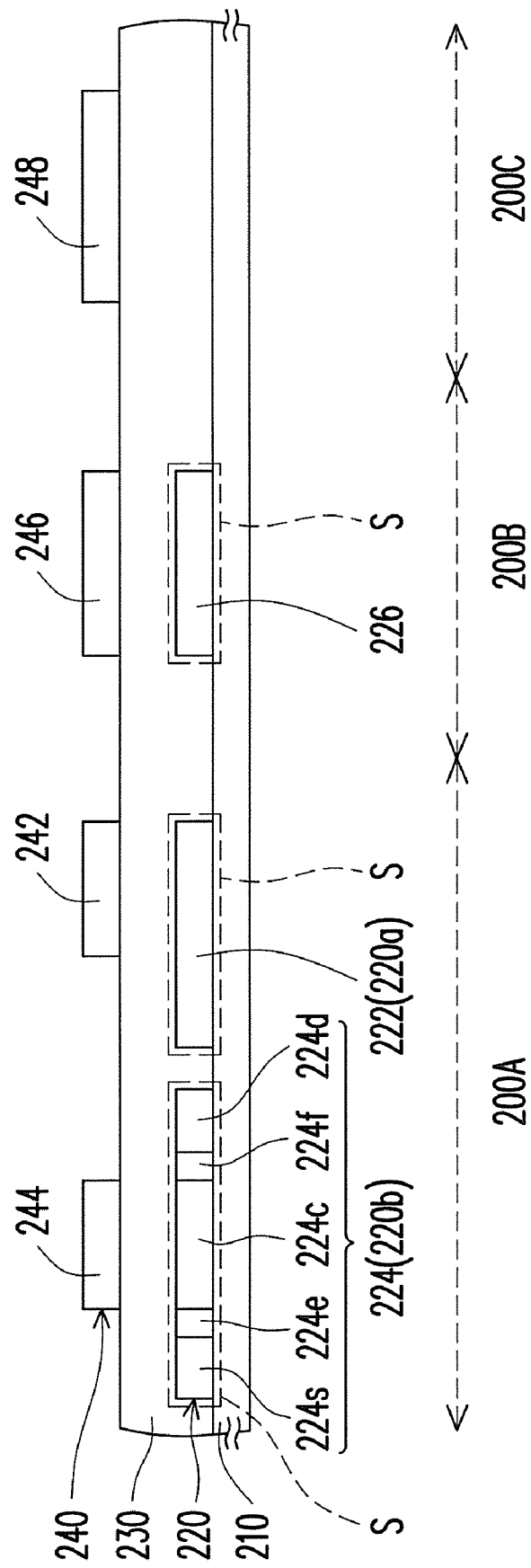
Figure 9D:
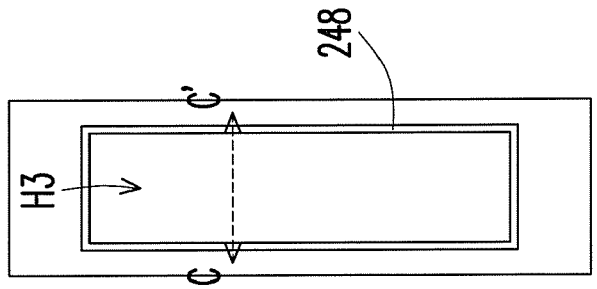
Figure 9D:
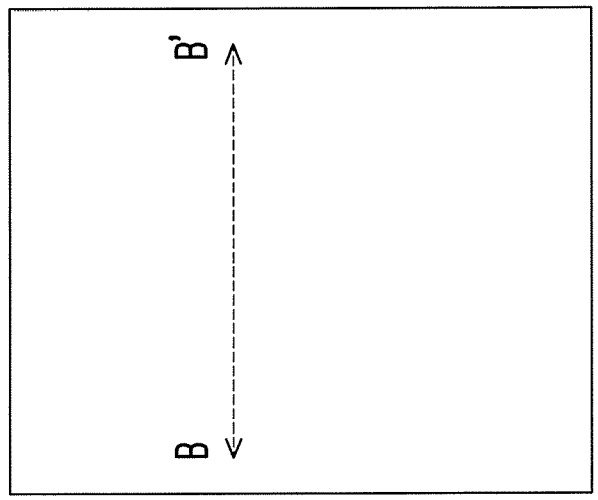
Figure 9D:
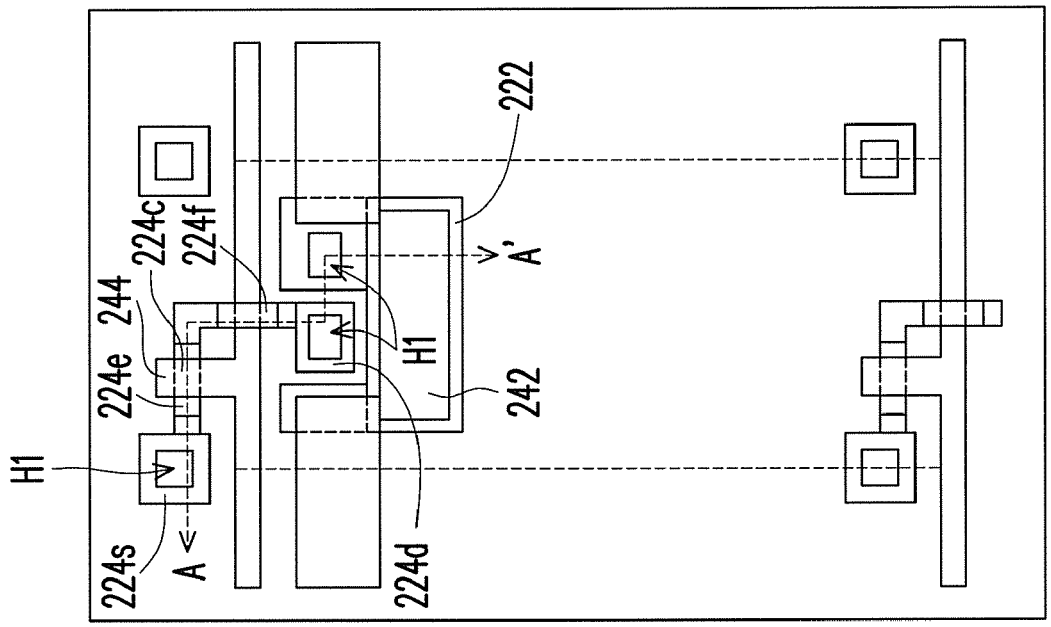
Figure 9D:
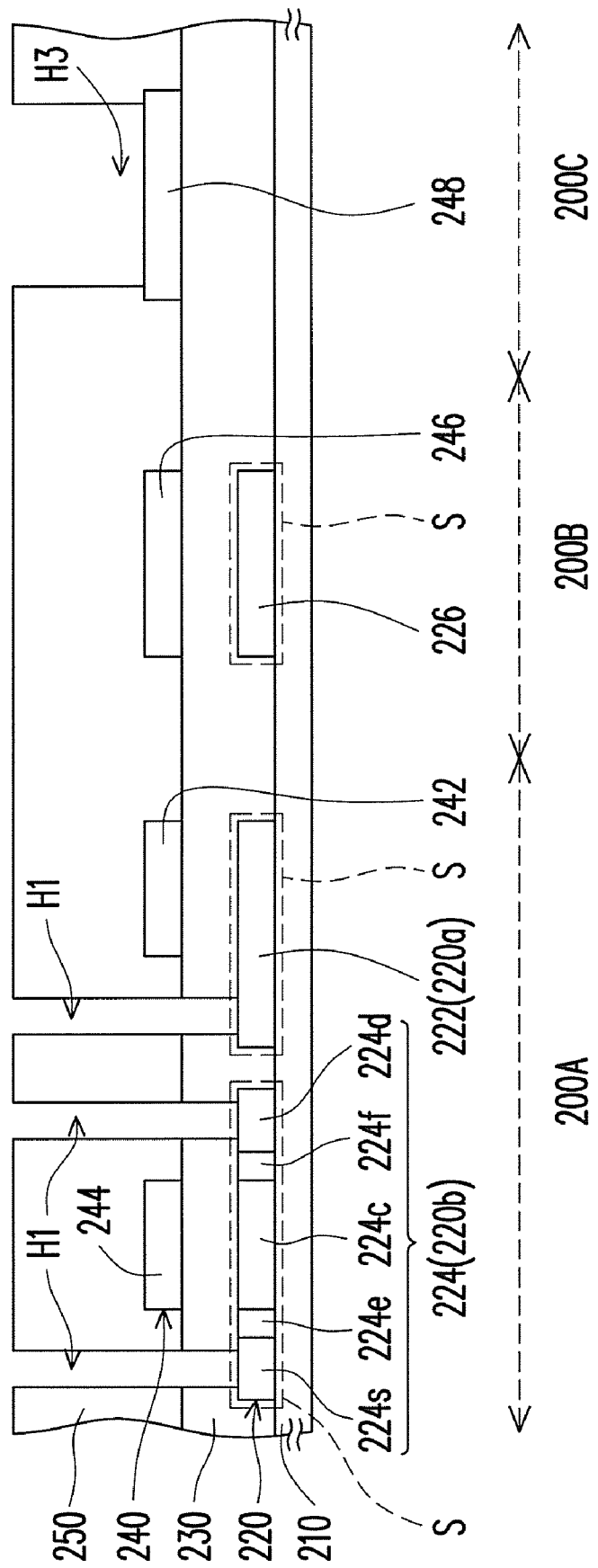

Please refer to FIGS. 9A-9G which illustrate a processing flow for fabricating the active device array substrate according to the third embodiment of the present invention. FIGS. 9A'-9G' are respective cross-sectional views along line AA' of the pixel region, line BB' of the sensing region, and line CC' of the pad region in FIGS. 9A-9G. In order to simplify the description, similarities in the processing flow of the present embodiment to the processing flows of FIGS. 6A-6G, and FIGS. 6A'-6G' will not be described repetitively.

Figure 9E:
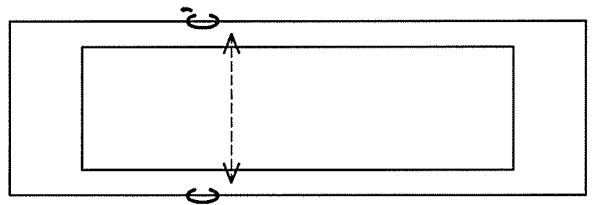
Figure 9E:
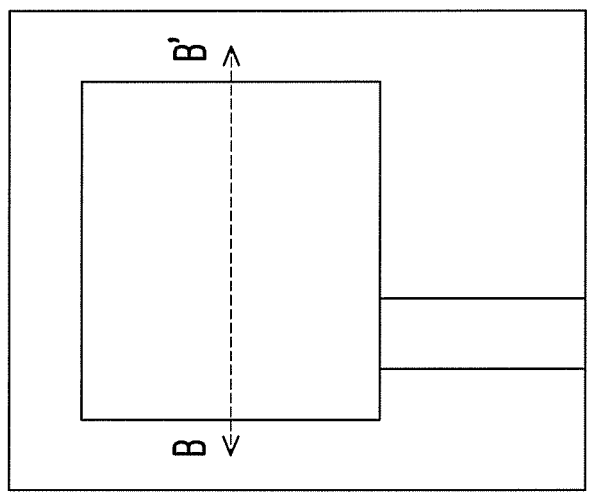
Figure 9E:
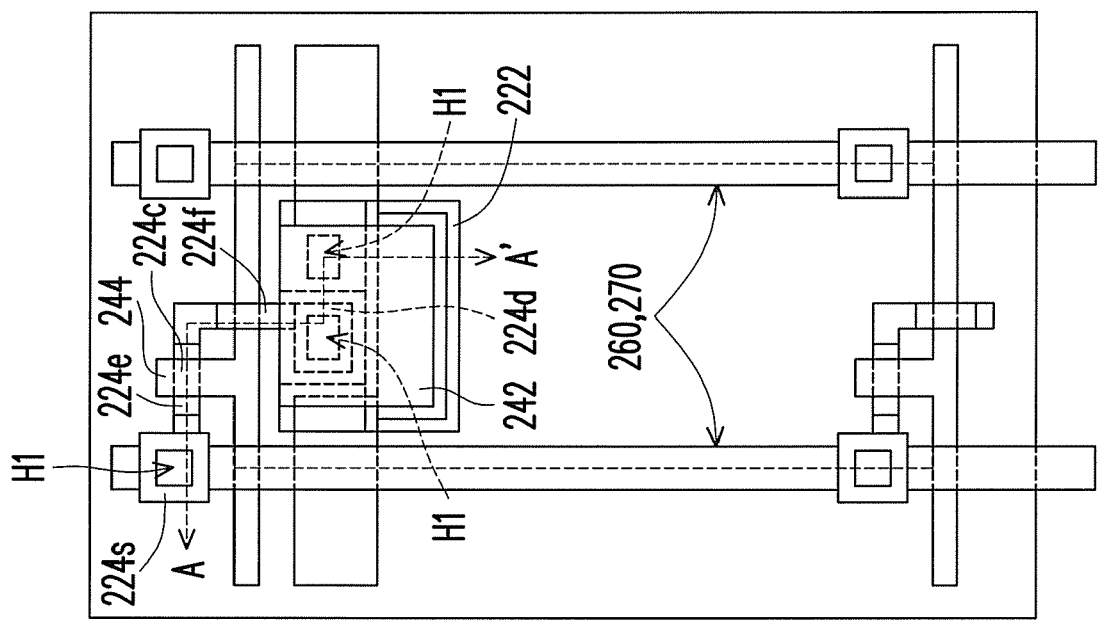
Figure 9E:
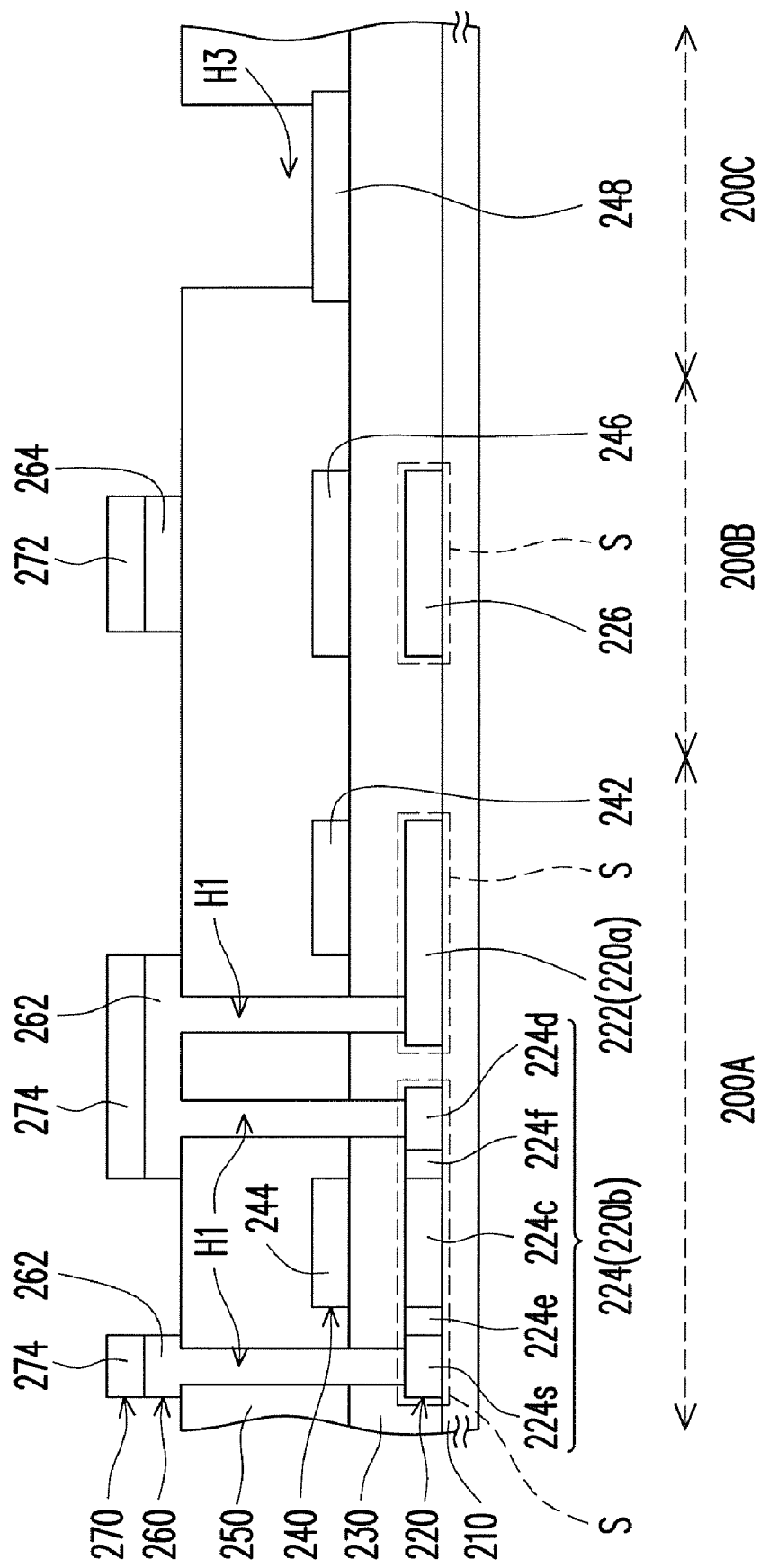

As shown in FIGS. 9E and 9E', compared with the third embodiment, in the present embodiment, in the step of simultaneously forming the second patterned conductive layer 260 and the second patterned semiconductor layer 270, the sizes of the contact conductors 262 are substantially equal to the sizes of the dummy semiconductor layers 274 by using the same photolithography and etching process, the contact conductors 262 are respectively filled into the source doping region 224s, the drain doping region 224d, and the storage electrode 222, and the drain doping region 224d and the storage electrode 222 are electrically connected to each other through a contact conductor 262.

Figure 9F:
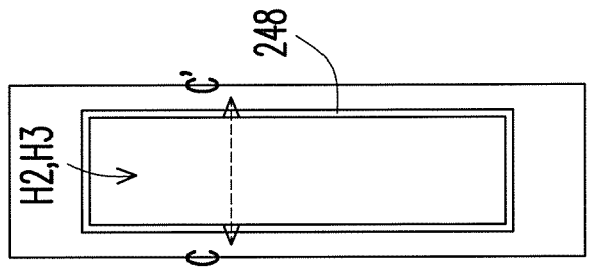
Figure 9F:
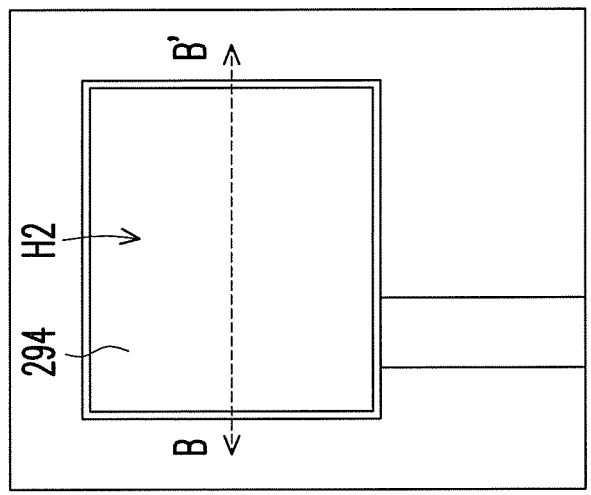
Figure 9F:
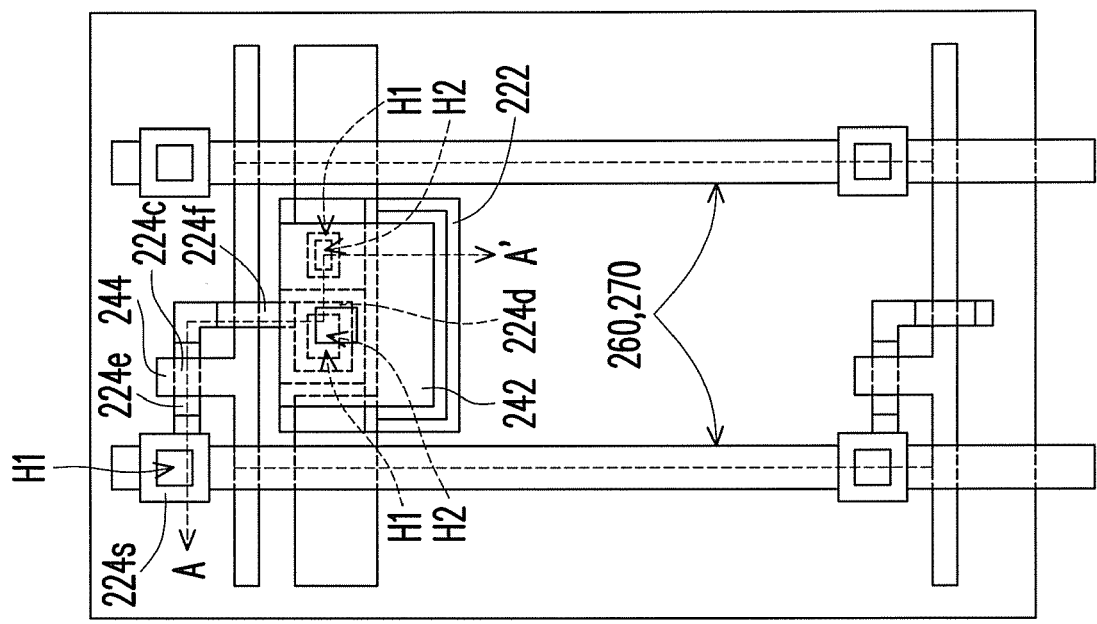
Figure 9F:
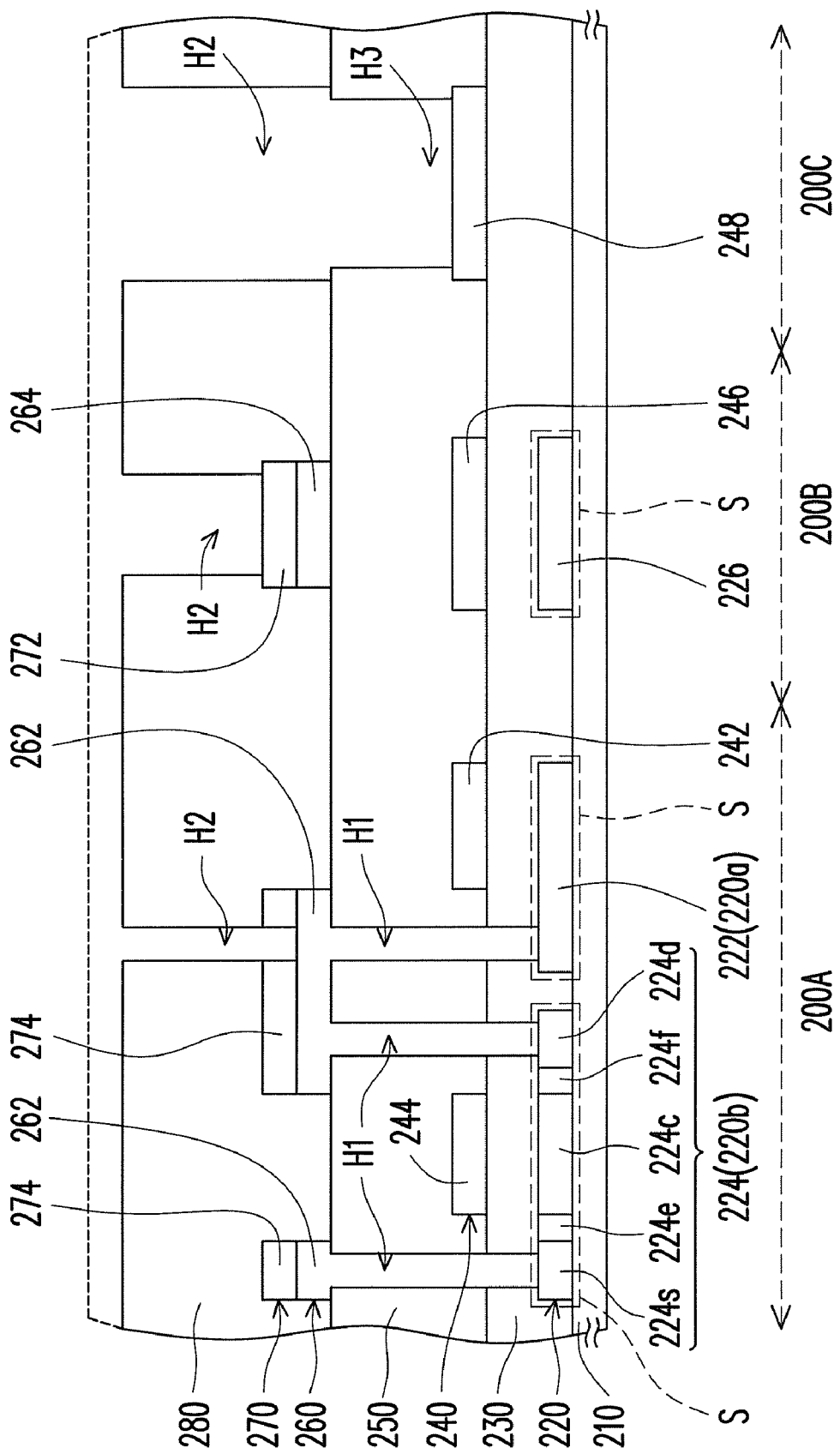

Particularly, as shown in FIGS. 9F and 9F', compared with the third embodiment, in the present embodiment, in the step of patterning the second dielectric layer 280 to form the second contact holes H2, the same photolithography and etching process is performed to remove the dummy semiconductor layer disposed below a portion of the second contact holes H2, so as to expose the contact conductors 262 connected to the drain doping region 224d and preserve the active layer 272, exposed by the second contact holes H2, in the sensing region 200B, wherein the same photolithography and etching process is a half-tone mask photolithography and etching process or a gray-tone mask photolithography and etching process, and the detailed fabricating steps thereof are described hereafter with reference to FIGS. 10A-10D.

Figure 9G:
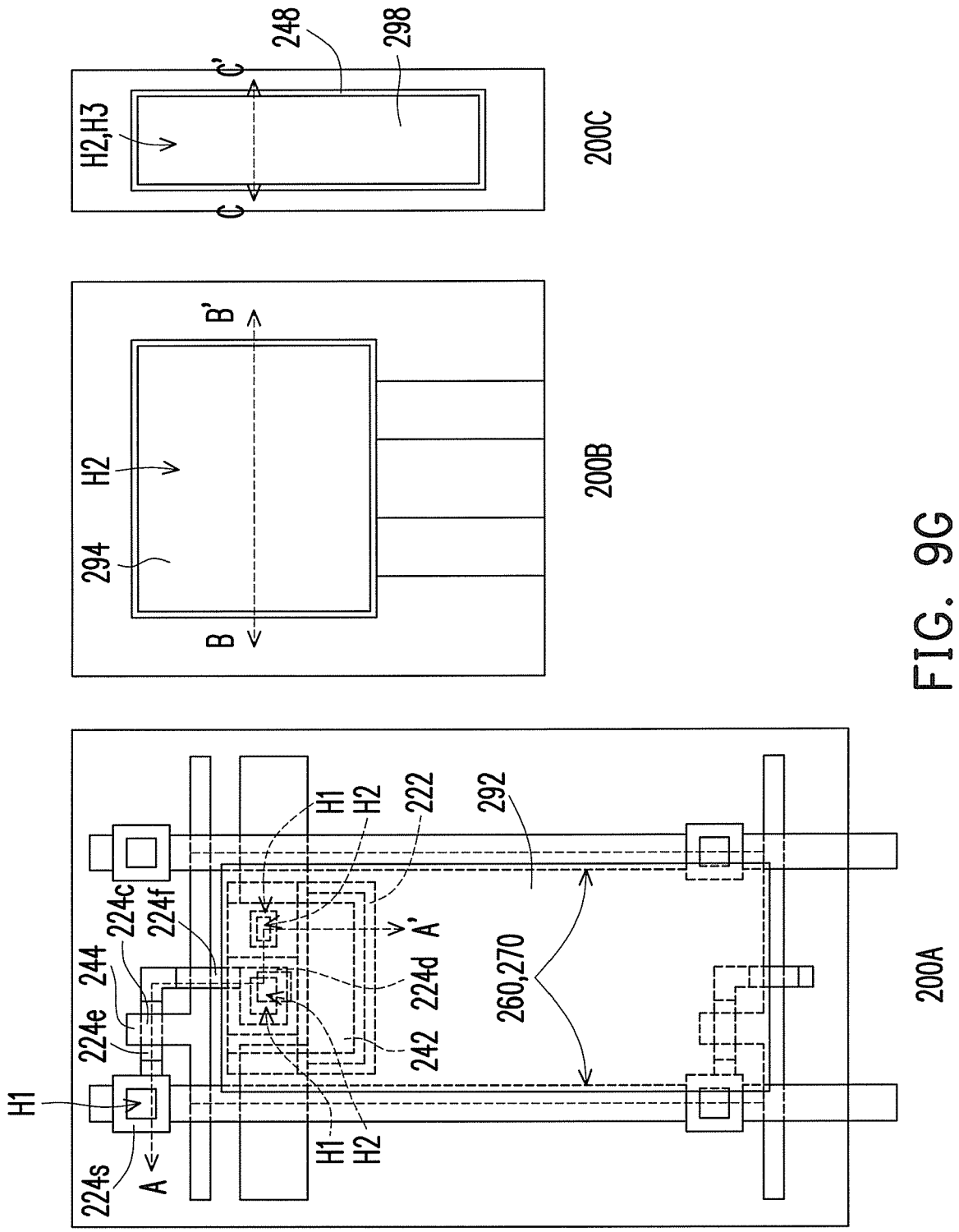
Figure 9G:
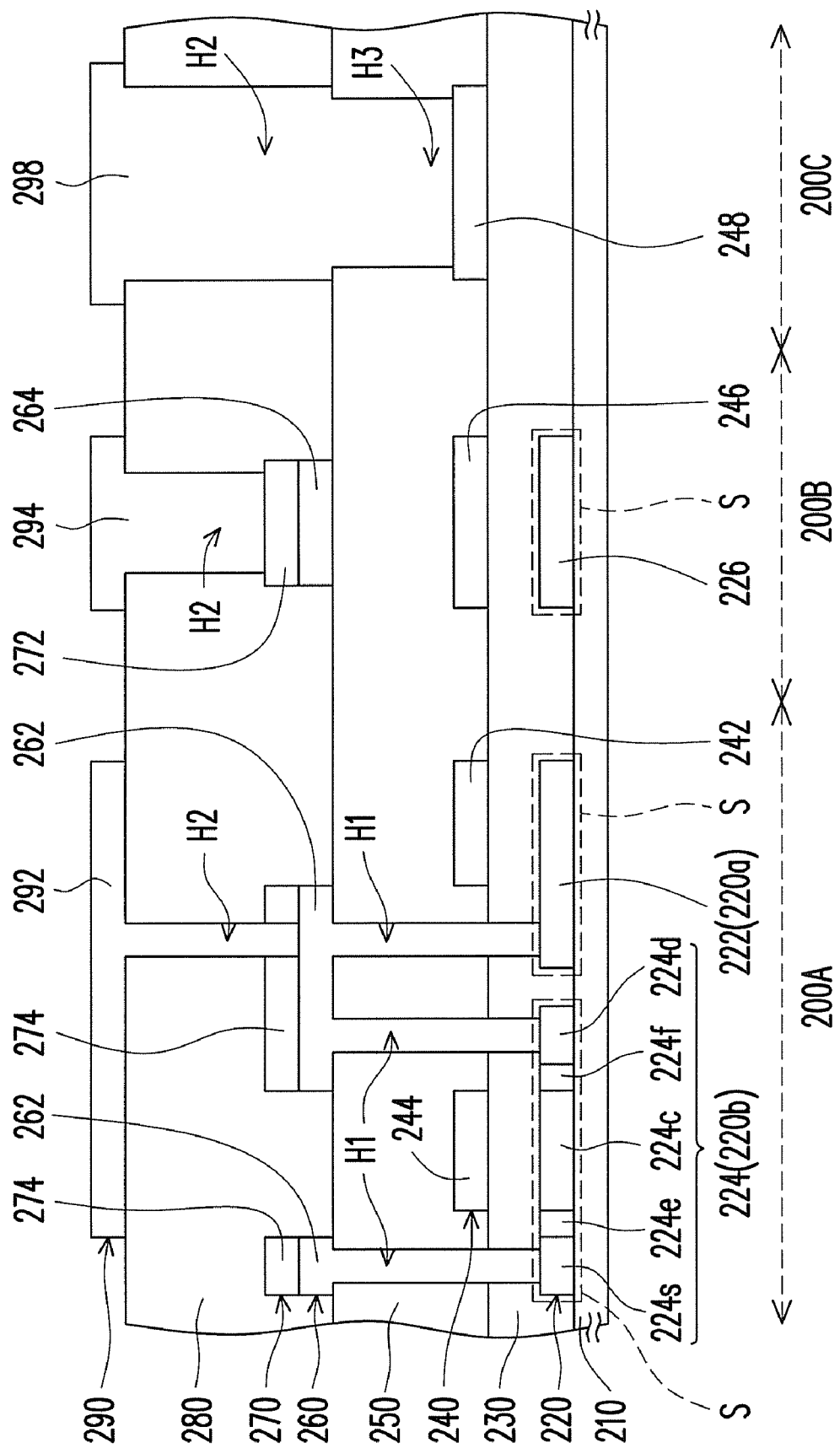

Then, as shown in FIGS. 9G and 9G', in the present embodiment, in the step of forming the third patterned conductive layer 290, a portion of the third patterned conductive layer 290 serving as the pixel electrode 292 is directly connected to the contact conductors 262 through the second contact holes H2 of the second dielectric layer 280 and the dummy semiconductor layers 274, and the pixel electrode 292 is electrically connected to the drain doping region 224d and the storage electrode 222 through the contact conductors 262.

Figure 10A:
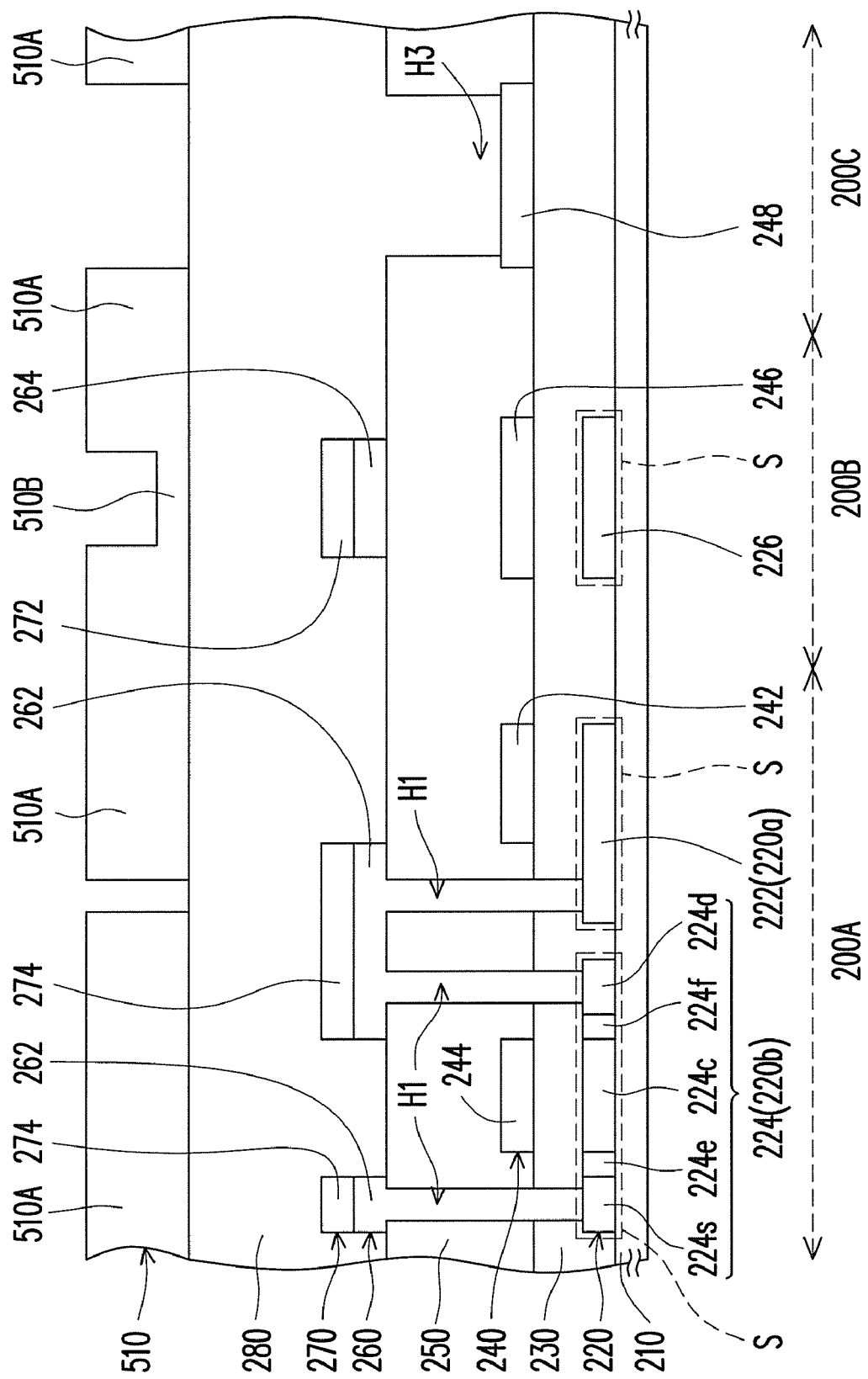
FIGS. 10A-10D illustrate a processing flow for forming the second contact holes with different depths.
Figure 10B:
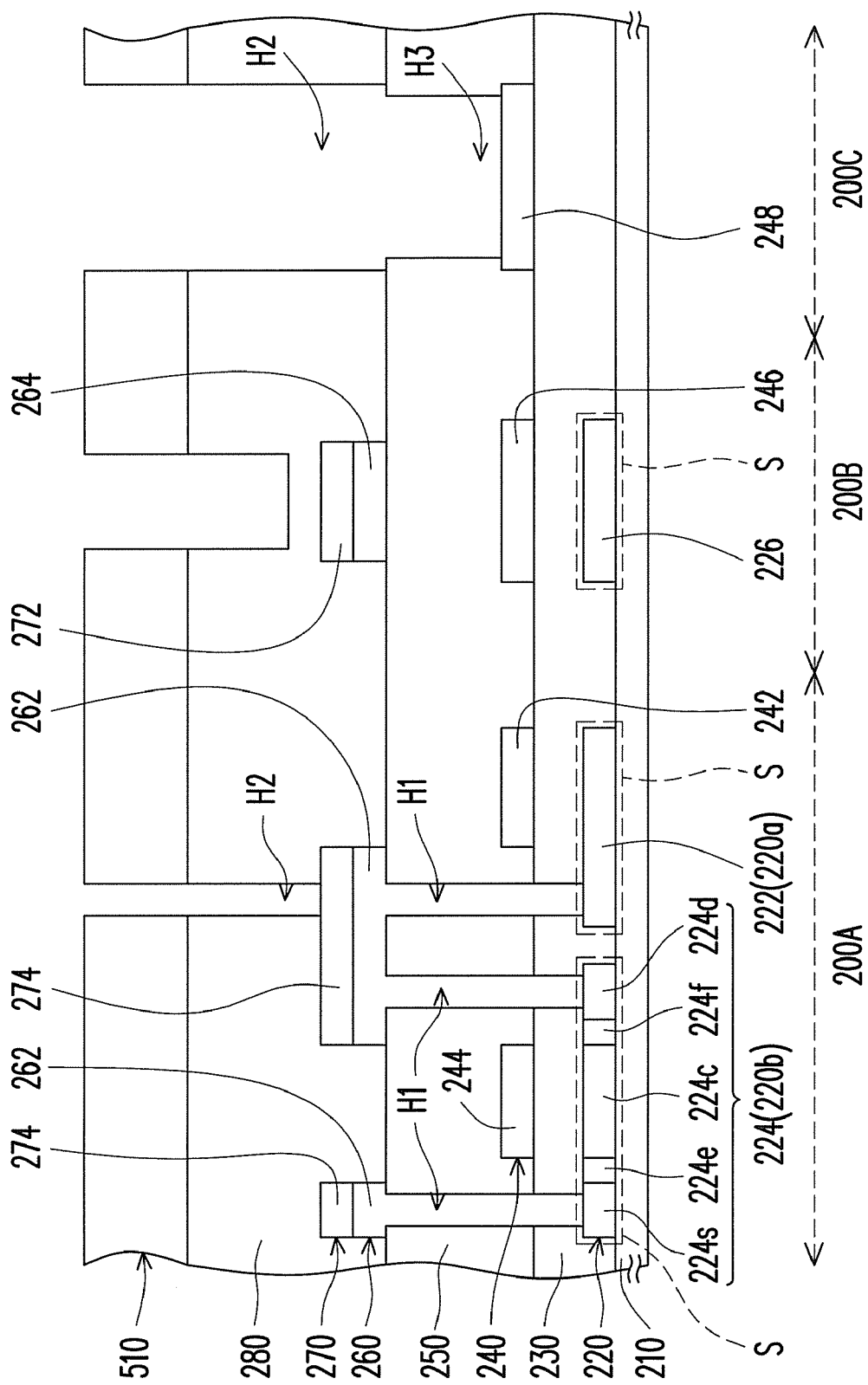

A method for forming the second contact holes H2 in the second dielectric layer 280 includes performing the half-tone mask photolithography and etching process, for example. FIGS. 10A-10D illustrate a processing flow for forming the second contact holes with different depths. As shown in FIG. 10A, a patterned photoresist layer 510 is formed on the second dielectric layer 280, wherein the photoresist layer 510 covers a portion of the second dielectric layer 280, and the patterned photoresist layer 510 includes a first block 510A and a second block 510B, the first block 510A is thicker than the second block 510B, and the second block 510B is correspondingly disposed over the active layer 272. Next, as shown in FIG. 10B, the patterned second dielectric layer 280 is removed by using the patterned photoresist layer 510 as the mask, so as to form the second contact holes H2 respectively exposing the dummy semiconductor layers 274 and the third contact holes H3. It should be noted that, since the second block 510B disposed over the active layer 272 has a smaller thickness, the second dielectric layer 280 with a certain thickness remains over the active layer 272 after the removing process is completed.

Figure 10C:
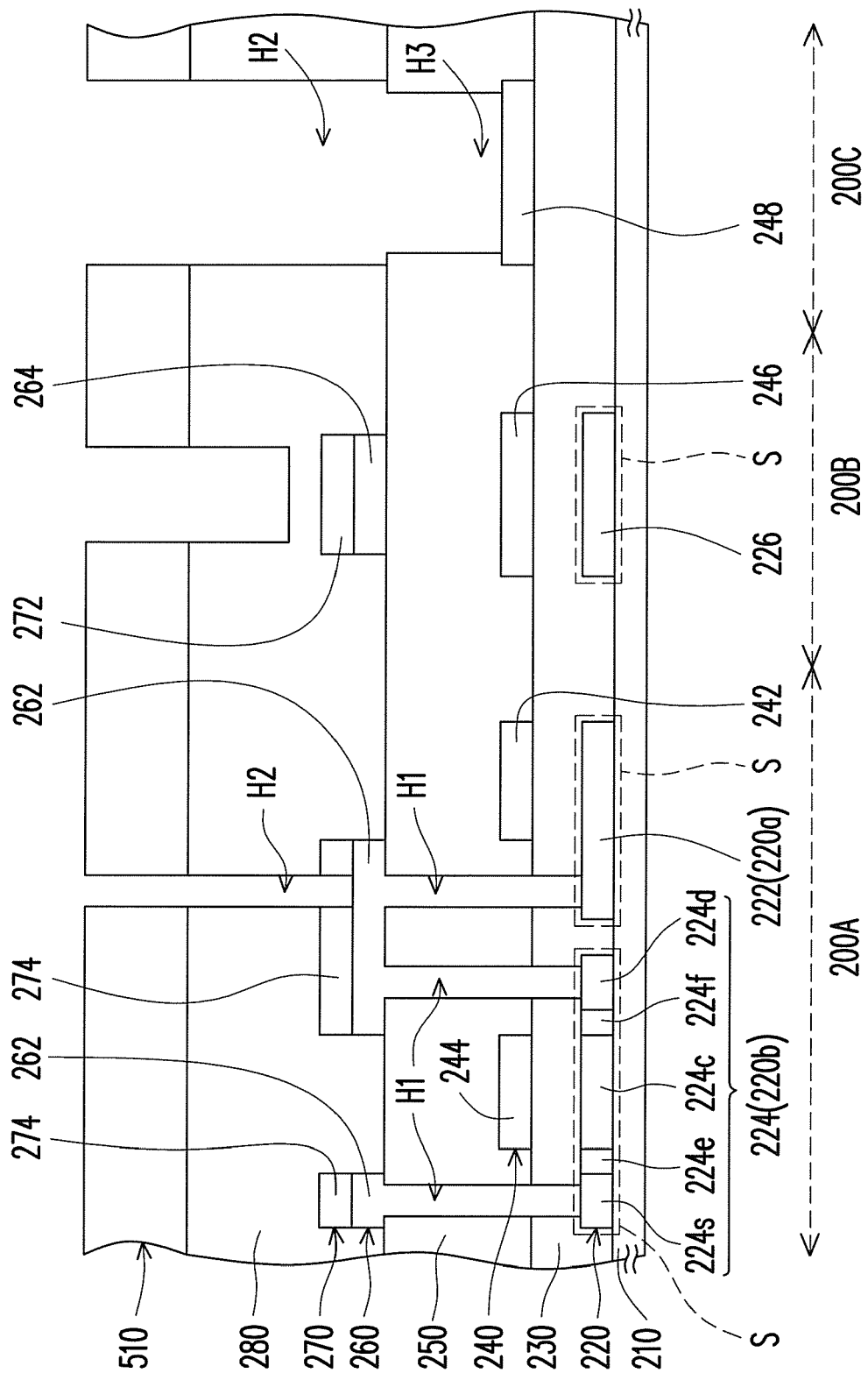
Figure 10D:
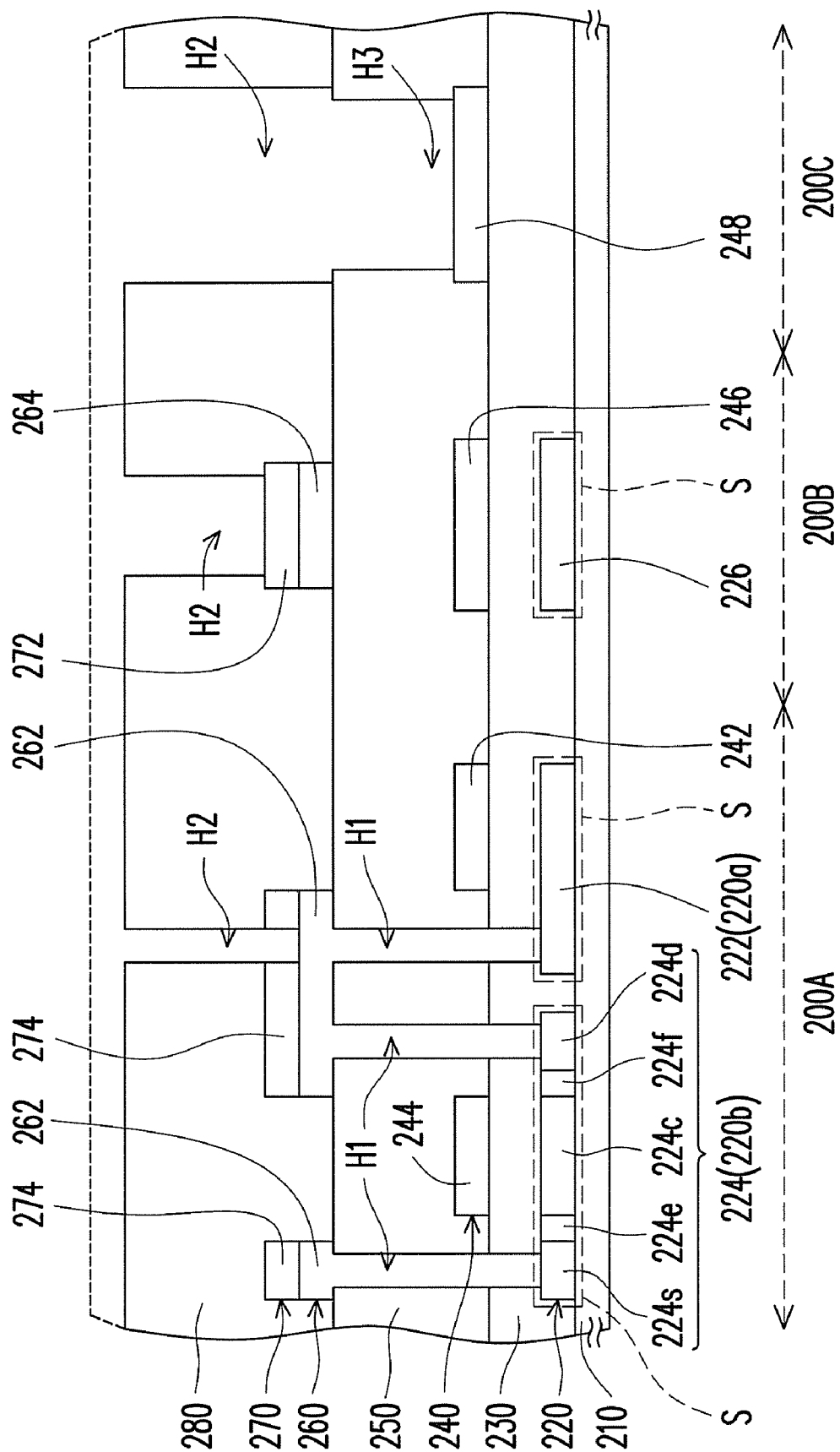

Then, as shown in FIG. 10C, an etching process is performed on the dummy semiconductor layers 274 exposed by the second dielectric layer 280 by using the patterned photoresist layer 510 as the mask, so that the second contact holes H2 near the dummy semiconductor layers 274 pass through the dummy semiconductor layers 274 to expose the contact conductors 262 disposed below the dummy semiconductor layers 274 after the etching process. Then, after removing the remained patterned photoresist layer 510, as shown in FIG. 10D, the thickness of the second dielectric layer 280 is reduced until the second dielectric layer 280 over the active layer 272 is completely removed to expose the active layer 272, wherein a method of reducing the thickness of the second dielectric layer 280 includes, for example, performing the ashing process, and thereby the structure shown in FIG. 9F' is formed.

Certainly, in another embodiment, when the second dielectric layer 280 is formed of organic photosensitive resin, the depths of the second contact holes H2 of the second dielectric layer 280 can be adjusted by adjusting the exposure dose irradiating the second contact holes H2 in the photolithography process; however, the present invention is not limited thereto.

Figure 9H:
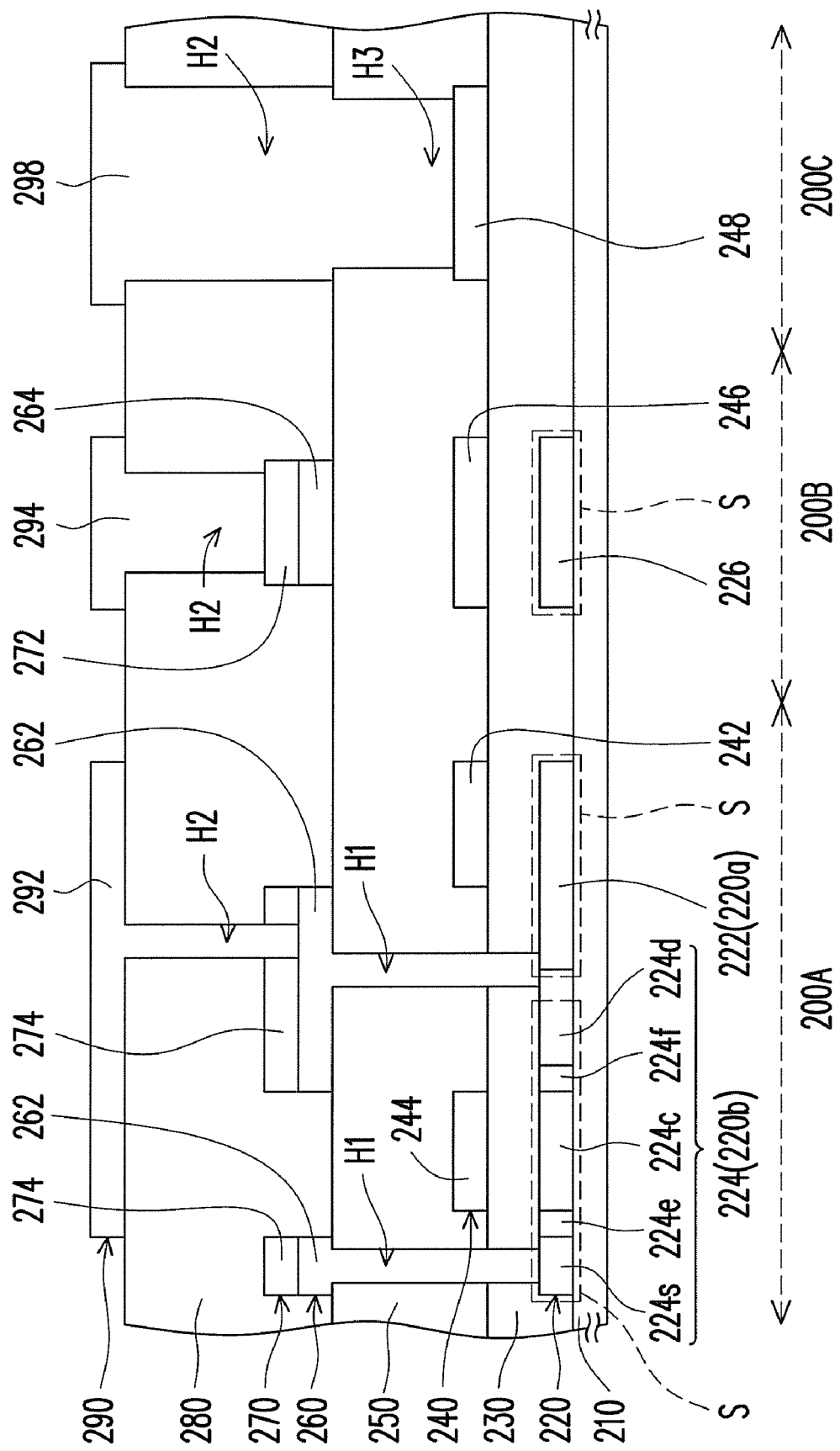
FIG. 9H is a schematic view illustrating another active device array substrate according to the fourth embodiment of the present invention.

FIG. 9H is a schematic view illustrating another active device array substrate according to the fourth embodiment of the present invention. Referring to FIG. 9H, a portion of the first type doping region 220a and the second type doping region 220b in the active device array substrate are in contact with each other. A contact interface is disposed between the first type doping region 220a and the second type doping region 220b. A portion of the first contact holes H1 exposes the contact interface. In other words, the first contact holes H1 expose both the first type doping region 220a and the second type doping region 220b at the same time, so that the contact conductor 262 electrically connected to the pixel electrode 292 is directly connected to the first type doping region 220a and the second type doping region 220b simply through a first contact hole H1.

Fifth Embodiment

Figure 11:
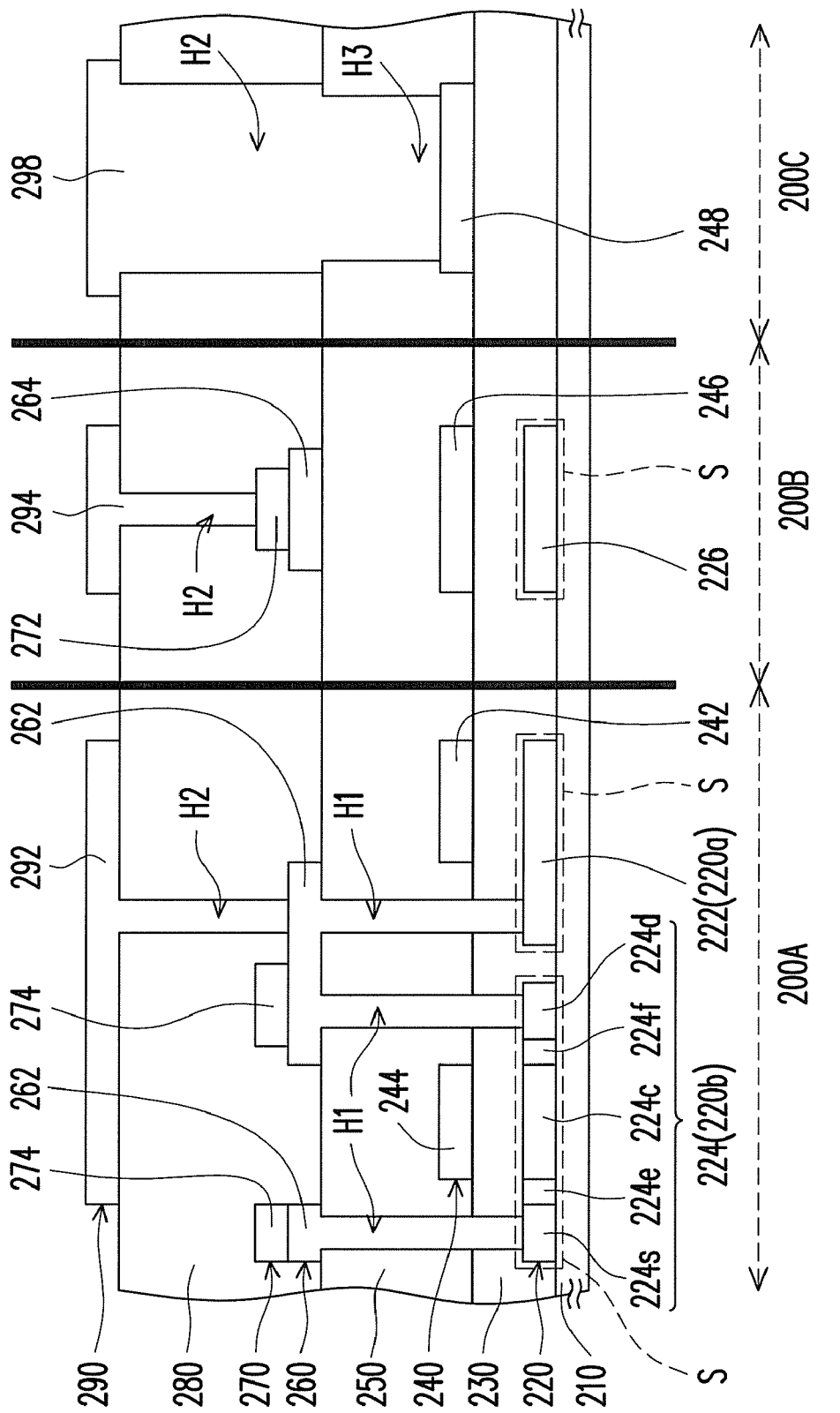
FIG. 11 illustrates an active device array substrate according to a fifth embodiment of the present invention.

FIG. 11 illustrates an active device array substrate according to a fifth embodiment of the present invention. Referring to FIG. 11, the active device array substrate 600 of the present embodiment is similar to the active device array substrate 400 of the third embodiment, wherein the third patterned conductive layer 290 serving as the pixel electrode 292 in the pixel region 200A is electrically connected to the first patterned semiconductor layer 220 through a portion of the second contact holes H2 and the second patterned conductive layer 260. However, compared with the third embodiment, in the active device array substrate 600 of the present embodiment, the sizes of a portion of the dummy semiconductor layers 274 are, for example, substantially smaller than the sizes of a portion of the contact conductors 262.

In detail, compared with the third embodiment, in the present embodiment, the second patterned conductive layer 260 and the second patterned semiconductor layer 270 have different sizes and are fabricated with use of the same photolithography and etching process. Thereby, not only the number of the photolithography and etching processes can be reduced, but also the bottom electrode 264 can effectively shield the light from a backlight source because the size of the bottom electrode 264 in the sensing region 200B is larger than the size of the active layer 272. As such, the active layer 272 is prevented from generating the photo current due to the interference of the unexpected light, and the noises of the photo sensor are reduced. Therefore, in the present embodiment, the size of the bottom electrode 264 in the photo sensor is larger than the size of the active layer, so as to further improve the sensitivity of the photo sensor. The data voltage in the drain doping region 224d of the active device is transmitted to the pixel electrode 292, used for display, through the contact conductors 262 of the second patterned conductive layer 260, and by passing through the second patterned semiconductor layer 270 and the second contact holes H2. According to the present embodiment, the storage electrode 222, the gate insulator 230, the storage electrode 242, the first dielectric layer 250, the second dielectric layer 280 and the pixel electrode 292 together form a storage capacitor having a multi-layered structure. Depending on the requirement of actual design in panel, the storage capacitor may be the single-layered structure or the multi-layered structure.

To better explain the technical content of the present invention, the following description in association with the accompanied drawings further illustrates the method for fabricating active device array substrate 600 according to the fifth embodiment of the present invention.

Figure 12A:
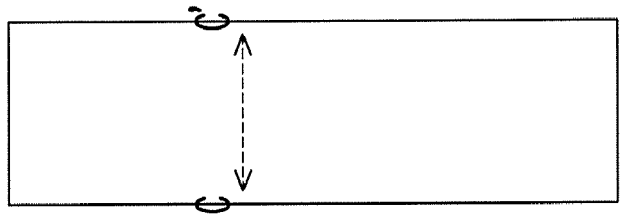
FIGS. 12A-12G illustrate a processing flow for fabricating the active device array substrate according to the fifth embodiment of the present invention.
Figure 12A:
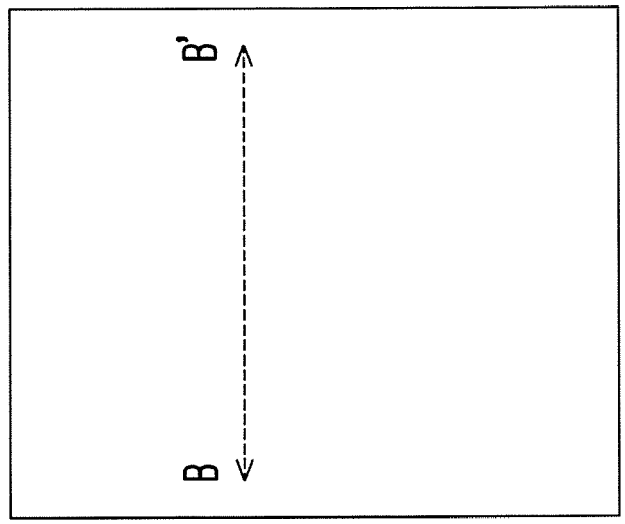
Figure 12A:
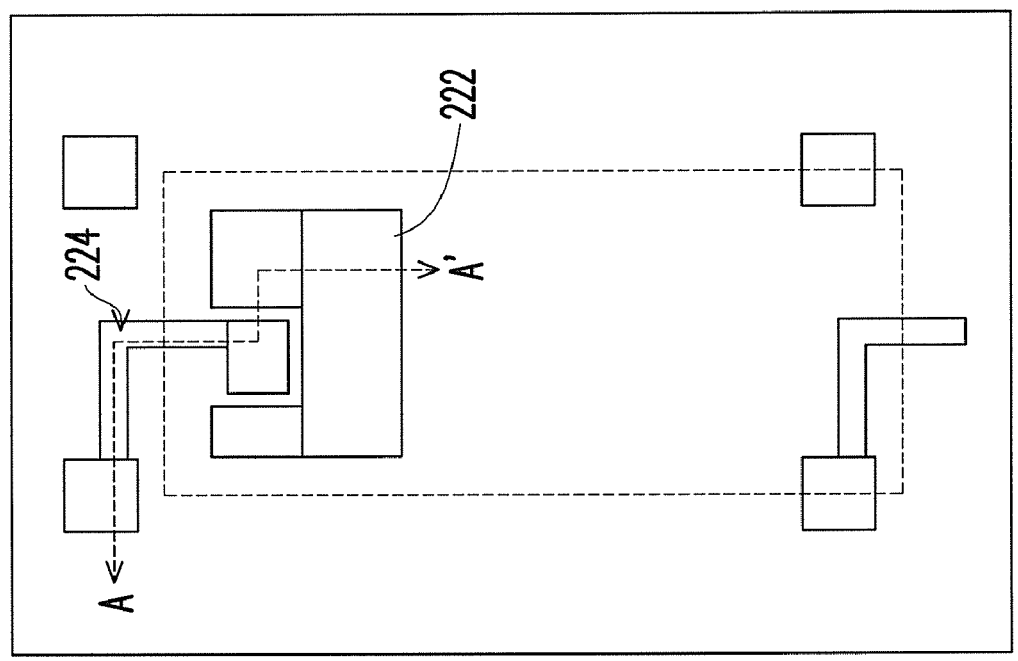
Figure 12A:
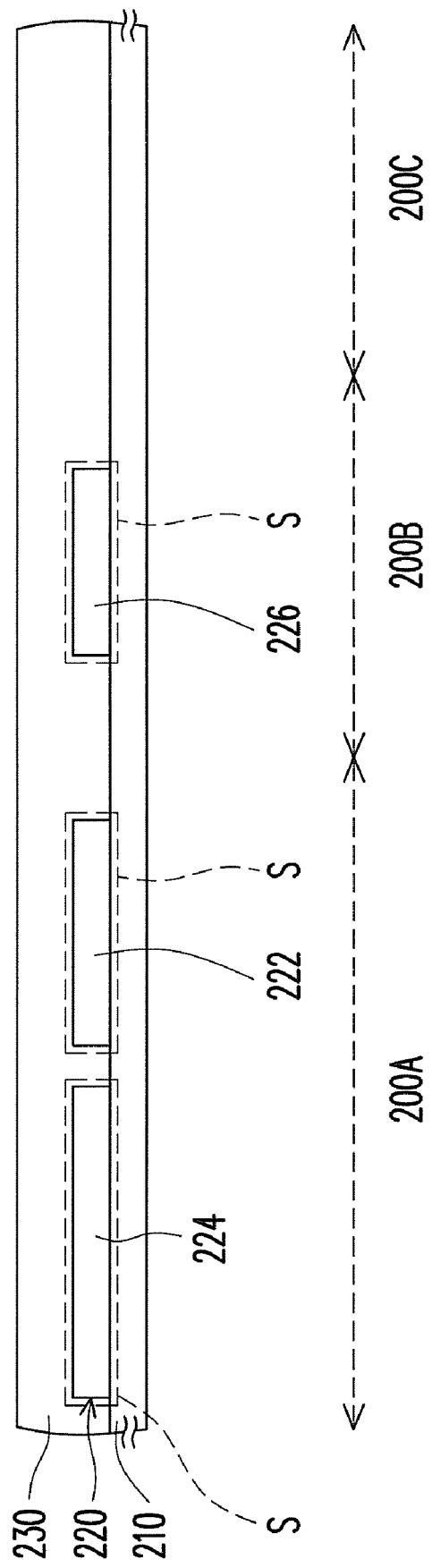
Figure 12B:
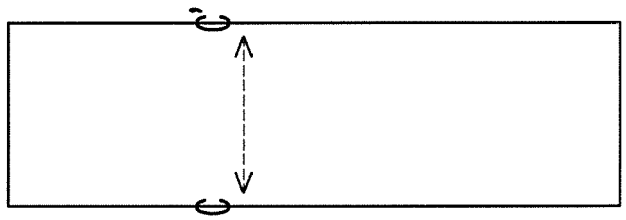
Figure 12B:
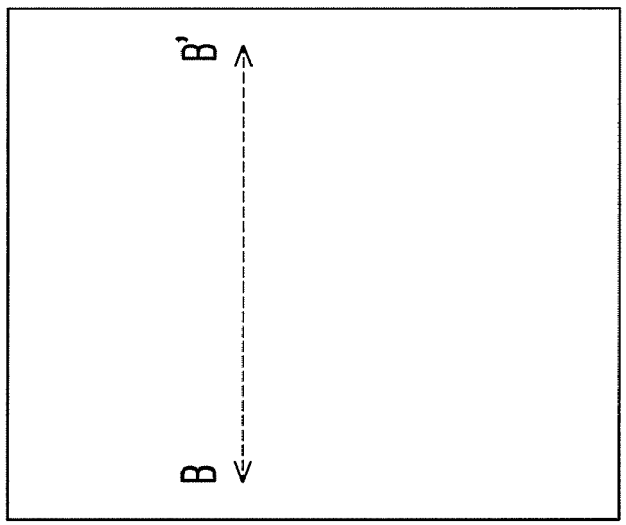
Figure 12B:
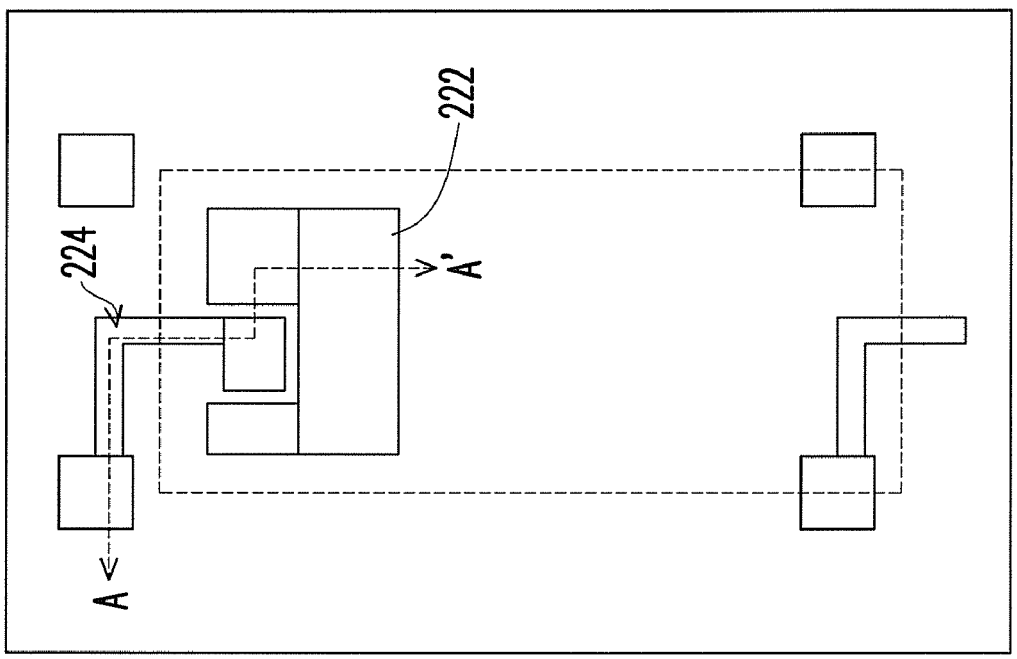
Figure 12B:
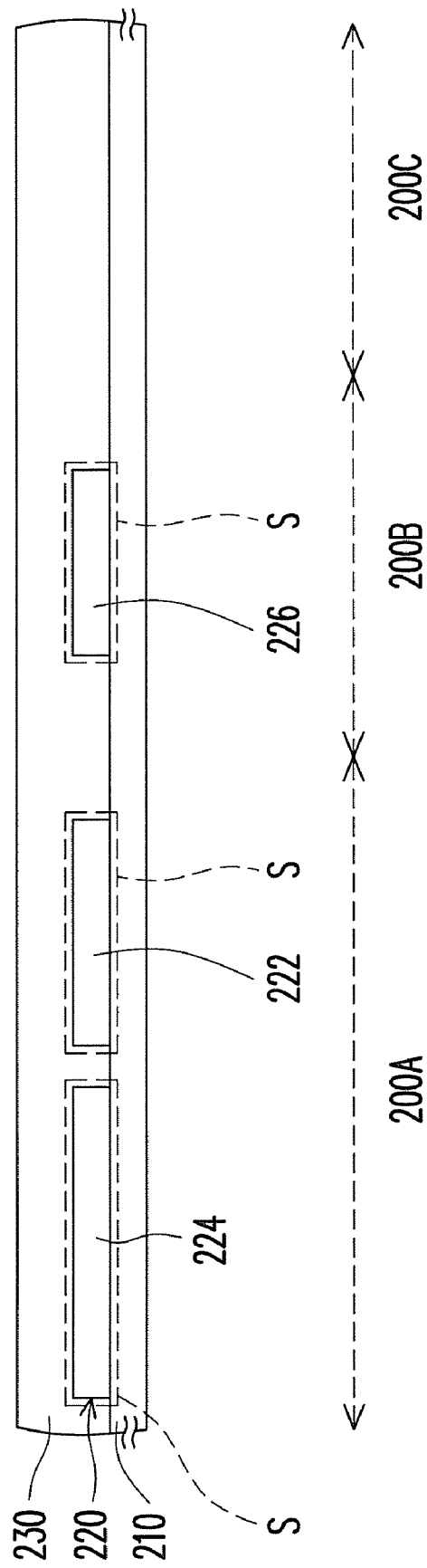
Figure 12C:
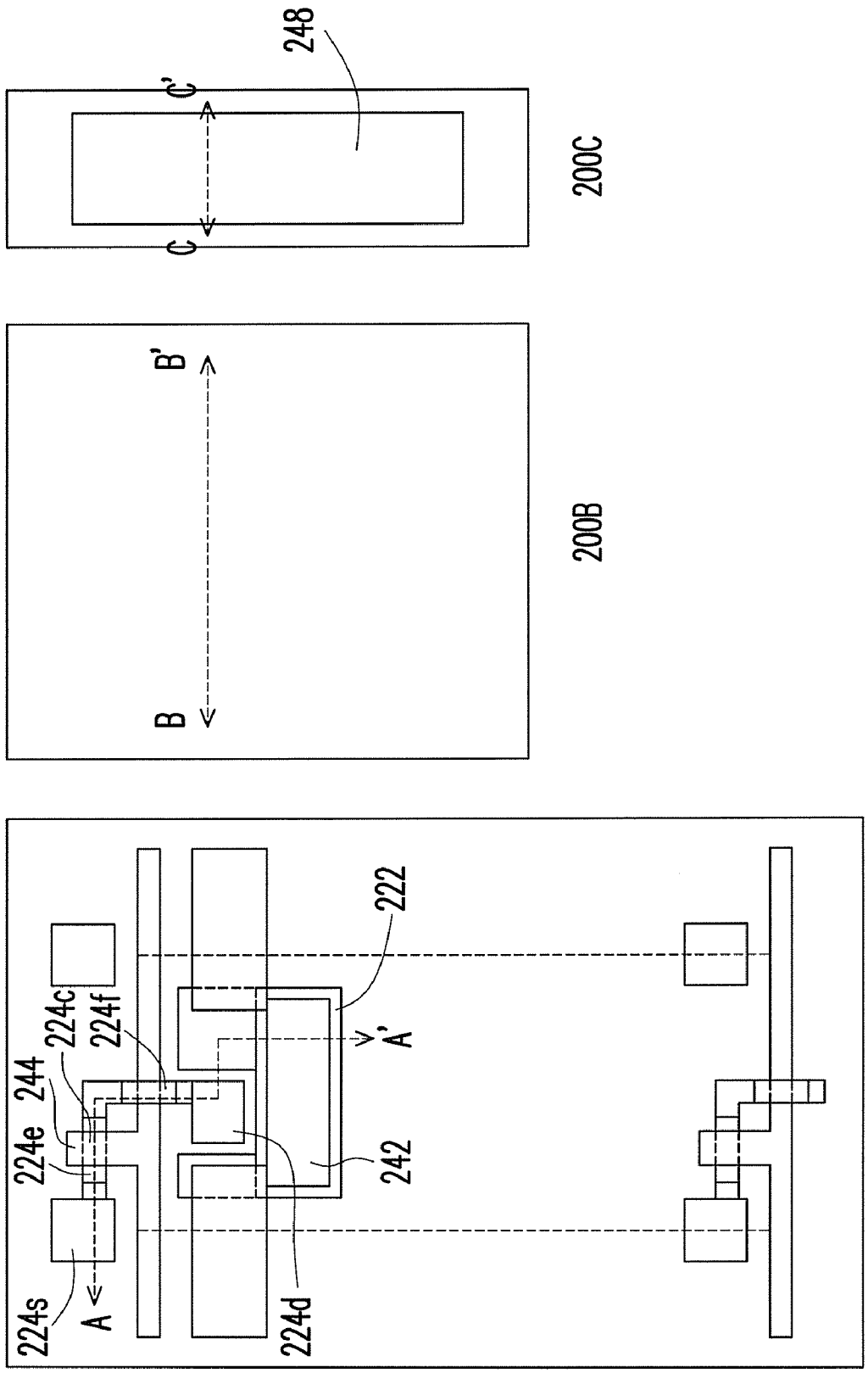
Figure 12C:
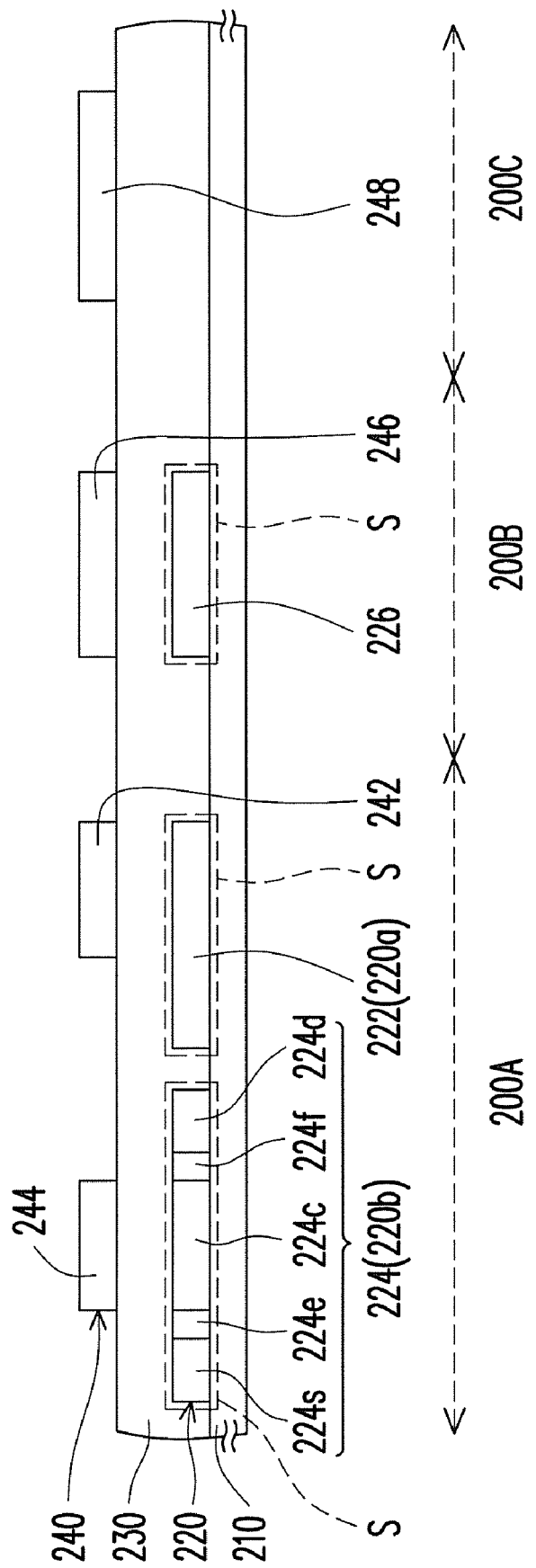
Figure 12D:
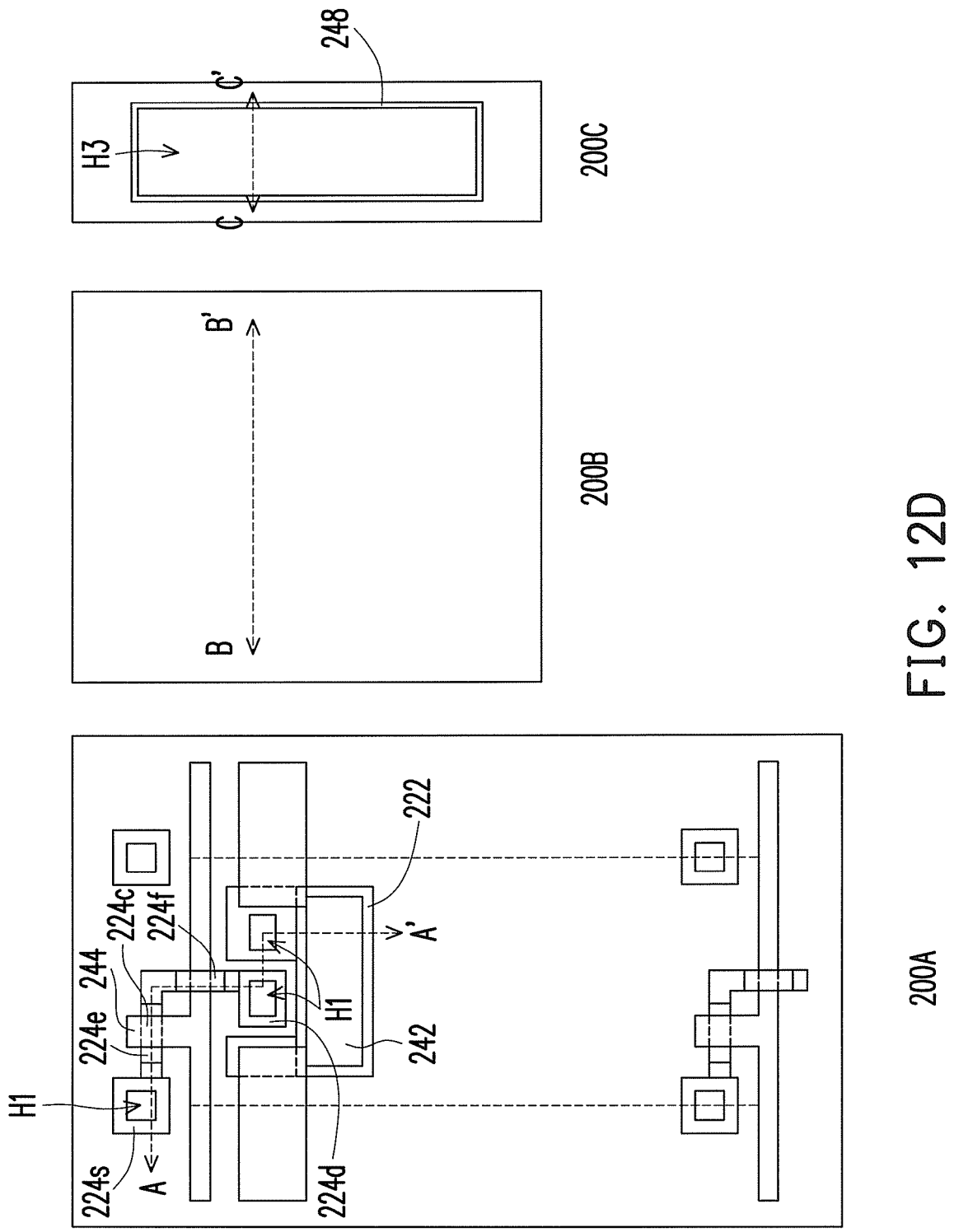
Figure 12D:
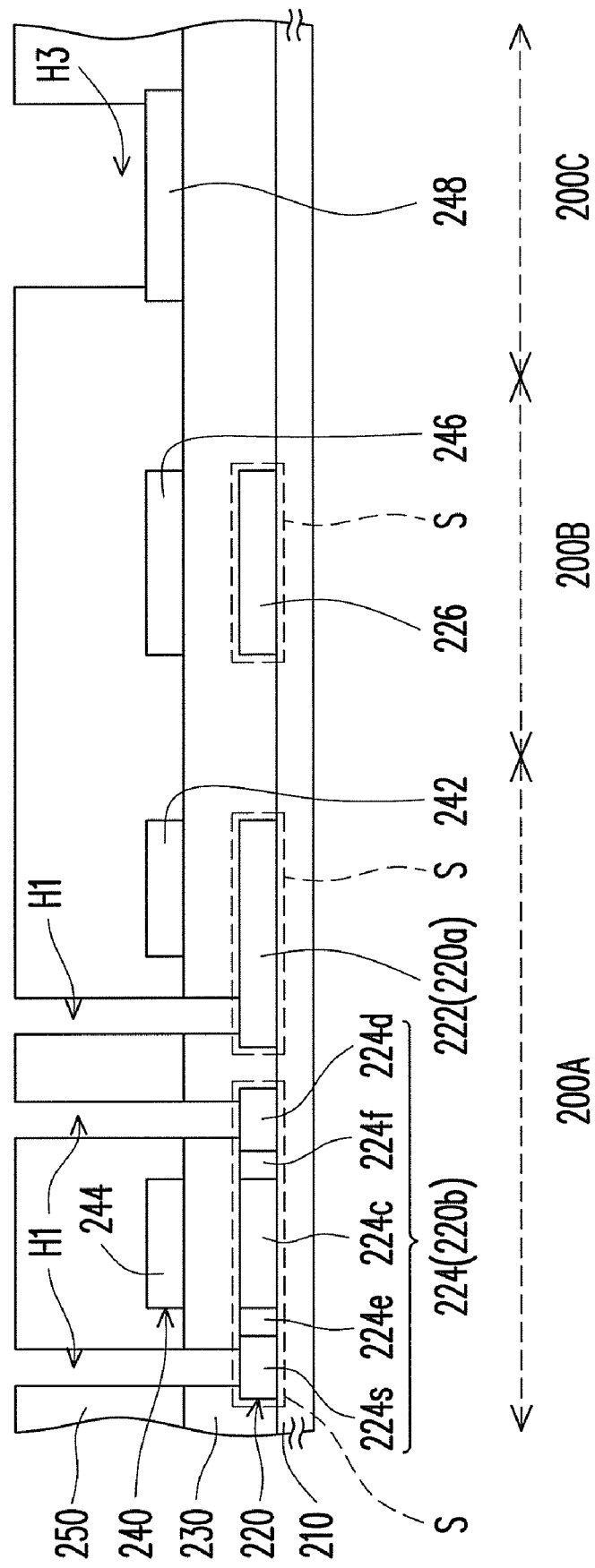

Please refer to FIGS. 12A-12G which illustrate a processing flow for fabricating the active device array substrate according to the fifth embodiment of the present invention. FIGS. 12A'-12G' are respective cross-sectional views along line AA' of the pixel region, line BB' of the sensing region, and line CC' of the pad region in FIGS. 12A-12G. In order to simplify the description, similarities in the processing flow of the present embodiment to the processing flows of FIGS. 6A-6G, and FIGS. 6A'~6G', are not described repetitively herein.

Figure 12E:
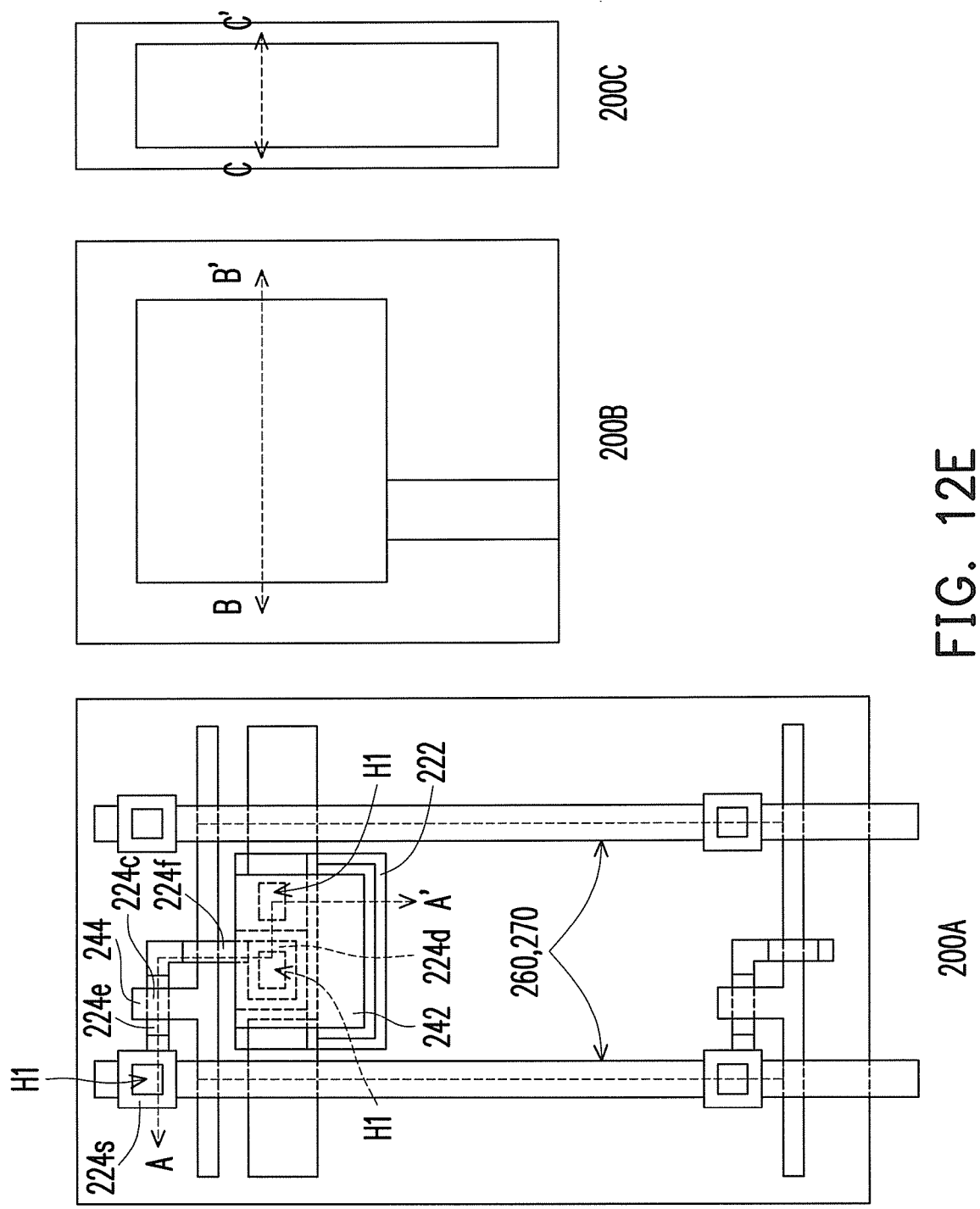
Figure 12E:
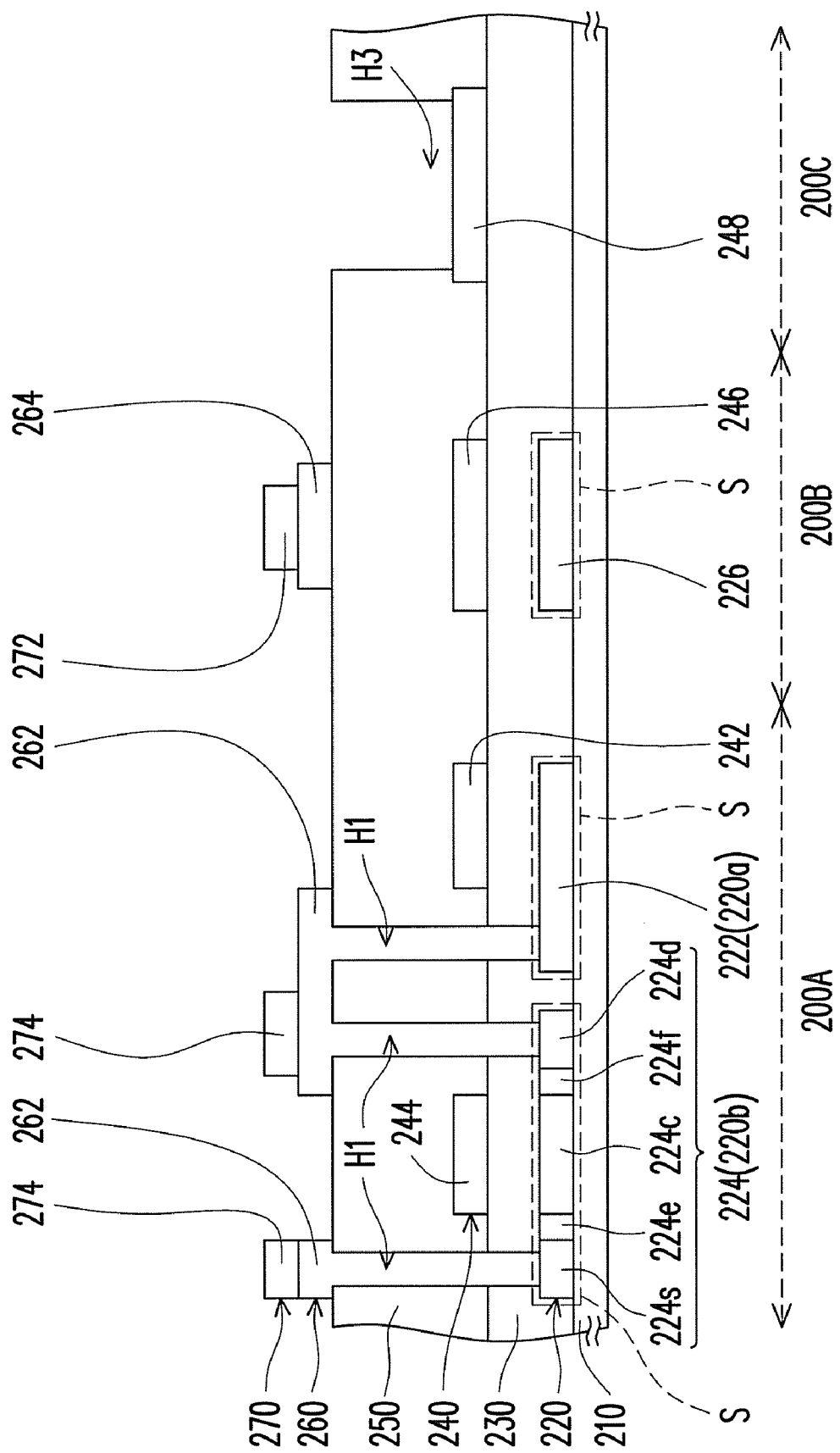

As shown in FIGS. 12E and 12E', compared with the third embodiment, in the present embodiment, in the step of simultaneously forming the second patterned conductive layer 260 and the second patterned semiconductor layer 270, the sizes of a portion of the dummy semiconductor layers 274 are substantially smaller than the sizes of a portion of the contact conductors 262 by using the same photolithography and etching process. Similar to the third embodiment, the contact conductors 262 are respectively filled into the source doping region 224s, the drain doping region 224d, and the storage electrode 222, and the drain doping region 224d and the storage electrode 222 are electrically connected to each other through a contact conductor 262. In this step, the sizes of the dummy semiconductor layers 274 in the pixel region 200A are smaller than the sizes of the contact conductors 262 by using the same photolithography and etching process, so that the size of the active layer 272 in the sensing region 200B is smaller than the size of the bottom electrode 264, wherein the photolithography and etching process is, for example, an isotropic etching process, and the detailed fabricating steps thereof are described hereafter with reference to FIGS. 13A-13D.

Figure 12F:
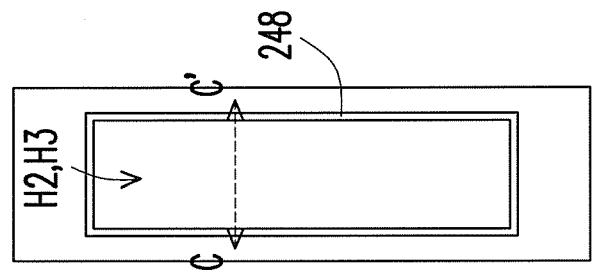
Figure 12F:
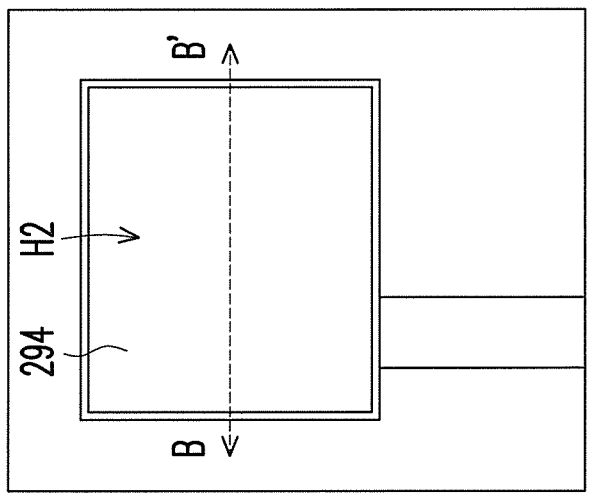
Figure 12F:
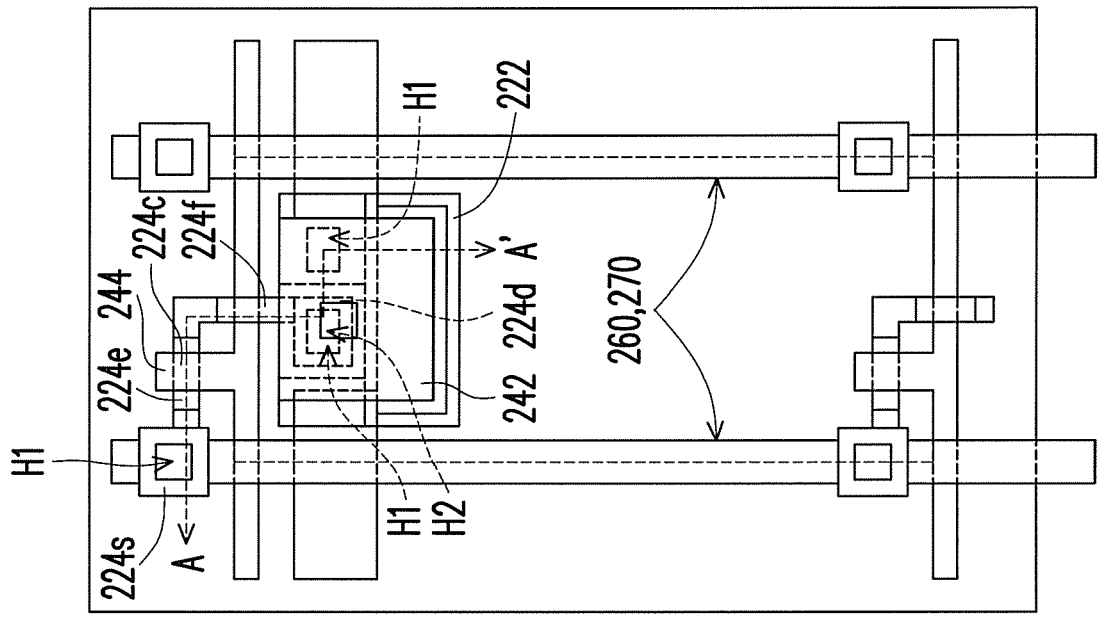
Figure 12F:
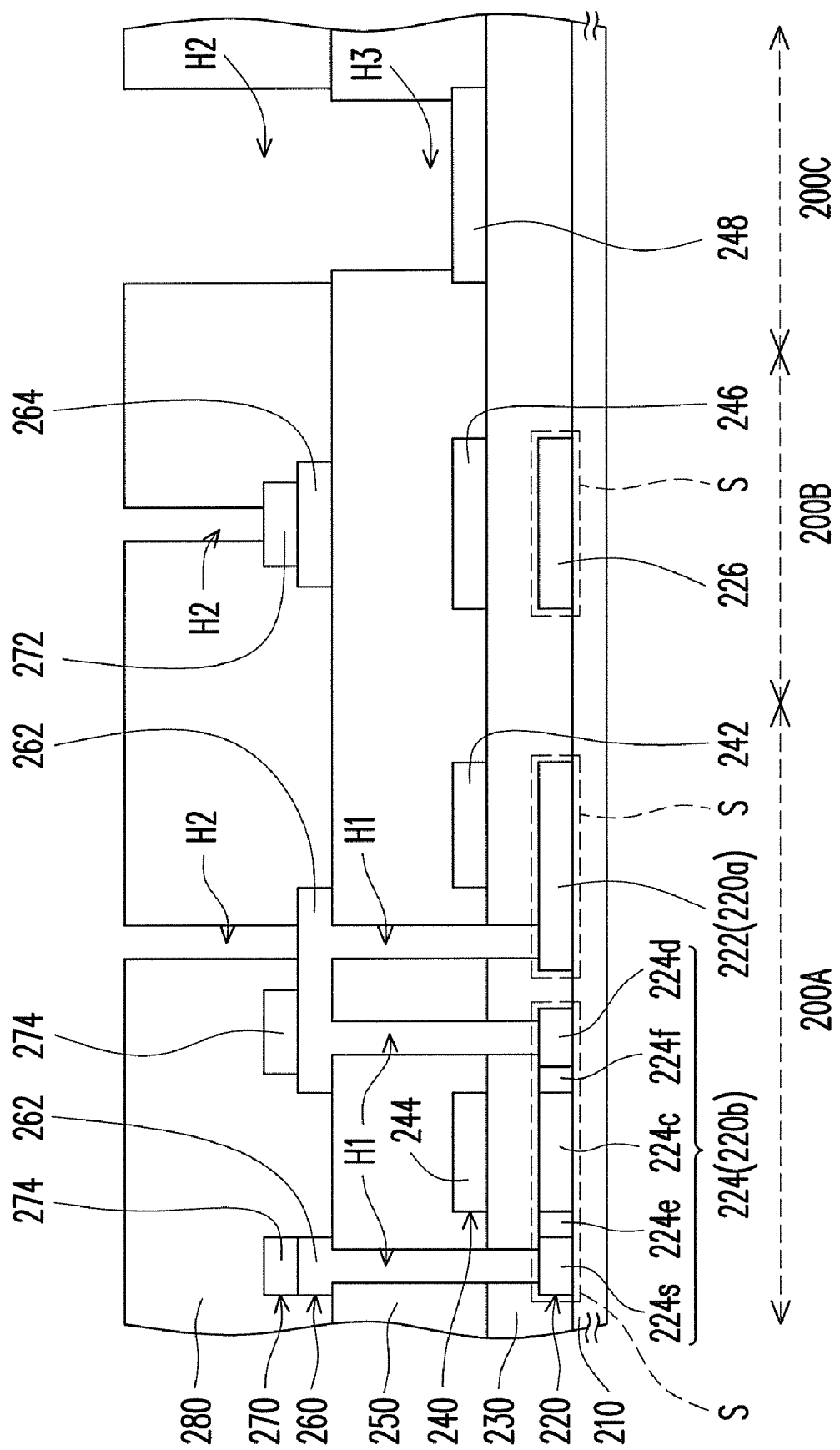
Figure 12G:
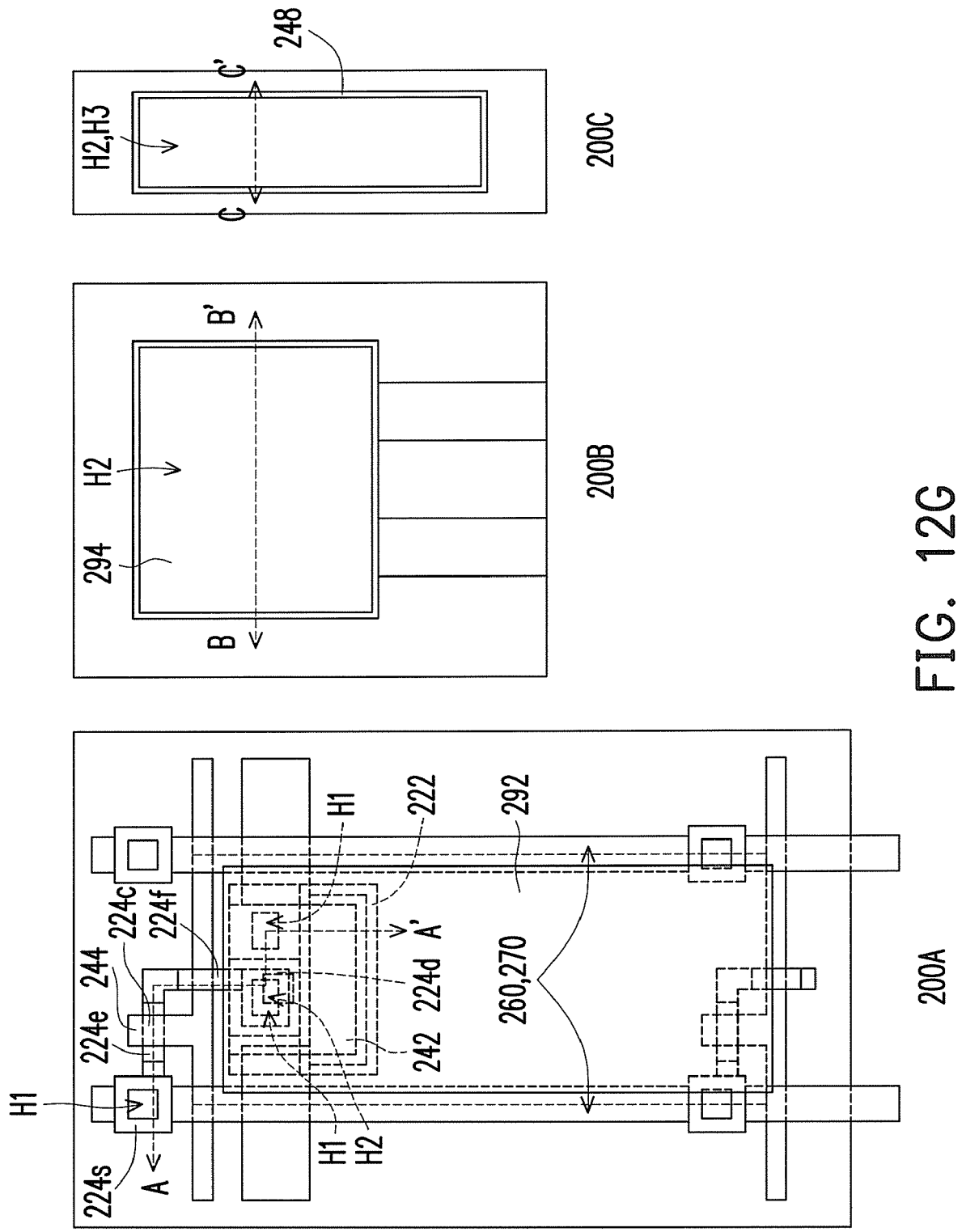
Figure 12G:
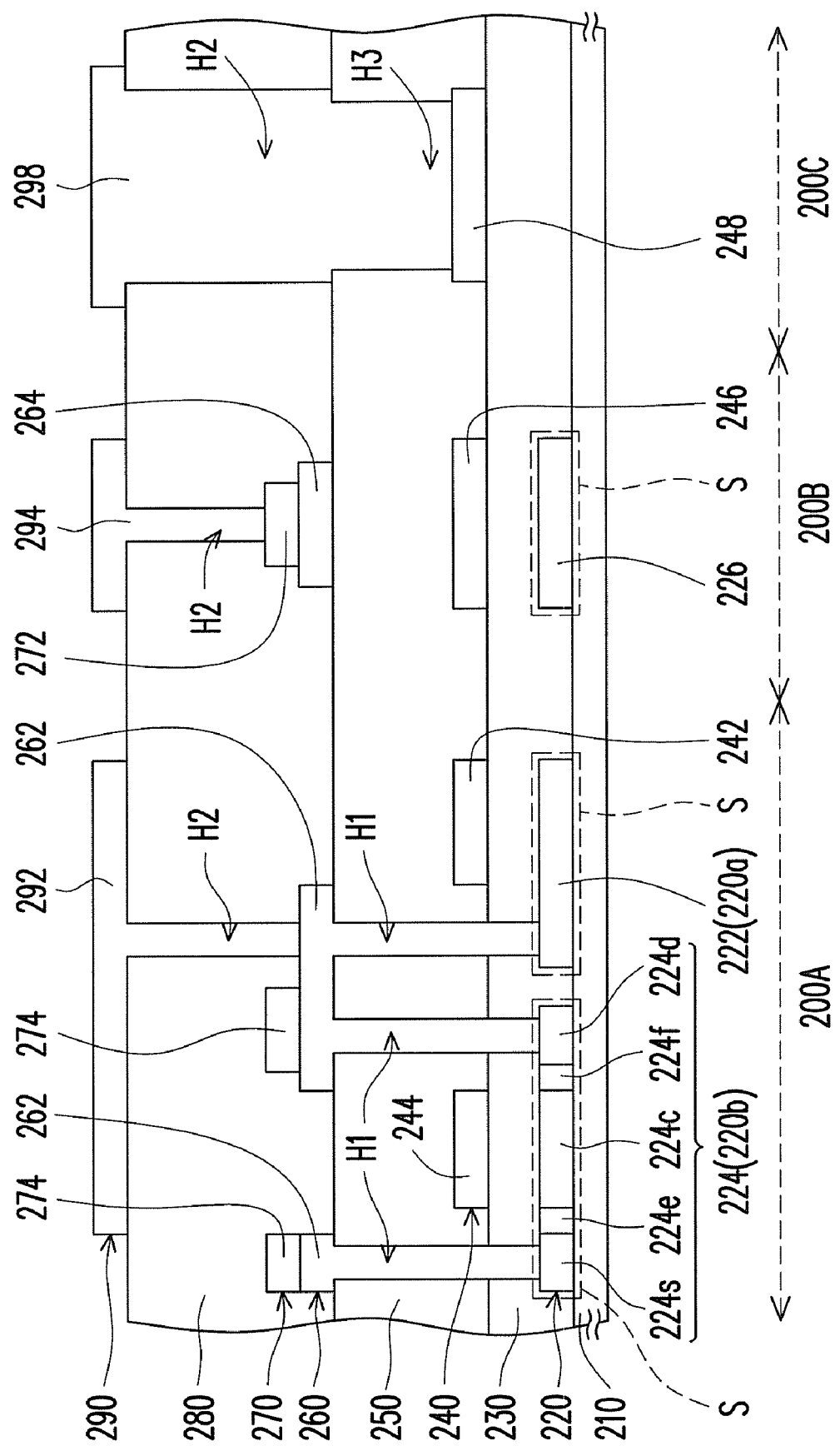

Then, as shown in FIGS. 12F and 12F', the coverage of second contact holes H2 is smaller than the active layer 272. After that, as shown in FIGS. 12G and 12G', in the present embodiment, in the step of forming the third patterned conductive layer 290, a portion of the third patterned conductive layer 290 serving as the pixel electrode 292 is directly connected to the contact conductors 262 through the second contact holes H2, and the pixel electrode 292 is electrically connected to the drain doping region 224d and the storage electrode 222 through the contact conductors 262. Moreover, in the sensing region 200B, the size of the bottom electrode 264 is larger than the size of the active layer 272.

Figure 13A:
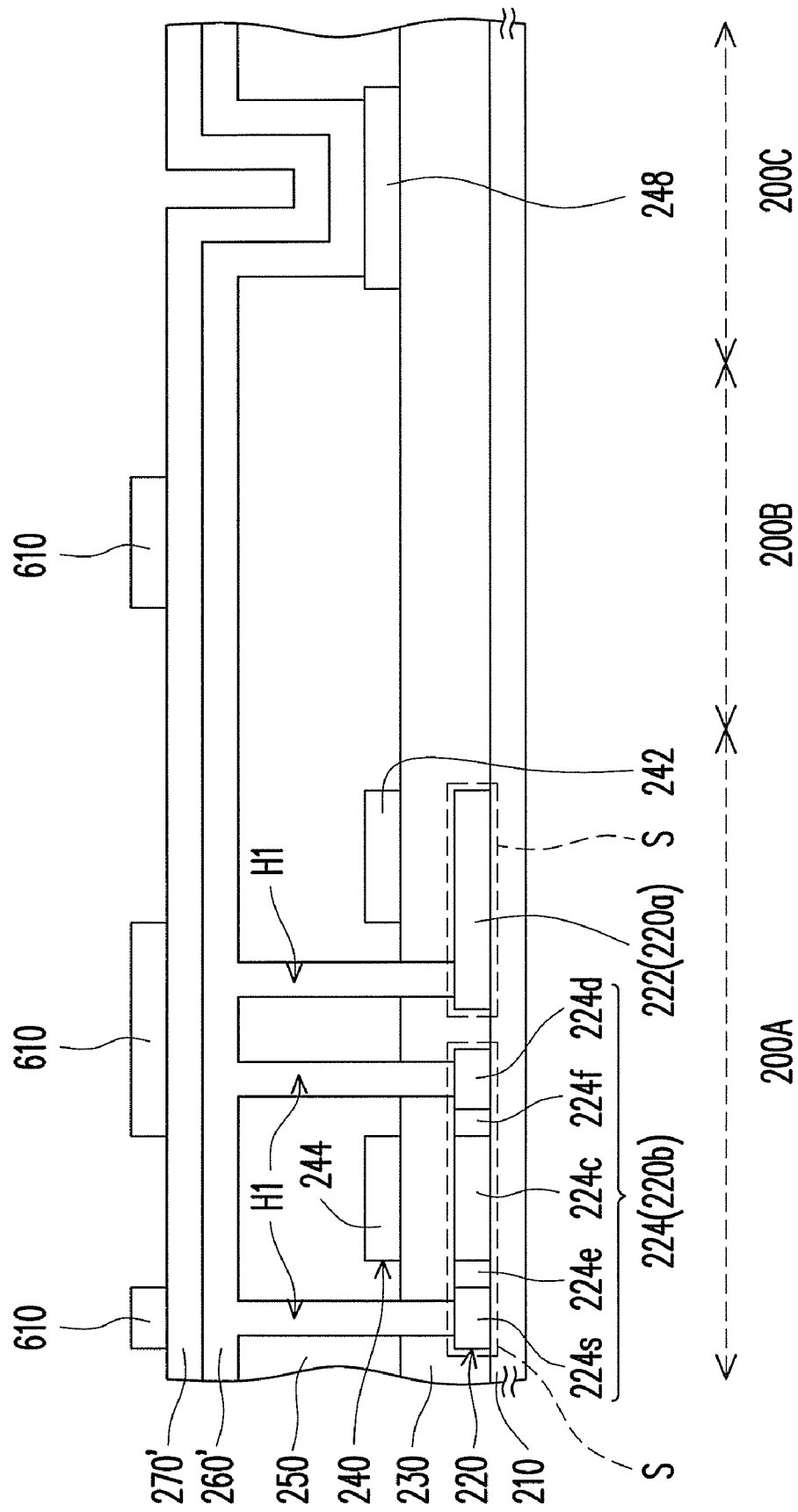
FIGS. 13A-13D illustrate a processing flow for forming the second patterned conductive layer and the second patterned semiconductor layer.
Figure 13B:
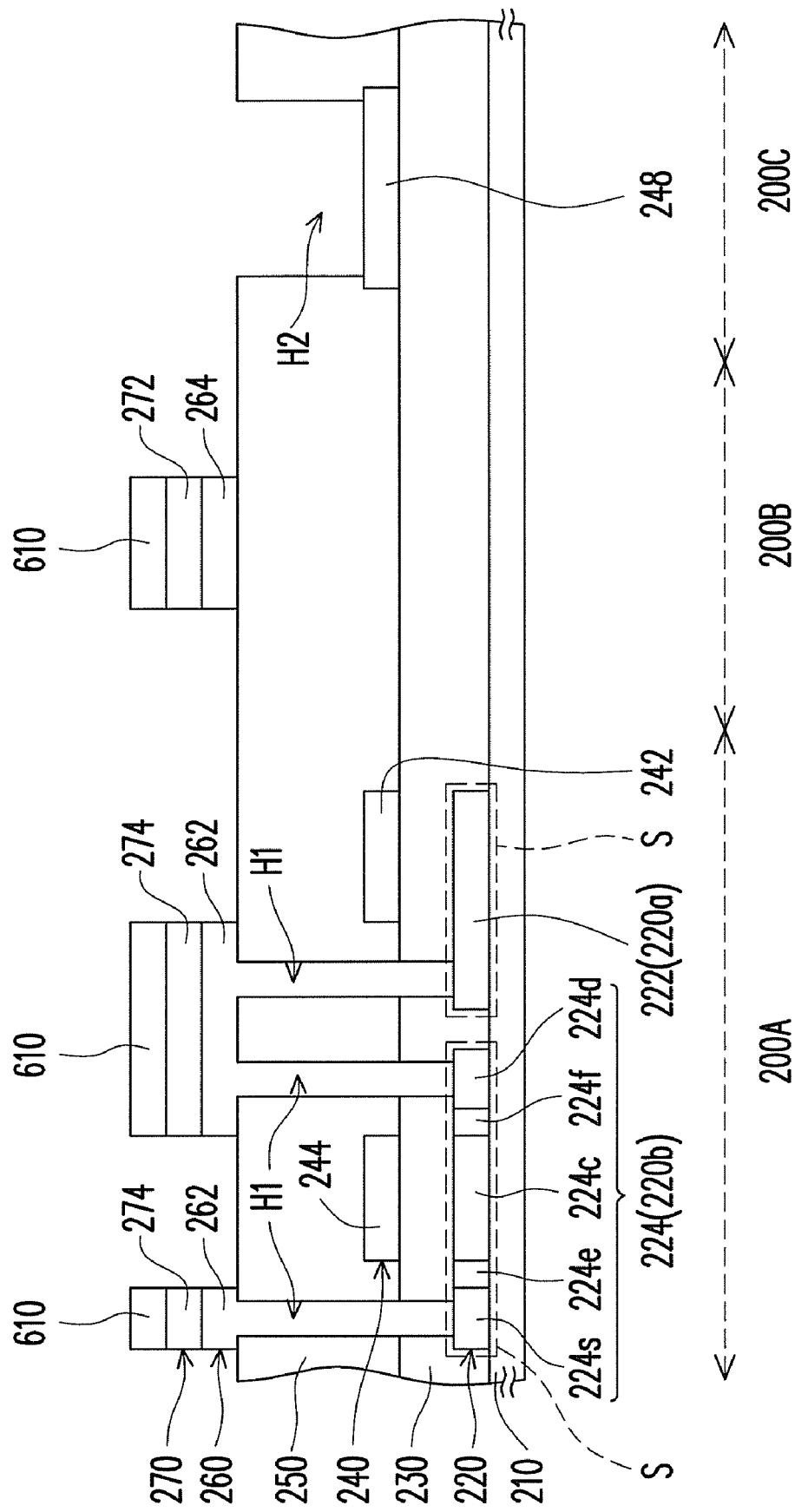

A method of forming the dummy semiconductor layers 274 of the sizes smaller than the sizes of the contact conductors 262, and forming the active layer 272 of the size smaller than the size of the bottom electrode 264 includes performing the isotropic etching process, for example. FIGS. 13A-13D illustrate a processing flow for forming the second patterned conductive layer and the second patterned semiconductor layer. As shown in FIG. 13A, a second conductive layer 260', a second semiconductor layer 270' and a patterned photoresist layer 610 are sequentially formed on the first dielectric layer 250, wherein the patterned photoresist layer 610 covers an area in which the bottom electrode 264 and the contact conductors 262 are to be formed, for example. Afterwards, as shown in FIG. 13B, the second conductive layer 260' and the second semiconductor layer 270' are patterned by using the patterned photoresist layer 610 as the mask, wherein a method of patterning the second conductive layer 260' and the second semiconductor layer 270' includes, for example, performing an etching process to form the bottom electrode 264, the active layer 272, the contact conductor 262 and the dummy semiconductor layers 274.

Figure 13C:
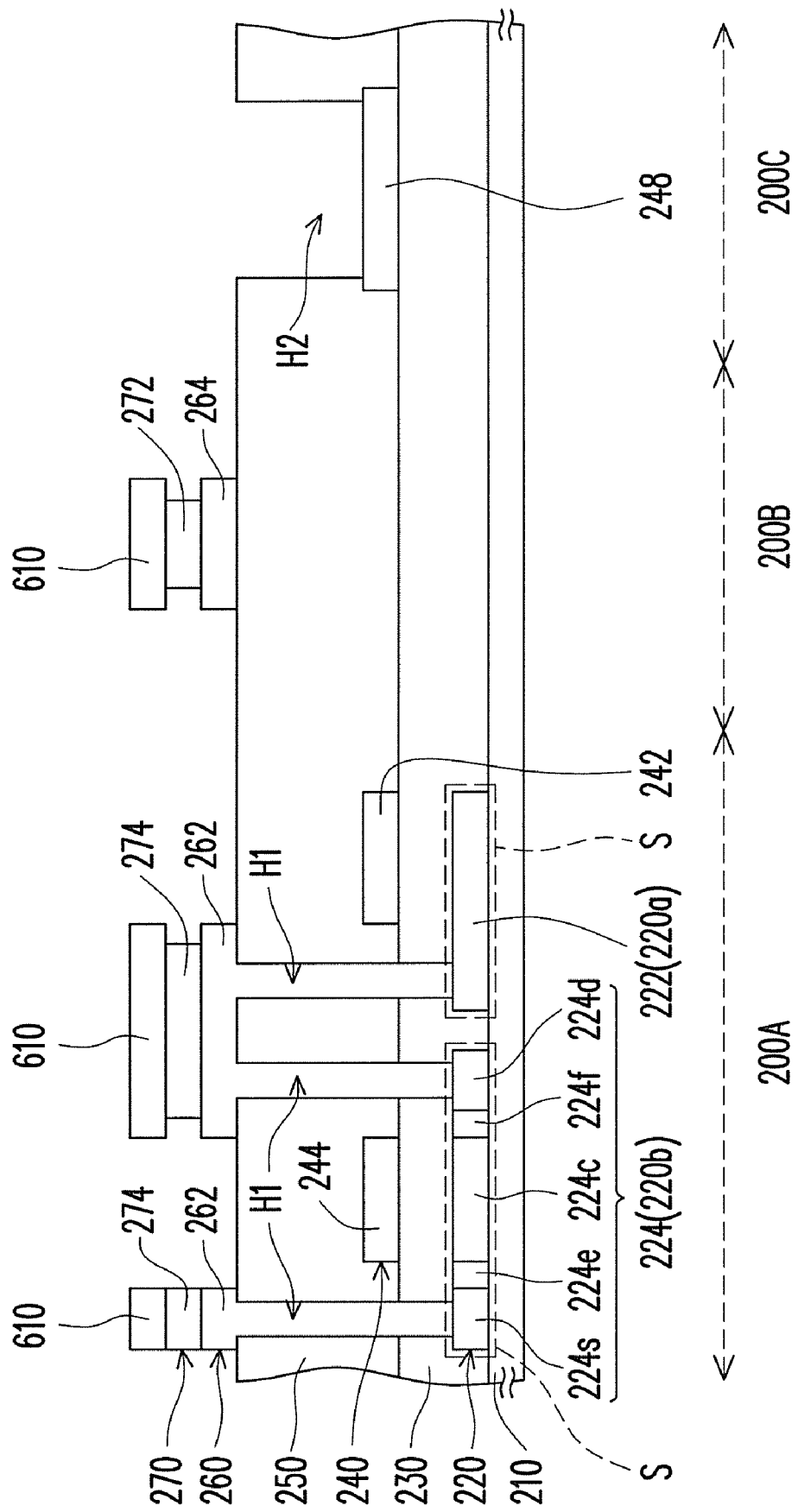

Then, as shown in FIG. 13C, a lateral etching process is performed on the active layer 272 and the dummy semiconductor layer 274, so that the sizes of the dummy semiconductor layers 274 are smaller than the sizes of the contact conductors 262, and the size of the active layer 272 is smaller than the size of the bottom electrode 264. In other words, the size of the second patterned semiconductor layer 270 is smaller than the size of the second patterned conductive layer 260. The lateral etching process includes, for example, a wet etching process, wherein an etchant with a high selection ratio to the material of the second conductor layer is used to perform the lateral etching process. Certainly, the lateral etching process is not limited to the wet etching process. The lateral etching process may be a dry etching process, wherein a reactive gas with higher concentration is used to perform the lateral etching process on the second semiconductor layer 270' without a biased pressure being applied. However, the types of the etching process are not limited by the present invention.

Figure 13D:
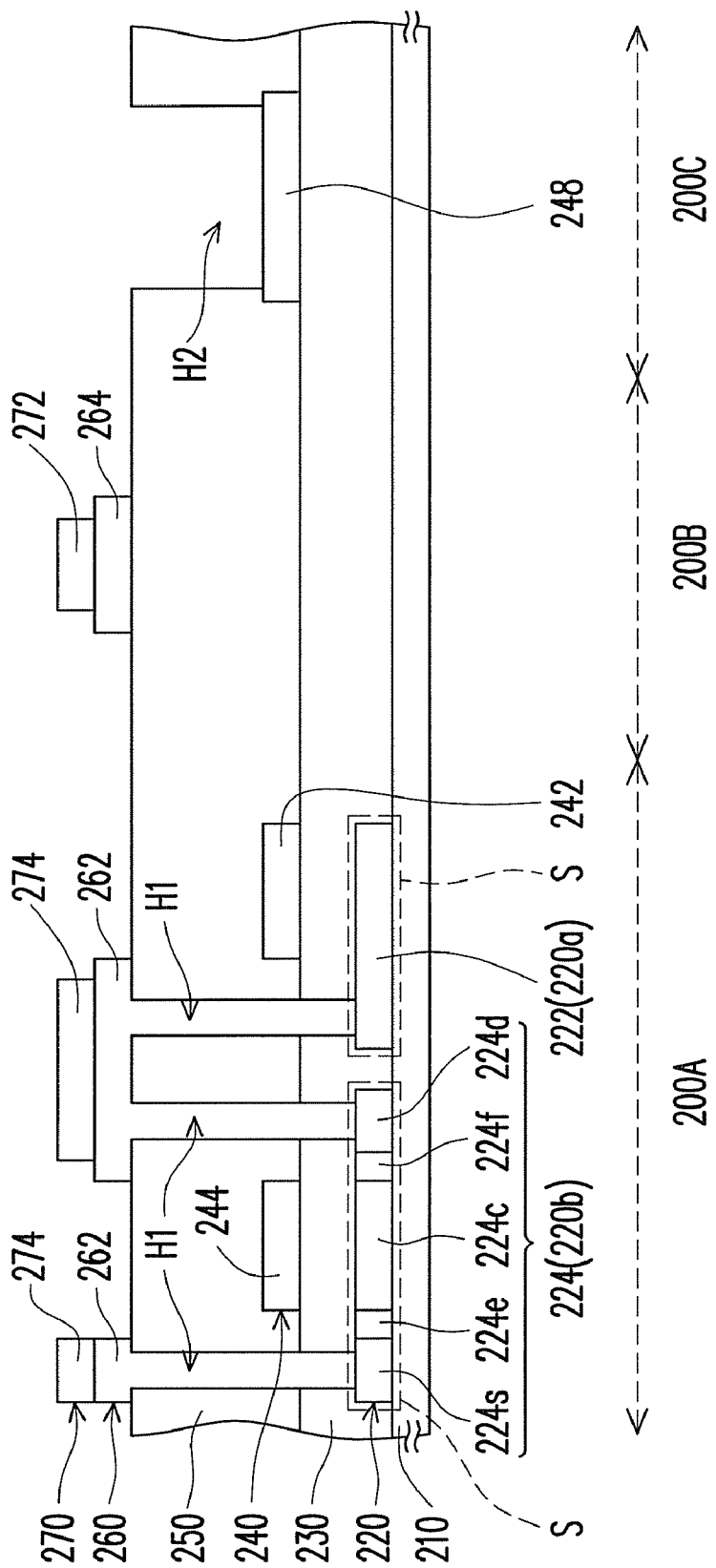

After that, as shown in FIG. 13D, after a photoresist layer removing process is performed, the remained patterned photoresist layer 610 is removed to form the structure shown in FIG. 12E, i.e., the sizes of the contact conductors 262 are larger than the sizes of the dummy semiconductor layers disposed over the same, and the size of the bottom electrode 264 is larger than the size of the active layer 272.

Figure 12H:
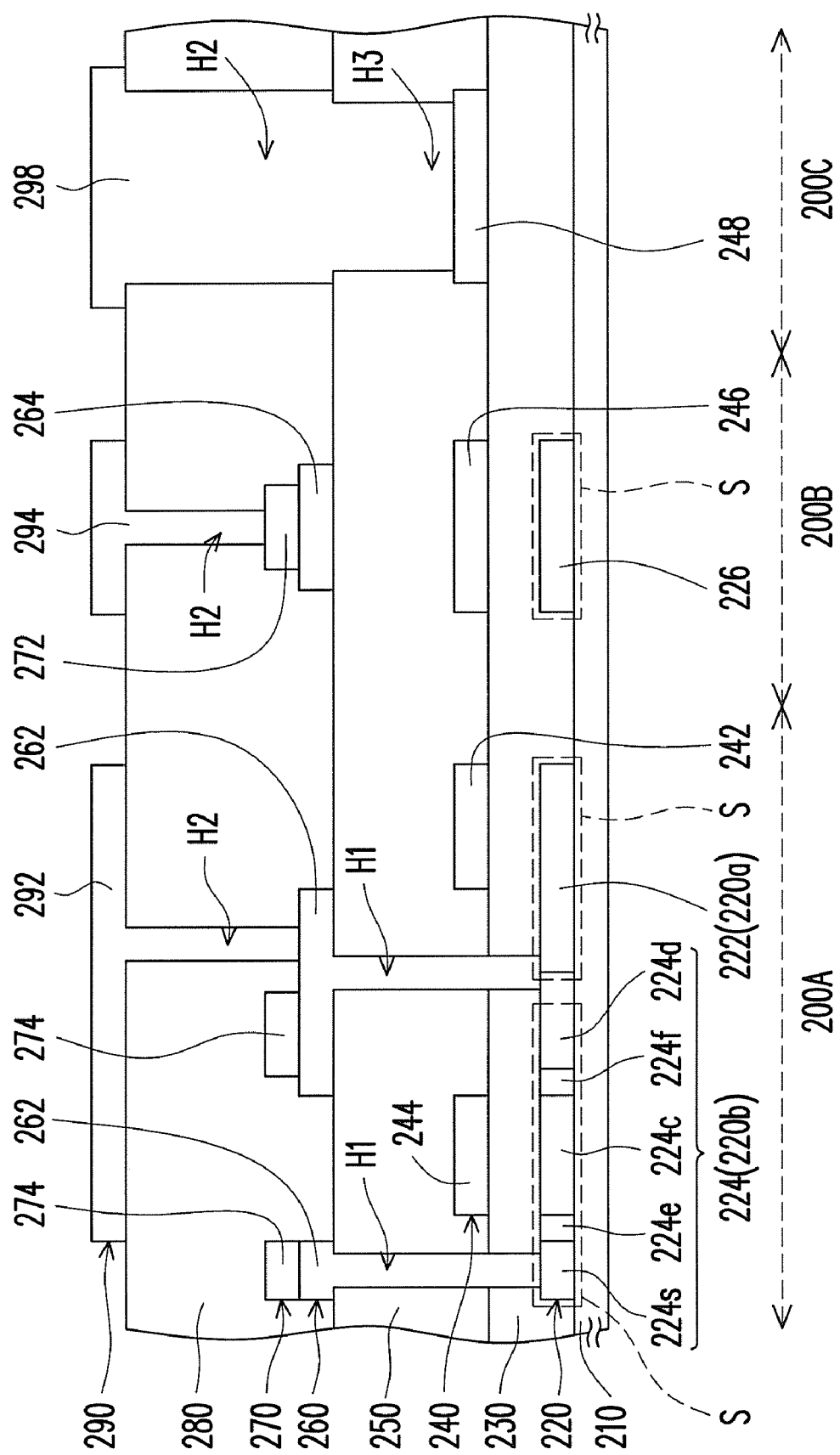
FIG. 12H is a schematic view illustrating another active device array substrate according to the fifth embodiment of the present invention.

FIG. 12H is a schematic view illustrating another active device array substrate according to the fifth embodiment of the present invention. Referring to FIG. 12H, a portion of the first type doping region 220a and the second type doping region 220b in the active device array substrate are in contact with each other, and a contact interface is disposed between the first type doping region 220a and the second type doping region 220b. A portion of the first contact holes H1 exposes the contact interface. In other words, the first contact holes H1 expose both the first type doping region 220a and the second type doping region 220b simultaneously, so that the contact conductor 262 electrically connected to the pixel electrode 292 is directly connected to the first type doping region 220a and the second type doping region 220b simply through a first contact hole H1.

Similar to the foregoing embodiments, in the fifth embodiment, seven photolithography and etching processes are also used to fabricate the active device array substrate 600 having the photo sensor. Thereby, the active device array substrate 600 according to the present embodiment also may reduce the process time and process cost. Meanwhile, since the size of the bottom electrode 264 in the sensing region 200B is larger than the size of the active layer 272, the bottom electrode 264 can effectively shield the light from the backlight source, thus preventing the active layer 272 from generating the photo current due to the interference of the unexpected light and reducing the noises of the photo sensor.

Sixth embodiment

Figure 14:
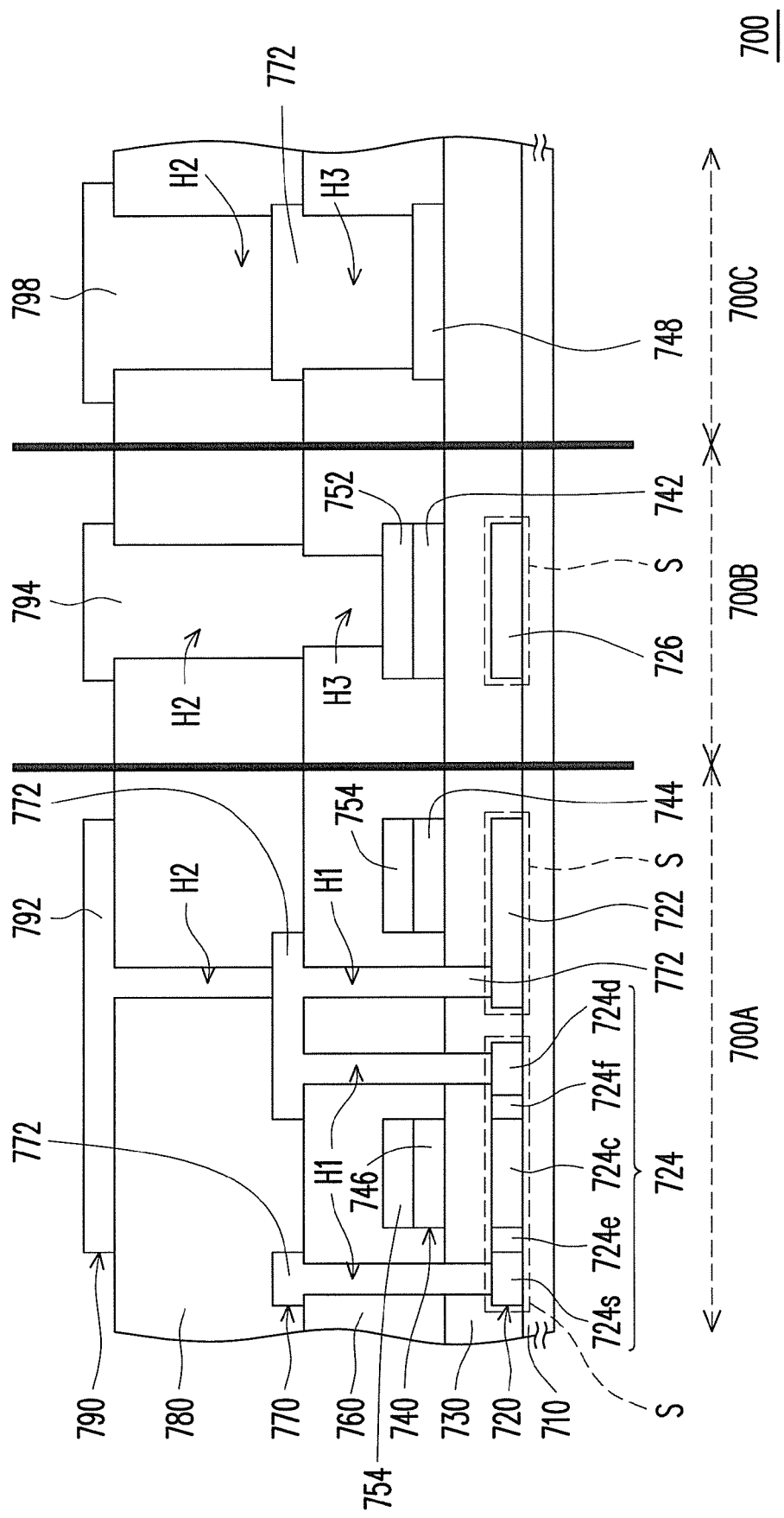
FIG. 14 illustrates an active device array substrate according to a sixth embodiment of the present invention.

FIG. 14 illustrates an active device array substrate according to a sixth embodiment of the present invention. An active device array substrate 700 of the present embodiment is similar the active device array substrate 400 of the third embodiment, and the materials of like elements and the fabricating steps may refer to the foregoing embodiment and not described repetitively herein. According to the present embodiment, the active device array substrate 700 is divided into a pixel region 700A, a sensing region 700B, and a pad region 700C, as shown in FIG. 14. The active device array substrate 700 includes a substrate 710, a first patterned semiconductor layer 720, a gate insulator 730, a first patterned conductive layer 740, a second patterned semiconductor layer 750, a first dielectric layer 760, a second patterned conductive layer 770, a second dielectric layer 780, and a third patterned conductive layer 790. Compared with the foregoing embodiments, the second patterned semiconductor layer 750 is disposed on the first patterned conductive layer 740, the bottom electrode 742 and the active layer 752 in the photo sensor are fabricated respectively by using the first patterned conductive layer 740 and the second patterned semiconductor layer 750, and the first patterned conductive layer 740 and the second patterned semiconductor layer 750 are formed simultaneously. Moreover, in the active device array substrate 700 of the present embodiment, dummy semiconductor layers 754 are formed on gates 746, for example.

In detail, referring to FIG. 14, the first patterned conductive layer 740 of the active device array substrate 700 includes a plurality of gates 746 and a bottom electrode 742. The second patterned semiconductor layer 750 is disposed on the first patterned conductive layer 740, wherein the second patterned semiconductor layer 750 includes the active layer 750 disposed on the bottom electrode 742. The first dielectric layer 760 is disposed on the gate insulator 730 to cover the first patterned conductive layer 740, wherein the first dielectric layer 760 and the gate insulator 730 include a plurality of first contact holes H1 exposing the first patterned semiconductor layer 720, and a third contact hole H3. The second patterned conductive layer 770 is disposed on the first dielectric layer 760, wherein the second patterned conductive layer 770 includes a plurality of contact conductors 772 in the first contact holes H1. The second dielectric layer 780 is disposed on the first dielectric layer 760, wherein the second dielectric layer 780 includes a plurality of second contact holes H2, and a portion of the second contact holes H2 is disposed over the active layer 752. The third patterned conductive layer 790 is disposed on the second dielectric layer 780, wherein a portion of the third patterned conductive layer 790 is electrically connected to the active layer 752 through a portion of the second contact holes H2 and the third contact hole H3.

As shown in FIG. 14, the first patterned semiconductor layer 720 is disposed on the substrate 710, and a first light-shielding layer 726 is selectively disposed on the substrate 710 in the sensing region 700B in order to prevent unexpected light from affecting the operation of the photo sensor. The gate insulator 730 is disposed on the substrate 710, and the gate insulator 730 is disposed on the substrate 710 to cover the first patterned semiconductor layer 720. The gate insulator 730 is formed of the dielectric material.

Referring to FIG. 14, it should be noted that, in the present embodiment, the first patterned conductive layer 740 is disposed on the gate insulator 730, and the first patterned conductive layer 740 is divided into the plurality of gates 746 of the active device, a storage electrode 744 of the storage capacitor, the bottom electrode 742 in the sensing region 700B, and a first pad layer 748 in the pad region 700C, wherein the gates 746, the storage electrode 744, the bottom electrode 742, the first pad layer 748 are formed of the same conductive material, the gates 746 are disposed over the gate insulator 730 disposed over a channel 724c, and the storage electrode 744 is disposed on the gate insulator 730 over the storage electrode 722.

As shown in FIG. 14, the second patterned semiconductor layer 750 is disposed on the first patterned conductive layer 740, wherein the second patterned semiconductor layer 750 includes the active layer 752 disposed on the bottom electrode 742. It should be noted that, in the present embodiment, the second patterned semiconductor layer 750 further includes a plurality of dummy semiconductor layers 754 disposed on the gates 746. The sizes of the dummy semiconductor layers 754 are smaller than or equal to the sizes of the contact conductors 772. However, the present invention is not limited thereto. As shown in FIG. 14, the first dielectric layer 760 is disposed on the gate insulator 730 to cover the first patterned conductive layer 740, wherein the first dielectric layer 760 and the gate insulator 730 include the plurality of first contact holes H1 and the third contact hole H3, and the third contact hole H3 exposes the active layer 752. In the present embodiment, the first dielectric layer 760 further forms, for example, a plurality of third contact holes H3 exposing the first patterned conductive layer 740. For example, the third contact holes H3 in the pad region 700C expose the first pad layer 748.

Still referring to FIG. 14, the second patterned conductive layer 770 is disposed on the first dielectric layer 760, wherein the second patterned conductive layer 770 includes the plurality of contact conductors 772, and the contact conductors 772 are disposed in at least a portion of the first contact holes H1 to pass through the first dielectric layer 760 and the gate insulator 730 to correspondingly couple with a portion of the first patterned semiconductor layer 720. In the present embodiment, the contact conductors 772 are connected respectively to a source doping region 724s, a drain doping region 724d, and the storage electrode 722, for example. Moreover, in the present embodiment, the contact conductors 772 are connected to the first pad layer 748 of the first patterned semiconductor layer 720 through the third contact hole H3.

Continuing to refer to FIG. 14, the second dielectric layer 780 is disposed on the first dielectric layer 760, wherein the second dielectric layer 780 includes the plurality of second contact holes H2, and a portion of the second contact holes H2 is disposed over the active layer 752. The third patterned conductive layer 790 is disposed on the second dielectric layer 780, wherein a portion of the third patterned conductive layer 790 is electrically connected to the active layer 752 through a portion of the second contact holes H2 and the third contact hole H3. Therefore, the photo sensor formed in the sensing region 700B includes the bottom electrode 742 disposed on the gate insulator 730, the active layer 752 disposed on the bottom electrode 742, and the top electrode 794 contacting the active layer 752 by passing through the second dielectric layer 780.

Furthermore, a portion of the second contact holes H2 is disposed correspondingly to the first contact holes H1, so that a portion of the third patterned conductive layer 790 serving as the pixel electrode 792 is electrically connected to the active device and the storage electrode 722 through the first contact holes H1 and the second contact holes H2. In other words, the pixel electrode 792 passes through the second dielectric layer 780 to contact the contact conductors 772 filled in the first contact holes H1, and the pixel electrode 792 is coupled downward with the first patterned semiconductor layer 720 through the contact conductors 772. In the present embodiment, the pixel electrode 792 is electrically connected to the drain doping region 724d of the first patterned semiconductor layer 720 and the storage electrode 722, for example. As shown in FIG. 14, the storage electrode 722 is electrically connected to the drain doping region 224d through the contact conductors 772. In other words, the storage electrode 722 below the gate insulator 730 has the same voltage as the pixel electrode 792. Therefore, according to the present embodiment, the storage electrode 722, the gate insulator 730, the storage electrode 744, the dummy semiconductor layers 754, the first dielectric layer 760, the second dielectric layer 780, and the pixel electrode 792 together form a multi-layered storage capacitor. Depending on the requirement of actual design in panel, the storage capacitor may be the single-layered or the multi-layered storage structure.

Furthermore, in the pad region 700C of the present embodiment, a portion of the second contact holes H2 is disposed correspondingly to the third contact hole H3 to expose the first pad layer 748 of the first patterned conductive layer 740, a portion of the third patterned conductive layer 790 serving as the second pad layer 798 is electrically connected to the first pad layer 748 of the first patterned conductive layer 740 through the third contact hole H3 and the second contact holes H2. In detail, a portion of the third patterned conductive layer 790 serving as the second pad layer 798 is electrically connected to the first pad layer 748 through the second contact holes H2 and the contact conductors 772 filled in the third contact hole H3. In the present embodiment, pads are mainly formed by the first pad layer 748 of the first patterned conductive layer 740, the contact conductors 772 of the second patterned conductive layer 770, and the second pad layer 798 of the third patterned conductive layer 790.

To better explain the technical content of the present invention, the following description in association with the accompanied drawings further illustrates the method for fabricating active device array substrate 700 according to the sixth embodiment of the present invention.

Figure 15A:
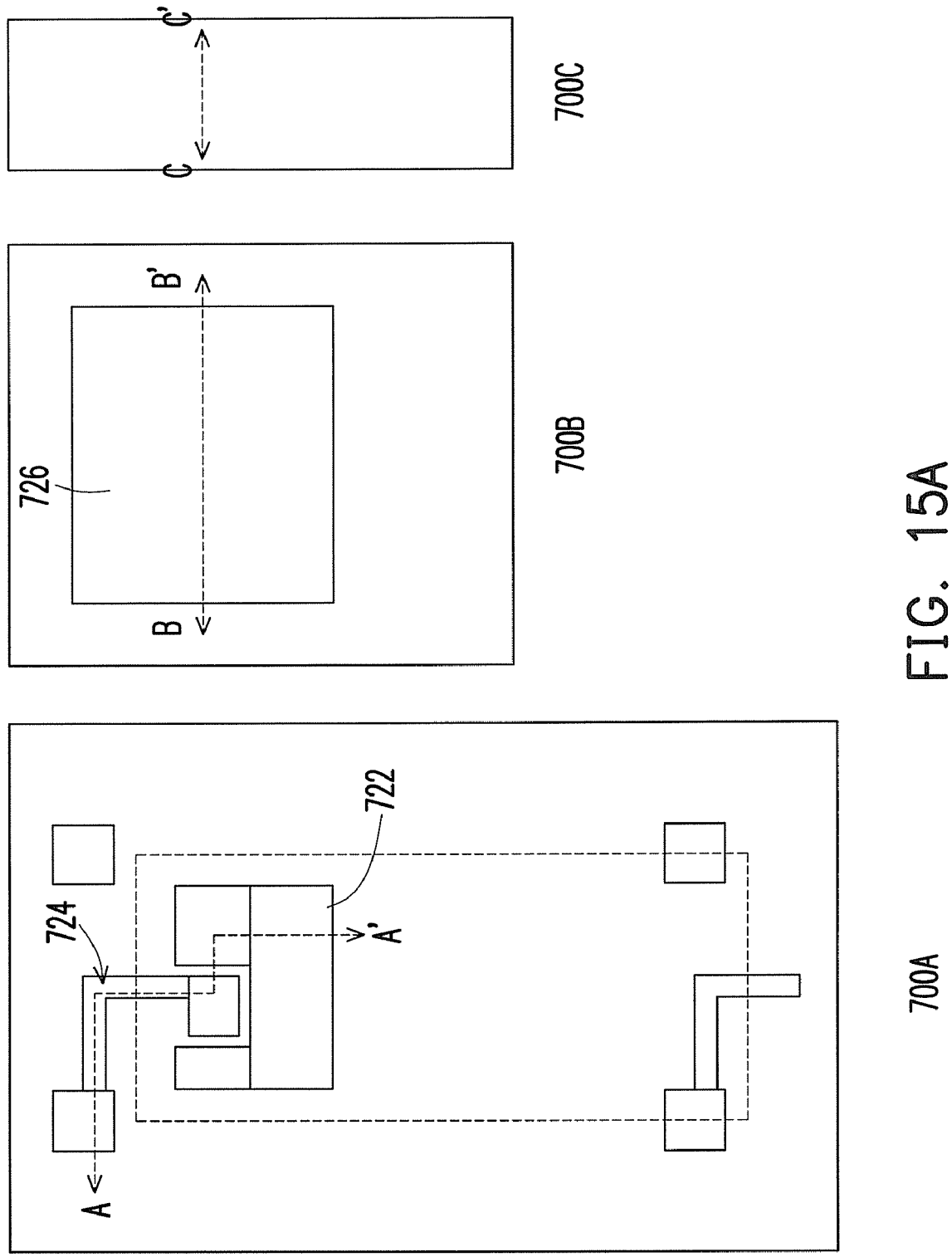
FIGS. 15A-15G illustrates a processing flow for fabricating the active device array substrate according to the sixth embodiment of the present invention.
Figure 15A:
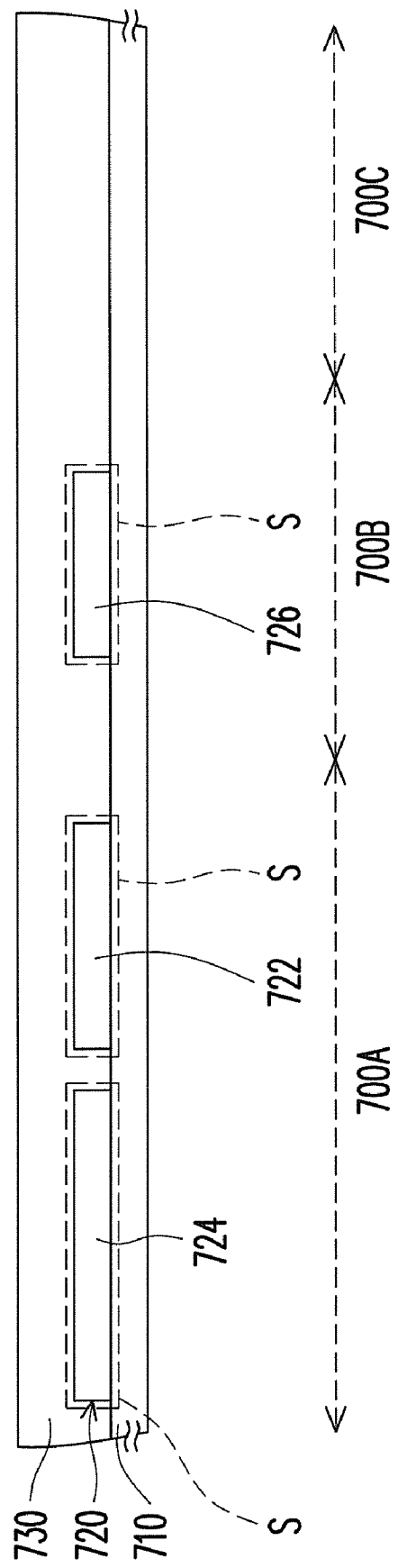
Figure 15B:
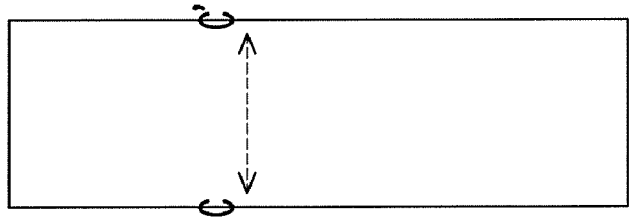
Figure 15B:
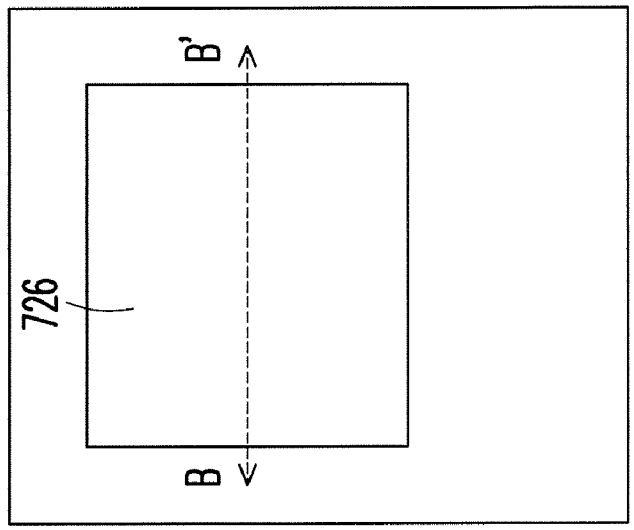
Figure 15B:
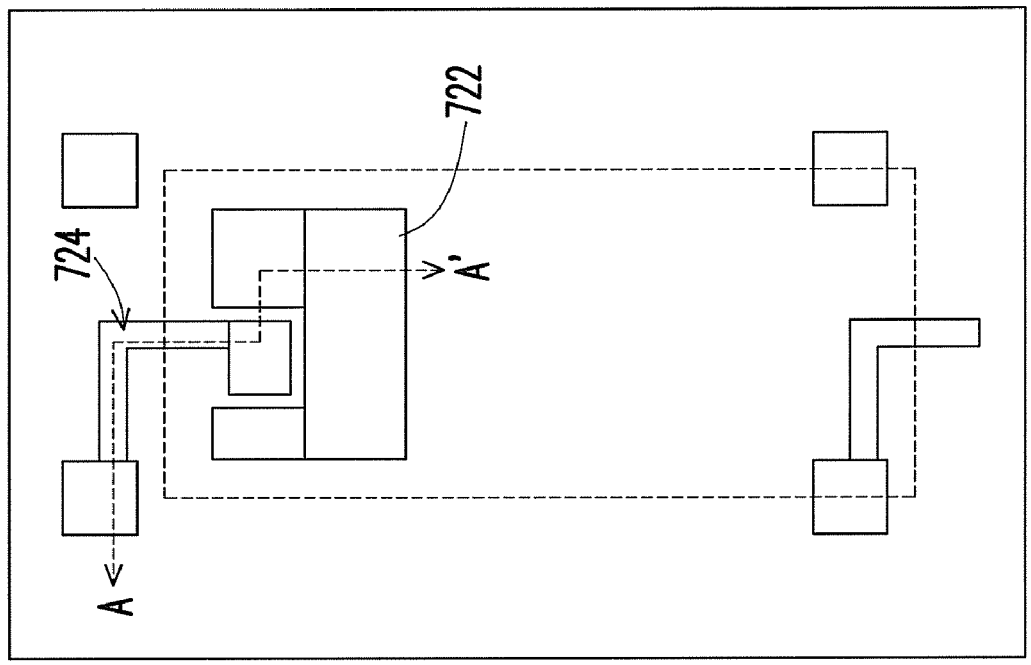
Figure 15B:
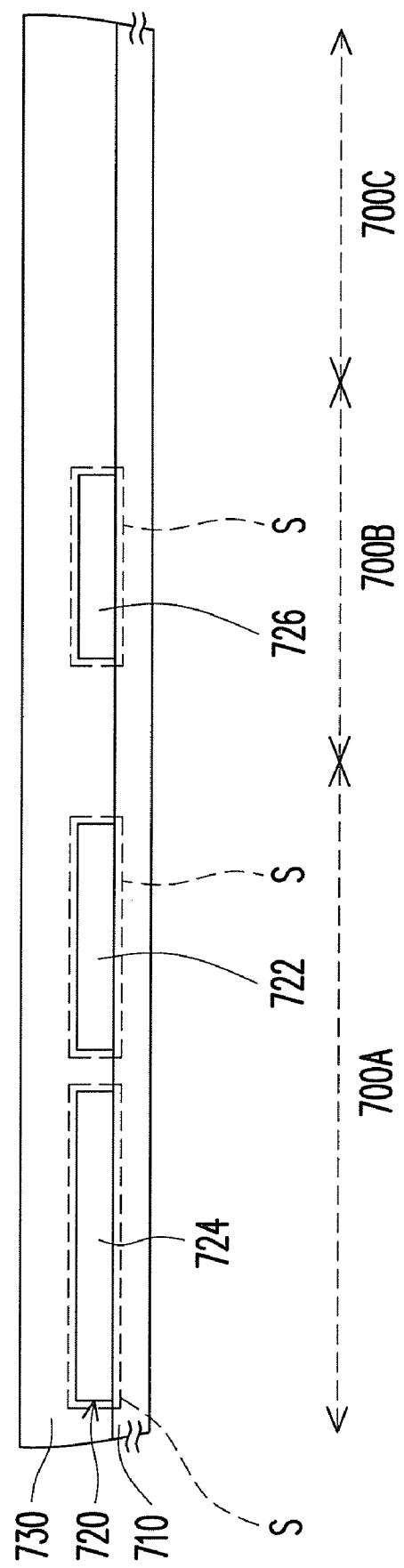

Please refer to FIGS. 15A-15G which illustrate a processing flow for fabricating the active device array substrate according to the sixth embodiment of the present invention. FIGS. 15A'-15G' are respective cross-sectional views along line AA' of the pixel region, line BB' of the sensing region, and line CC' of the pad region in FIGS. 15A-15G. In order to simplify the description, similarities in the process flow of the present embodiment to the processing flows of FIGS. 6A-6G, and FIGS. 6A'-6G' are not described repetitively. The processing flows of FIGS. 15A-15B and FIGS. 15A'-15B'are similar to those of FIGS. 6A-6B and FIGS. 6A'-6B', and therefore detailed descriptions are omitted herein.

Figure 15C:
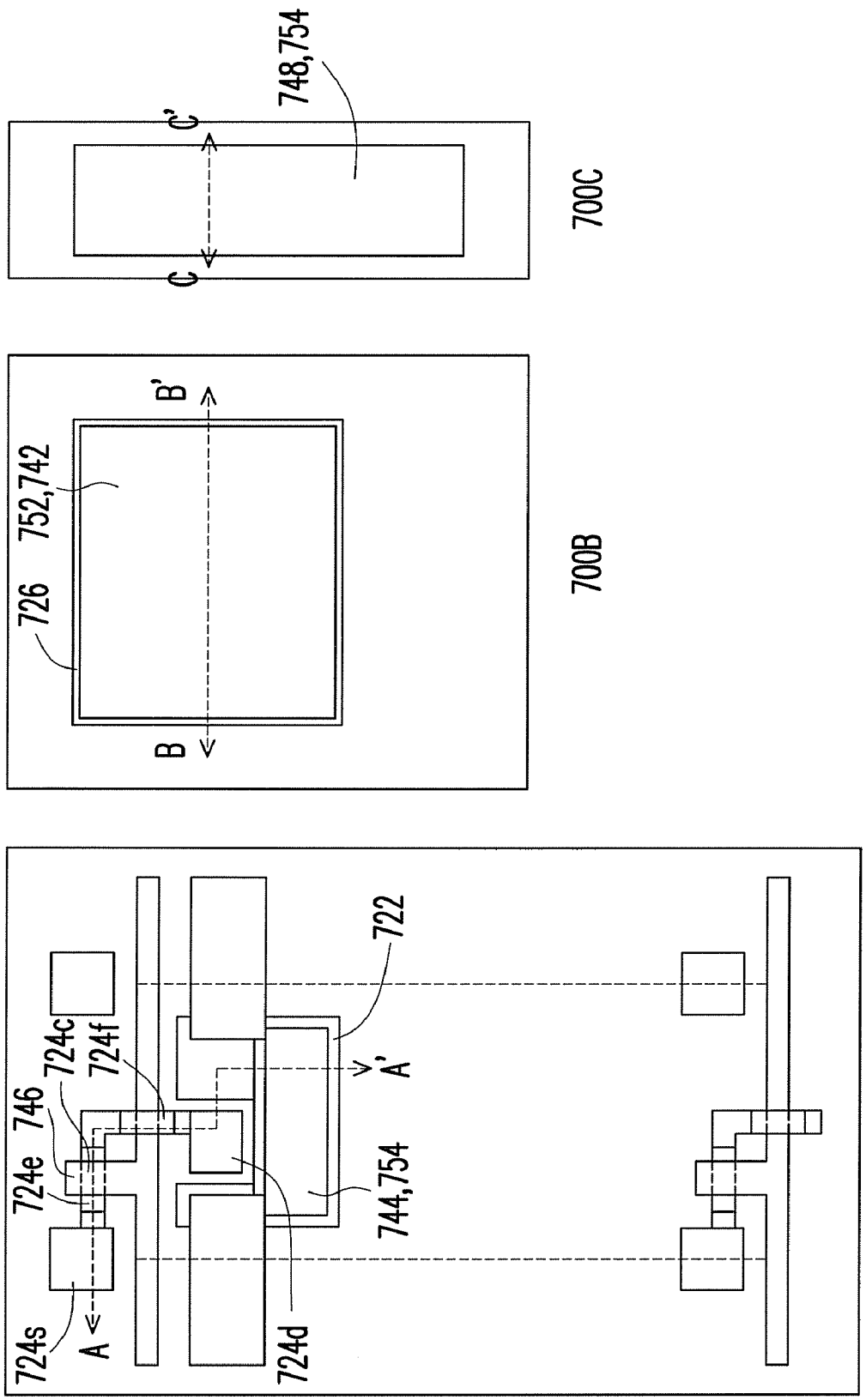
Figure 15C:
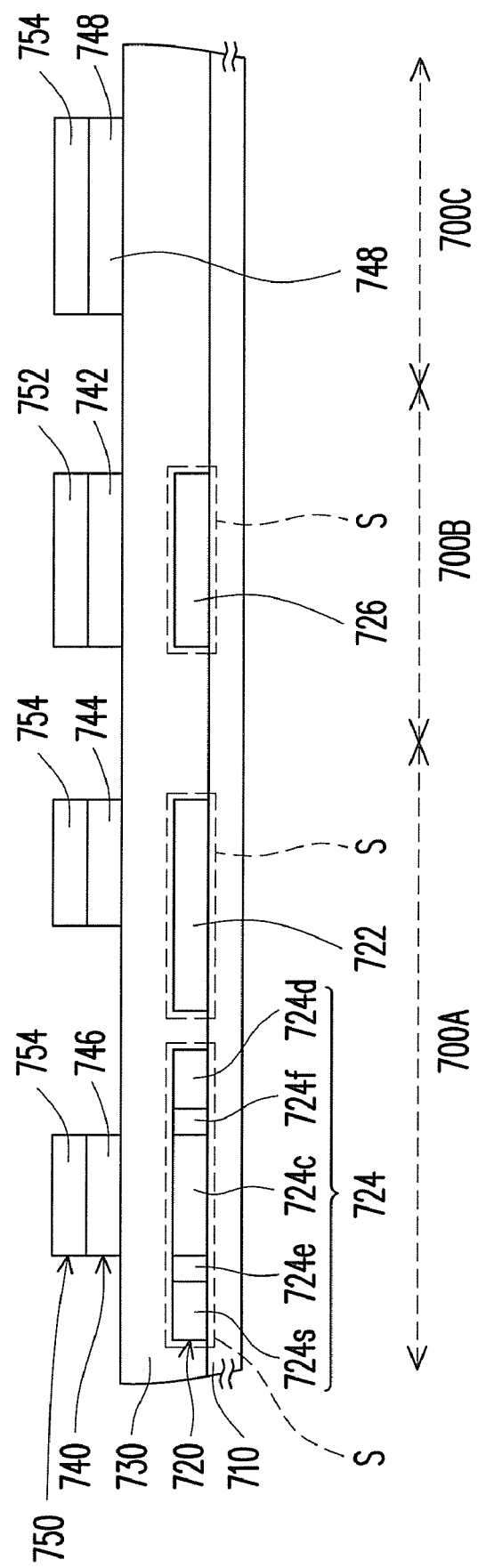

As shown in FIGS. 15C and 15C', compared with the third embodiment, in the present embodiment, after the gate insulator 730 is formed, a method of simultaneously forming the first patterned conductive layer 740 and the second patterned semiconductor layer 750 disposed on the first patterned conductive layer 740 includes, for example, first forming a first conductive layer and a second semiconductor layer on the gate insulator 730. Next, the first conductive layer and the second semiconductor layer are patterned simultaneously to form the bottom electrode 742 and the active layer 752 in the sensing region 700B on the gate insulator 730, and to form the gates 746 and the dummy semiconductor layers 754 disposed thereon, the storage electrode 744, and the dummy semiconductor layer 754 disposed thereon respectively over the first patterned semiconductor layer 720 of the pixel region 700A, and to form the first pad layer 748 and the dummy semiconductor layers 754 on the gate insulator 730 of the pad region 700C. Certainly, a method of simultaneously forming the first patterned conductive layer 740 and the second patterned semiconductor layer 750 may include a half-tone mask photolithography and etching process, and the detailed steps thereof may refer to the steps of FIGS. 7A-7D as described above and are not repeated herein.

Figure 15D:
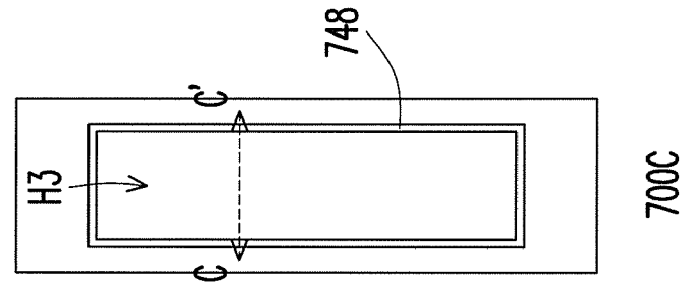
Figure 15D:
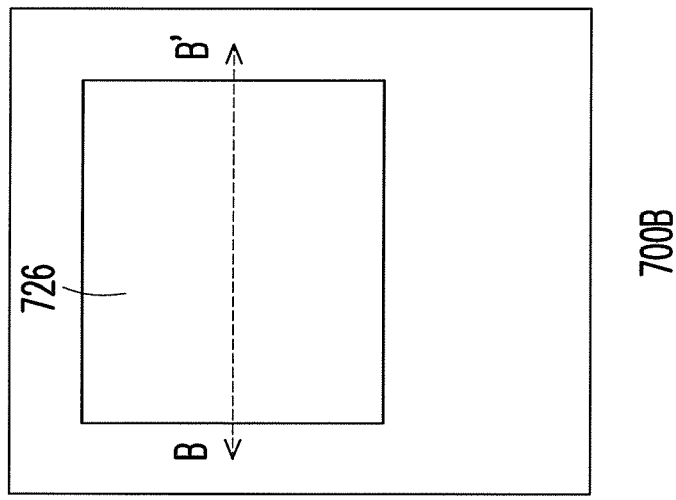
Figure 15D:
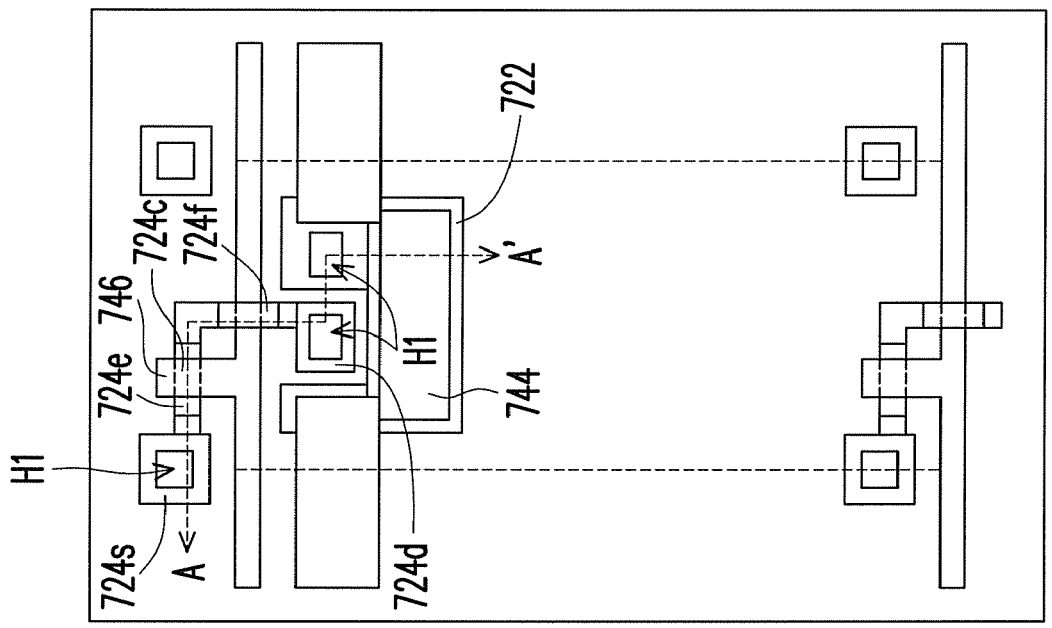
Figure 15D:
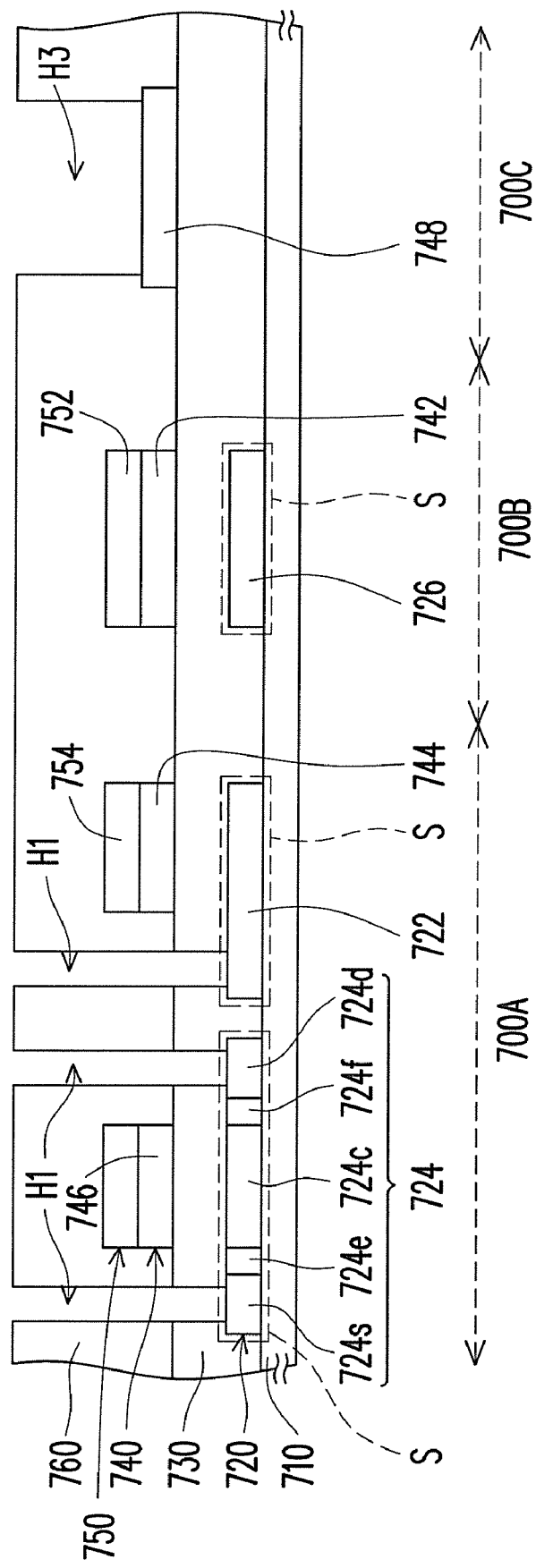

Then, as shown in FIG. 15D and 15D', compared with the third embodiment, in the present embodiment, a plurality of third contact holes H3 are simultaneously formed in the first dielectric layer 760 at the same time of forming the first contact hole H1 in the first dielectric layer 760 exposing the first pad layer 748 in the first patterned conductive layer 740. The method of simultaneously forming the first contact holes H1 and the third contact hole H3 in the first dielectric layer 760 may refer to the steps illustrated by FIGS. 10A-10D as described above, and thus detailed descriptions are omitted herein.

Figure 15E:
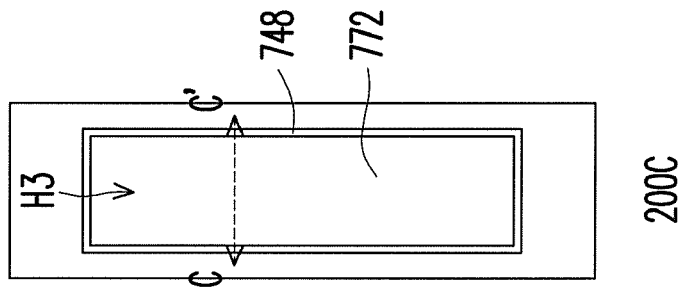
Figure 15E:
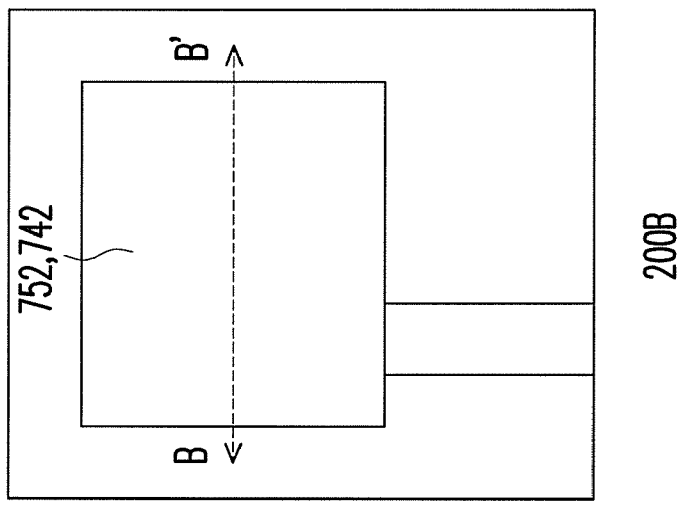
Figure 15E:
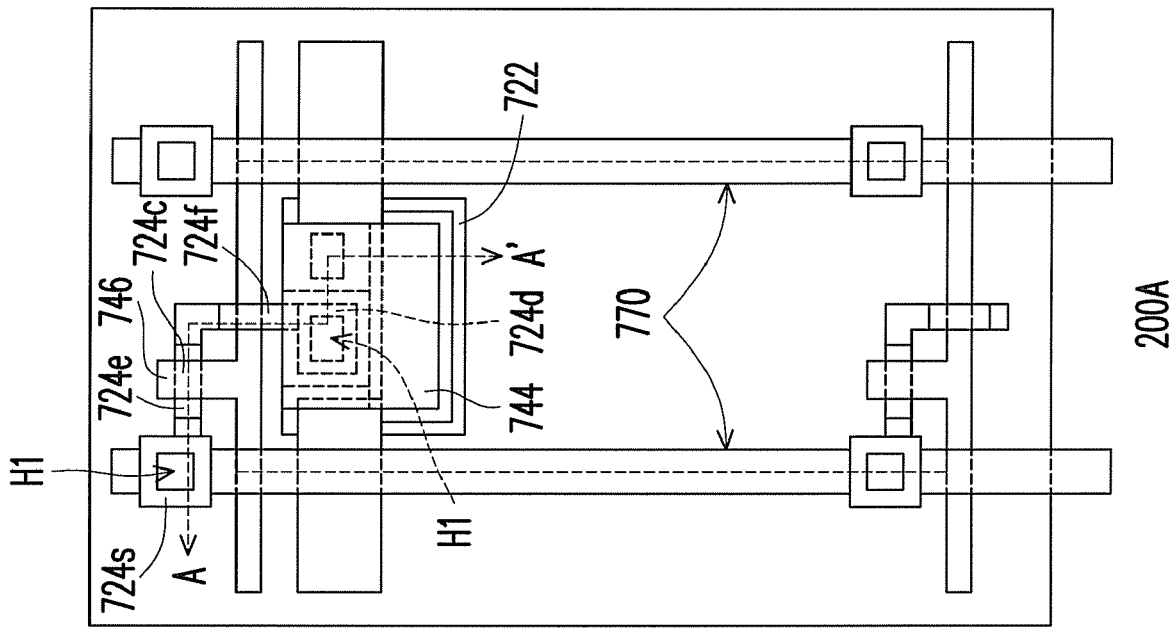
Figure 15E:
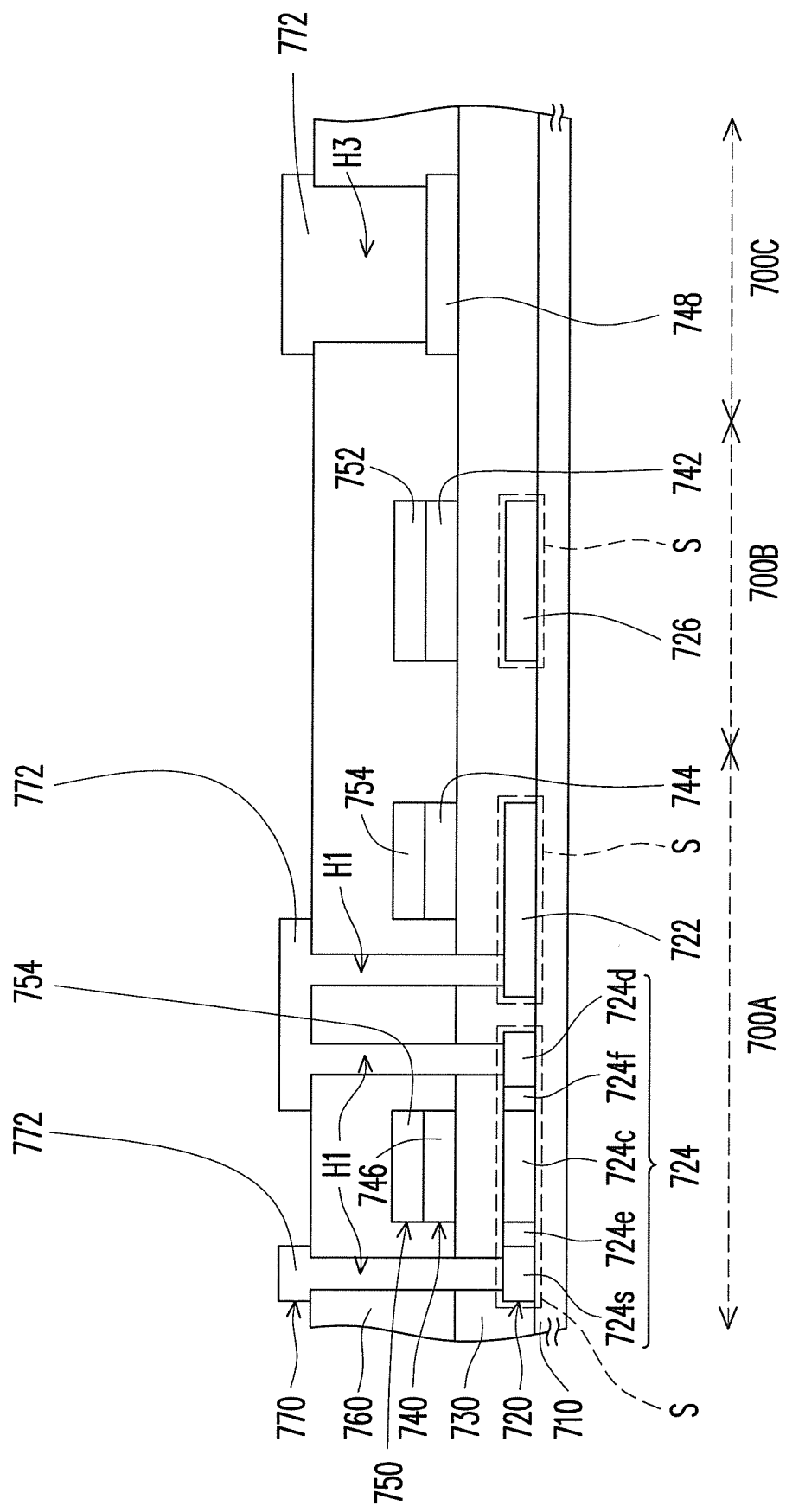

Following that, as shown in FIGS. 15E and 15E', the second patterned conductive layer 770 is formed on the first dielectric layer 760, wherein the second patterned conductive layer 770 includes a plurality of contact conductors 772 disposed in the first contact holes H1 to directly contact the source doping region 724s, the drain doping region 724d, and the storage electrode 722 of the first patterned semiconductor layer. In the present embodiment, the second patterned conductive layer 770 further includes the contact conductors 772 filled into the third contact hole H3 to connect the first pad layer 748 of the first patterned conductive layer 740.

Figure 15F:
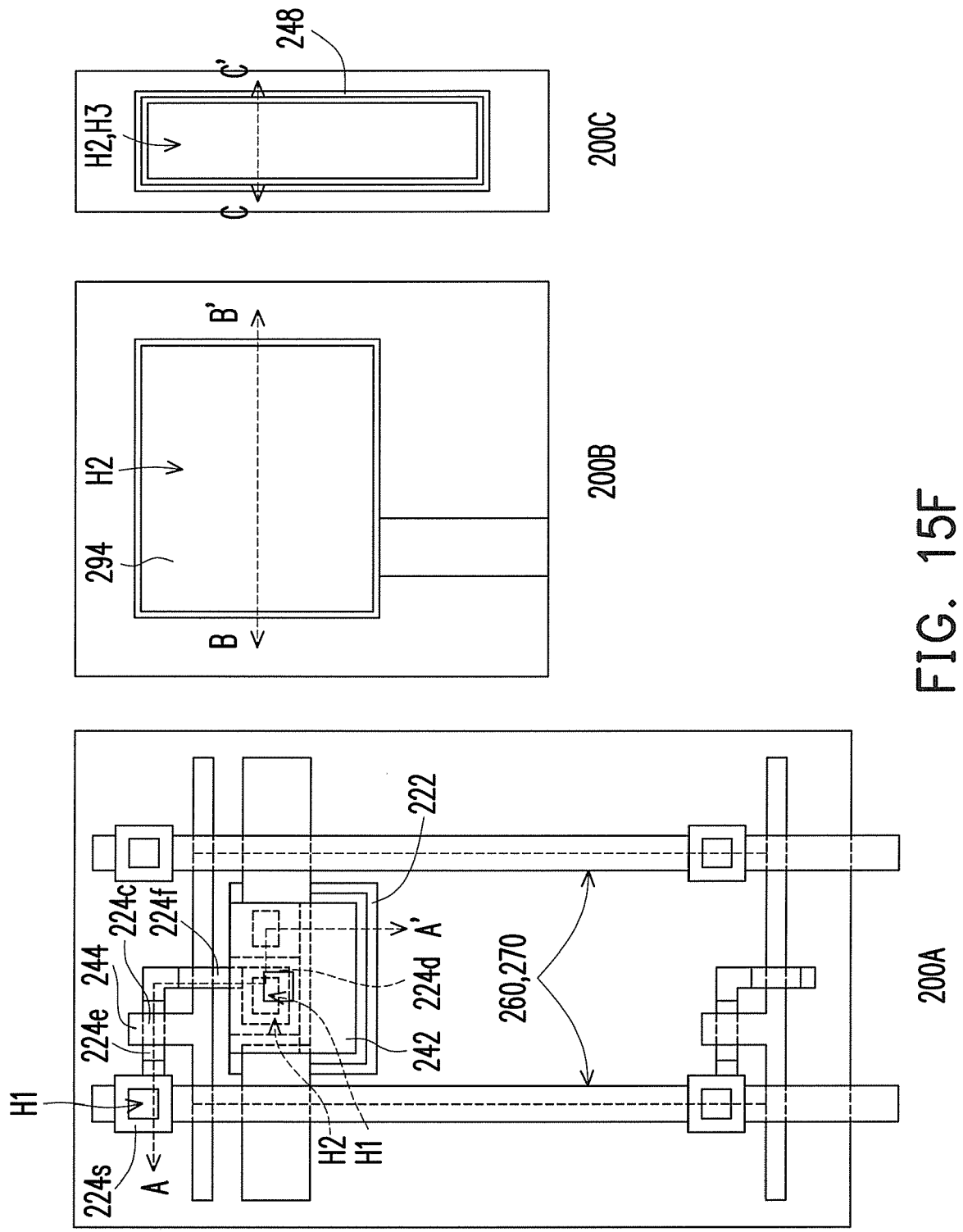
Figure 15F:
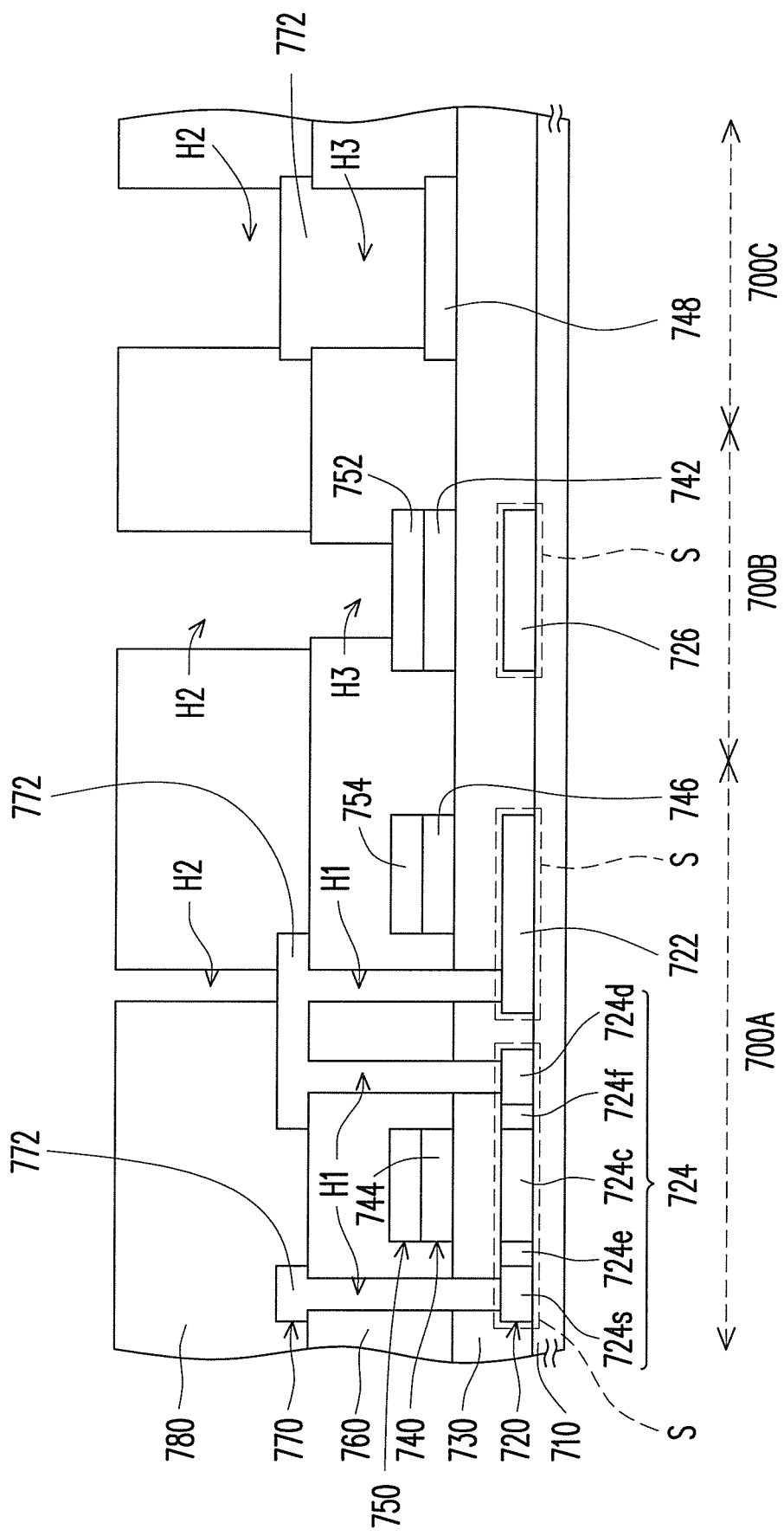

After that, as shown in FIGS. 15F and 15F', the second dielectric layer 780 is formed on the first dielectric layer 760 to cover the contact conductors 772. Afterwards, a plurality of contact holes H2 is formed in the second dielectric layer 780, wherein a portion of the second contact holes H2 is disposed over the active layer 752. Moreover, in the first dielectric layer 760, the first dielectric layer 760 exposed by the second contact holes H2 is removed, for example, by performing an etching process, so that the third contact hole H3 is formed in the first dielectric layer 760 to expose the active layer 752. Furthermore, a portion of the second contact holes H2 are formed correspondingly on the first contact holes H1, a portion of the second contact holes H2 is formed correspondingly over the third contact hole H3, so as to respectively expose the contact conductors 772 filled in the first contact holes H1, and the contact conductors 772 filled in the third contact holes H3.

Figure 15G:
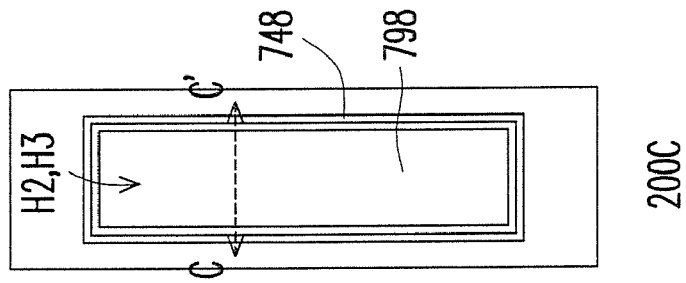
Figure 15G:
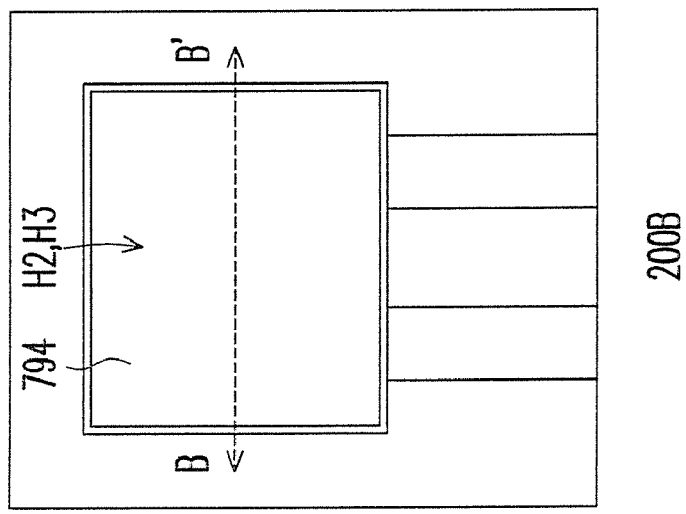
Figure 15G:
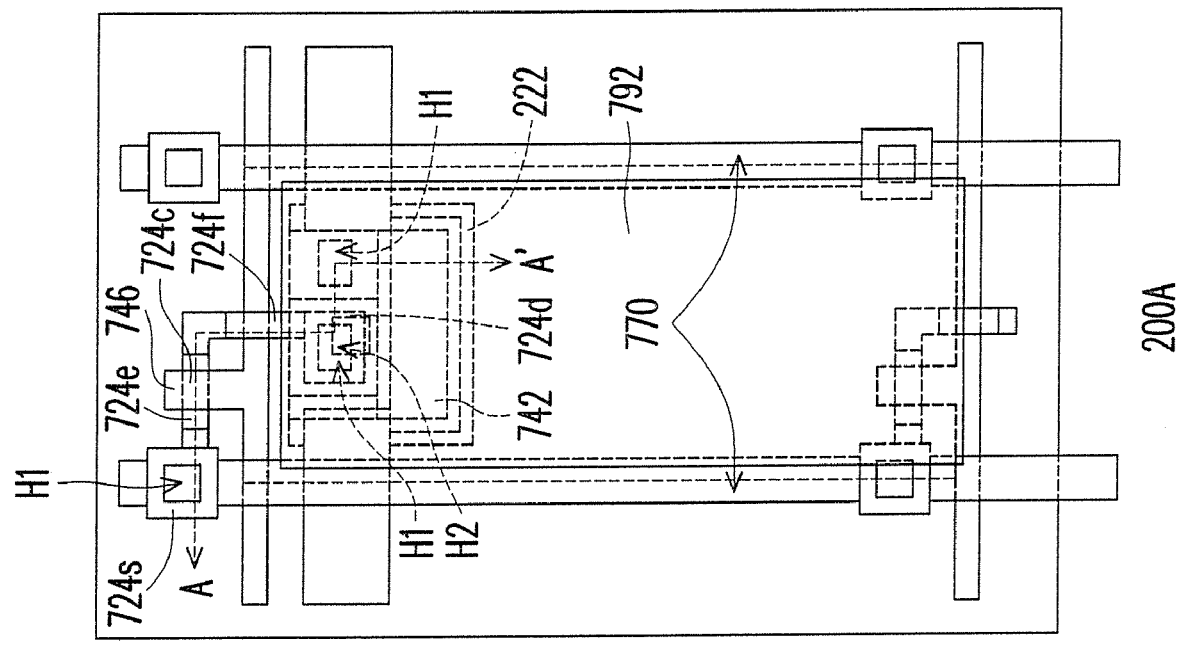
Figure 15G:
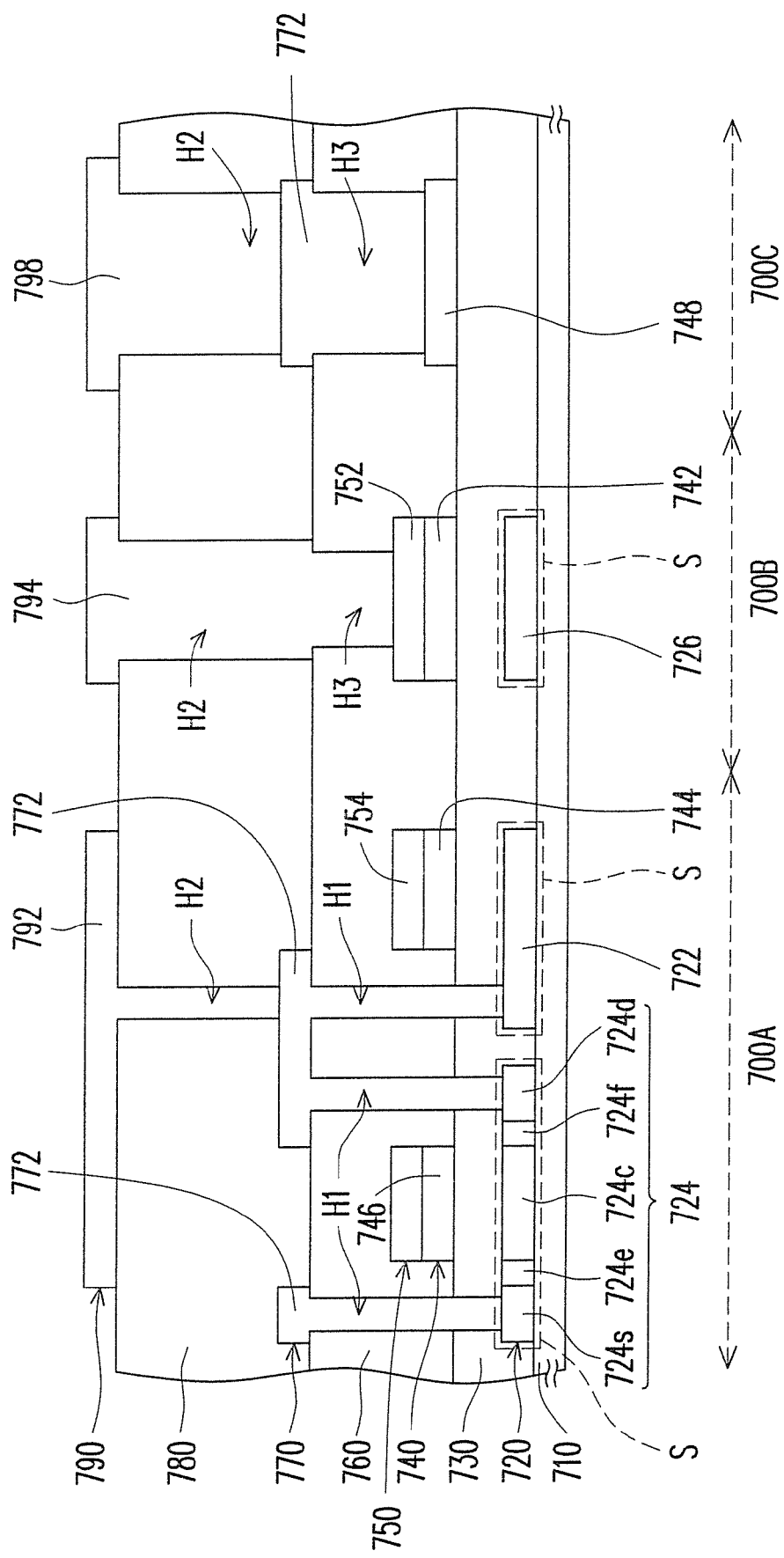

Thereafter, as shown in FIGS. 15G and 15G', the third patterned conductive layer 790 is formed on the second dielectric layer 780, wherein, in the sensing region 700B, a portion of the third patterned conductive layer 790 serves as a top electrode 794 and is electrically connected to the active layer 752 through a portion of the second contact holes H2 and the third contact hole H3. At this point, a portion of the third patterned conductive layer serves as the pixel electrode 792, and is electrically connected to the drain doping region 724d and the storage electrode 742 in the first patterned semiconductor layer 720 through, for example, the first contact holes H1 and the contact conductors 772 filled in the second contact holes H2. Moreover, a portion of the third conductive layer 790 serves as the second pad layer 798, and is electrically connected to the first pad layer 748 of the first patterned conductive layer 740 through, for example, the second contact holes H2 and the contact conductors 772 filled in the third contact holes H3.

Figure 15H:
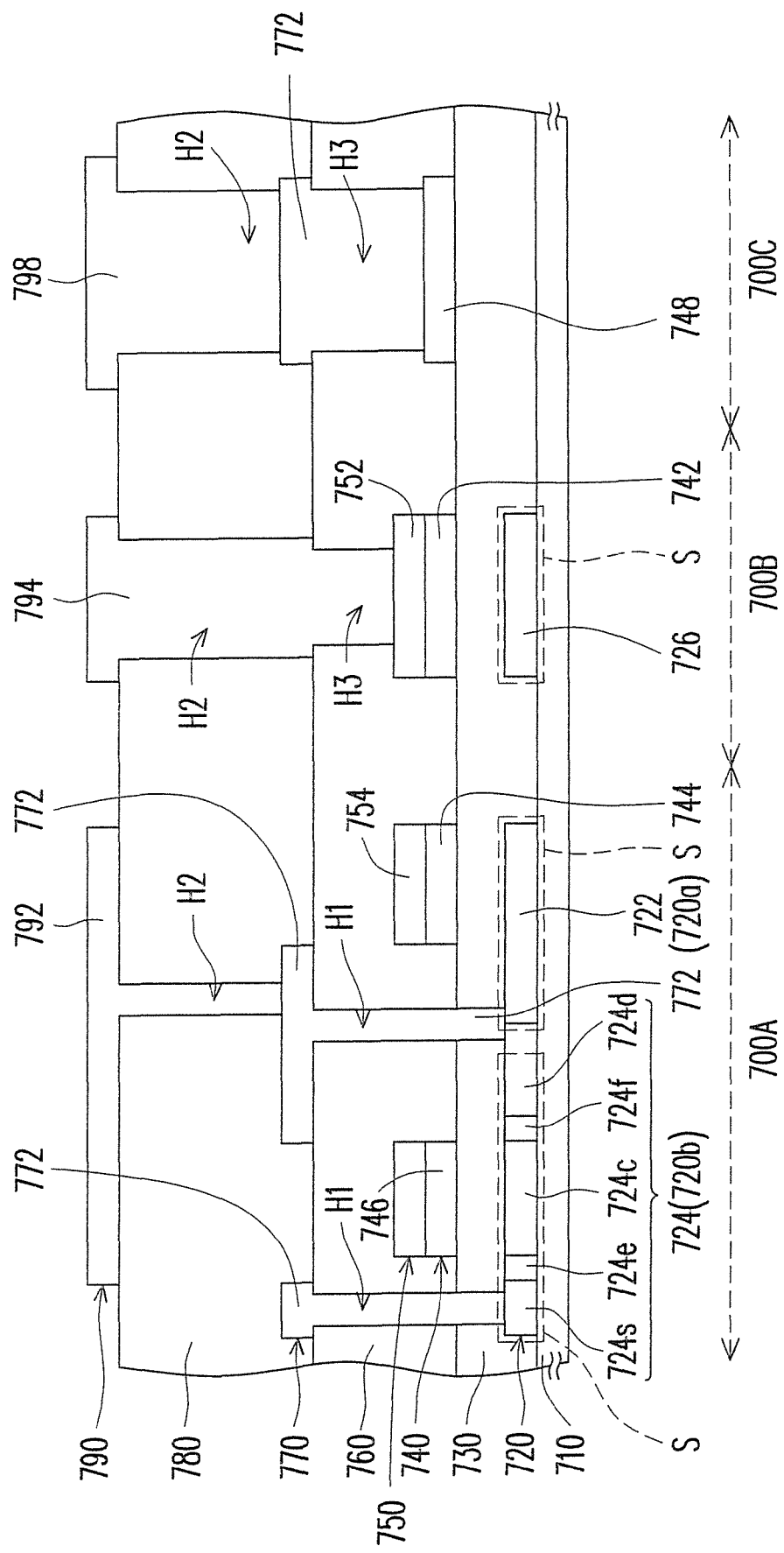
FIG. 15H is a schematic view illustrating another active device array substrate according to the sixth embodiment of the present invention.

FIG. 15H is a schematic view illustrating another active device array substrate according to the sixth embodiment of the present invention. Referring to FIG. 15H, a portion of the first type doping region 720a and the second type doping region 720b in the active device array substrate are in contact with each other, and a contact interface is disposed between the first type doping region 720a and the second type doping region 720b. A portion of the first contact holes H1 exposes the contact interface. In other words, the first contact holes H1 simultaneously expose the first type doping region 720a and the second type doping region 720b, so that the contact conductor 772 electrically connected to the pixel electrode 792 is directly connected to the first type doping region 720a and the second type doping region 720b simply through a first contact hole H1.

Similar to the foregoing embodiments, in the sixth embodiment, seven photolithography and etching processes are also used to fabricate the active device array substrate 700 having the photo sensor. Thereby, the active device array substrate 700 according to the present embodiment also may reduce the process time and process cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active device array substrate, comprising:
a substrate;
a first patterned semiconductor layer disposed on the substrate;
a gate insulator disposed on the substrate and covering the first patterned semiconductor layer;
a first patterned conductive layer disposed on the gate insulator;
a first dielectric layer disposed on the gate insulator and covering the first patterned conductive layer, wherein the first dielectric layer and the gate insulator comprise a plurality of first contact holes exposing the first patterned semiconductor layer;
a second patterned conductive layer, disposed on the first dielectric layer, wherein the second patterned conductive layer comprises a plurality of contact conductors and a bottom electrode, and the active layer being substantially located within an area of the bottom electrode;
a second patterned semiconductor layer, disposed on the second patterned conductive layer, wherein the second patterned semiconductor layer comprises an active layer disposed on the bottom electrode;
a second dielectric layer, disposed on the first dielectric layer, wherein the second dielectric layer comprises a plurality of second contact holes to expose the active layer; and
a third patterned conductive layer, disposed on the second dielectric layer, wherein a portion of the third patterned conductive layer is electrically connected to the active layer through a portion of the second contact holes.

2. The active device array substrate according to claim 1, further comprising a first light-shielding layer disposed on the substrate.

3. The active device array substrate according to claim 1, further comprising a second light-shielding layer disposed on the gate insulator.

4. The active device array substrate according to claim 1, wherein the first patterned semiconductor layer comprises a plurality of island patterns, a portion of the island patterns has a plurality of first type doping regions, and a portion of the island patterns has a plurality of second type doping regions.

5. The active device array substrate according to claim 4, wherein a contact interface is disposed between a portion of the first type doping regions and a portion of the second type doping regions, and a portion of the first contact holes exposes the contact interface.

6. The active device array substrate according to claim 1, wherein the contact conductors are disposed in at least a portion of the first contact holes.

7. The active device array substrate according to claim 6, wherein a portion of the third patterned conductive layer is electrically connected to the first patterned semiconductor layer in a direct manner through the first contact holes and the second contact holes.

8. The active device array substrate according to claim 1, wherein the first dielectric layer comprises a plurality of third contact holes exposing the first patterned conductive layer, and a portion of the second contact holes is disposed correspondingly to the first contact holes and the third contact holes.

9. The active device array substrate according to claim 1, the contact conductors are disposed in the first contact holes and a portion of third contact holes.

10. The active device array substrate according to claim 1, wherein the third patterned conductive layer is electrically connected to the first patterned semiconductor layer through a portion of the second contact holes and the second patterned conductive layer.

11. The active device array substrate according to claim 1, wherein the second patterned semiconductor layer further comprises a plurality of dummy semiconductor layers disposed on the contact conductors.

12. The active device array substrate according to claim 11, wherein sizes of the dummy semiconductor layers are smaller than or equal to sizes of the contact conductors.

13. An active device array substrate, comprising:
a substrate;
a first patterned semiconductor layer disposed on the substrate;
a gate insulator disposed on the substrate, wherein the gate insulator covers the first patterned semiconductor layer;
a first patterned conductive layer, wherein the first patterned conductive layer comprises a plurality of gates and a bottom electrode;
a second patterned semiconductor layer, disposed on the first patterned conductive layer, wherein the second patterned semiconductor layer comprises an active layer disposed on the bottom electrode, and the active layer being substantially located within an area of the bottom electrode;
a first dielectric layer, disposed on the gate insulator to cover the first patterned conductive layer, wherein the first dielectric layer and the gate insulator comprise a plurality of first contact holes exposing the first patterned semiconductor layer, and comprise a third contact hole;
a second patterned conductive layer disposed on the first dielectric layer, wherein the second patterned conductive layer comprises a plurality of contact conductors in the first contact holes;
a second dielectric layer, disposed on the first dielectric layer, wherein the second dielectric layer comprises a plurality of second contact holes, and a portion of the second contact holes is disposed over the active layer; and
a third patterned conductive layer, disposed on the second dielectric layer, wherein a portion of the third patterned conductive layer is electrically connected to the active layer through a portion of the second contact holes and the third contact hole.

14. The active device array substrate according to claim 13, wherein the first patterned semiconductor layer comprises a plurality of island patterns, a portion of the island patterns comprises a plurality of first type doping regions, and a portion of the island patterns comprises a plurality of second type doping regions.

15. The active device array substrate according to claim 14, wherein a contact interface is disposed between a portion of the first type doping regions and a portion of the second type doping regions, and a portion of the first contact holes exposes the contact interface.

16. The active device array substrate according to claim 13, wherein the first dielectric layer comprises a plurality of third contact holes exposing the first patterned conductive layer, and a portion of the second contact holes is disposed correspondingly to the first contact holes and the third contact holes.

17. The active device array substrate according to claim 16, wherein a portion of the third patterned conductive layer is electrically connected to the first patterned conductive layer through the second contact holes and the second patterned conductive layer in the third contact holes.

18. The active device array substrate according to claim 13, wherein the third patterned conductive layer is electrically connected to the first patterned semiconductor layer through a portion of the second contact holes and the second patterned conductive layer.

19. The active device array substrate according to claim 13, wherein the second patterned semiconductor layer further comprises a plurality of dummy semiconductor layers disposed on the gates.

20. The active device array substrate according to claim 19, wherein sizes of the dummy semiconductor layers are smaller than or equal to sizes of the contact conductors.

21. The active device array substrate according to claim 13, further comprising a first light-shielding layer disposed on the substrate.

22. An active device array substrate, comprising:
a substrate;
a first patterned semiconductor layer disposed on the substrate;
a gate insulator disposed on the substrate and covering the first patterned semiconductor layer;
a first patterned conductive layer disposed on the gate insulator;
a first dielectric layer disposed on the gate insulator and covering the first patterned conductive layer, wherein the first dielectric layer and the gate insulator comprise a plurality of first contact holes exposing the first patterned semiconductor layer;
a second patterned conductive layer, disposed on the first dielectric layer, wherein the second patterned conductive layer comprises a plurality of contact conductors and a bottom electrode, and wherein the bottom electrode is not formed on a slant surface of the first dielectric layer;
a second patterned semiconductor layer, disposed on the second patterned conductive layer, wherein the second patterned semiconductor layer comprises an active layer disposed on the bottom electrode;
a second dielectric layer, disposed on the first dielectric layer, wherein the second dielectric layer comprises a plurality of second contact holes to expose the active layer; and
a third patterned conductive layer, disposed on the second dielectric layer, wherein a portion of the third patterned conductive layer is electrically connected to the active layer through a portion of the second contact holes.

23. An active device array substrate, comprising:
a substrate;
a first patterned semiconductor layer disposed on the substrate;
a gate insulator disposed on the substrate, wherein the gate insulator covers the first patterned semiconductor layer;
a first patterned conductive layer, wherein the first patterned conductive layer comprises a plurality of gates and a bottom electrode;
a second patterned semiconductor layer, disposed on the first patterned conductive layer, wherein the second patterned semiconductor layer comprises an active layer disposed on the bottom electrode, and the bottom electrode is not formed on a slant surface of the first dielectric layer;

a first dielectric layer, disposed on the gate insulator to cover the first patterned conductive layer, wherein the first dielectric layer and the gate insulator comprise a plurality of first contact holes exposing the first patterned semiconductor layer, and comprise a third contact hole;

a second patterned conductive layer disposed on the first dielectric layer, wherein the second patterned conductive layer comprises a plurality of contact conductors in the first contact holes;

a second dielectric layer, disposed on the first dielectric layer, wherein the second dielectric layer comprises a plurality of second contact holes, and a portion of the second contact holes is disposed over the active layer; and a third patterned conductive layer, disposed on the second dielectric layer, wherein a portion of the third patterned conductive layer is electrically connected to the active layer through a portion of the second contact holes and the third contact hole.

* * * * *